(12) United States Patent
Nakatani et al.

(10) Patent No.: US 8,829,629 B2
(45) Date of Patent: Sep. 9, 2014

(54) CAPACITANCE TYPE SENSOR

(71) Applicant: Rohm Co., Ltd., Kyoto (JP)

(72) Inventors: Goro Nakatani, Kyoto (JP); Toma Fujita, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/952,214

(22) Filed: Jul. 26, 2013

(65) Prior Publication Data
US 2013/0313660 A1  Nov. 28, 2013

Related U.S. Application Data

(62) Division of application No. 13/274,292, filed on Oct. 14, 2011, now Pat. No. 8,513,746.

(30) Foreign Application Priority Data

Oct. 15, 2010 (JP) ................. 2010-232910
Dec. 6, 2010 (JP) ................. 2010-271982
Dec. 13, 2010 (JP) ................. 2010-277213
Dec. 13, 2010 (JP) ................. 2010-277214

(51) Int. Cl.
*H01L 21/48* (2006.01)
*G01C 19/5769* (2012.01)
*B81C 1/00* (2006.01)
*B81B 7/02* (2006.01)
*G01P 15/125* (2006.01)
*G01C 19/5733* (2012.01)

(52) U.S. Cl.
CPC ........... *B81B 7/02* (2013.01); *B81B 2203/0136* (2013.01); *G01C 19/5769* (2013.01); *B81C 1/00182* (2013.01); *G01P 15/125* (2013.01); *B81B 2201/0242* (2013.01); *G01C 19/5733* (2013.01); *B81B 2203/04* (2013.01)
USPC ............. 257/415; 257/419; 257/E21.219; 257/E21.499; 257/E29.329

(58) Field of Classification Search
USPC ............ 257/415–419, E21, 219, 499, 29.329
See application file for complete search history.

(56) References Cited

U.S. PATENT DOCUMENTS 6,062,082 A  5/2000 Guenther et al.
6,109,106 A  8/2000 Ferrari et al.
(Continued)

FOREIGN PATENT DOCUMENTS

JP  05-076186  3/1993
JP  11-515092  12/1999
(Continued)

OTHER PUBLICATIONS

P. Merz et al., "PSM-X2 General Sensor Process Description Revision 0.2", Feb. 13, 2008.

*Primary Examiner* — Michael Lebentritt
(74) *Attorney, Agent, or Firm* — Rabin & Berdo, P.C.

(57) ABSTRACT

A capacitance type gyro sensor includes a semiconductor substrate, a first electrode integrally including a first base portion and first comb tooth portions and a second electrode integrally including a second base portion and second comb tooth portions, formed by processing the surface portion of the semiconductor substrate. The first electrode has first drive portions that extend from opposed portions opposed to the respective second comb tooth portions on the first base portion toward the respective second comb tooth portions. The second electrode has second drive portions formed on the tip end portions of the respective second comb tooth portions opposed to the respective first drive portions. The first drive portions and the second drive portions engage with each other at an interval like comb teeth.

15 Claims, 85 Drawing Sheets

(56) References Cited

U.S. PATENT DOCUMENTS

| | | |
|---|---|---|
| 6,257,059 B1 | 7/2001 | Weinberg et al. |
| 6,520,017 B1 | 2/2003 | Schoefthaler et al. |
| 6,626,039 B1 | 9/2003 | Adams et al. |
| 6,691,571 B2 | 2/2004 | Willig et al. |
| 6,705,164 B2 | 3/2004 | Willig et al. |
| 6,766,689 B2 | 7/2004 | Spinola Durante et al. |
| 6,792,804 B2 | 9/2004 | Adams et al. |
| 7,260,991 B2 | 8/2007 | Maurer et al. |
| 7,504,757 B2 | 3/2009 | Subramanian et al. |
| 8,513,746 B2 * | 8/2013 | Nakatani et al. ...... 257/E29.329 |
| 2002/0100919 A1 | 8/2002 | Seki et al. |
| 2003/0210511 A1 | 11/2003 | Sakai et al. |
| 2004/0182158 A1 | 9/2004 | Tsubaki |
| 2004/0256689 A1 | 12/2004 | Wachtmann et al. |
| 2005/0178203 A1 | 8/2005 | Goto |
| 2007/0199377 A1 | 8/2007 | Katsumata et al. |
| 2008/0038921 A1 | 2/2008 | Gouda et al. |
| 2009/0159997 A1 | 6/2009 | Okudo et al. |
| 2009/0267165 A1 | 10/2009 | Okudo et al. |
| 2010/0186506 A1 | 7/2010 | Robert |
| 2010/0194407 A1 | 8/2010 | Nakatani |

FOREIGN PATENT DOCUMENTS

| | | |
|---|---|---|
| JP | 2000-307018 A | 11/2000 |
| JP | 2003-337138 A | 11/2003 |
| JP | 2004-286535 A | 10/2004 |
| JP | 2007-523755 A | 8/2007 |
| JP | 2008-241477 A | 10/2008 |
| JP | 2009-500635 A | 1/2009 |
| JP | 2010-175482 A | 8/2010 |

* cited by examiner

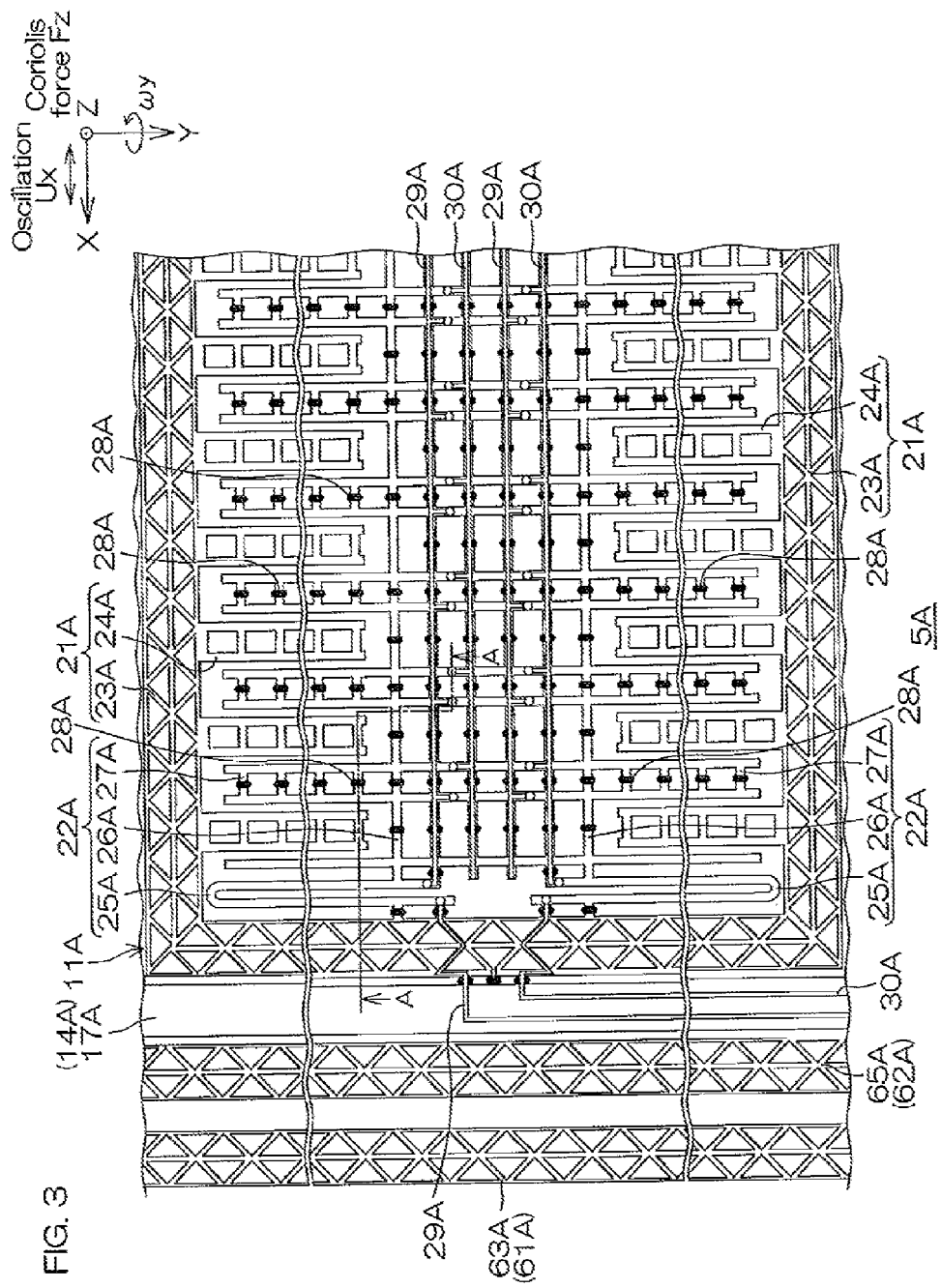

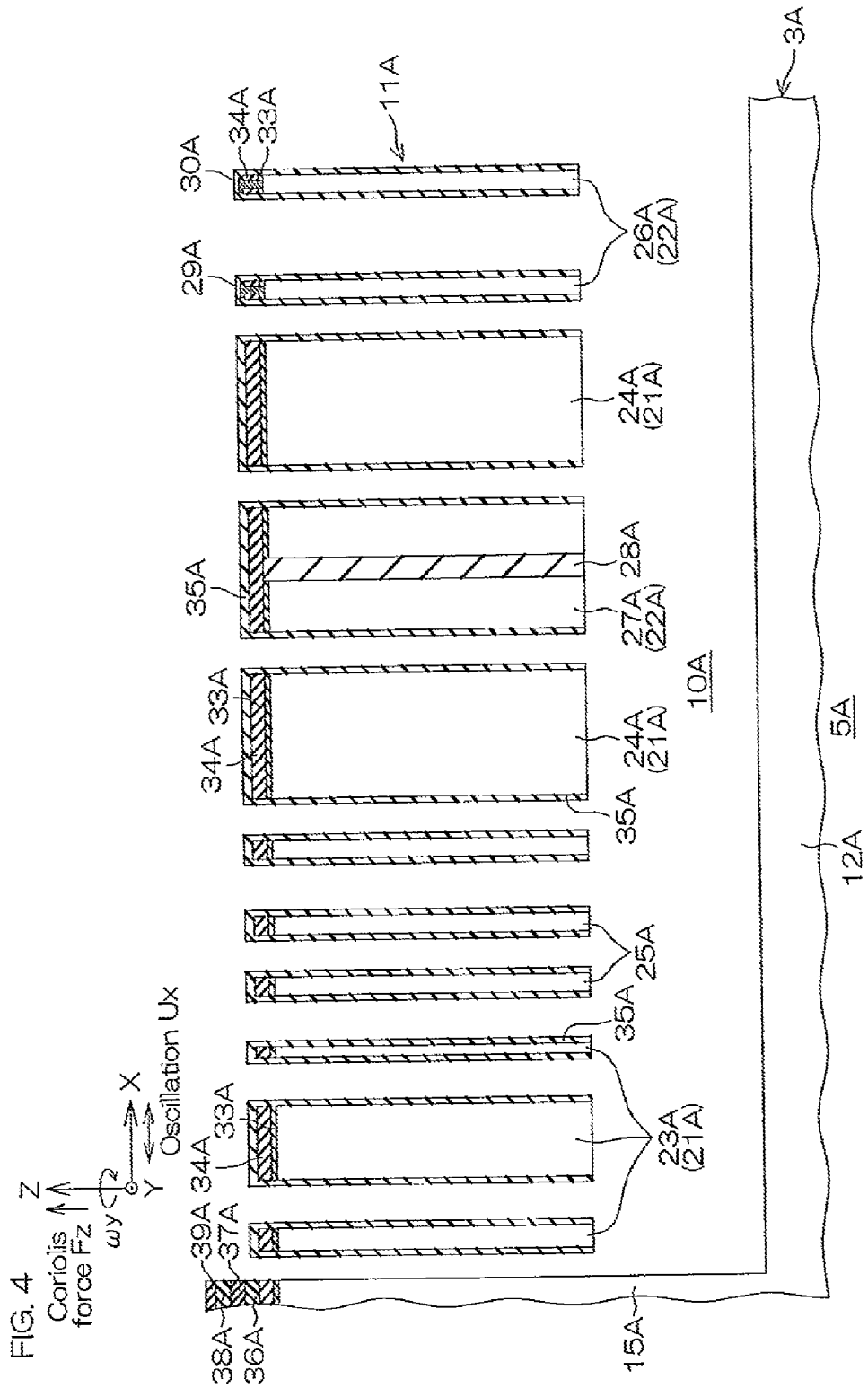

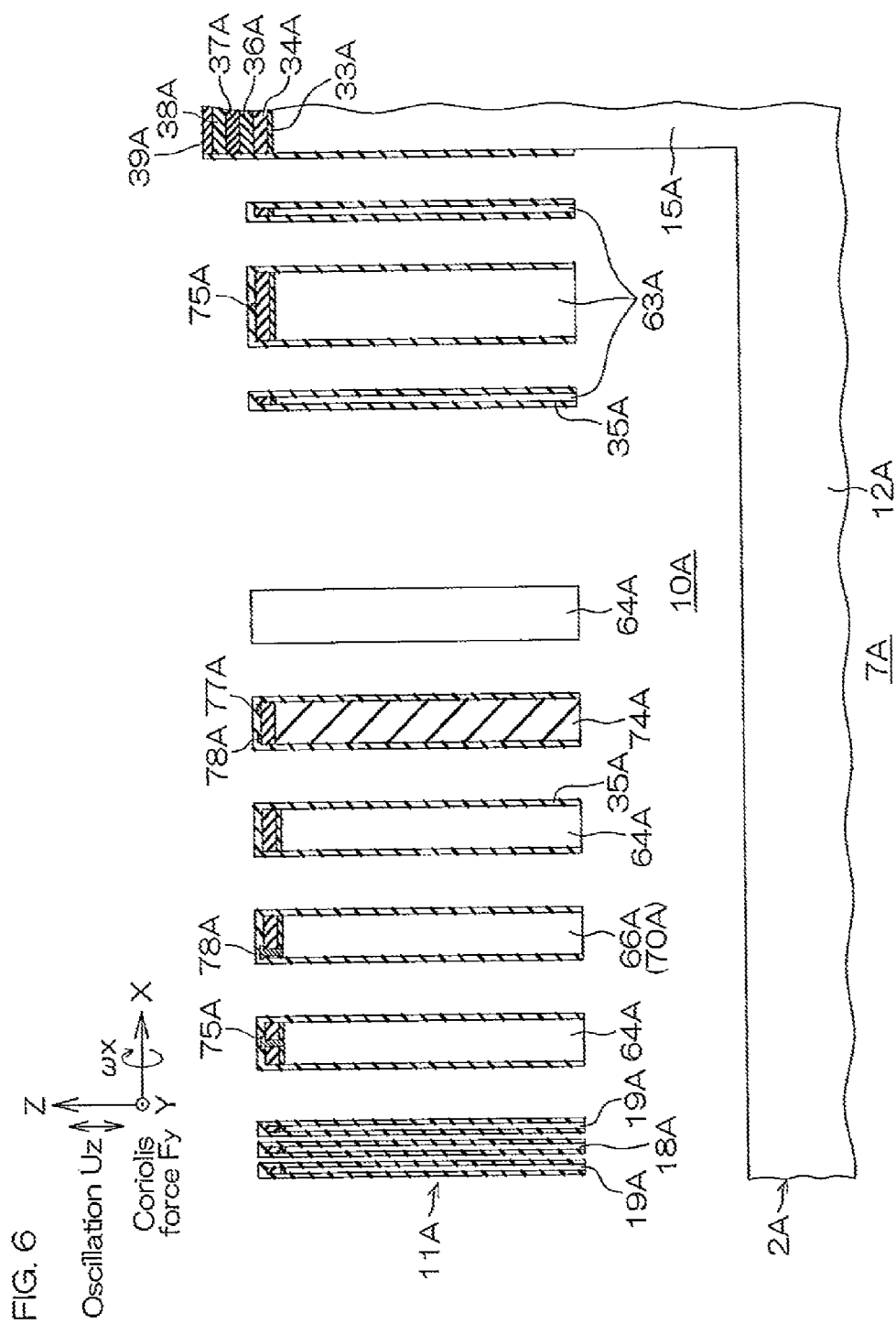

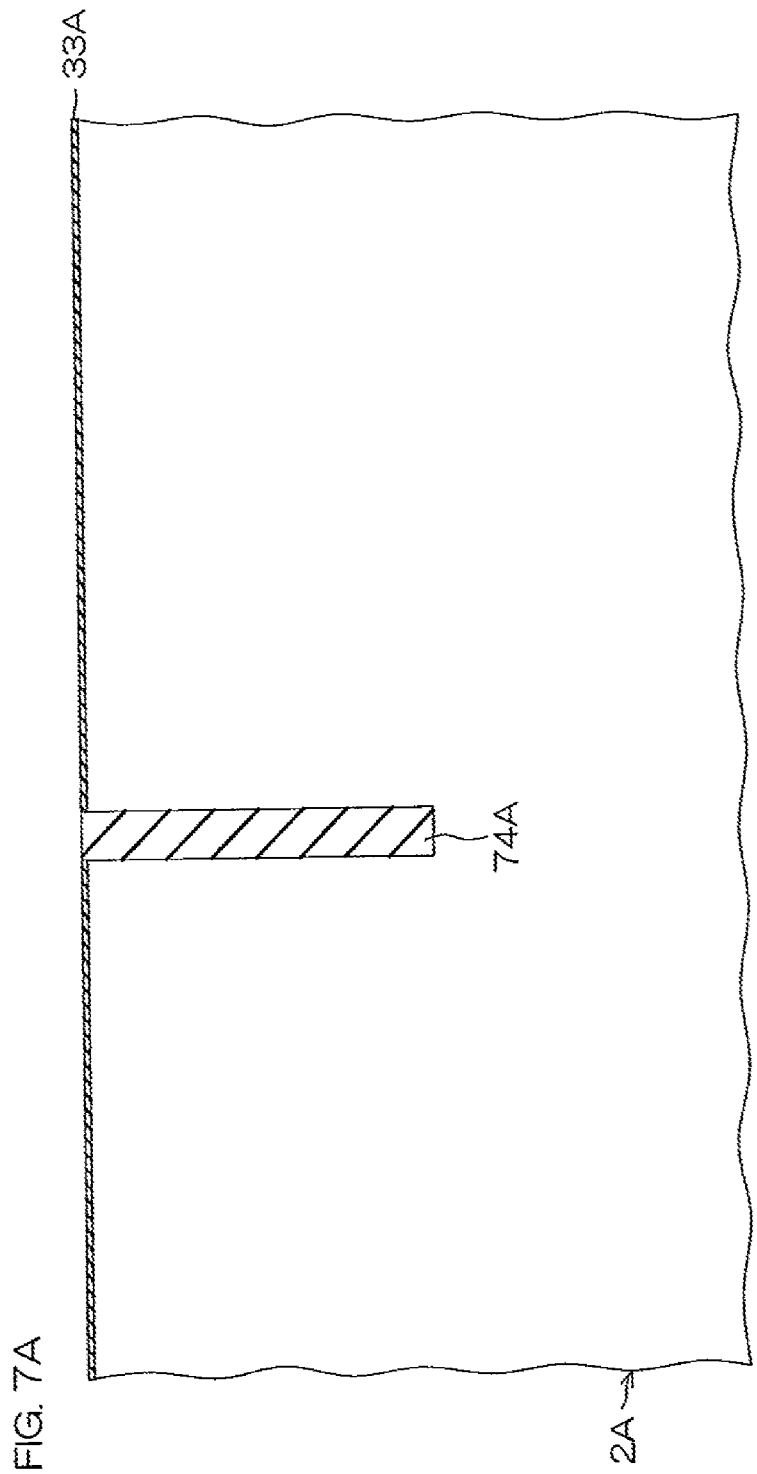

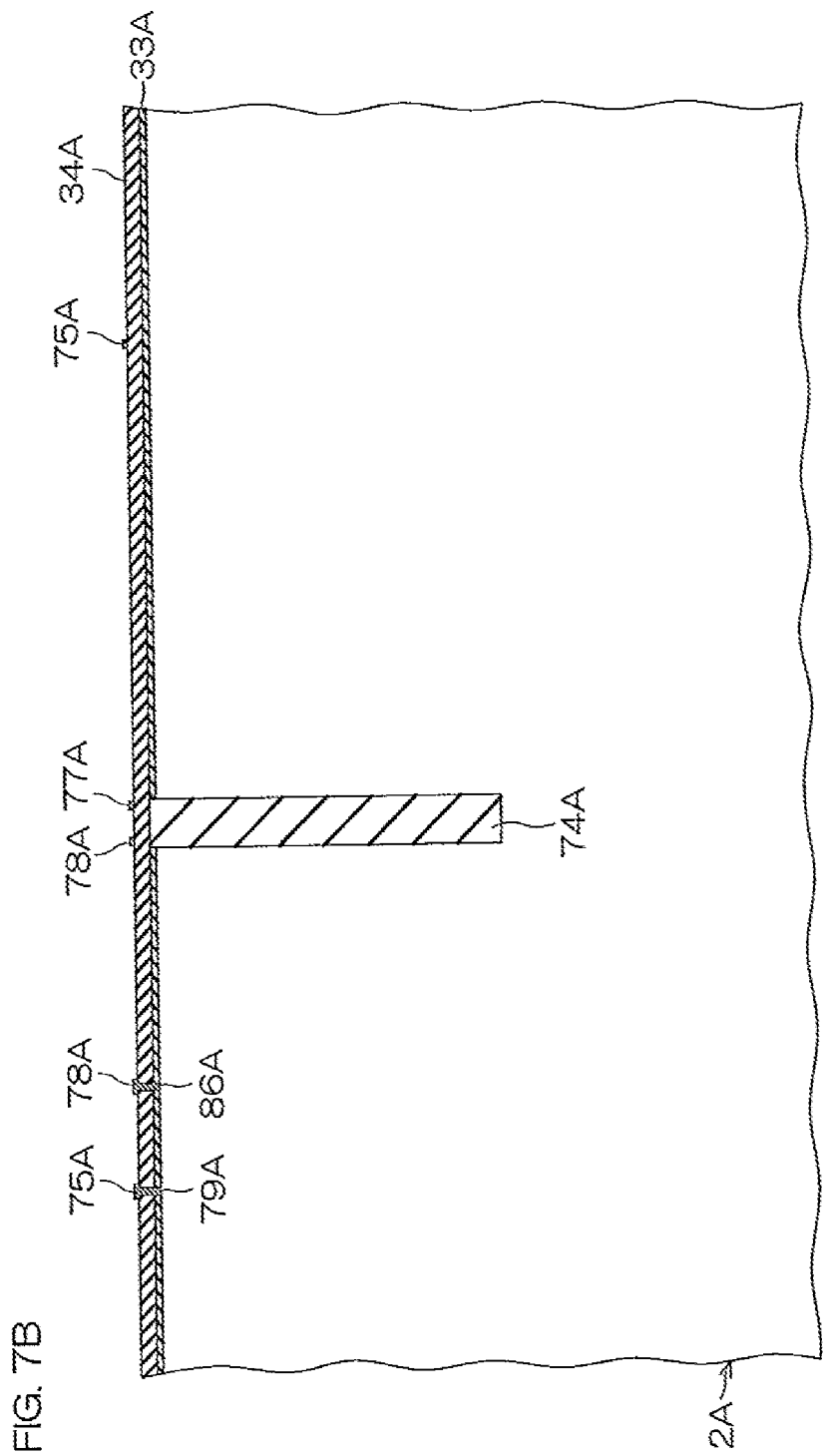

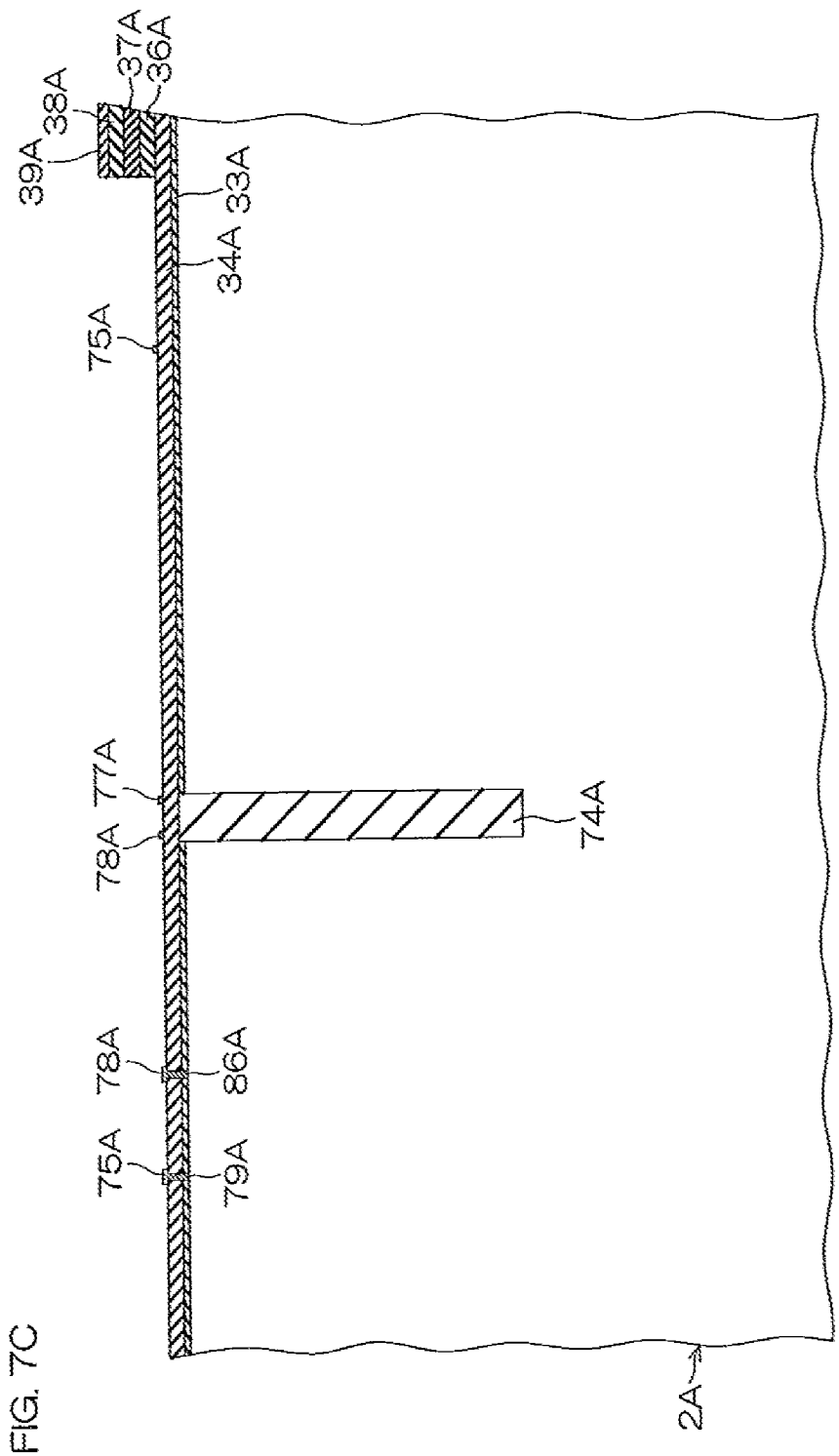

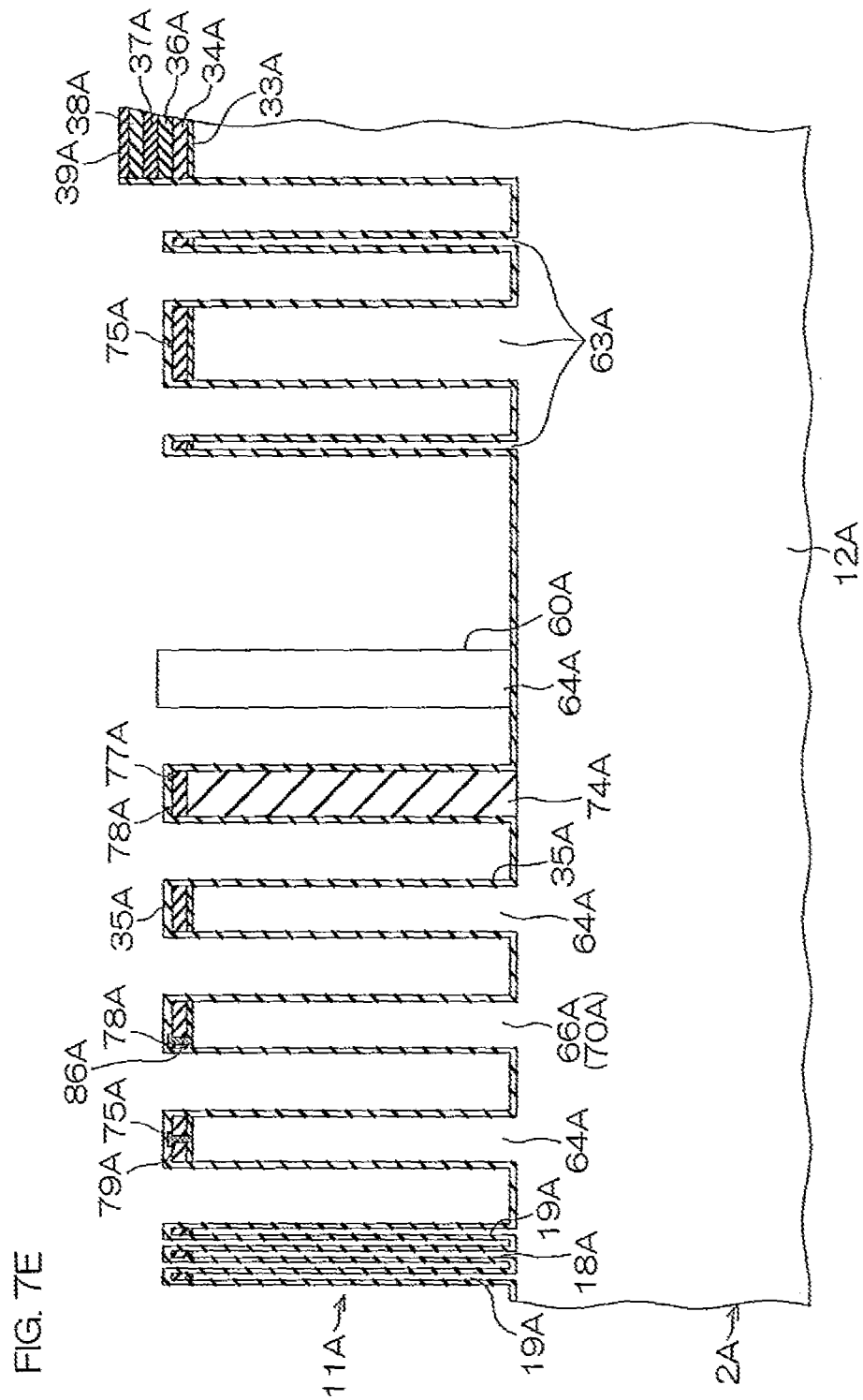

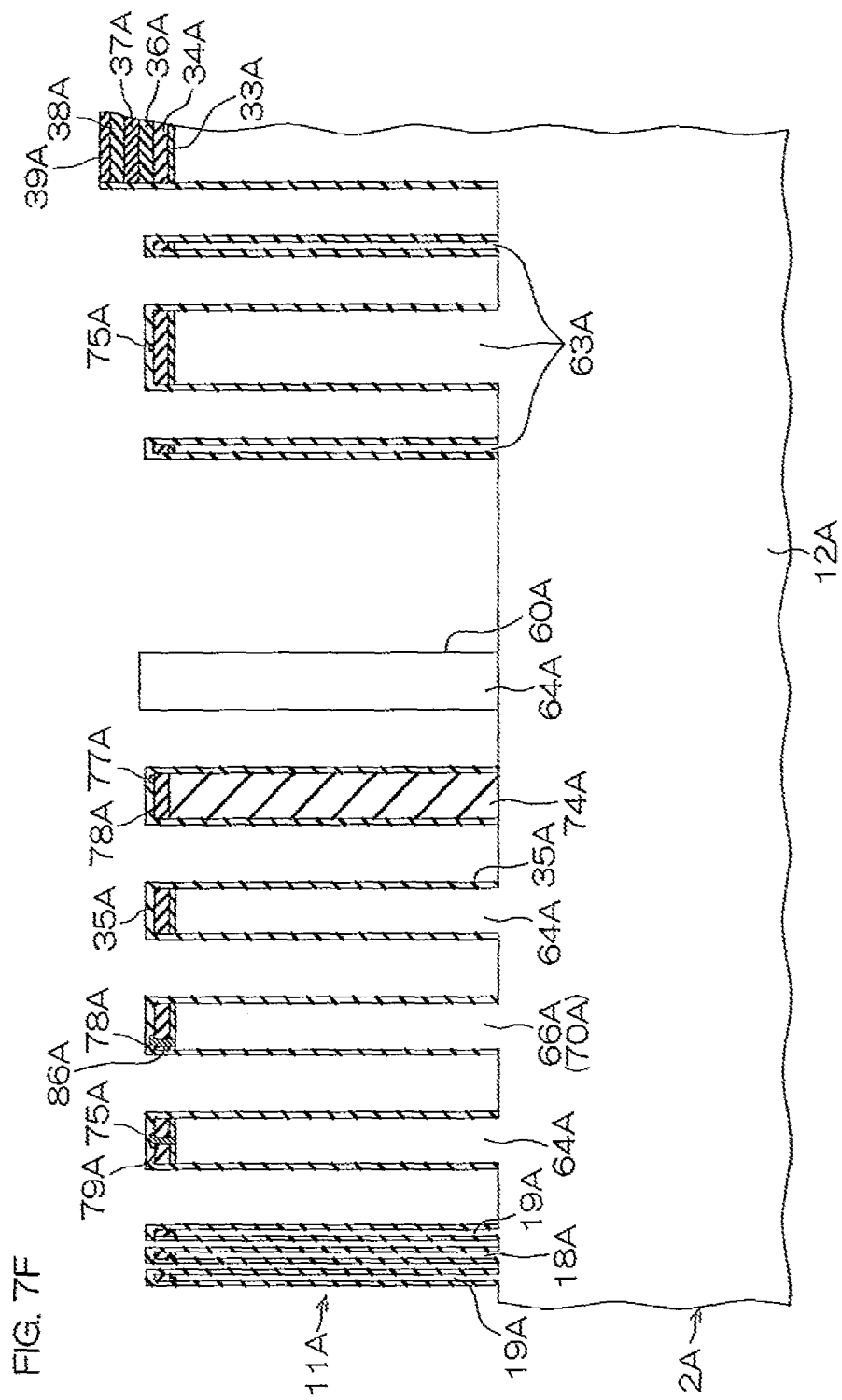

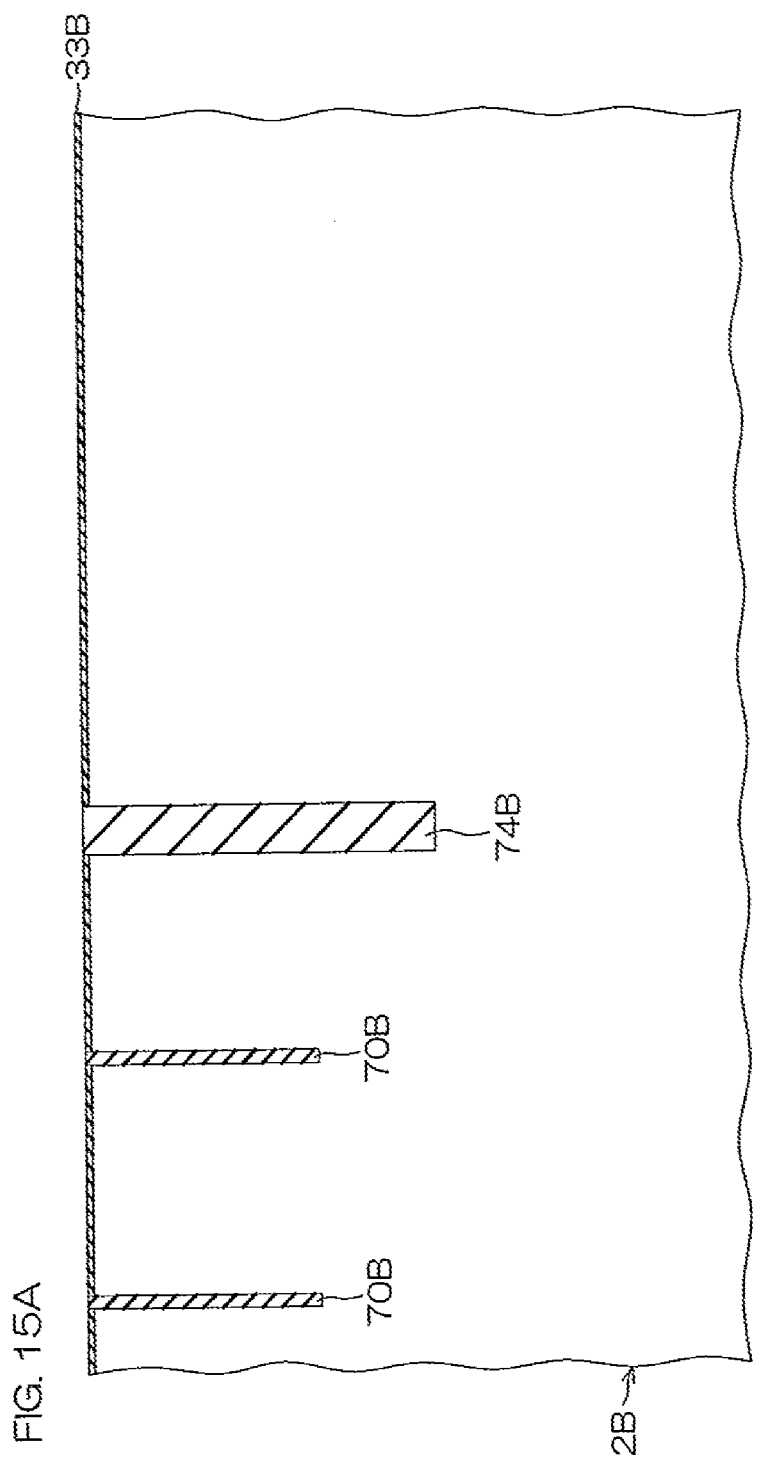

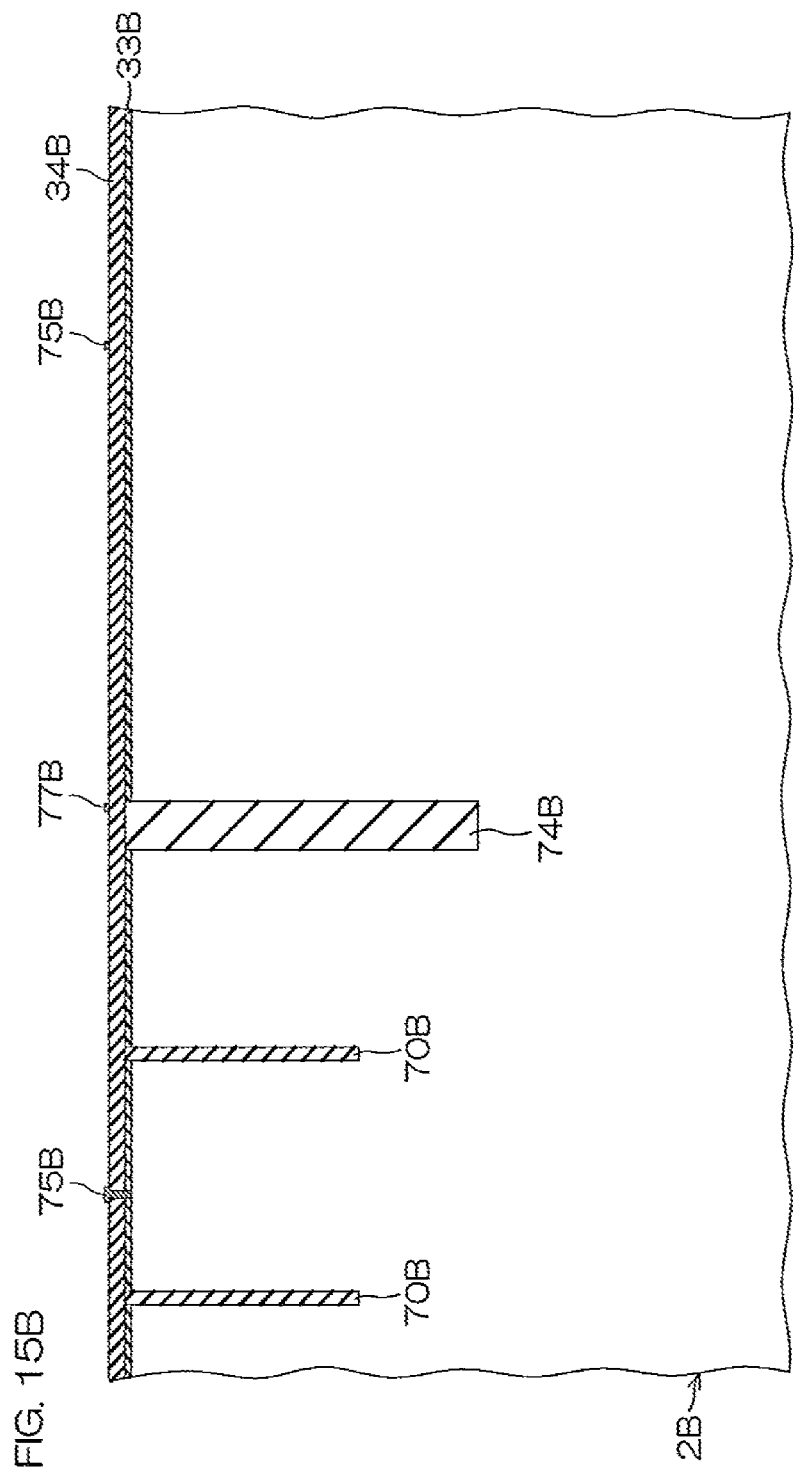

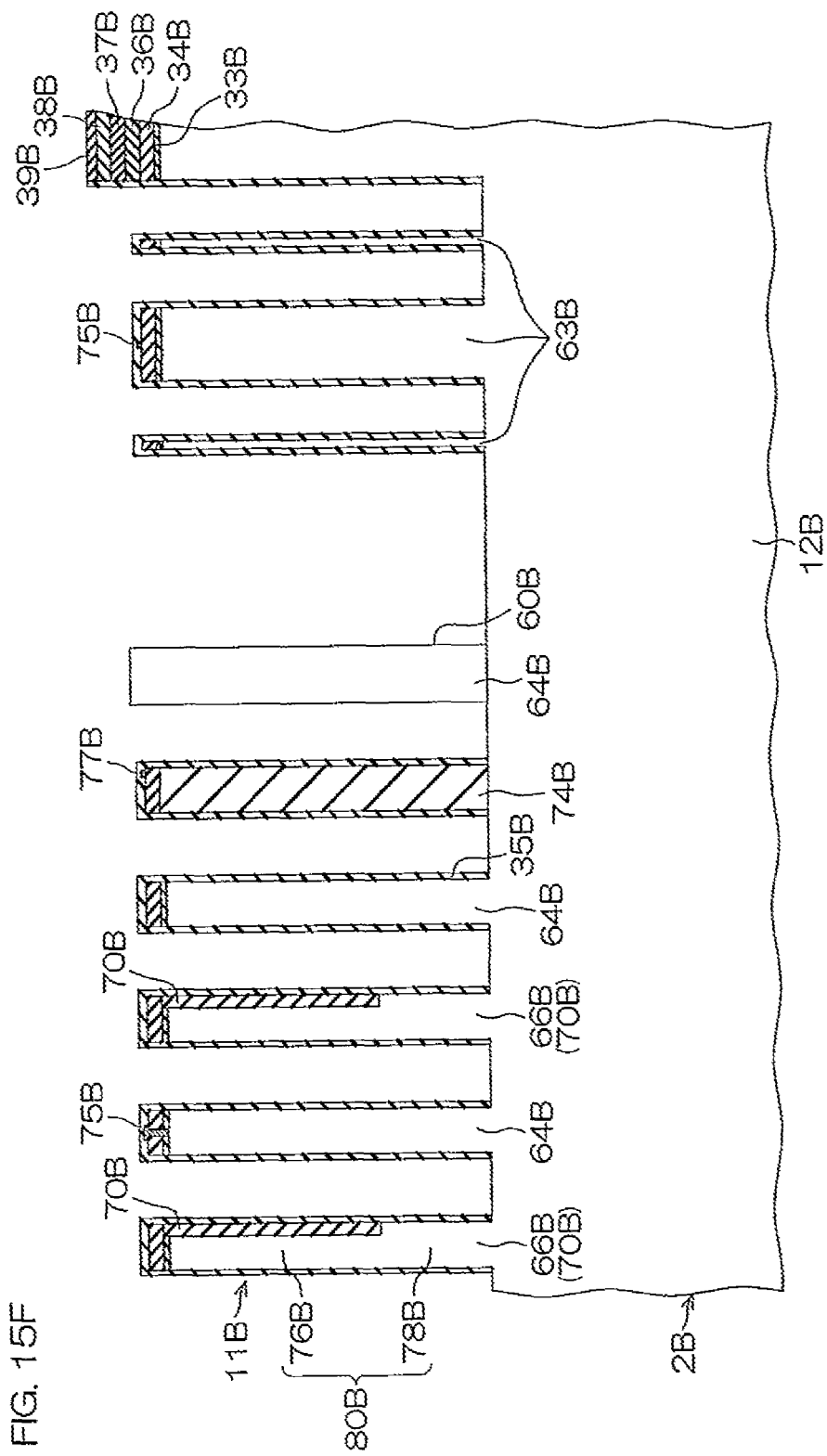

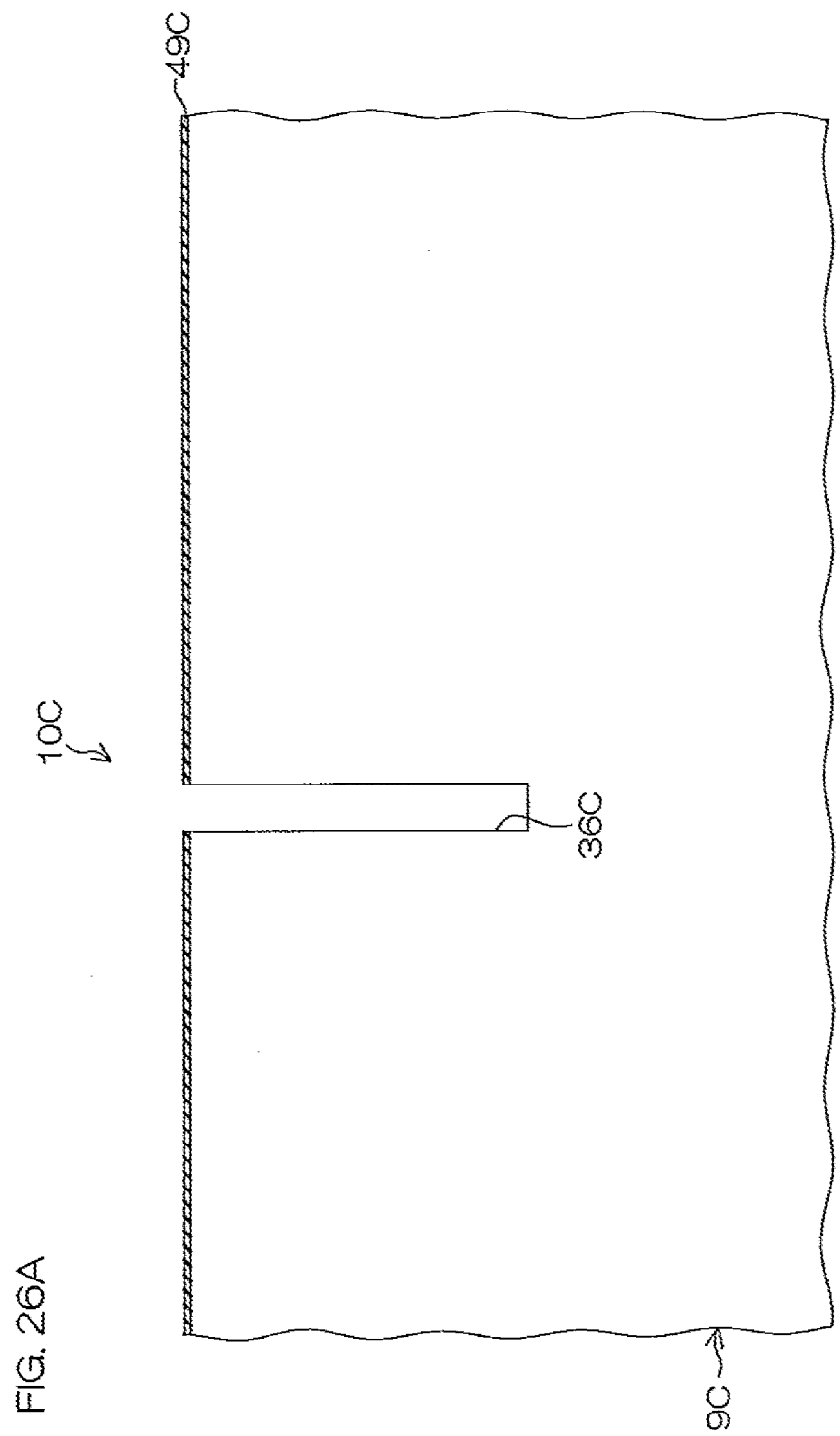

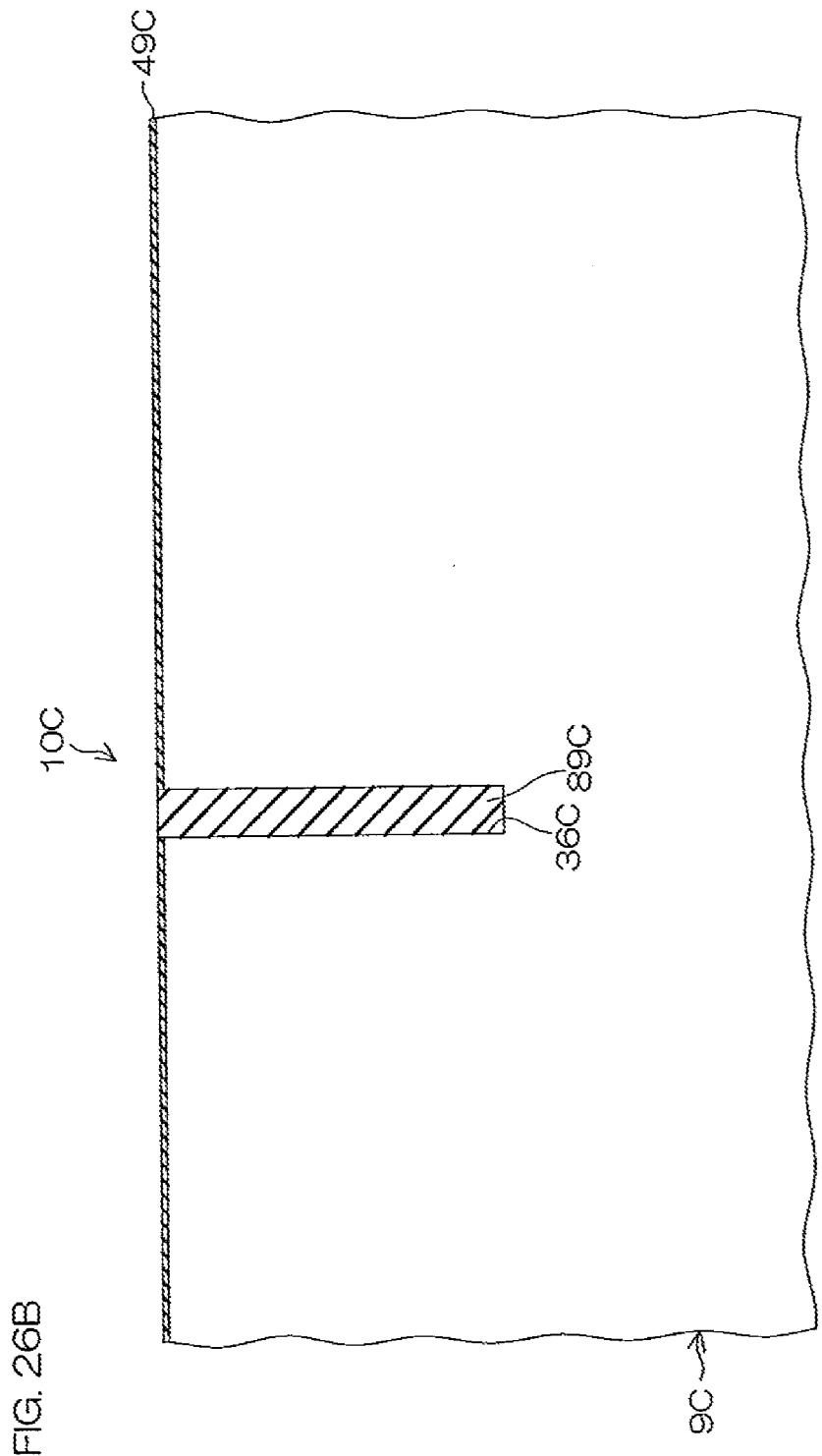

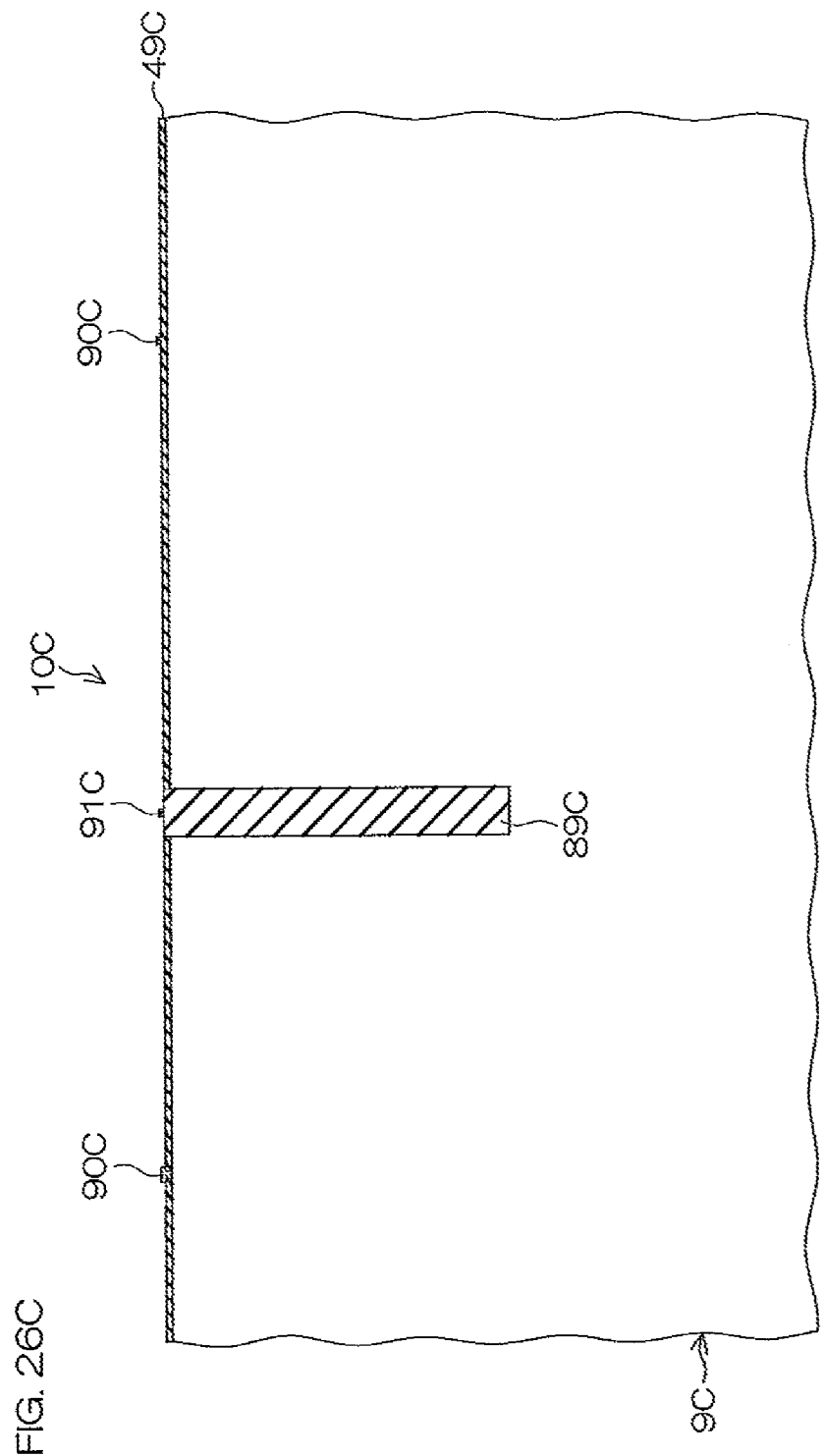

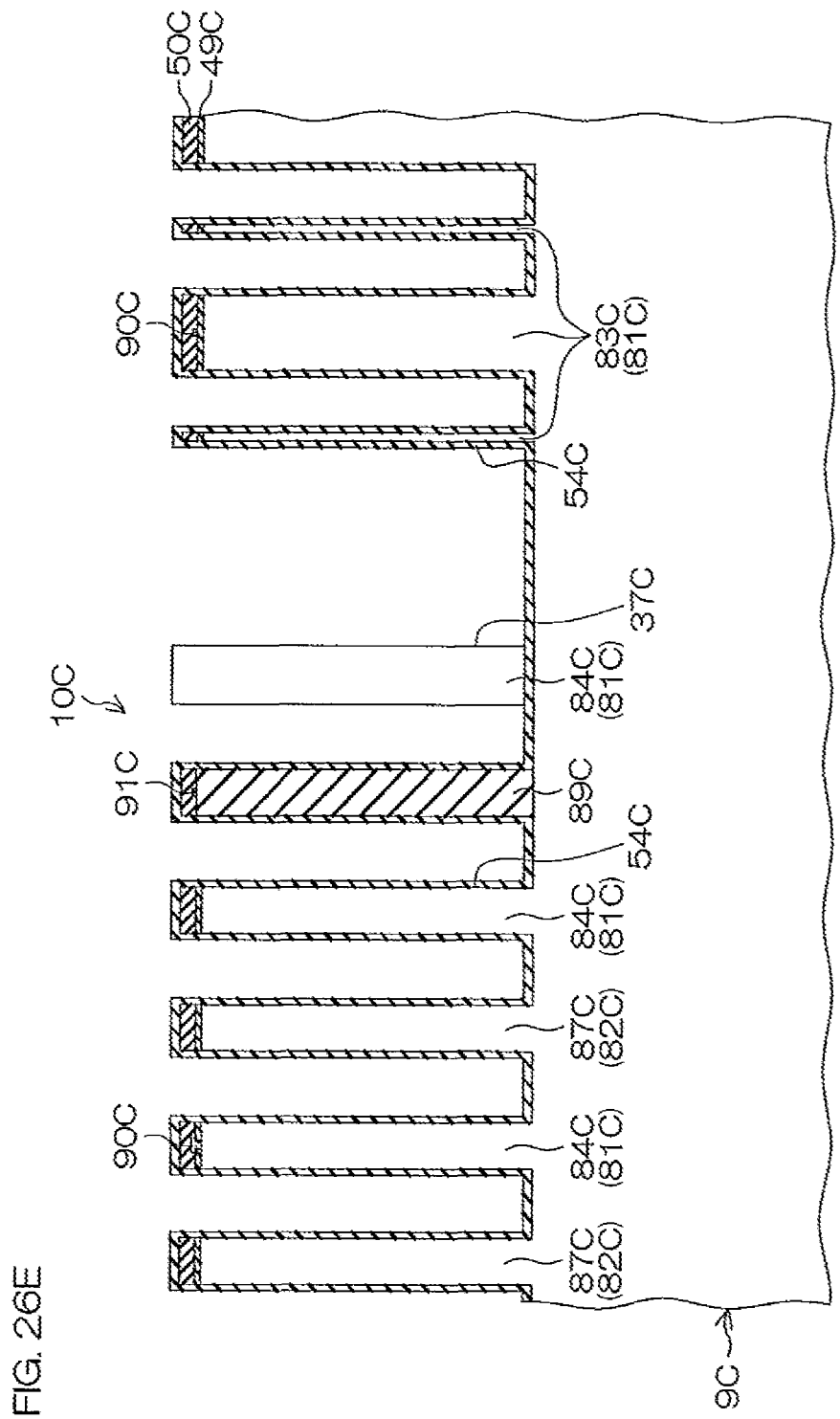

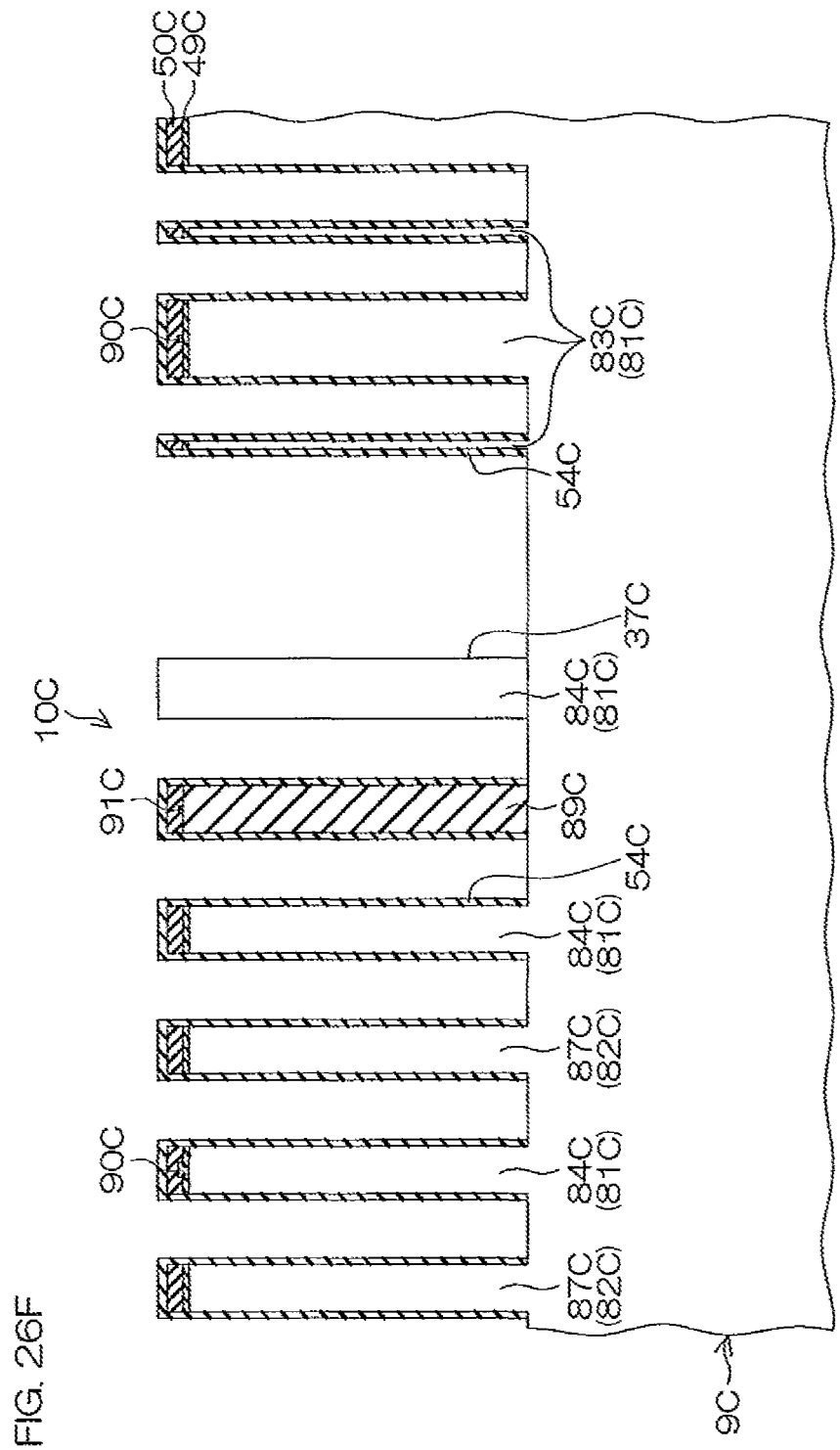

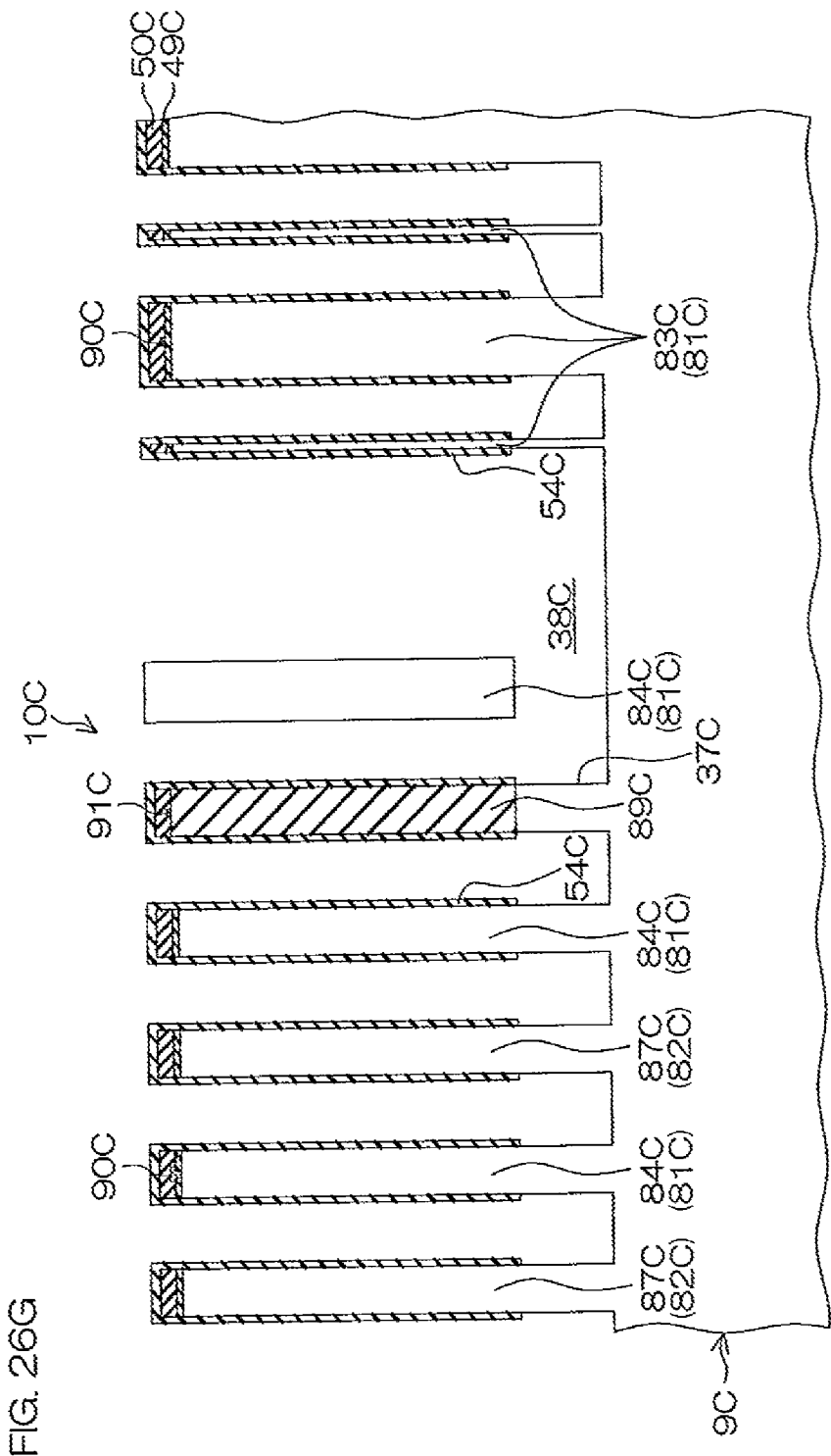

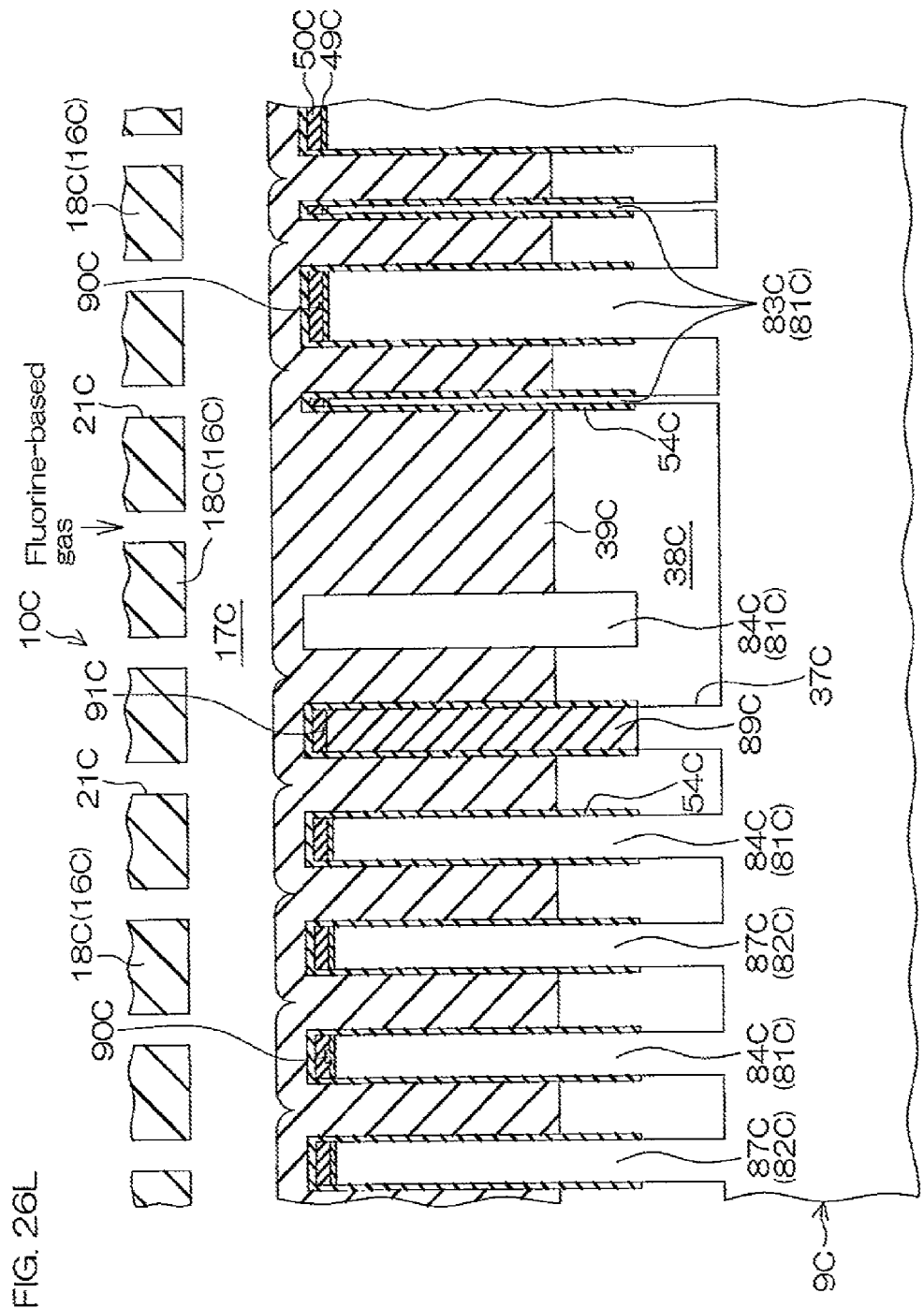

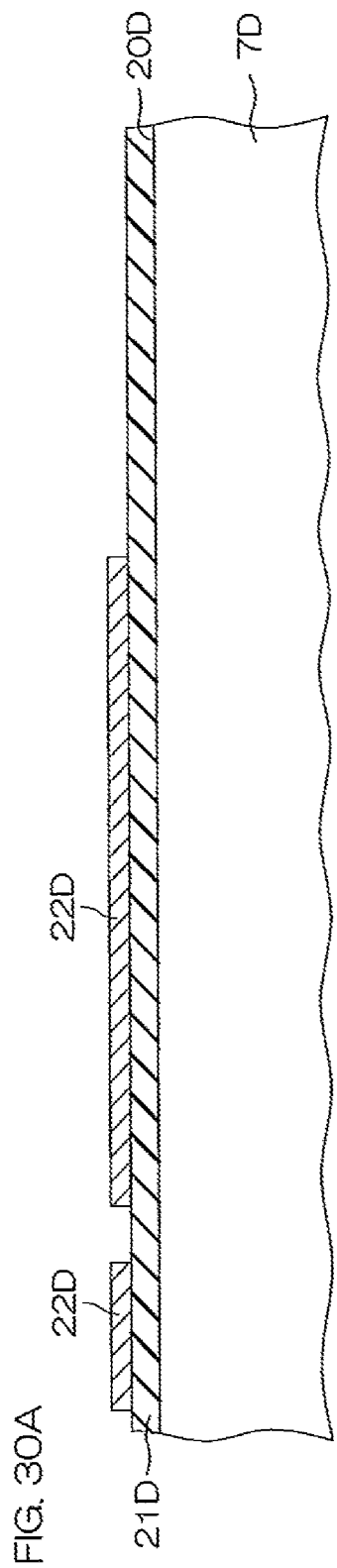

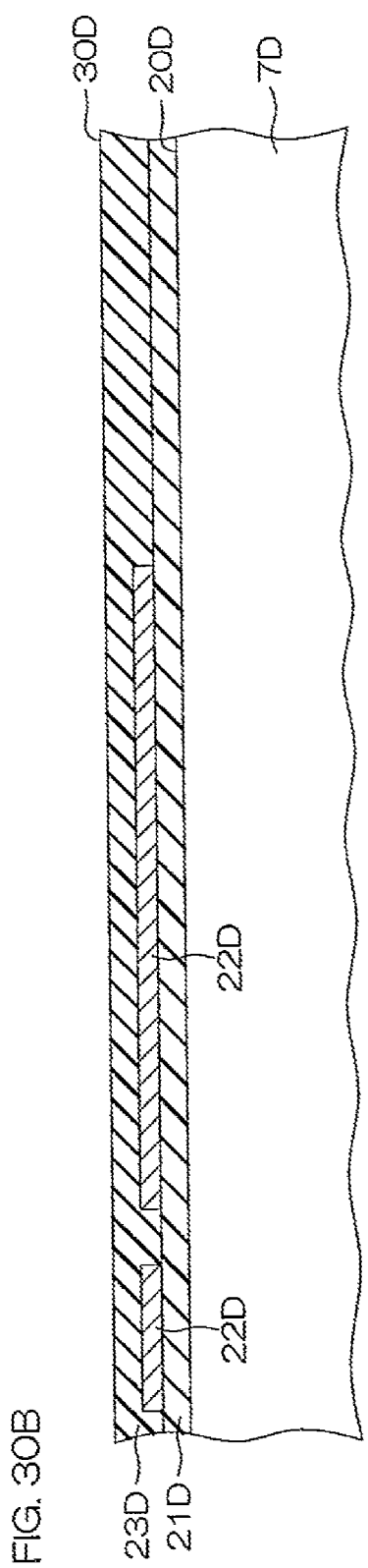

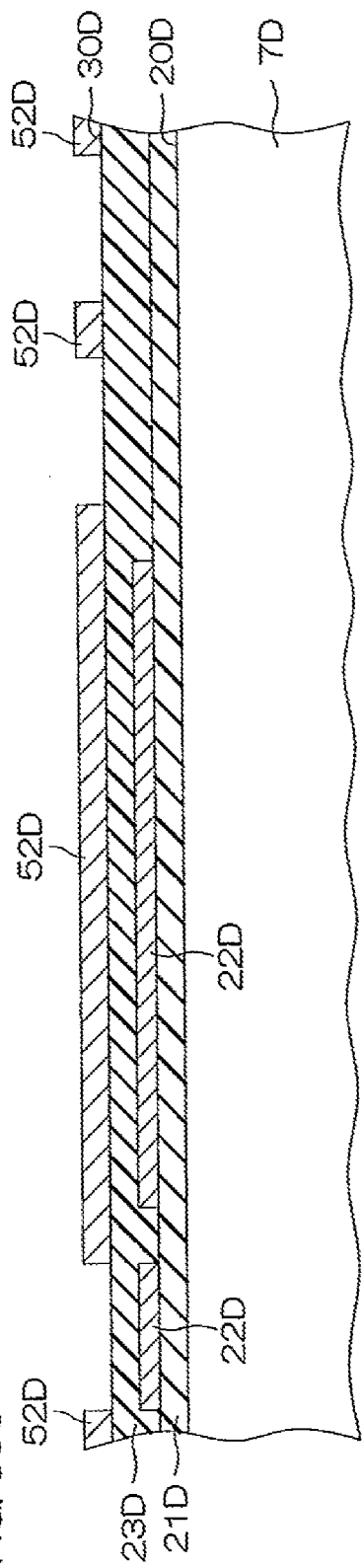

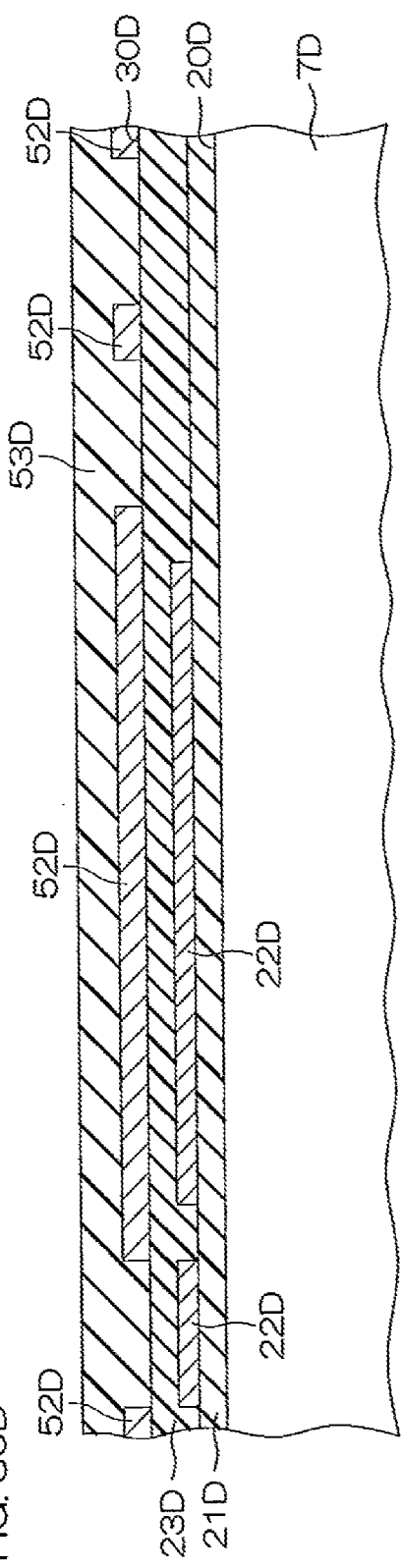

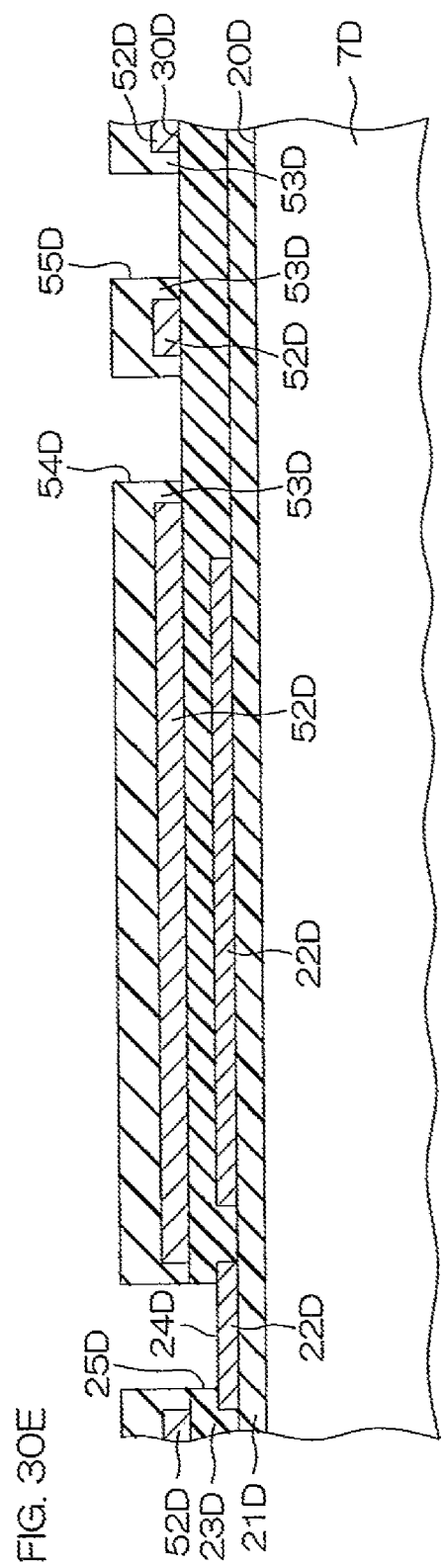

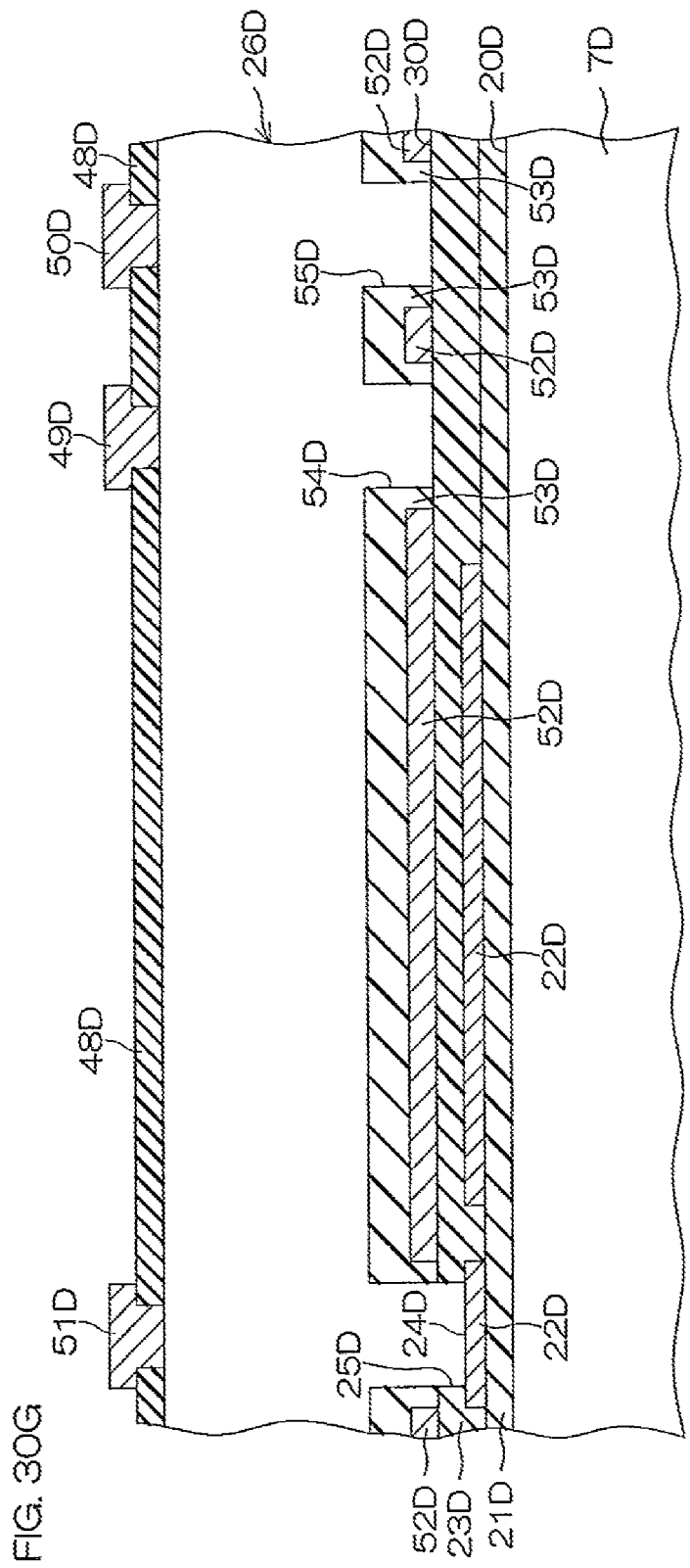

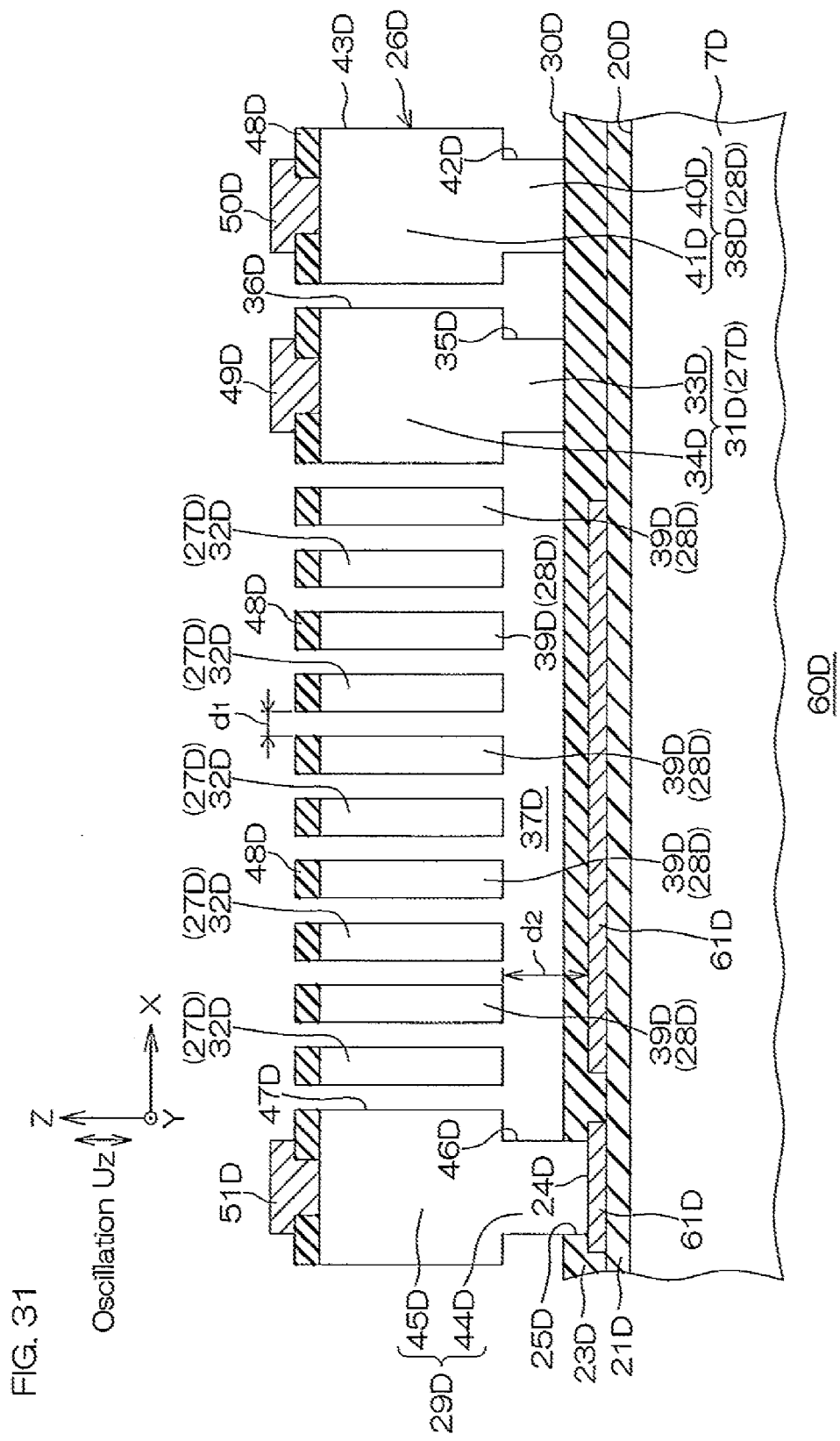

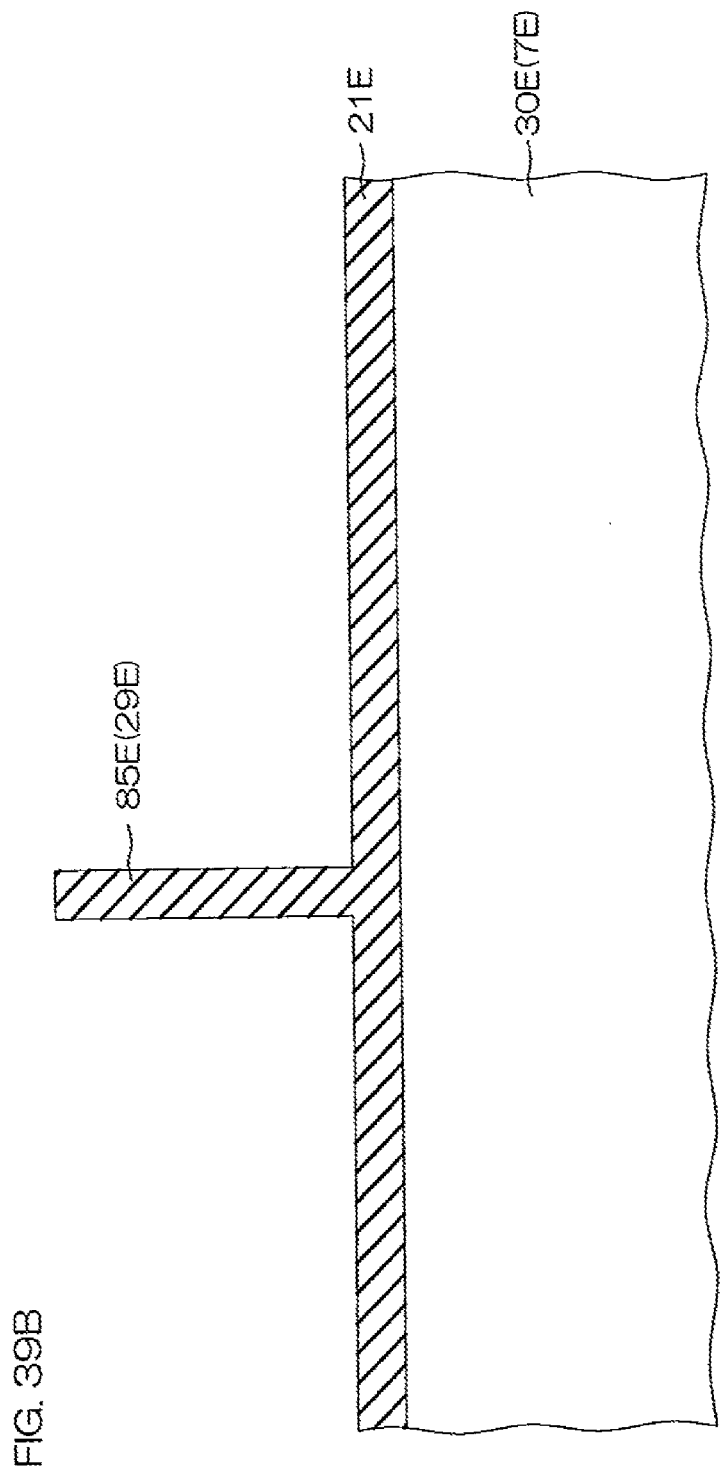

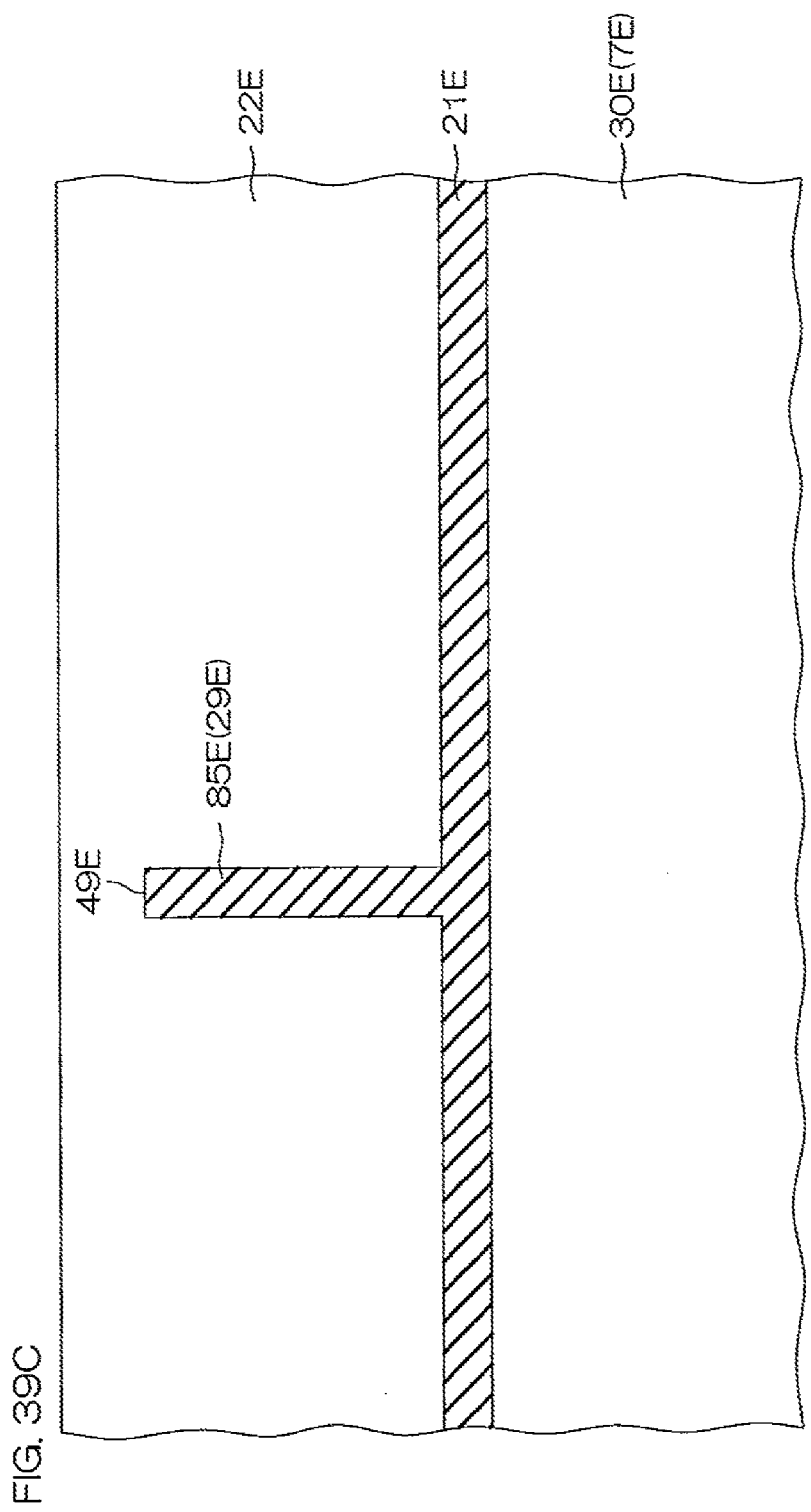

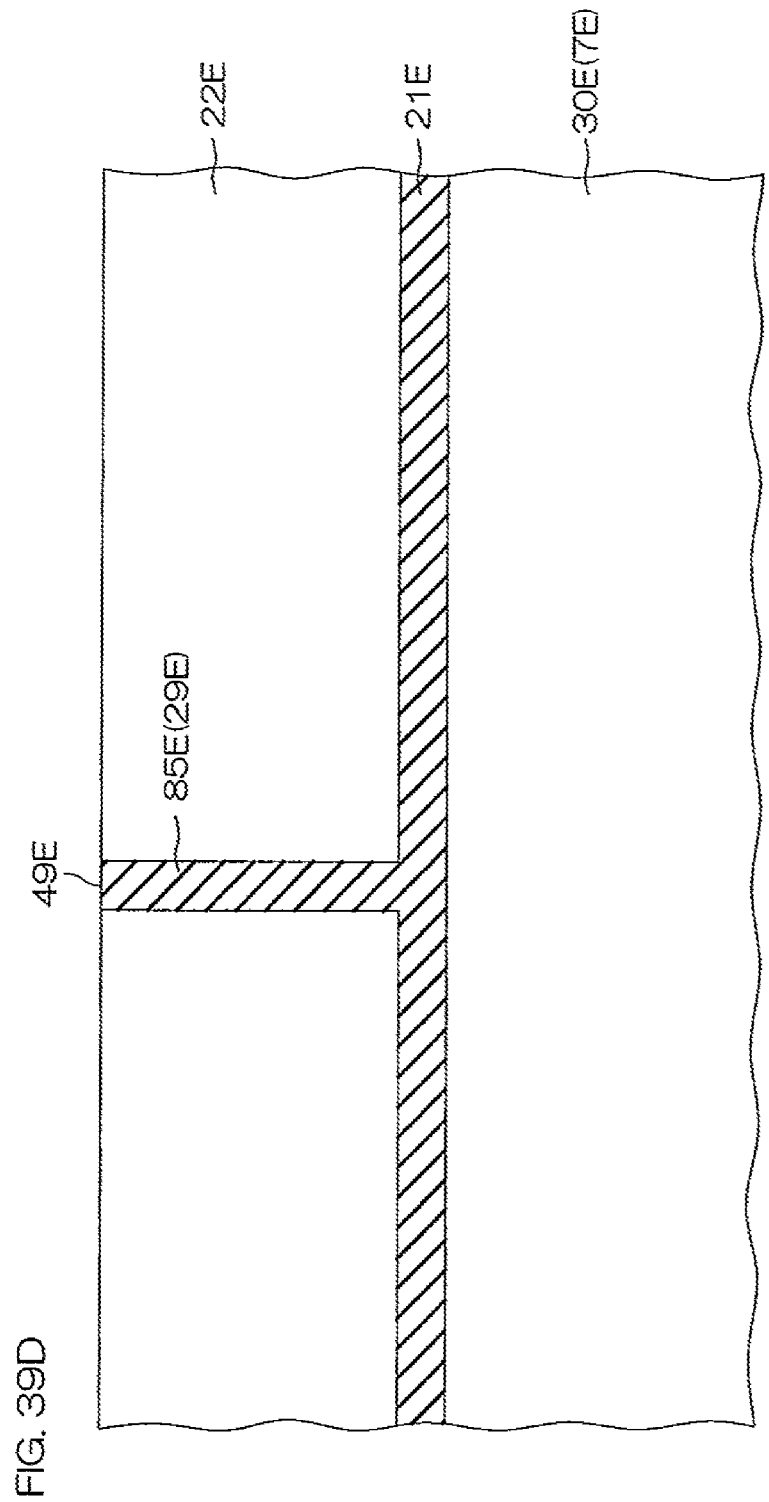

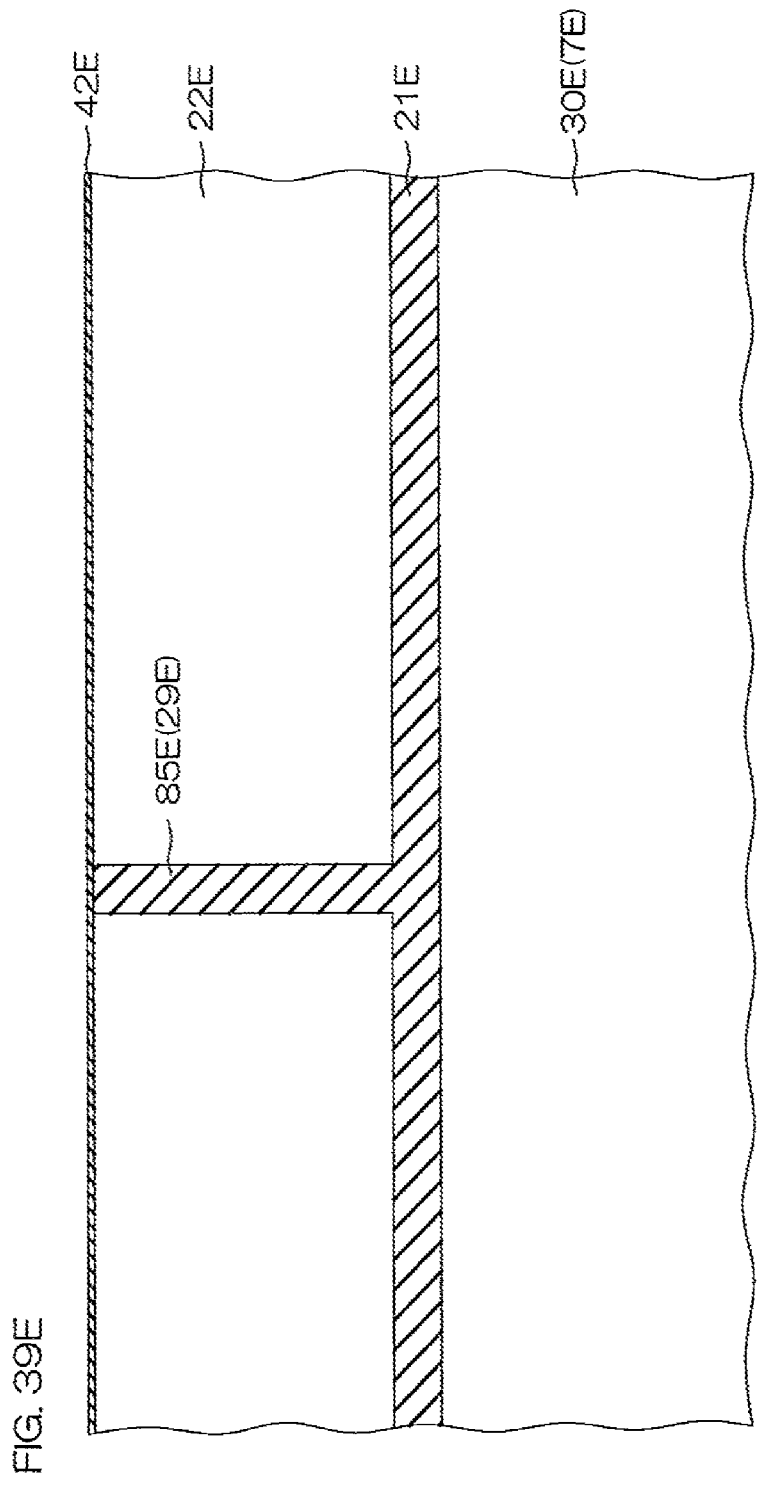

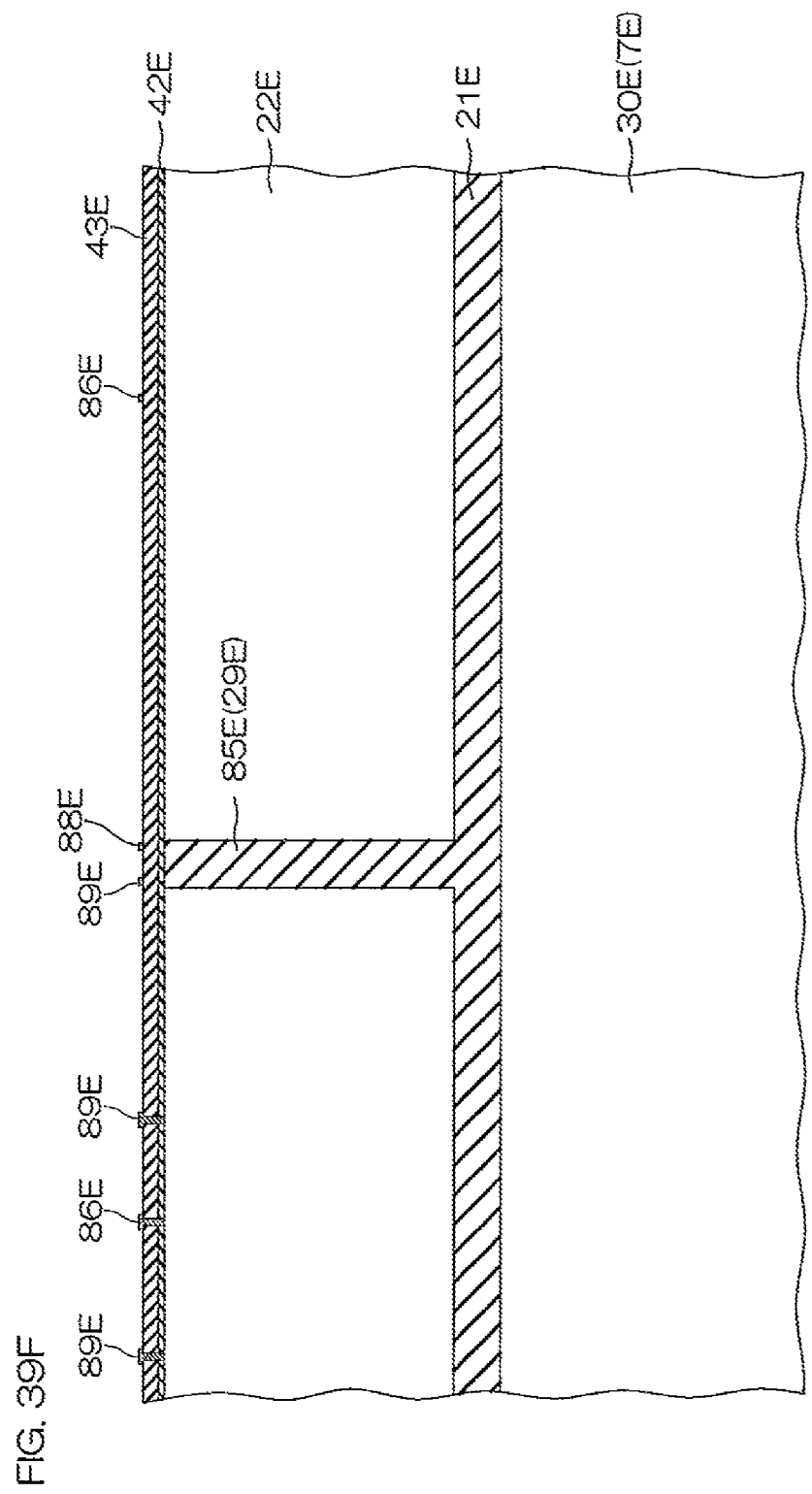

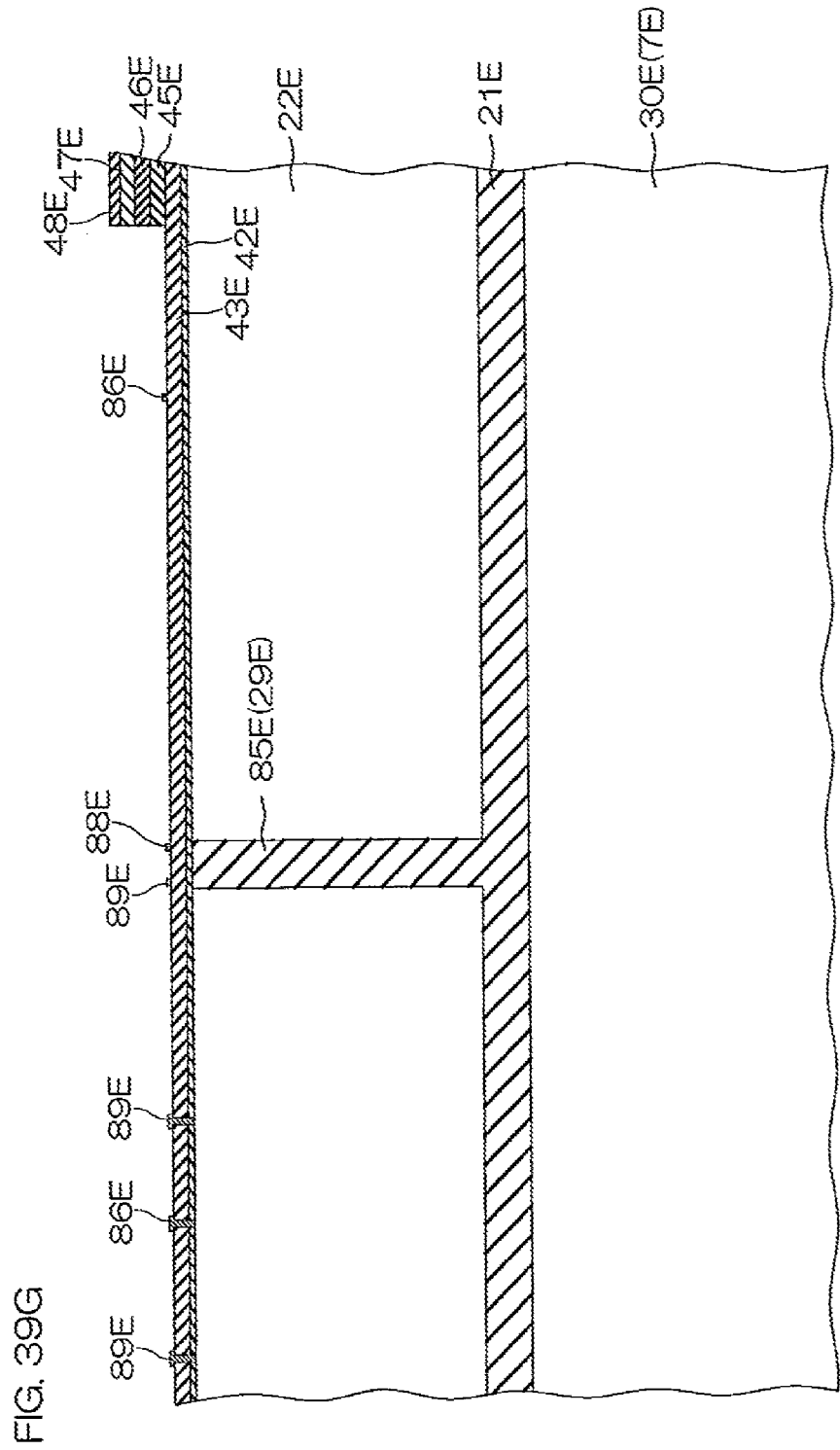

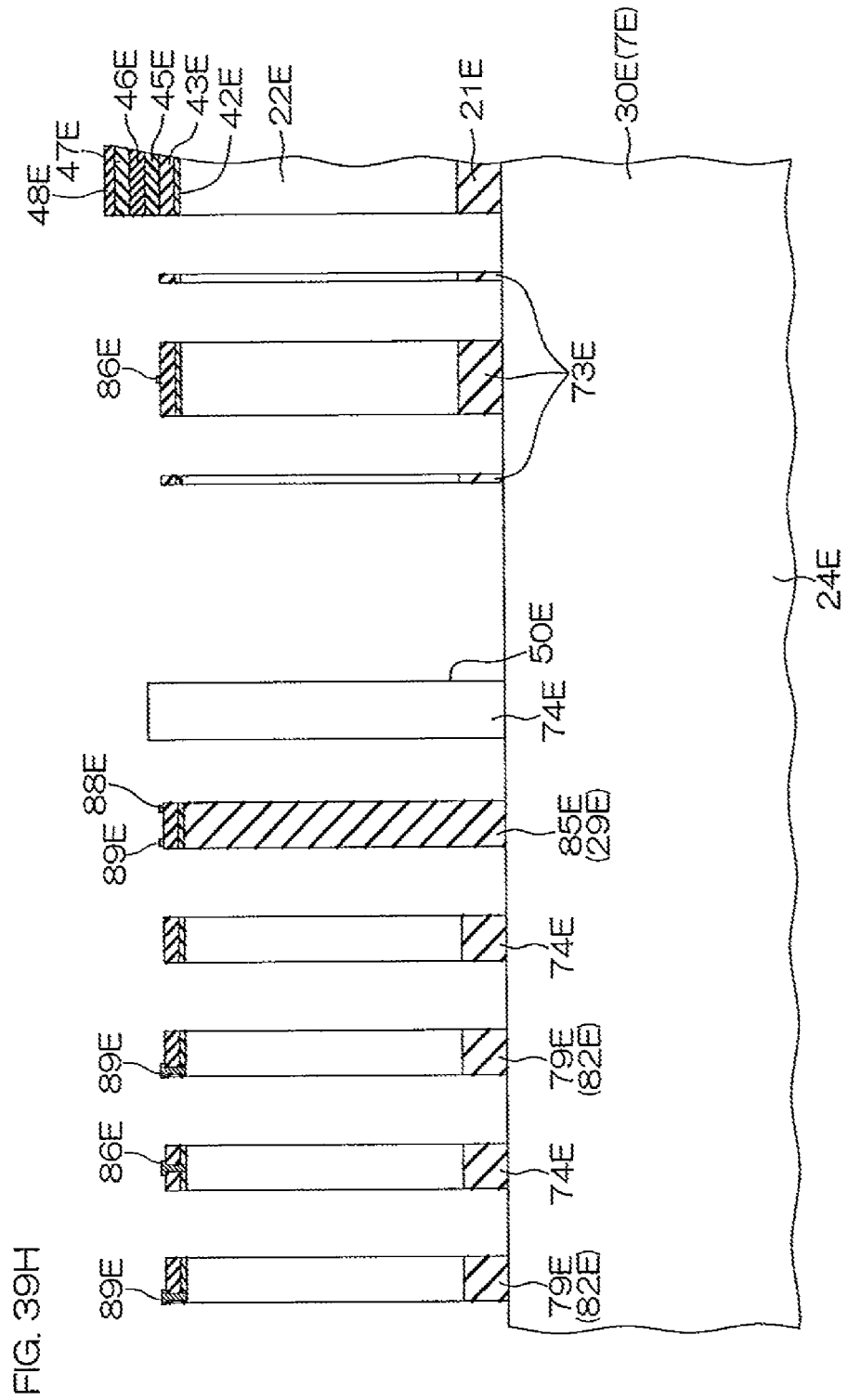

CAPACITANCE TYPE SENSOR

CROSS REFERENCE TO RELATED APPLICATION

This application is a divisional of application Ser. No. 13/274,292, filed on Oct. 14, 2011. Furthermore, this application claims the benefit of priority of Japanese applications 2010-212341 filed on Sep. 22, 2010, 2010-232910 filed on Oct. 15, 2010, 2010-271982 filed on Dec. 6, 2010, 2010-277213 filed on Dec. 13, 2010, and 2010-277214 filed on Dec. 13, 2010. The disclosures of these prior U.S. and Japanese applications are incorporated herein by reference.

BACKGROUND OF THE INVENTION

1. Field of the Invention

The present invention relates to a MEMS sensor and a method for manufacturing the same, and a MEMS package with the MEMS sensor.

2. Description of Related Arts

A MEMS (Micro Electro Mechanical Systems) sensor detects acceleration, an angular velocity, and a pressure, etc., applied to an object by using a "structure" that changes according to application of an external force.

As a detection method of a MEMS sensor, for example, a capacitance type that performs detection based on a change in capacitance of a capacitor is known. As detailed devices, capacitance type gyro sensors and capacitance type acceleration sensors, etc., are known.

SUMMARY OF THE INVENTION

A first object of the present invention is to provide a capacitance type gyro sensor that is downsized and has excellent detection sensitivity.

A second object of the present invention is to provide a capacitance type acceleration sensor that has a simple structure and excellent detection sensitivity.

A third object of the present invention is to provide a method for manufacturing a MEMS sensor in which a layer for protecting a fixed electrode and a movable electrode can be formed by a simple method at a low cost, and a MEMS sensor manufactured by this manufacturing method.

A fourth object of the present invention is to provide a highly reliable MEMS package that has a MEMS sensor including a protective layer for a fixed electrode and a movable electrode.

A fifth object of the present invention is to provide a MEMS sensor in which a lower electrode can be easily formed directly below an upper electrode via a cavity, the upper electrode and the lower electrode are prevented from being short-circuited by each other, and the detection accuracy of the sensor can be improved, and a method for manufacturing the same.

A sixth object of the present invention is to provide a MEMS package with a MEMS sensor having excellent detection accuracy.

A seventh object of the present invention is to provide a MEMS sensor in which the variation in size of a first electrode and a second electrode that have comb-tooth-like shapes and engage with each other can be reduced and the detection accuracy of the sensor can be improved, and a method for manufacturing the same.

The above-described or other objects, features, and effects of the present invention will be clarified by the following description of preferred embodiments with reference to the accompanying drawings.

BRIEF DESCRIPTION OF THE DRAWINGS

FIG. 4 is a sectional view of the principal portion of the X-axis sensor shown in FIG. 2, illustrating a section taken along the cutting plane A-A in FIG. 3.

FIG. 6 is a sectional view of the principal portion of the Z-axis sensor shown in FIG. 2, illustrating a section taken along the cutting plane B-B in FIG. 5.

FIG. 7A to FIG. 7G are sectional views showing parts of a manufacturing process of the gyro sensor according to the first preferred embodiment of the present invention in order of steps.

FIG. 15A to FIG. 15G are sectional views showing parts of a manufacturing process of the acceleration sensor according to the second preferred embodiment of the present invention in order of steps.

FIG. 31 is a plan view showing a mode in which the Z-axis sensor shown in FIG. 29 is used as an acceleration sensor.

DETAILED DESCRIPTION OF PREFERRED EMBODIMENTS

Figure 1:
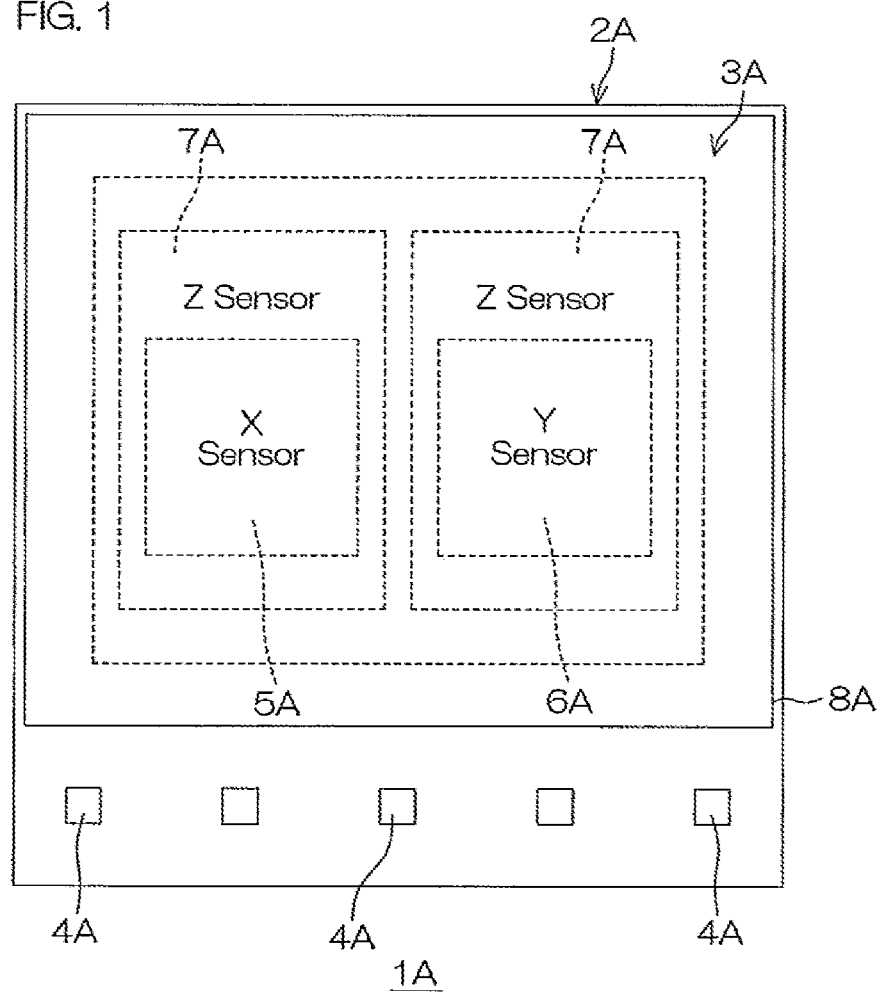
FIG. 1 is a schematic plan view of a gyro sensor according to a first preferred embodiment of the present invention.

A capacitance type gyro sensor according to an aspect of the present invention includes a semiconductor substrate having a cavity inside by forming an upper wall and a bottom wall, and having a surface portion forming the upper wall of the cavity and a back surface portion forming the bottom wall, a first electrode formed by processing the surface portion of the semiconductor substrate, and integrally having a first base portion and first comb tooth portions extending from the first base portion and aligned at intervals like comb teeth, and a second electrode formed by processing the surface portion of the semiconductor substrate, and integrally having a second base portion and second comb tooth portions extending from the second base portion toward the portions between the first comb tooth portions and aligned like comb teeth to engage with the first comb tooth portions at an interval, and drives the first electrode or the second electrode up and down with respect to the other electrode and detects an angular velocity applied at the time of this driving by detecting a change in capacitance between the first comb tooth portion and the second comb tooth portion, wherein the first electrode includes first drive portions extending from opposed portions opposed to the second comb tooth portions of the first base portion toward the second comb tooth portions, and electrically insulated from other portions of the first base portion, and the second electrode includes second drive portions formed on the tip end portions of the second comb tooth portions opposed to the first drive portions so as to be electrically insulated from other portions of the second comb tooth portions, and the first drive portions and the second drive portions engage with each other at an interval like comb teeth.

In the capacitance type gyro sensor according to an aspect of the present invention, the first electrode integrally includes a first base portion and a comb-tooth-like electrode (an assembly of a plurality of first comb tooth portions) supported on this first base portion. The first comb tooth portions engage with the comb-tooth-like second electrode (assembly of the plurality of second comb tooth portions) at an interval. Accordingly, the first comb tooth portions and the second comb tooth portions constitute electrodes of a capacitor (detector) when a fixed voltage is applied between the first comb tooth portions and the second comb tooth portions and which changes in capacitance due to a change in interval between these and/or a change in opposing area.

On the other hand, on the first base portion of the first electrode, first drive portions extending toward the second comb tooth portions disposed between the first comb tooth portions adjacent to each other are provided. Second drive portions are provided on tip end portions of the second comb tooth portions facing the first drive portions, and the first drive portions and the second drive portions engage with each other like comb teeth. Accordingly, the first drive portions and the second drive portions drive either the first electrode or the second electrode by coulomb forces generated by changes in drive voltages when the drive voltages are applied between these electrodes.

In this capacitance type gyro sensor, the first comb tooth portions and the second comb tooth portions for detecting an angular velocity and the first drive portions and the second drive portions for driving the first electrode and the second electrode are all formed by processing the surface portion of the semiconductor substrate. Therefore, the thickness of the whole sensor is substantially the thickness of the substrate, so that the sensor can be downsized.

Next, as an example of angular velocity detection by using this capacitance type gyro sensor, assuming a three-dimensional orthogonal XYZ coordinate system indicating the thickness direction of the semiconductor substrate in the Z-axis direction, detection of an angular velocity applied around the X-axis when the first electrode is driven in the Z-axis direction will be described.

First, between the first drive portions and the second drive portions that engage with each other like comb teeth, drive voltages with the same polarity and drive voltages with different polarities are alternately applied. Accordingly, between the first drive portions and the second drive portions, coulomb repulsive and attractive forces are alternately generated. As a result, the first comb tooth portions integrated with the first drive portions oscillate (are driven) up and down (along the thickness direction of the semiconductor substrate) along the Z-axis direction like a pendulum around the second comb tooth portions as a center of oscillation. At this time, the first drive portions and the second drive portions as drive electrodes for driving the first electrode are disposed to engage with each other like comb teeth, so that the opposing area between these can be made larger than in the case where one drive electrode and the other drive electrode are just opposed to each other or just adjacent to each other. Therefore, the first electrode can be oscillated with a large amplitude, so that the detection sensitivity can be improved.

Then, in this state, when an angular velocity to rotate the first electrode around the X axis as a central axis is applied to the first electrode being oscillated, a coriolis force is generated to the first electrode in the Y-axis direction. This coriolis force changes the distance between the first comb tooth portions (first electrode) and the second comb tooth portions (second electrode) (electrode-to-electrode distance) and/or the opposing area. Then, by detecting a change in capacitance between the movable electrode and the fixed electrode caused by this change in electrode-to-electrode distance and/or opposing area, the angular velocity around the X-axis can be detected.

The capacitance type gyro sensor according to the present invention may further include first insulating layers that are embedded in the first base portion so as to surround the opposed portions and insulate and separate the opposed portions from other portions of the first base portion. The capacitance type gyro sensor according to the present invention may further include second insulating layers that are embedded in the base end portion sides relative to the tip end portions of the second comb tooth portions and insulate and separate the tip end portions from other portions of the second comb tooth portions.

When the first insulating layers and/or the second insulating layers are embedded in the semiconductor substrate, the surface of the semiconductor substrate can be efficiently used as a space for leading wirings to be connected to the first electrode and the second electrode.

In the capacitance type gyro sensor according to the present invention, the semiconductor substrate may be a conductive silicon substrate.

When the semiconductor substrate is a conductive silicon substrate, without applying a special treatment for giving conductivity to the first electrode and the second electrode molded to have predetermined shapes, the molded structures can be used as they are as electrodes. Portions except for the portions to be used as electrodes can be used as wirings.

A capacitance type gyro sensor according to another aspect of the present invention includes a semiconductor substrate having a cavity inside by forming an upper wall and a bottom wall, and having a surface portion forming the upper wall of the cavity and a back surface portion forming the bottom wall, a first electrode formed by processing the surface portion of the semiconductor substrate, and integrally having a first base portion and first comb tooth portions extending from the first base portion and aligned at intervals like comb teeth, a second electrode formed by processing the surface portion of the semiconductor substrate, and integrally having a second base portion and second comb tooth portions extending from the second base portion toward the portions between the first comb tooth portions and aligned like comb teeth to engage with the first comb tooth portions at an interval, a first contact wiring that is formed on the surface portion of the semiconductor substrate and comes into direct contact with the first electrode from the surface side, and a second contact wiring that is formed on the surface portion of the semiconductor substrate, and comes into direct contact with the second electrode from the surface side, wherein the first electrode includes first drive portions extending from opposed portions opposed to the second comb tooth portions of the first base portion toward the second comb tooth portions, and the second electrode includes second drive portions formed on the tip end portions of the second comb tooth portions opposed to the first drive portions so as to be electrically insulated from other portions of the second comb tooth portions, and the first drive portions and the second drive portions engage with each other at an interval like comb teeth.

In the capacitance type gyro sensor according to another aspect of the present invention, the first drive portions may be electrically insulated from other portions of the first base portion, and in this case, the capacitance type gyro sensor may further include first insulating layers that are embedded in the first base portion so as to surround the opposed portions and insulate and separate the opposed portions from other portions of the first base portion.

The capacitance type gyro sensor according to another aspect of the present invention may further include second insulating layers that are embedded in the base end portion sides relative to the tip end portions of the second comb tooth portions and insulate and separate the tip end portions from other portions of the second comb tooth portions.

In the capacitance type gyro sensor according to another aspect of the present invention, the first contact wiring may include first detection wiring that comes into contact with the first comb tooth portions, the second contact wiring may include second detection wiring that comes into contact with the base end portion sides relative to the second insulating layers of the second comb tooth portions, and the first electrode or the second electrode is driven relative to the other electrode, and an angular velocity applied at the time of this driving may be detected by detecting a change in capacitance between the first comb tooth portions and the second comb tooth portions.

In this case, by the first detection wiring and the second detection wiring, an electric signal corresponding to a change in capacitance caused by the distance between the first comb tooth portions (first electrode) and the second comb tooth portions (second electrode) (electrode-to-electrode distance) and/or the opposing area can be detected.

A capacitance type acceleration sensor according to an aspect of the present invention includes a semiconductor substrate having a cavity inside by forming an upper wall and a bottom wall, and having a surface portion forming the upper wall of the cavity and a back surface portion forming the bottom wall, and a first electrode and a second electrode that are formed by processing the surface portion of the semiconductor substrate and have comb-tooth-like shapes to engage with each other at an interval, and detects acceleration when the first electrode or the second electrode moves up and down with respect to the other electrode by detecting a change in capacitance between the first electrode and the second electrode, wherein the first electrode includes dielectric layers that have a predetermined thickness from the surface or the back surface to a halfway point of the first electrode along the thickness direction orthogonal to the opposing direction of the second electrode and has a predetermined width along the opposing direction, and conductive layers consisting of remaining portions except for the dielectric layers.

With the present arrangement, the capacitor for detecting acceleration is formed by making the first electrode and the second electrode opposed to each other. The capacitor detects acceleration based on a change in capacitance caused by oscillation of the first electrode or the second electrode.

In this capacitor, the first electrode is partially formed of dielectric layers having a predetermined thickness along the thickness direction orthogonal to an opposing direction of the first electrode and the second electrode and a predetermined width along the opposing direction.

Accordingly, in this capacitor, at a portion in which the dielectric layer and the second electrode are opposed to each other, the electrode-to-electrode distance $d1$ of the capacitor is increased by the width $W$ of the dielectric layer as compared with the electrode-to-electrode distance $d2$ (distance between the first electrode and the second electrode) that the capacitor originally has (that is, d1=d2+W). Therefore, a capacitance difference can be provided in one capacitor.

For example, a method for detecting acceleration when the first electrode is a movable electrode that oscillates along the Z-axis direction and dielectric layers are embedded from the surface to a halfway point of the movable electrode (first electrode) will be described.

When acceleration in the Z-axis direction is applied to the sensor, the comb-tooth-like first electrode (movable electrode) oscillates up and down like a pendulum as a center of oscillation along the Z-axis direction with respect to the second electrode similarly around the comb-tooth-like second electrode (fixed electrode).

At this time, when the first electrode oscillates first to the side (upper side) away from the cavity with respect to the second electrode, the capacitance of the capacitor decreases at a decrease rate D1 (D1≥0) based on the electrode-to-electrode distance d1 while the dielectric layers are opposed to the second electrode. Thereafter, when the dielectric layers completely protrude above the second electrode and only the conductive layers are opposed to the second electrode, the capacitance decreases from this timing at a decrease rate D2 (D2≥0) based on the original electrode-to-electrode distance d2. This decrease rate D2 of the capacitance is higher than the decrease rate D1 because the electrode-to-electrode distance d2 is smaller than the electrode-to-electrode distance d1 and the capacitance to decrease per unit time increases. Specifically, when the first electrode starts to oscillate to the upper side, the capacitance of the capacitor decreases at the first decrease rate D1 and then decreases at the second decrease rate D2 higher than the first decrease rate D1.

On the other hand, when the first electrode oscillates first to the side (the lower side) to approach the cavity with respect to the second electrode, until portions of the dielectric layers start to protrude to the side below the second electrode, the capacitance of the capacitor decreases at the decrease rate D2 based on the electrode-to-electrode distance d2. Thereafter, when portions of the dielectric layers start to protrude below the second electrode, the capacitance decreases from this timing at the decrease rate D1 based on the electrode-to-electrode distance d1. This decrease rate D1 of the capacitance is smaller than the decrease rate D2 because the electrode-to-electrode distance d1 is larger than the electrode-to-electrode distance d2 and the capacitance to decrease per unit time becomes smaller. Specifically, when the first electrode starts to oscillate to the lower side, the capacitance of the capacitor decreases at the second decrease rate D2 and then decreases at the first decrease rate D1 smaller than the second decrease rate D2.

Therefore, by detecting whether the capacitance of the capacitor decreases at the relatively small decrease rate D1 and then decreases at the relatively large decrease rate D2 (D1->D2) or decreases at the relatively large decrease rate D2 and then decreases at the relatively small decrease rate D1 (D2->D1), the direction in which the first electrode oscillated first (the direction away from the cavity or the direction approaching the cavity) can be easily grasped. As a result, the direction of the acceleration vector can be accurately detected, so that the detection sensitivity can be improved.

In addition, this improvement in detection sensitivity is obtained by embedding the dielectric layers in the first electrode constituting the capacitor, so that the sensor structure can be prevented from becoming complicated.

In the capacitance type acceleration sensor according to an aspect of the present invention, it is preferable that the dielectric layers are one-sided to one end side in the width direction of the first electrode, and the conductive layer includes a first portion formed adjacently on the other end side in the width direction to the dielectric layer, and a second portion formed below the dielectric layer and having a width larger than that of the first portion.

With the present arrangement, the conductive layers are formed across the entire region in the thickness direction from the surface to the back surface of the first electrode.

Therefore, for example, when the first electrode is a movable electrode that oscillates along the Z-axis direction as described above, regardless of the direction of oscillation (upward or downward) of the first electrode with respect to the second electrode, the opposing area of the conductive layer of the first electrode and the second electrode decreases by necessity. In detail, when the first electrode oscillates to the upper side first, the opposing area of the first portion of the conductive layer and the second electrode decreases, and on the other hand, when the first electrode oscillates to the lower side first, the opposing area of the second portion of the conductive layer and the second electrode decreases. Specifically, this arrangement shows the case of D1>0 and D2>0 in the above-described detection method.

Accordingly, a change in capacitance can be detected immediately after the first electrode starts to oscillate, so that the magnitude of the acceleration vector immediately after the start of oscillation can also be detected.

In the capacitance type acceleration sensor according to an aspect of the present invention, it is preferable that the dielectric layers are formed from one end to the other end in the width direction of the first electrode and have the same width as that of the first electrode, and the first electrode has a lamination structure including the dielectric layers and the conductive layers formed below the dielectric layers.

With the present arrangement, the portion from the surface or the back surface to a halfway point of the first electrode is entirely formed of the dielectric layer. In this case, in the portion in which the dielectric layer and the second electrode are opposed to each other, the conductive layer opposed to the second electrode does not exist, so that the capacitance becomes 0 (zero).

Therefore, for example, in the case where the first electrode is a movable electrode that oscillates along the Z-axis direction as described above, when the first electrode oscillates to the upper side first, the capacitance of the capacitor does not change (that is, D1=0) while the dielectric layers are opposed to the second electrode. Thereafter, when the dielectric layers completely protrude above the second electrode and only the conductive layers are opposed to the second electrode, the capacitance decreases from this timing at the decrease rate D2 (D2>0) based on the original electrode-to-electrode distance d2.

On the other hand, when the first electrode oscillates to the lower side first, the capacitance of the capacitor decreases at the decrease rate D2 (D>0) based on the electrode-to-electrode distance d2 until the dielectric layers start to protrude below the second electrode. Thereafter, when the dielectric layers start to protrude below the second electrode, the capacitance from this timing does not change (that is, D1=0).

Therefore, with this arrangement, the direction of the acceleration vector can be judged based on whether the decrease rate of the capacitance is 0 or not, that is, based on whether or not the capacitance changes. Therefore, acceleration can be easily detected.

It is also possible that the first electrode is a movable electrode and the second electrode is a fixed electrode. Alternatively, it is also possible that the first electrode is a fixed electrode and the second electrode is a movable electrode.

In the capacitance type acceleration sensor according to an aspect of the present invention, the semiconductor substrate is preferably a conductive silicon substrate.

When the semiconductor substrate is a conductive silicon substrate, even without applying a special treatment for giving conductivity to the first electrode and the second electrode molded to have predetermined shapes, the molded structures can be used as they are as electrodes. The portions except for the portions to be used as electrodes can be used as wirings.

A method for manufacturing a MEMS sensor according to an aspect of the present invention includes the steps of forming a recess dug to a halfway point in the thickness direction of a semiconductor substrate by selectively etching the surface layer portion of a sensor region of the semiconductor substrate having the sensor region and a peripheral region surrounding the sensor region, and concurrently, forming comb-tooth-like fixed electrode and movable electrode that engage with each other via the recess, forming a sacrifice layer that covers the sensor region and exposes the peripheral region, forming a protective layer made of a first inorganic material on the semiconductor substrate so that the peripheral edge portion of the protective layer is bonded to the peripheral region and the central portion surrounded by the peripheral edge portion covers the sacrifice layer, forming a space between the protective layer and the sensor region by removing the sacrifice layer directly below the protective layer, and forming a cavity by linking the lower portions of the fixed electrode and the movable electrode to each other by isotropic etching by supplying an etching medium into the recess after removing the sacrifice layer.

According to this method, by forming a layer made of a first inorganic material on the semiconductor substrate in which the fixed electrode and the movable electrode are formed, even without using a bonding material such as glass frit, the layer for protecting the fixed electrode and the movable electrode can be formed. Therefore, the cost required to form the protective layer can be reduced.

Concerning workability of formation of the protective layer, the operation can be made simpler than in the case where a lid substrate is bonded by using a bonding material.

In detail, according to this method, a sacrifice layer is formed to cover the sensor region in which the fixed electrode and the movable electrode are formed, a protective layer is formed to cover the sacrifice layer, and then, the sacrifice layer directly below the protective layer is removed. Accordingly, a space is formed in the portion in which the sacrifice layer existed, and a protective layer covering the fixed electrode and the movable electrode is formed on the sensor region via the space. Therefore, without performing an operation such as position alignment of wafers, the protective layer can be easily formed by combining known semiconductor device manufacturing techniques (for example, a CVD (Chemical Vapor Deposition) method, sputtering, and photolithography, etc.). In addition, when forming the sacrifice layer for forming the space between the sensor region and the protective layer, no cavity is formed directly below the fixed electrode and the movable electrode, and the lower portions of these electrodes are fixed integrally to the semiconductor substrate. Therefore, even if the sacrifice layer comes into contact with the fixed electrode and the movable electrode, the electrodes do not oscillate due to the impact of this contact. Therefore, it is not necessary to add a step for protecting the electrodes from the sacrifice layer, etc., so that the process can be prevented from becoming complicated.

In the method for manufacturing a MEMS sensor according to an aspect of the present invention, the step of forming the sacrifice layer preferably includes a step of forming a first sacrifice layer made of a second inorganic material different from the material of the protective layer so as to close the opening end of the recess formed in the sensor region, and after forming the first sacrifice layer, a step of forming a second sacrifice layer made of a metal material on the first sacrifice layer so as to cover the sensor region.

According to this method, the sensor region is covered by the second sacrifice layer, so that the space between the protective layer and the sensor region is formed by removing (etching) the second sacrifice layer. Specifically, what (the second sacrifice layer) is to be removed by etching is made of the metal material, and what (the protective layer) is to be left even after etching is made of the first inorganic material. Accordingly, when forming the space, the etching selectivity of the protective layer to the sacrifice layer (the second sacrifice layer) can be increased. Therefore, even if the protective layer is exposed to an etching medium to be used for removing the second sacrifice layer for a long period of time, the etching medium is for etching metal materials, so that erosion of the protective layer made of the first inorganic material can be reduced. Therefore, the shape of the protective layer can be excellently maintained.

On the other hand, as a sacrifice layer that closes the opening end of the recess, when the second sacrifice layer made of a metal material is used, if the second sacrifice layer remains on the fixed electrode and/or the movable electrode, an operation failure of the sensor may occur by the second sacrifice layer. For example, if the second sacrifice layer remains across the fixed electrode and the movable electrode, a short-circuit occurs between the fixed electrode and the movable electrode via this second sacrifice layer.

Therefore, as a sacrifice layer that closes the opening end of the recess, the first sacrifice layer made of the second inorganic material is used. Accordingly, while etching selectivity of the protective layer to the first sacrifice layer is secured, the operation failure of the sensor can be prevented from occurring due to the sacrifice layer remaining.

The description that the protective layer has etching selectivity to the sacrifice layer means that, for example, the materials of these layers satisfy a ratio (etching selectivity) of the etching rate of the sacrifice layer with a certain etching medium to the etching rate of the protective layer with this etching medium=(etching rate of protective layer/etching rate of sacrifice layer)≠1.

The first sacrifice layer and the second sacrifice layer may be made of an inorganic material that can be etched with a fluorine-based gas and a metal material that can be etched with a chlorine-based gas, respectively.

In detail, when the protective layer is made of $SiO_2$, it is preferable that the first sacrifice layer is made of SiN, and the second sacrifice layer is made of Al.

The method for manufacturing a MEMS sensor according to an aspect of the present invention preferably further includes a step of forming a protective film having etching selectivity to the sacrifice layer so as to cover side walls of the fixed electrode and the movable electrode previous to formation of the sacrifice layer.

According to this method, the side walls of the fixed electrode and the movable electrode are covered by the protective film having etching selectivity to the sacrifice layer. Therefore, when removing the sacrifice layer by etching, even if the etching medium comes into contact with the side walls of the fixed electrode and the movable electrode, erosion (damage) of the fixed electrode and the movable electrode can be reduced. As a result, the variation in size of the fixed electrode and the movable electrode can be reduced.

The step of removing the sacrifice layer may include a step of supplying an etching medium capable of etching the sacrifice layer from a through hole by forming the through hole in the central portion of the protective layer.

A MEMS sensor according to an aspect of the present invention includes a semiconductor substrate having a sensor region and a peripheral region surrounding the sensor region and having a cavity formed directly below a surface layer portion of the sensor region, comb-tooth-like fixed electrode and movable electrode that are formed by processing the surface layer portion of the sensor region and engage with each other at an interval, and a protective layer that has a peripheral edge portion bonded to the peripheral region of the semiconductor substrate and a central portion surrounded by the peripheral edge portion and covering the fixed electrode and the movable electrode while being spaced from the sensor region and is made of a first inorganic material.

With the present arrangement, the fixed electrode and the movable electrode are covered by the central portion of the protective layer. Accordingly, dust, etc., can be prevented from entering the inside of the protective layer from the outside of the protective layer (the side opposite to the sensor region with respect to the protective layer). Therefore, the fixed electrode and the movable electrode can be excellently protected from dust, etc. As a result, operation failures of the sensor can be reduced.

In the MEMS sensor according to an aspect of the present invention, it is preferable that when the peripheral region includes a pad region in which electrode pads electrically connected to the fixed electrode and the movable electrode are formed, openings for exposing the electrode pads are formed in the peripheral edge portion of the protective layer.

In the central portion of the protective layer, a through hole that makes communication between the inside and the outside of the protective layer may be formed.

The MEMS sensor according to an aspect of the present invention may further include first insulating layers that are selectively embedded in the fixed electrode and insulate and separate certain portions of the fixed electrode from other portions of the fixed electrode. Further, the MEMS sensor according to an aspect of the present invention may further include second insulating layers that are selectively embedded in the movable electrode and insulate and separate certain portions of the movable electrode from other portions of the movable electrode.

The protective layer may be made of $SiO_2$ or SiN.

In the MEMS sensor according to an aspect of the present invention, the semiconductor substrate is preferably a conductive silicon substrate.

When the semiconductor substrate is a conductive silicon substrate, even without applying a special treatment for giving conductivity to the fixed electrode and movable electrode molded to have predetermined shapes, the molded structures can be used as they are as electrodes. Portions except for the portions to be used as electrodes can be used as wirings.

The MEMS sensor according to an aspect of the present invention may include an acceleration sensor that detects acceleration applied to the MEMS sensor by detecting a change in capacitance between the fixed electrode and the movable electrode.

The MEMS sensor according to an aspect of the present invention may include an angular velocity sensor that drives the movable electrode in directions approaching and away from the cavity and detects an angular velocity applied to the MEMS sensor at the time of this driving by detecting a change in capacitance between the movable electrode and the fixed electrode.

A MEMS package according to an aspect of the present invention includes the MEMS sensor and a resin package formed to cover the MEMS sensor.

With the present arrangement, the MEMS sensor according to an aspect of the present invention is used. Therefore, in the MEMS sensor, dust, etc., can be prevented from entering the inside of the protective layer from the outside, so that operation failures of the sensor can be reduced. As a result, a MEMS package with a highly reliable MEMS sensor can be provided.

The MEMS package according to an aspect of the present invention may further include an integrated circuit that is electrically connected to the MEMS sensor and covered together with the MEMS sensor by the same resin package. When the MEMS package according to an aspect of the present invention further includes a substrate that has a surface and a back surface and supports the MEMS sensor by the surface, the resin package may seal the MEMS sensor so as to cover the surface of the substrate and expose the back surface of the substrate.

A method for manufacturing a MEMS sensor according to another aspect of the present invention includes the steps of selectively forming a lower electrode on a semiconductor substrate, laminating an electrode coating film made of a material having etching selectivity to polysilicon on the semiconductor substrate so as to coat the lower electrode, selectively forming a sacrifice polysilicon layer on the electrode coating film, laminating a sacrifice oxide film on the electrode coating film so as to coat the sacrifice polysilicon layer, forming an electrode polysilicon layer on the sacrifice oxide film, forming an upper electrode by selectively etching the electrode polysilicon layer, forming a protective film having etching selectivity to polysilicon so as to cover side walls of the upper electrode, exposing the sacrifice polysilicon layer by removing portions of the sacrifice oxide film, and forming a cavity directly below the upper electrode by removing the exposed sacrifice polysilicon layer.

According to this method, after a lower electrode is formed on a semiconductor substrate, an upper electrode is formed on the semiconductor substrate by using an electrode polysilicon layer. Therefore, before the upper electrode is formed, the lower electrode can be easily formed directly below the upper electrode. Further, a sacrifice polysilicon layer is formed between the lower electrode and the electrode polysilicon layer, and after the upper electrode is formed, the sacrifice polysilicon layer is removed. Therefore, a cavity can be easily formed between the upper electrode and the lower electrode. Accordingly, a MEMS sensor including a capacitor consisting of an upper electrode and a lower electrode opposed vertically to each other via a cavity can be manufactured.

This MEMS sensor includes, for example, a semiconductor substrate, a lower electrode selectively formed on the semiconductor substrate, an electrode coating film made of an insulating material and formed on the semiconductor substrate so as to coat the lower electrode, and a polysilicon layer having an upper electrode formed at an interval above the electrode coating film and opposed to the lower electrode via the electrode coating film.

With the present arrangement, the lower electrode is formed along the surface of the semiconductor substrate. Therefore, by adjusting the area of the lower electrode, the capacitance of the capacitor consisting of the upper electrode and the lower electrode can be controlled to the optimum capacitance for sensor operations.

In addition, even after the cavity is formed by removing the sacrifice polysilicon layer, the lower electrode is covered by the electrode coating film. Therefore, even if the upper electrode approaches the lower electrode, the upper electrode and the lower electrode can be prevented from coming into contact with each other. As a result, the upper electrode and the lower electrode can be prevented from being short-circuited by each other. Therefore, operation failures of the sensor can be reduced.

As a result, with the MEMS sensor according to another aspect of the present invention, the detection accuracy of the sensor can be improved.

In the method for manufacturing a MEMS sensor according to another aspect of the present invention, the step of forming the upper electrode preferably includes a step of molding the electrode polysilicon layer into comb-tooth-like fixed electrode and movable electrode that engage with each other at an interval.

By this method, the MEMS sensor according to another aspect of the present invention in which the upper electrode includes comb-tooth-like fixed electrode and movable electrode that engage with each other at an interval can be manufactured.

In this MEMS sensor, the capacitor consisting of the fixed electrode and the movable electrode can be used for sensor operations. Accordingly, the capacitor relating to the detection operations of the sensor can be increased, so that the detection accuracy of the sensor can be further improved.

The method for manufacturing a MEMS sensor according to another aspect of the present invention preferably further includes a step of removing the protective film from the side walls of the fixed electrode and the movable electrode after removing the sacrifice polysilicon layer.

In the manufactured MEMS sensor, if the protective film remains on the side walls of the fixed electrode and the movable electrode, the fixed electrode and the movable electrode are easily electrically charged as compared with a case where no protective film remains. Therefore, for example, when a voltage X (V) is applied between the fixed electrode and the movable electrode, the sensor may erroneously recognize a potential difference between the fixed electrode and the movable electrode caused by electric charging as a voltage applied between the fixed electrode and the movable electrode, that is, a so-called memory effect may occur. As a result, a voltage smaller than the voltage X (V) may be applied between the fixed electrode and the movable electrode and the designed detection performance may not be realized.

Therefore, in the MEMS sensor manufactured by this method, the side walls of the fixed electrode and the movable electrode are exposed. Therefore, occurrence of the above-described memory effect can be reduced. As a result, a necessary and sufficient voltage can be applied between the fixed electrode and the movable electrode, and the designed detection performance can be reliably realized.

Preferably, the method for manufacturing a MEMS sensor according to another aspect of the present invention further includes a step of forming an opening that penetrates through the electrode coating film and selectively exposes the lower electrode previous to formation of the electrode polysilicon layer, and the step of forming the electrode polysilicon layer includes a step of forming the electrode polysilicon layer on the sacrifice oxide film and concurrently, making a portion of the electrode polysilicon layer enter the opening of the electrode coating film and come into contact with the lower electrode, and the step of forming the upper electrode includes a step of forming a contact electrode that is separated from the upper electrode and in contact with the lower electrode.

By this method, the MEMS sensor according to another aspect of the present invention in which the polysilicon layer further includes a contact electrode that penetrates through the electrode coating film and is in contact with the lower electrode can be manufactured.

In this MEMS sensor, by using a portion of the electrode polysilicon layer forming the upper electrode, a contact electrode is formed in the same layer as that of the upper electrode. Therefore, the contacts with the upper electrode and the lower electrode can be collectively formed in the same layer (polysilicon layer).

As a result, for example, when a wiring is formed on the contact electrode, the contact wiring for the upper electrode can be formed in the same step. As a result, the number of manufacturing steps can be reduced and the cost can be reduced.

By this manufacturing method, the MEMS sensor according to another aspect of the present invention further including a wiring on the contact electrode can be manufactured.

The step of forming a wiring on the contact electrode may include a step of forming a wiring on the upper electrode as well, concurrently.

The MEMS sensor according to another aspect of the present invention may include an acceleration sensor that detects acceleration applied to the MEMS sensor by detecting a change in capacitance between the lower electrode and the movable electrode.

With the present arrangement, acceleration can be detected by a plurality of capacitors including a capacitor consisting of the lower electrode and the movable electrode and a capacitor consisting of the fixed electrode and the movable electrode. Therefore, the acceleration applied to the sensor can be accurately detected.

The MEMS sensor according to another aspect of the present invention may include an angular velocity sensor that drives the movable electrode in directions approaching and away from the lower electrode, and detects an angular velocity applied to the MEMS sensor at the time of this driving by detecting a change in capacitance between the movable electrode and the fixed electrode.

With the present arrangement, by adjusting the area of the lower electrode, the area of the lower electrode with respect to the movable electrode can be made larger than the area of the fixed electrode with respect to the movable electrode. Therefore, as compared with the case where a drive voltage is applied between the fixed electrode and the movable electrode that engage with each other like comb teeth, the movable electrode can be oscillated with a large amplitude. As a result, the angular velocity detection sensitivity can be improved.

In the MEMS sensor according to another aspect of the present invention, it is preferable that the lower electrode is formed along a direction across the comb teeth of the movable electrode so as to be opposed to the entire comb-tooth-like movable electrode.

With the present arrangement, the lower electrode can be opposed with a large area to the movable electrode, so that the capacitance of the capacitor between the lower electrode and the movable electrode can be increased. As a result, the detection accuracy of the sensor can be improved.

The electrode coating film may be made of $SiO_2$. The side walls of the upper electrode may be covered by a protective thin film made of an insulating material.

A MEMS package according to another aspect of the present invention includes the MEMS sensor according to another aspect of the present invention and a resin package formed to cover the MEMS sensor.

With the present arrangement, the MEMS sensor according to another aspect of the present invention is used. Therefore, in the MEMS sensor, the capacitance of the capacitor consisting of the upper electrode and the lower electrode can be controlled to an optimum capacitance for sensor operations, and the upper electrode and the lower electrode can be prevented from being short-circuited by each other. As a result, a MEMS package with a MEMS sensor having excellent detection accuracy can be provided.

The MEMS package according to another aspect of the present invention may further include an integrated circuit electrically connected to the MEMS sensor and covered together with the MEMS sensor by the same resin package. When the MEMS package according to another aspect of the present invention further includes a substrate that has a surface and a back surface and supports the MEMS sensor by the surface, the resin package may seal the MEMS sensor so as to cover the surface of the substrate and expose the back surface of the substrate.

A method for manufacturing a MEMS sensor according to still another aspect of the present invention includes the steps of forming a base film made of a material having etching selectivity to Si on a Si substrate, forming a polysilicon layer on the base film, forming trenches from the surface of the polysilicon layer to the surface of the Si substrate by selectively etching the polysilicon layer and the base film and concurrently, forming comb-tooth-like first electrode and second electrode that have a lamination structure including the base film and the polysilicon layer and engage with each other via the trenches, and forming a cavity directly below the base film by etching portions directly below the base film of the Si substrate by isotropic etching by supplying an etching medium into the trenches.

According to this method, the lowest layers of the first electrode and the second electrode are formed of the base film having etching selectivity to Si. Therefore, when a cavity is formed by isotropic etching of the Si substrate, even if the etching medium comes into contact with the first electrode and the second electrode, erosion of the first electrode and the second electrode can be reduced. As a result, a MEMS sensor with the first electrode and the second electrode with less variation in size can be manufactured.

Such a MEMS sensor includes, for example, similar to the MEMS sensor according to still another aspect of the present invention, a Si substrate having a surface layer portion on which a recess is formed, and comb-tooth-like first electrode and second electrode that are disposed directly above the recess of the Si substrate and have a lamination structure including a base film made of an insulating material and a polysilicon layer laminated in order from the side close to the recess, and engage with each other via an interval.

With the present arrangement, the variation in size of the comb-tooth-like first electrode and second electrode that engage with each other is small, so that the detection accuracy of the sensor can be improved.

The material that has etching selectivity to Si (in this paragraph, defined as material A) is, for example, a material satisfying a ratio (etching selectivity) of the etching rate of Si with a certain etching medium to the etching rate of the material A with this etching medium=(etching rate of material A/etching rate of Si)≠1. In particular, the material A is preferably a material that can make the etching selectivity closer to 0 (zero) (etching selectivity≈0), and specifically, the material A is preferably $SiO_2$.

In the method for manufacturing a MEMS sensor according to still another aspect of the present invention, preferably, the step of forming the base film includes a step of processing the Si substrate into a plate-shaped base portion and columnar portions standing on the surface of the base portion by selectively etching the Si substrate, and a step of altering the surface of the base portion and the columnar portions into insulating films by thermally oxidizing the surface of the base portion and the columnar portions, and the step of selectively etching the polysilicon layer and the base film includes a step of etching to insulate the first electrode and/or the second electrode from other portions of the polysilicon layer by the columnar portions altered into the insulating films, respectively.

By this method, the MEMS sensor according to still another aspect of the present invention further including first insulating layers that are embedded in the first electrode so as to penetrate through the polysilicon layer and reach the base film and selectively insulate certain portions of the first electrode from other portions of the polysilicon layer, can be manufactured. Further, the MEMS sensor according to still another aspect of the present invention further including second insulating layers that are embedded in the second electrode so as to reach the base film by penetrating through the polysilicon layer and selectively insulate certain portions of the second electrode from other portions of the polysilicon layer, can be manufactured.

In the invention described in Patent Document 1 (United States Patent Publication No. 6792804), a plurality of portions that should be electrically insulated of the Si substrate are isolated by isolation joints (isolation joints 160, 360 . . . ). The isolation joints are formed by forming trenches in the Si substrate and thermally oxidizing the inner walls (side walls and bottom walls) of the trenches as shown in FIG. 6a of Patent Document 1. When the inner walls of the trenches are thermally oxidized, $SiO_2$ grows from the side walls and the bottom walls toward the insides of the trenches, and $SiO_2$ that grew from the walls are eventually integrated together. Due to this integration, the isolation joint (612 in FIG. 6a) embedded in the trenches is obtained. However, the isolation joint to be thus obtained is a film formed by integrating multiple $SiO_2$ growing inside the trenches that were originally void, so that the strength thereof is not so high, and formation takes time.

In the method for manufacturing a MEMS sensor according to still another aspect of the present invention, the shapes of the first insulating layers and the second insulating layers are formed as columnar portions by etching the Si substrate with a neat crystal structure. Next, the columnar portions are altered into insulating films by thermal oxidization. Next, around the insulating films, a polysilicon layer is formed and etched into the shapes of the first electrode and the second electrode. Specifically, in this manufacturing method, the shapes of the first insulating layers and the second insulating layers are formed by etching the Si, so that they can be formed as insulating layers having high strength in a short time as compared with the isolation joint forming method described in Patent Document 1.

In the method for manufacturing a MEMS sensor according to still another aspect of the present invention, the step of forming the polysilicon layer preferably includes a step of depositing a polysilicon material to a position higher than the top portions of the columnar portions on the base portion, and a step of grinding the polysilicon material until the surfaces of the deposited polysilicon material are lowered to the positions of the heights of the top portions of the columnar portions.

By this method, a polysilicon layer having thicknesses equal to the heights of the insulating films formed of the columnar portions can be formed. Therefore, certain portions of the first electrode and the second electrode can be reliably insulated from other portions of the polysilicon layer.

The method for manufacturing a MEMS sensor according to still another aspect of the present invention preferably further includes a step of forming a protective film having etching selectivity to polysilicon so as to cover the side walls of the first electrode and the second electrode.

According to this method, the side walls of the first electrode and the second electrode are covered by the protective film having etching selectivity to Si. Therefore, when a cavity is formed by isotropic etching of the Si substrate, even if an etching medium comes into contact with the side walls of the first electrode and the second electrode, erosion of the first electrode and the second electrode can be reduced. As a result, the variation in size of the first electrode and the second electrode can be further reduced.

The method for manufacturing a MEMS sensor according to still another aspect of the present invention preferably includes a step of selectively forming wirings on the polysilicon layer previous to formation of the trenches.

According to this method, wirings are formed on the polysilicon layer before the polysilicon layer is molded into complicated comb-tooth-like first electrode and second electrode, so that the wirings for contact with the first electrode and the second electrode can be easily formed.

In the MEMS sensor according to still another aspect of the present invention, the first electrode may be a movable electrode and the second electrode may be a fixed electrode. Alternatively, the first electrode may be a fixed electrode and the second electrode may be a movable electrode.

The MEMS sensor according to still another aspect of the present invention may include an acceleration sensor that detects acceleration applied to the MEMS sensor by detecting a change in capacitance between the first electrode and the second electrode.

With the present arrangement, acceleration can be detected by a capacitor consisting of the first electrode and the second electrode with less variation in size. Therefore, acceleration applied to the sensor can be accurately detected.

The MEMS sensor according to still another aspect of the present invention may include an angular velocity sensor that drives the first electrode in directions approaching and away from the recess and detects an angular velocity applied to the MEMS sensor at the time of this driving by detecting a change in capacitance between the first electrode and the second electrode.

With the present arrangement, the variation in size of the first electrode is small, so that the first electrode can be driven as designed. Therefore, an angular velocity applied to the sensor can be accurately detected.

In the MEMS sensor according to still another aspect of the present invention, the thickness of the base film may be 2 μm to 10 μm. The thickness of the polysilicon layer may be 5 μm to 20 μm.

A MEMS package according to still another aspect of the present invention includes the MEMS sensor according to still another aspect of the present invention and a resin package formed to cover the MEMS sensor.

With the present arrangement, the MEMS sensor according to still another aspect of the present invention is used. Therefore, in the MEMS sensor, the variation in size of the comb-tooth-like first electrode and second electrode that engage with each other can be reduced, so that the detection accuracy of the sensor can be improved. As a result, a MEMS package including a MEMS sensor with excellent detection accuracy can be provided.

The MEMS package according to still another aspect of the present invention may further include an integrated circuit electrically connected to the MEMS sensor and covered together with the MEMS sensor by the same resin package. When the MEMS package according to still another aspect of the present invention further includes a substrate that has a surface and a back surface and supports the MEMS sensor by the surface, the resin package may seal the MEMS sensor so as to cover the surface of the substrate and expose the back surface of the substrate.

Hereinafter, preferred embodiments of the present invention will be described in detail with reference to the accompanying drawings.

(1) First Preferred Embodiment

<Entire Arrangement of Gyro Sensor>

FIG. 1 is a schematic plan view of a gyro sensor according to a first preferred embodiment of the present invention.

The gyro sensor 1A is a capacitance type angular velocity sensor that detects an angular velocity based on a change in capacitance of a capacitor, and is used for, for example, correcting shake of a video camera or a still camera, detecting a position of a car navigation system, and detecting motions of a robot and a gaming machine, etc.

The gyro sensor 1A includes a semiconductor substrate 2A quadrilateral in a plan view, a sensor portion 3A disposed at the central portion of the semiconductor substrate 2A, and electrode pads 4A that are disposed on the lateral side of the sensor portion 3A on the semiconductor substrate 2A and for supplying voltages to the sensor portion 3A.

The sensor portion 3A includes an X-axis sensor 5A, a Y-axis sensor 6A, and Z-axis sensors 7A as sensors that respectively detect angular velocities around the three axes orthogonal to each other in the three-dimensional space. These three sensors 5A to 7A are covered and sealed by a lid substrate 8A by, for example, bonding the lid substrate 8A formed of a silicon substrate to the surface of a semiconductor substrate 2A.

The X-axis sensor 5A generates a coriolis force Fz in the Z-axis direction by using oscillation Ux in the X-axis direction when the gyro sensor 1A is tilted, and detects an angular velocity ωy applied around the Y axis by detecting a change in capacitance caused by the coriolis force. The Y-axis sensor 6A generates a coriolis force Fx in the X-axis direction by using oscillation Uy in the Y-axis direction when the gyro sensor 1A is tilted, and detects an angular velocity ωz applied around the Z axis by detecting a change in capacitance caused by the coriolis force. The Z-axis sensor 7A generates a coriolis force Fy in the Y-axis direction by using oscillation Uz in the Z-axis direction when the gyro sensor 1A is tilted, and detects an angular velocity ωx applied around the X-axis by detecting a change in capacitance caused by the coriolis force.

A plurality (five in FIG. 1) of electrode pads 4A are provided at even intervals.

<Arrangement of X-axis Sensor and Y-axis Sensor>

Next, the arrangement of the X-axis sensor and the Y-axis sensor will be described with reference to FIG. 2 to FIG. 4.

Figure 2:
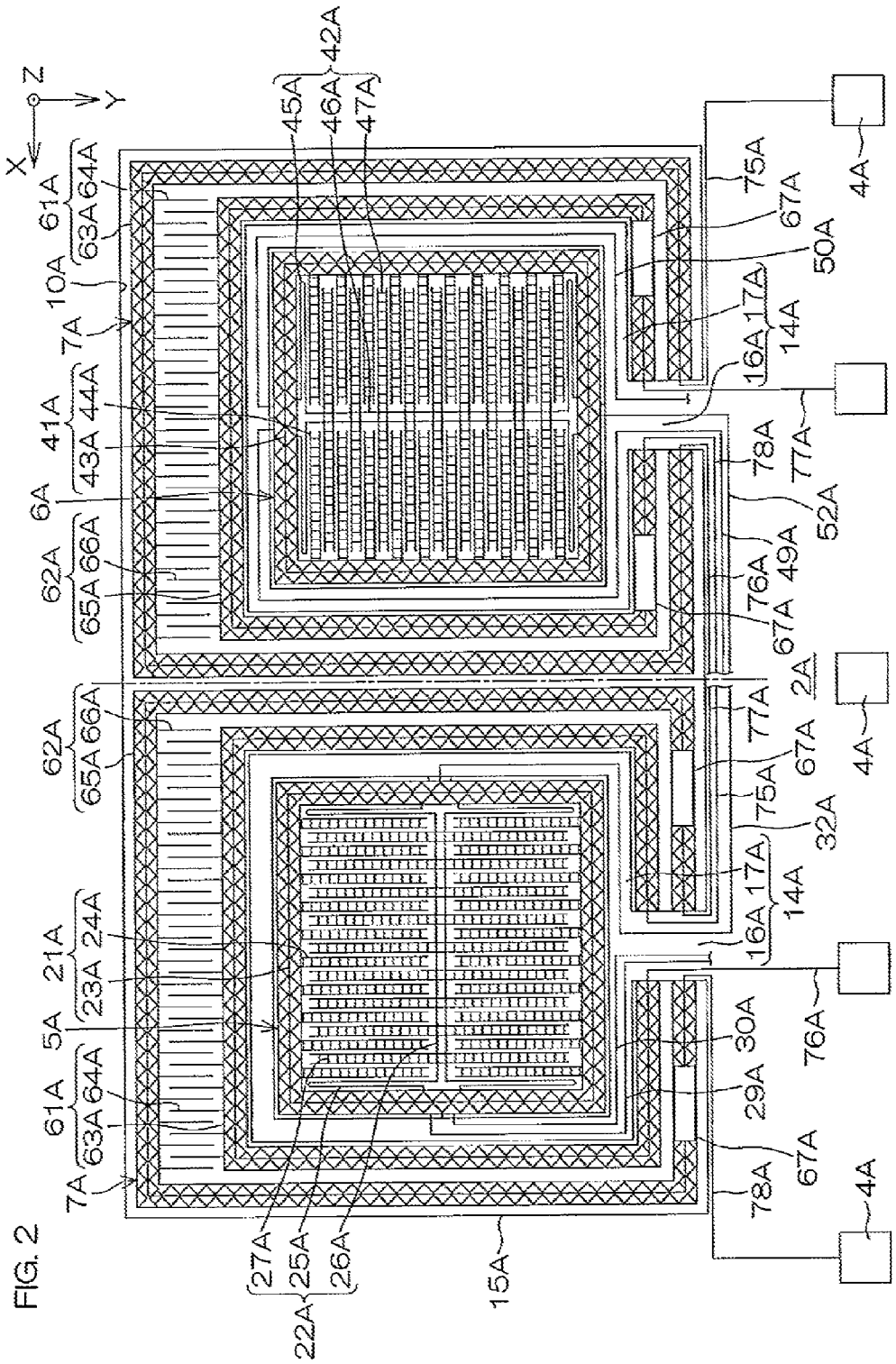
FIG. 2 is a schematic plan view of a sensor portion shown in FIG. 1.
Figure 3O:
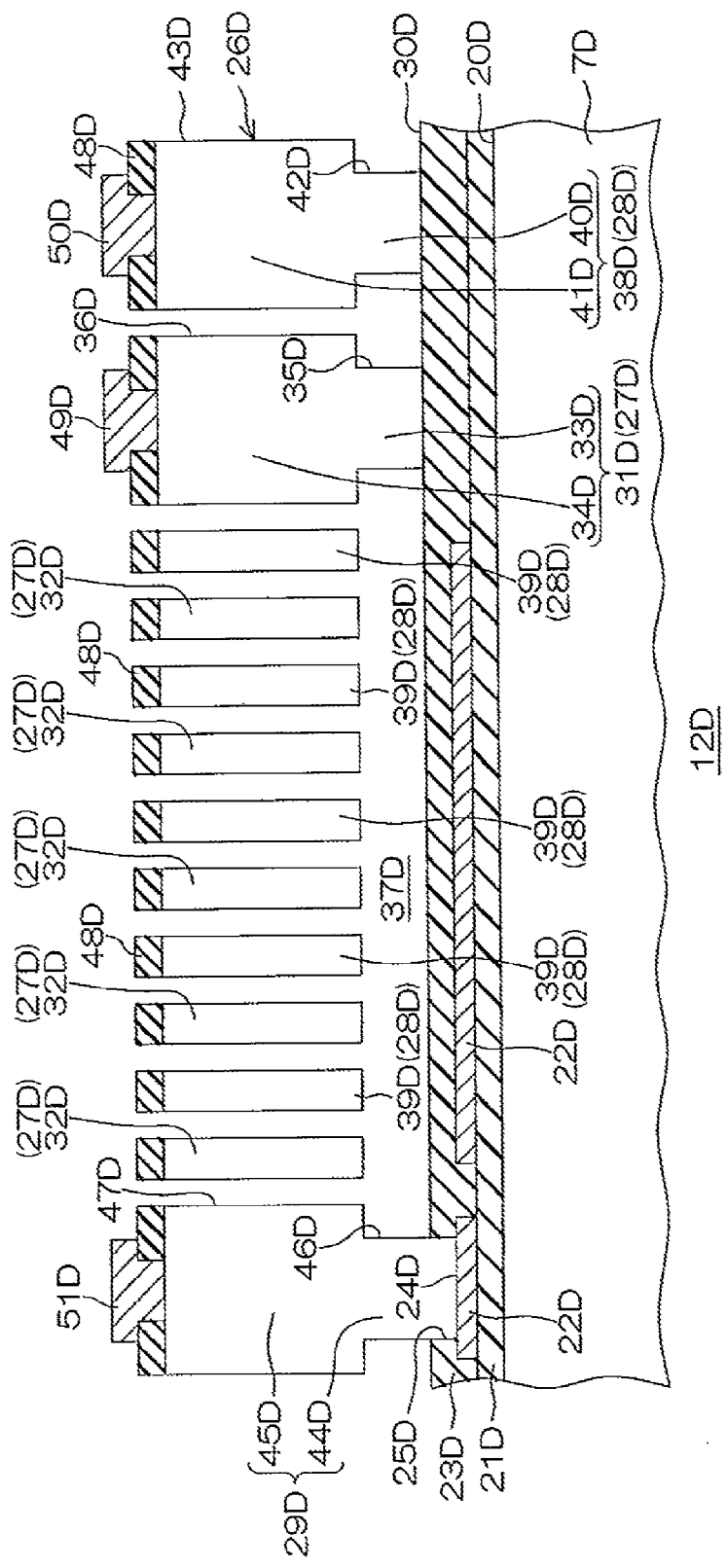
FIG. 3 is a plan view of a principal portion of an X-axis sensor shown in FIG. 2.

FIG. 2 is a schematic plan view of a sensor portion shown in FIG. 1. FIG. 3 is a plan view of a principal portion of the X-axis sensor shown in FIG. 2. FIG. 4 is a sectional view of the principal portion of the X-axis sensor shown in FIG. 2, illustrating a section taken along the cutting plane A-A in FIG. 3.

The semiconductor substrate 2A is formed of a conductive silicon substrate (low-resistance substrate with a resistivity of, for example, 5 Ω·m to 500 Ω·m). This semiconductor substrate 2A has a cavity 10A inside, and in the upper wall 11A (surface portion) of the semiconductor substrate 2A having a ceiling that partitions the cavity 10A from the surface side, the X-axis sensor 5A, the Y-axis sensor 6A, and the Z-axis sensors 7A are formed. Specifically, the X-axis sensor 5A, the Y-axis sensor 6A, and the Z-axis sensors 7A are formed of portions of the semiconductor substrate 2A, and are supported while in a floating state with respect to the bottom wall 12A of the semiconductor substrate 2A that has a bottom surface partitioning the cavity 10A from the back surface side.

The X-axis sensor 5A and the Y-axis sensor 6A are disposed adjacent to each other at an interval, and the Z-axis sensors 7A are disposed to surround the X-axis sensor 5A and Y-axis sensor 6A, respectively. In the present preferred embodiment, the Y-axis sensor 6A has an arrangement that is substantially the same as an arrangement obtained by rotating 90 degrees the X-axis sensor 5A in a plan view. Therefore, hereinafter, instead of a detailed description of the arrangement of the Y-axis sensor 6A, in the description of the portions of the X-axis sensor 5A, portions of the Y-axis sensor corresponding to the portions of the X-axis sensor are also described with parentheses.

Between the X-axis sensor 5A and the Z-axis sensor 7A and between the Y-axis sensor 6A and the Z-axis sensor 7A, support portions 14A for supporting these in a floating state are formed. The support portions 14A integrally include straight portions 16A extending across the Z-axis sensors 7A from one side walls 15A having side surfaces that partition the cavity 10A of the semiconductor substrate 2A from the lateral sides toward the X-axis sensor 5A and the Y-axis sensor 6A, and annular portions 17A surrounding the X-axis sensor 5A and the Y-axis sensor 6A.

The X-axis sensor 5A and the Y-axis sensor 6A are disposed inside the annular portions 17A, and both ends of these sensors are supported at two points opposing each other on the inner walls of the annular portions 17A. Both ends of the Z-axis sensors 7A are supported on both side walls of the straight portions 16A.

The X-axis sensor 5A (Y-axis sensor 6A) includes an X fixed electrode 21A (Y fixed electrode 41A) fixed to the support portion 14A provided inside the cavity 10A, and an X movable electrode 22A (Y movable electrode 42A) held to be capable of oscillating with respect to the X fixed electrode 21A. The X fixed electrode 21A and the X movable electrode 22A are formed to have the same thickness.

The X fixed electrode 21A (Y fixed electrode 41A) includes a base portion 23A (base portion 43A of the Y fixed electrode 41A) that is fixed to the support portion 14A and has a quadrilateral annular shape in a plan view, and a plurality of pairs of comb tooth portions 24A (comb tooth portions 44A of the Y fixed electrode 41A) aligned like comb teeth at even intervals along the inner wall of the base portion 23A.

On the other hand, the X movable electrode 22A (Y movable electrode 42A) includes a base portion 26A (base portion 46A of the Y movable electrode 42A) that extends in a direction across the comb tooth portions 24A of the X fixed electrode 21A and has both ends connected to the base portion 23A of the X fixed electrode 21A via expandable beam portions 25A (beam portions 45A of the Y-axis sensor 6A) along the direction across the comb tooth portions 24A, and comb tooth portions 27A (comb tooth portions 47A of the Y movable electrode 42A) that extend from the base portion 26A to both sides toward the portions between the comb tooth portions 24A adjacent to each other of the X fixed electrode 21A, and are aligned like comb teeth that engage with the comb tooth portions 24A of the X fixed electrode 21A without contact.

In the X-axis sensor 5A, when the beam portions 25A expand and contract and the base portion 26A of the X movable electrode 22A oscillates along the surface of the semiconductor substrate 2A (oscillation Ux), the comb tooth portions 27A of the X movable electrode 22A that engage with the comb tooth portions 24A like comb teeth of the X fixed electrode 21A oscillate alternately in directions approaching and away from the comb tooth portions 24A of the X fixed electrode 21A.

The base portion 23A of the X fixed electrode 21A has a truss-shaped framed structure including straight main frames extending parallel to each other and reinforcing frames combined with the main frames so that a triangular space is repeatedly formed along the main frames.

As the comb tooth portions 24A of the X fixed electrode 21A, two electrode portions straight in a plan view that have base end portions connected to the base portion 23A and tip end portions thereof opposed to each other are paired, and a plurality of the pairs are provided at even intervals. Each comb tooth portion 24A has a framed structure having a ladder-like shape in a plan view including straight main frames extending parallel to each other and a plurality of traverse frames laid across the main frames.

On the other hand, the base portion 26A of the X movable electrode 22A is formed of a plurality (six in the present preferred embodiment) of straight frames extending parallel to each other, and both ends thereof are connected to beam portions 25A. Two beam portions 25A are provided on each of both ends of the base portion 26A of the X movable electrode 22A.

Each comb tooth portion 27A of the X movable electrode 22A has a framed structure having a ladder-like shape in a plan view including straight main frames extending parallel to each other across the frames of the base portion 26A and a plurality of traverse frames laid across the main frames.

In the X movable electrode 22A, on lines halving the comb tooth portions 27A in a direction orthogonal to the oscillation direction Ux, insulating layers 28A (silicon oxide in the present preferred embodiment) across the traverse frames are embedded from the surface to the cavity 10A. By the insulating layer 28A, each comb tooth portion 27A is insulated and separated into two of one side and the other side along the oscillation direction Ux. Accordingly, the separated comb tooth portions 27A of the X movable electrode 22A function as independent electrodes respectively in the X movable electrode 22A.

On the surface of the semiconductor substrate 2A including the X fixed electrode 21A and the X movable electrode 22A, a first insulating film 33A and a second insulating film 34A made of silicon oxide ($SiO_2$) are laminated in order, and on this second insulating film 34A, an X first drive/detection wiring 29A (Y first drive/detection wiring 49A) and an X second drive/detection wiring 30A (Y second drive/detection wiring 50A) are formed.

The X first drive/detection wiring 29A supplies a drive voltage to one side (the left side on the paper surface shown in FIG. 3 in the present preferred embodiment) of each comb tooth portion 27A insulated and separated into two, and detects a change in voltage accompanying a change in capacitance from the comb tooth portion 27A. On the other hand, the X second drive/detection wiring 30A supplies a drive voltage to the other side (the right side on the paper surface shown in FIG. 3 in the present preferred embodiment) of each comb tooth portion 27A insulated and separated into two, and detects a change in voltage accompanying a change in capacitance from the comb tooth portion 27A.

The X first and X second drive/detection wirings 29A and 30A are made of aluminum (Al) in the present preferred embodiment. The X first and X second drive/detection wirings 29A and 30A are electrically connected to the comb tooth portions 27A by penetrating through the first and second insulating films 33A and 34A.

The X first and X second drive/detection wirings 29A and 30A are led onto the support portion 14A via the beam portions 25A of the X movable electrode 22A and the base portion 23A of the X fixed electrode 21A, and are partially exposed as electrode pads 4A. The X first and X second drive/detection wirings 29A and 30A use the beam portions 25A themselves formed of portions of the conductive semiconductor substrate 2A as current paths in sections passing through the beam portions 25A of the X movable electrode 22A, respectively. No aluminum wiring is provided on the beam portions 25A, so that the expandability of the beam portions 25A can be maintained.

To the support portion 14A, an X third drive/detection wiring 32A that detects a change in voltage caused by a change in capacitance from the comb tooth portions 24A of the X fixed electrode 21A is led, and this X third drive/detection wiring 32A is also partially exposed as an electrode pad 4A (not shown) in the same manner as other wirings 29A and 30A.

On the semiconductor substrate 2A, the upper surfaces and the side surfaces of the X fixed electrode 21A and the X movable electrode 22A are coated together with the first insulating film 33A and the second insulating film 34A by a protective thin film 35A made of silicon oxide ($SiO_2$).

On portions except for the cavity 10A of the surface of the semiconductor substrate 2A, a third insulating film 36A, a fourth insulating film 37A, a fifth insulating film 38A, and a surface protective film 39A are laminated in order on the second insulating film 34A.

In the X-axis sensor 5A structured as described above, drive voltages with the same polarity and drive voltages with different polarities are alternately applied between the X fixed electrode 21A and the X movable electrode 22A via the X first to X third drive/detection wirings 29A, 30A, and 32A. Accordingly, between the comb tooth portions 24A of the X fixed electrode 21A and the comb tooth portions 27A of the X movable electrode 22A, coulomb repulsive and attractive forces are alternately generated. As a result, the comb-tooth-like X movable electrode 22A oscillates similarly to the left and right along the X-axis direction with respect to the comb-tooth-like X fixed electrode 21A (oscillation Ux). In this state, when the X movable electrode 22A rotates around the Y axis as a central axis, a coriolis force Fz is generated in the Z-axis direction. This coriolis force Fz changes the opposing area and/or distance between the comb tooth portions 24A of the X fixed electrode 21A and the comb tooth portions 27A of the X movable electrode 22A adjacent to each other. Then, by detecting a change in capacitance between the X movable electrode 22A and the X fixed electrode 21A caused by the change in opposing area and/or distance, the angular velocity $\omega y$ around the Y axis is detected.

In the present preferred embodiment, the angular velocity $\omega y$ around the Y axis is obtained by calculating a difference between detection values of one-side and the other-side electrode portions insulated and separated from each other of the X movable electrode 22A.

In the Y-axis sensor 6A, drive voltages with the same polarity and drive voltages with different polarities are alternately applied between the Y fixed electrode 41A and the Y movable electrode 42A via the Y first to Y third drive/detection wirings 49A, 50A, and 52A. Accordingly, coulomb repulsive and attractive forces are alternately generated between the comb tooth portions 44A of the Y fixed electrode 41A and the comb tooth portions 47A of the Y movable electrode 42A. As a result, the comb-tooth-like Y movable electrode 42A oscillates similarly to the left and right along the Y-axis direction with respect to the comb-tooth-like Y fixed electrode 41A (oscillation Uy). In this state, when the Y movable electrode 42A rotates around the Y axis as a central axis, a coriolis force Fx is generated in the X-axis direction. This coriolis force Fx changes the opposing area and/or distance between the comb tooth portions 44A of the Y fixed electrode 41A and the comb tooth portions 47A of the Y movable electrode 42A adjacent to each other. Then, by detecting a change in capacitance between the Y movable electrode 42A and the Y fixed electrode 41A caused by the change in opposing area and/or distance, the angular velocity $\omega z$ around the Z axis is detected.

<Arrangement of Z-axis Sensors>

Next, an arrangement of the Z-axis sensors will be described with reference to FIG. 2, FIG. 5, and FIG. 6.

Figure 5:
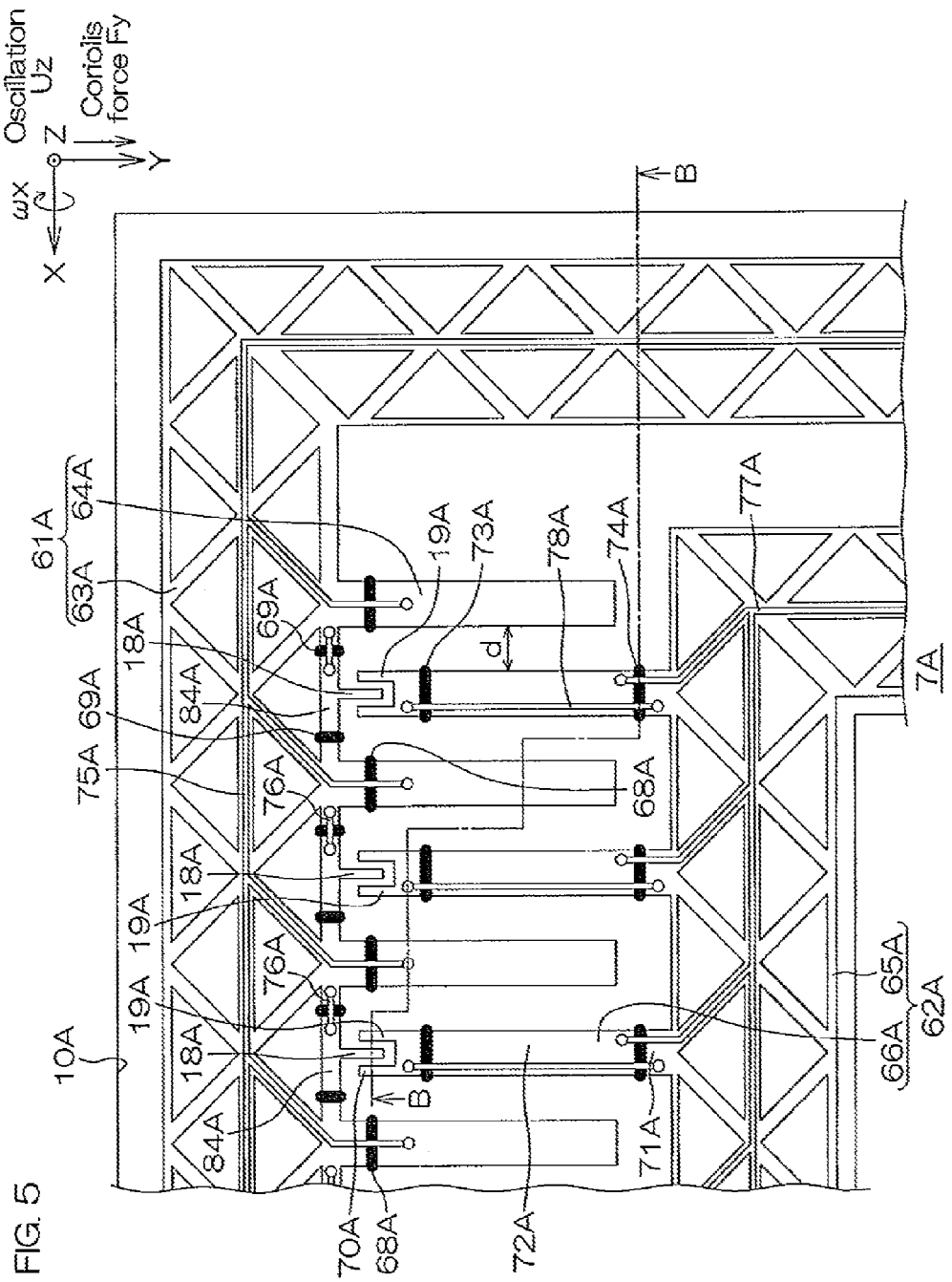
FIG. 5 is a plan view of a principal portion of a Z-axis sensor shown in FIG. 2.

FIG. 5 is a plan view of a principal portion of the Z-axis sensor shown in FIG. 2. FIG. 6 is a sectional view of the principal portion of the Z-axis sensor shown in FIG. 2, illustrating a section taken along the cutting plane B-B in FIG. 5.

Referring to FIG. 2, the semiconductor substrate 2A made of conductive silicon has a cavity 10A inside as described above. In the upper wall 11A (surface portion) of the semiconductor substrate 2A, the Z-axis sensors 7A supported by the support portions 14A while in a floating state with respect to the bottom wall 12A of the semiconductor substrate 2A are disposed to surround the X-axis sensor 5A and the Y-axis sensor 6A, respectively.

Each Z-axis sensor 7A includes a Z fixed electrode 61A as a first electrode fixed to the support portion 14A (straight portion 16A) provided inside the cavity 10A, and a Z movable electrode 62A as a second electrode held to be capable of oscillating with respect to the Z fixed electrode 61A. The Z fixed electrode 61A and the Z movable electrode 62A are formed to have the same thickness.

In one Z-axis sensor 7A of these two Z-axis sensors 7A, the Z movable electrode 62A is disposed to surround the annular portion 17A of the support portion 14A, and the Z fixed electrode 61A is disposed to further surround the Z movable electrode 62A. In the other Z-axis sensor 7A, the Z fixed electrode 61A is disposed to surround the annular portion 17A of the support portion 14A, and the Z movable electrode 62A is disposed to further surround the Z fixed electrode 61A. The Z fixed electrode 61A and the Z movable electrode 62A are connected integrally to both side walls of the straight portion 16A of the support portion 14A.

The Z fixed electrode 61A includes a first base portion 63A having a quadrilateral annular shape in a plan view fixed to the support portion 14A, and a plurality of comb-tooth-like first comb tooth portions 64A provided on the portion opposite to the straight portion 16A with respect to the X-axis sensor 5A (Y-axis sensor 6A) of the first base portion 63A.

On the other hand, the Z movable electrode 62A includes a second base portion 65A having a quadrilateral annular shape in a plan view, and comb-tooth-like second comb tooth portions 66A extending from the second base portion 65A toward the portions between the comb-tooth-like first comb tooth portions 64A of the Z fixed electrode 61A adjacent to each other that engage with the first comb tooth portions 64A of the Z fixed electrode 61A without contact. The second base portion 65A of the Z movable electrode 62A has a truss-shaped framed structure including straight main frames extending parallel to each other and reinforcing frames combined with the main frames so that a triangular space is repeatedly formed along the main frames. The second base portion 65A of the Z movable electrode 62A thus structured has sections in which the reinforcing frames are omitted at portions on the side opposite to the side of disposition of the second comb tooth portions 66A, and the main frames in the sections function as beam portions 67A for enabling the Z movable electrode 62A to move up and down.

Specifically, in this Z-axis sensor 7A, the beam portions 67A elastically warp, and the second base portion 65A of the Z movable electrode 62A turns like a pendulum in directions approaching and away from the cavity 10A around the beam portions 67A as pivot points (oscillation Uz), and accordingly, the second comb tooth portions 66A of the Z movable electrode 62A engaging with the first comb tooth portions 64A of the Z fixed electrode 61A like comb teeth oscillate up and down.

The first base portion 63A of the Z fixed electrode 61A has a truss-shaped framed structure including straight main frames extending parallel to each other and reinforcing frames combined with the main frames so that a triangular space is repeatedly formed along the main frames.

The first comb tooth portions 64A of the Z fixed electrode 61A have base end portions connected to the first base portion 63A of the Z fixed electrode 61A and tip end portions extending toward the Z movable electrode 62A, and are aligned like comb teeth at even intervals along the inner wall of the first base portion 63A. In portions close to the base end portions of the first comb tooth portions 64A, insulating layers 68A (silicon oxide in the present preferred embodiment) are embedded across the first comb tooth portions 64A in the width direction from the surface to the cavity 10A. By the insulating layers 68A, the first comb tooth portions 64A of the Z fixed electrode 61A are insulated from other portions of the Z fixed electrode 61A.

In the first base portion 63A of the Z fixed electrode 61A, on both sides of a portion (opposed portion 84A) opposed to the tip end portion 70A (described later) of each second comb tooth portion 66A of the Z movable electrode 62A, insulating layers 69A as first separating and insulating layers are embedded across the main frame of the truss structure in the width direction from the surface to the cavity 10A of the semiconductor substrate 2A. Accordingly, the opposed portion 84A surrounded by the insulating layers 69A and the triangular space of the truss structure is insulated from other portions of the first base portion 63A of the Z fixed electrode 61A.

To the opposed portions 84A, the first drive portions 18A extending toward the tip end portions 70A (described later) of the second comb tooth portions 66A disposed in front of the opposed portions are connected integrally. Specifically, the first drive portions 18A are provided between the first comb tooth portions 64A aligned like comb teeth on the first base portion 63A of the Z fixed electrode 61A. Therefore, on the entire first base portion 63A of the Z fixed electrode 61A, the first comb tooth portions 64A and the first drive portions 18A shorter than the first comb tooth portions 64A are aligned like comb teeth at even intervals.

On the other hand, the second comb tooth portions 66A of the Z movable electrode 62A have base end portions 71A connected to the second base portion 65A of the Z movable electrode 62A and tip end portions 70A extending toward the portions between the first comb tooth portions 64A of the Z fixed electrode 61A, and are aligned like comb teeth that engage with the first comb tooth portions 64A of the Z fixed electrode 61A without contact therebetween. In portions close to the tip end portions 70A of the second comb tooth portions 66A of the Z movable electrode 62A, insulating layers 73A (silicon oxide in the present preferred embodiment) as second separating and insulating layers are embedded across the second comb tooth portions 66A in the width direction from the surface to the cavity 10A of the semiconductor substrate 2A. In portions close to the base end portions 71A of the second comb tooth portions 66A of the Z movable electrode 62A, insulating layers 74A (silicon oxide in the present preferred embodiment) are embedded across the second comb tooth portions 66A in the width direction from the surface to the cavity 10A of the semiconductor substrate 2A. Each second comb tooth portion 66A has three portions (the tip end portion 70A, the base end portion 71A, and the intermediate portion 72A between the tip end portion 70A and the base end portion 71A) insulated from other portions by these insulating layers 73A and 74A.

The tip end portions 70A of the second comb tooth portions 66A integrally include second drive portions 19A formed like comb teeth. Specifically, the Z movable electrode 62A includes a plurality of second comb tooth portions 66A aligned like comb teeth, and on the tip end portion 70A of each second comb tooth portion 66A, a second drive portion 19A having a comb-tooth-like shape smaller than the second comb tooth portion 66A is formed. The second drive portions 19A engage with the first drive portions 18A of the Z fixed electrode 61A while being spaced from each other so as not to come into contact with each other.

On the surface of the semiconductor substrate 2A including the Z fixed electrode 61A and the Z movable electrode 62A, a first insulating film 33A and a second insulating film 34A made of silicon oxide ($SiO_2$) are laminated in order as described above. On the second insulating layer 34A, a Z first detection wiring 75A, Z first drive wiring 76A as a first detection wiring, a Z second detection wiring 77A, Z second drive wiring 78A as a second detection wiring are formed. In the present preferred embodiment, the Z first detection wiring 75A and the Z first drive wiring 76A constitute a first contact wiring that comes into direct contact with the Z fixed electrode 61A from the surface side of the semiconductor substrate 2A. Also, the Z second detection wiring 77A and the Z second drive wiring 78A constitute a second contact wiring that comes into direct contact with the Z movable electrode 62A from the surface side of the semiconductor substrate 2A.

The Z first detection wiring 75A and the Z second detection wiring 77A are connected to the first comb tooth portions 64A of the Z fixed electrode 61A and the intermediate portions 72A of the Z movable electrode 62A adjacent to each other, respectively. Specifically, in this Z-axis sensor 7A, the first comb tooth portions 64A of the Z fixed electrode 61A and the intermediate portions 72A of the Z movable electrode 62A to which the Z first detection wiring 75A and the Z second detection wiring 77A are connected are opposed to each other at an electrode-to-electrode distance d, and constitutes electrodes of a capacitor (detector) when a fixed voltage is applied between the electrodes and the capacitance of the capacitor changes according to a change in electrode-to-electrode distance d and/or opposing area.

In detail, the Z first detection wiring 75A is formed along the first base portion 63A of the Z fixed electrode 61A and includes aluminum wirings branched toward the tip end portions of the first comb tooth portions 64A across the insulating layers 68A of the first comb tooth portions 64A of the Z fixed electrode 61A. The branched aluminum wirings are electrically connected to the tip end sides relative to the insulating layers 68A of the first comb tooth portions 64A by penetrating through the first insulating film 33A and the second insulating film 34A. As shown in FIG. 2, the Z first detection wiring 75A is led onto the support portion 14A via the first base portion 63A of the Z fixed electrode 61A, and is partially exposed as an electrode pad 4A.

On the other hand, the Z second detection wiring 77A detects a change in voltage accompanying a change in capacitance from the second comb tooth portions 66A of the Z movable electrode 62A. This Z second detection wiring 77A is formed along the second base portion 65A of the Z movable electrode 62A, and includes aluminum wirings branched toward the intermediate portions 72A across the insulating layers 74A close to the base end portions 71A of the second comb tooth portions 66A of the Z movable electrode 62A. The branched aluminum wirings are electrically connected to the intermediate portions 72A of the second comb tooth portions 66A by penetrating through the first insulating film 33A and the second insulating film 34A. As shown in FIG. 2, the Z second detection wiring 77A is led onto the support portion 14A via the second base portion 65A of the Z movable electrode 62A, and partially exposed as an electrode pad 4A.

The Z first drive wiring 76A and the Z second drive wiring 78A are respectively connected to the opposed portions 84A (first drive portions 18A) of the Z fixed electrode 61A and the tip end portions 70A (second drive portions 19A) of the Z movable electrode 62A that face each other in a direction orthogonal to the opposing direction of electrodes constituting a capacitor. Specifically, in this Z-axis sensor 7A, the first drive portions 18A of the Z fixed electrode 61A and the second drive portions 19A of the Z movable electrode 62A that engage with each other like comb teeth at an interval constitute drive portions between which drive voltages are applied to oscillate the Z movable electrode 62A by coulomb forces generated by changes in the drive voltages.

In detail, the Z first drive wiring 76A supplies a drive voltage to the opposed portions 84A (first drive portions 18A) of the Z fixed electrode 61A. The Z first drive wiring 76A includes aluminum wirings that are laid across both sides of the insulating layers 69A by using the surface of the second insulating film 34A and electrically connected to the opposed portions 84A and portions except for the opposed portions 84A of the first base portion 63A by penetrating through the first insulating film 33A and the second insulating film 34A, and a remaining portion of the Z first drive wiring is formed by using the first base portion 63A of the Z fixed electrode 61A made of conductive silicon. As shown in FIG. 2, the Z first drive wiring 76A is led onto the support portion 14A, and partially exposed as an electrode pad 4A.

On the other hand, the Z second drive wiring 78A supplies a drive voltage to the tip end portions 70A (second drive portions 19A) of the Z movable electrode 62A. The Z second drive wiring 78A includes aluminum wirings that are laid across the tip end portions 70A and the base end portions 71A of the second comb tooth portions 66A by using the surface of the second insulating film 34A, and electrically connected to the tip end portions 70A and the base end portions 71A by penetrating through the first insulating film 33A and the second insulating film 34A, and a remaining portion of the Z second drive wiring is formed by using the second base portion 65A of the Z movable electrode 62A made of conductive silicon. As shown in FIG. 2, the Z second drive wiring 78A is led onto the support portion 14A and partially exposed as an electrode pad 4A.

On the semiconductor substrate 2A, the upper surfaces and the side surface of the Z fixed electrode 61A and the Z movable electrode 62A are coated together with the first insulating film 33A and the second insulating film 34A by the protective thin film 35A made of silicon oxide ($SiO_2$).

On portions except for the cavity 10A of the surface of the semiconductor substrate 2A, the third insulating film 36A, the fourth insulating film 37A, the fifth insulating film 38A, and the surface protective film 39A are laminated in order on the second insulating film 34A.

In this Z-axis sensor 7A, drive voltages with the same polarity and drive voltages with different polarities are alternately applied between the opposed portions 84A (first drive portions 18A) of the Z fixed electrode 61A and the tip end portions 70A (second drive portions 19A) of the Z movable electrode 62A via the Z first drive wiring 76A and the Z second drive wiring 78A. Accordingly, coulomb repulsive and attractive forces are alternately generated between the first drive portions 18A of the Z fixed electrode 61A and the second drive portions 19A of the Z movable electrode 62A. As a result, the comb-tooth-like Z movable electrode 62A oscillates up and down like a pendulum similarly around the comb-tooth-like Z fixed electrode 61A as a center of oscillation along the Z-axis direction with respect to the Z fixed electrode 61A (oscillation Uz). In this state, when the Z movable electrode 62A rotates around the X axis as a central axis, a coriolis force Fy is generated in the Y-axis direction. This coriolis force Fy changes the opposing area S and/or electrode-to-electrode distance d between the first comb tooth portions 64A of the Z fixed electrode 61A and the intermediate portions 72A of the second comb tooth portions 66A of the Z movable electrode 62A adjacent to each other. Then, by detecting a change in capacitance C between the Z movable electrode 62A and the Z fixed electrode 61A caused by the change in opposing area S and/or electrode-to-electrode distance d via the Z first detection wiring 75A and the Z second detection wiring 77A, the angular velocity ωx around the X axis is detected. In the present preferred embodiment, the angular velocity ωx around the X axis is obtained by calculating a difference between a detection value of the Z-axis sensor 7A surrounding the X-axis sensor 5A and a detection value of the Z-axis sensor 7A surrounding the Y-axis sensor 6A. The difference can be provided, for example, as shown in FIG. 2, by making the position relationship of the fixed electrode and the movable electrode of the Z-axis sensor 7A surrounding the X-axis sensor 5A opposite to the position relationship of the fixed electrode and the movable electrode of the Z-axis sensor 7A surrounding the Y-axis sensor 6A. Accordingly, the manner of oscillation of the Z movable electrode 62A differs between the pair of Z-axis sensors 7A, so that a difference occurs.

In this gyro sensor 1A, the first drive portions 18A and the second drive portions 19A for driving (oscillating) the Z movable electrode 62A are disposed to engage with each other like comb teeth. Therefore, for example, as compared with cases such as where the side walls of the opposed portions 84A of the Z fixed electrode 61A and the side walls of the Z movable electrode 62A are both flat and just opposed to each other, the opposing area between the drive electrodes (in the present preferred embodiment, the opposing area between the side surface of the drive portion 18A and the side surface of the second drive portion 19A) can be made larger. Therefore, the Z movable electrode 62A can be oscillated with a large amplitude, so that the detection sensitivity can be improved.

In the gyro sensor 1A, the Z fixed electrode 61A and the Z movable electrode 62A are formed by using the upper wall 11A of the semiconductor substrate 2A having the cavity 10A in the surface portion of the semiconductor substrate 2A. Therefore, the thickness of the entire sensor is substantially the thickness of the semiconductor substrate 2A, so that the sensor can be downsized.

The insulating layers 68A, 69A, 73A and 74A for insulating and separating the opposed portions 84A of the Z fixed electrode 61A and the base end portions 71A, the intermediate portions 72A, and the tip end portions 70A of the Z movable electrode 62A are embedded in the semiconductor substrate 2A, so that the surface of the semiconductor substrate 2A can be efficiently used as a space for leading the aluminum wirings of the X first drive/detection wiring 29A and the Z first detection wiring 75A, etc.

Further, the semiconductor substrate 2A is a conductive silicon substrate, so that even without applying a special treatment for giving conductivity to the X fixed electrode 21A, the Y fixed electrode 41A, and the Z fixed electrode 61A, and the X movable electrode 22A, the Y movable electrode 42A, and the Z movable electrode 62A molded into predetermined shapes, the molded structures can be used as they are as electrodes. The portions except for the portions to be used as electrodes can be used as wirings (the X first drive/detection wiring 29A and the Z first detection wiring 75A, etc.).

<Method for Manufacturing Gyro Sensor 1A>

Next, a manufacturing process of the above-described gyro sensor will be described in order of steps with reference to FIG. 7A to FIG. 7G. In this paragraph, only the manufacturing process of the Z-axis sensors is shown in the drawings, and the manufacturing processes of the X-axis sensor and the Y-axis sensor are omitted, however, the manufacturing processes of the X-axis sensor and the Y-axis sensor are performed in parallel to the manufacturing process of the Z-axis sensors in the same manner as the manufacturing process of the Z-axis sensors.

FIG. 7A to FIG. 7G are schematic sectional views showing parts of the manufacturing process of the gyro sensor according to the first preferred embodiment of the present invention in order of steps, illustrating a section taken along the cutting plane at the same position as in FIG. 6.

To manufacture this gyro sensor 1A, first, as shown in FIG. 7A, the surface of the semiconductor substrate 2A made of conductive silicon is thermally oxidized (for example, temperature: 1100 to 1200° C., film thickness: 5000 Å). Accordingly, the first insulating film 33A is formed on the surface of the semiconductor substrate 2A. Next, by a known patterning technique, the first insulating film 33A is patterned, and openings are formed in regions in which the insulating layers 68A, 69A, 73A, and 74A should be embedded. Next, by anisotropic deep RIE (Reactive Ion Etching) using the first insulating film 33A as a hard mask, specifically, by a Bosch process, the semiconductor substrate 2A is dug. Accordingly, trenches are formed in the semiconductor substrate 2A. In the Bosch process, a step of etching the semiconductor substrate 2A by using $SF_6$ (sulfur hexafluoride) and a step of forming a protective film on the etched surfaces by using $C_4F_8$ (perfluorocyclobutane) are alternately repeated. Accordingly, the semiconductor substrate 2A can be etched at a high aspect ratio, however, a wavy irregularity called scallop is formed on the etched surfaces (inner peripheral surfaces of the trenches). Subsequently, the insides of the trenches formed in the semiconductor substrate 2A and the surface of the semiconductor substrate 2A are thermally oxidized (for example, temperature: 1100 to 1200° C.), and then, the surface of the oxide film is etched back (for example, the film thickness after etching back is 21800 Å). Accordingly, the insulating layers 68A, 69A, 73A, and 74A filling the trenches are formed (only the insulating layer 74A is shown).

Next, as shown in FIG. 7B, by a CVD method, the second insulating film 34A made of silicon oxide is laminated on the semiconductor substrate 2A. Next, the second insulating film 34A and the first insulating film 33A are successively etched. Accordingly, contact holes are formed in the second insulating film 34A and the first insulating film 33A. Next, contact plugs filling the contact holes are formed, and by sputtering, aluminum is deposited (for example, 7000 Å) on the second insulating film 34A, and the aluminum deposit layer is patterned. Accordingly, the wirings 75A to 78A are formed on the second insulating film 34A.

Next, as shown in FIG. 7C, by a CVD method, the third insulating film 36A, the fourth insulating film 37A, the fifth insulating film 38A, and the surface protective film 39A are laminated in order on the second insulating film 34A. Next, the third to fifth insulating films 36A to 38A and the surface protective film 39A on the region in which the cavity 10A of the semiconductor substrate 2A should be formed are removed by etching.

Figure 7D:
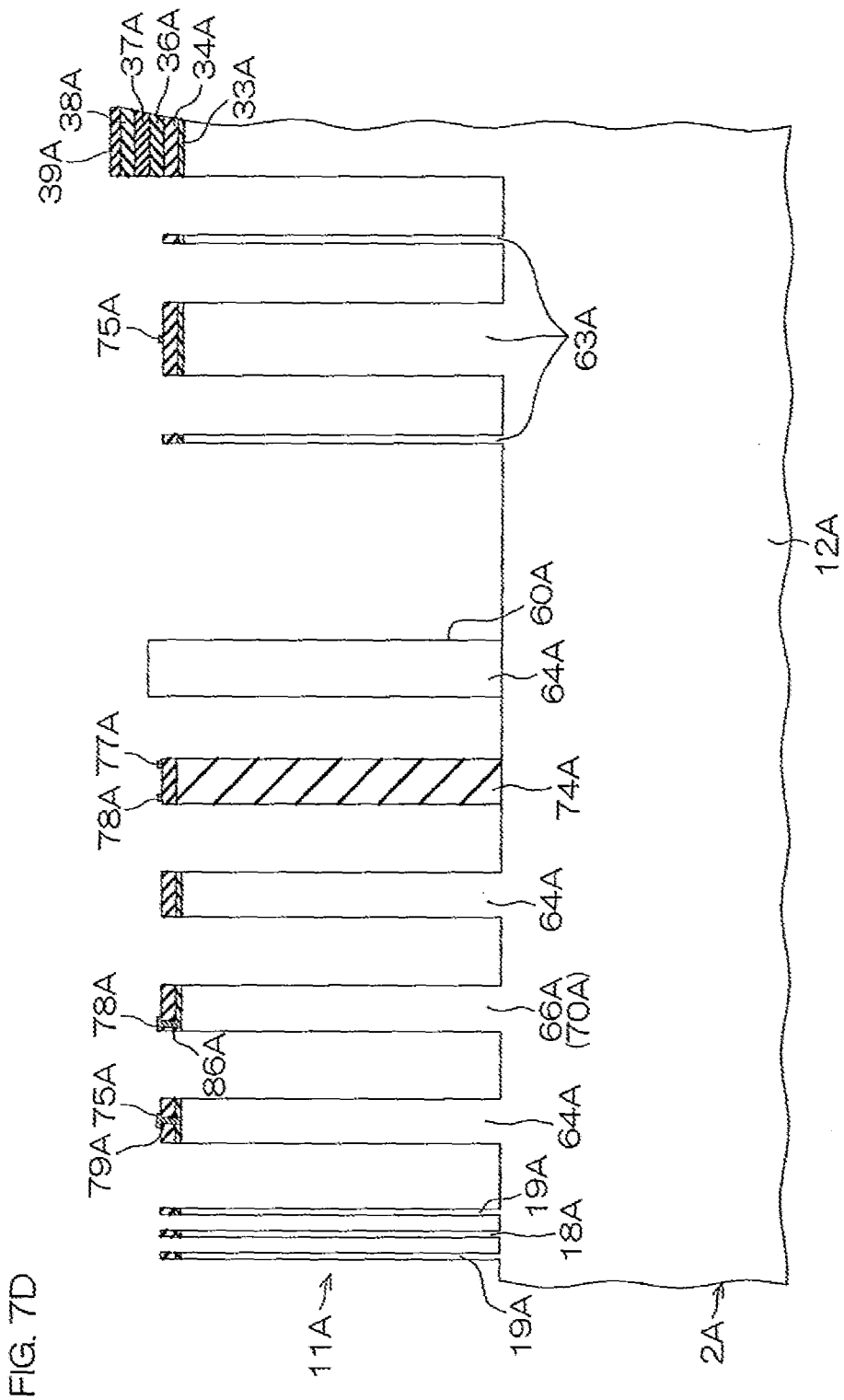

Next, as shown in FIG. 7D, a resist having openings in regions other than the regions in which the Z fixed electrode 61A and the Z movable electrode 62A should be formed is formed on the second insulating film 34A. Subsequently, by anisotropic deep RIE using this resist as a mask, specifically, by a Bosch process, the semiconductor substrate 2A is dug. Accordingly, the surface portion of the semiconductor substrate 2A is molded into the shapes of the Z fixed electrode 61A and the Z movable electrode 62A, and between these, trenches 60A are formed. In the Bosch process, a step of etching the semiconductor substrate 2A by using $SF_6$ (sulfur hexafluoride) and a step of forming a protective film on the etched surfaces by using $C_4F_8$ (perfluorocyclobutane) are alternately repeated. After the deep RIE, the resist is stripped.

Next, as shown in FIG. 7E, by thermal oxidization or by a PECVD method, on the entire surfaces of the Z fixed electrode 61A and the Z movable electrode 62A and the entire inner surfaces of the trenches 60A (that is, the side surfaces and the bottom surfaces that define the trenches 60A), the protective thin film 35A made of silicon oxide ($SiO_2$) is formed.

Next, as shown in FIG. 7F, by etching back, the portions on the bottom surfaces of the trenches 60A of the protective thin film 35A are removed. Accordingly, the bottom surfaces of the trenches 60A are exposed.

Figure 7G:
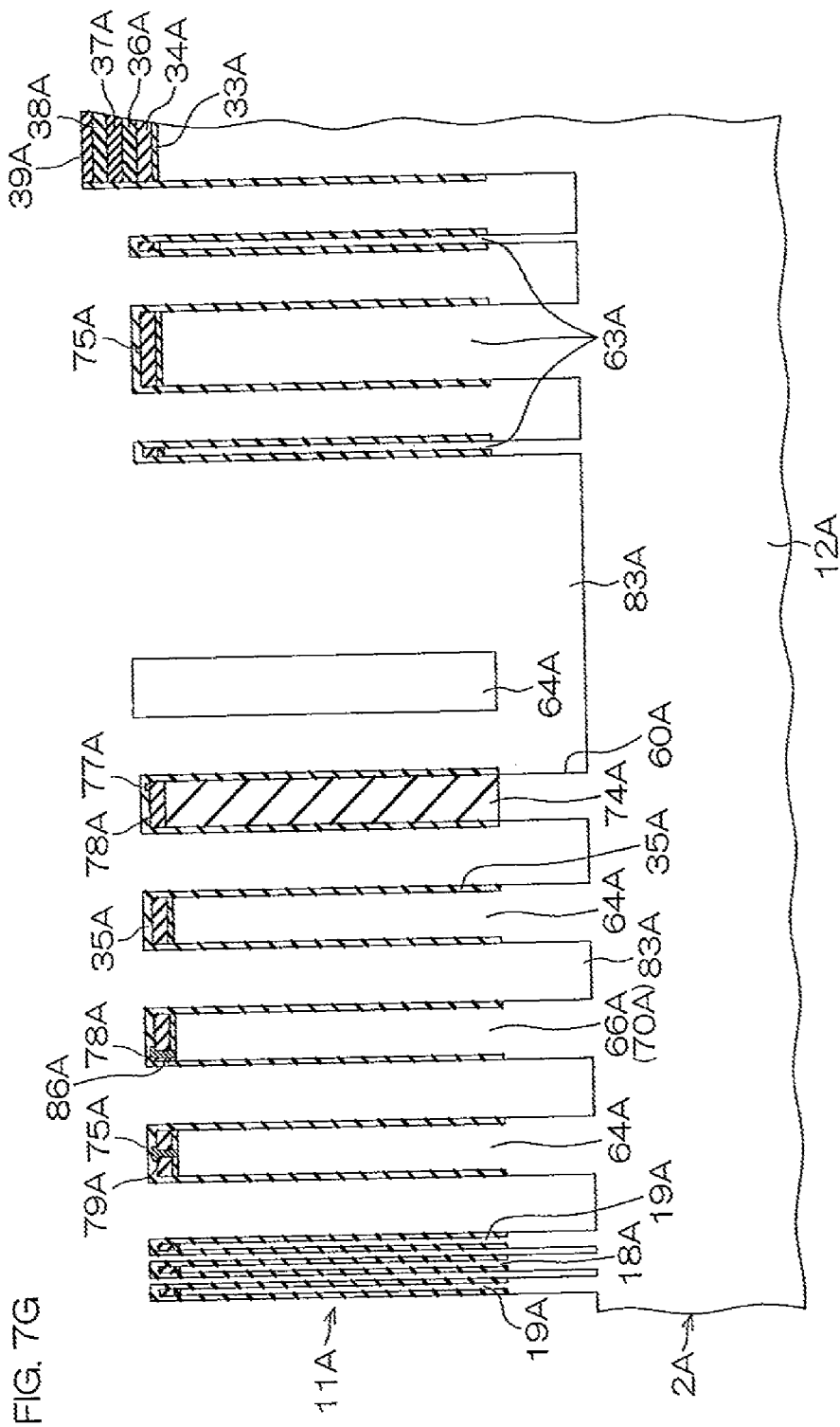

Next, as shown in FIG. 7G, by anisotropic deep RIE using the surface protective film 39A as a mask, the bottom surfaces of the trenches 60A are further dug. Accordingly, at the bottom portions of the trenches 60A, exposure spaces 83A from which the crystal face of the semiconductor substrate 2A is exposed are formed. Subsequent to this anisotropic deep RIE, by isotropic RIE, reactive ions and etching gas are supplied into the exposure spaces 83A of the trenches 60A. Then, by action of the reactive ions, etc., the semiconductor substrate 2A is etched in a direction parallel to the surface of the semiconductor substrate 2A while being etched in the thickness direction of the semiconductor substrate 2A from the exposure spaces 83A. Accordingly, all exposure spaces 83A adjacent to each other are integrated together to form the cavity 10A inside the semiconductor substrate 2A, and in the cavity 10A, the Z fixed electrode 61A and the Z movable electrode 62A float.

Through these steps, the gyro sensor 1A (Z-axis sensor 7A) shown in FIG. 1 is obtained.

The first preferred embodiment of the present invention is described above, however the present invention can also be carried out in other embodiments.

Figure 8:
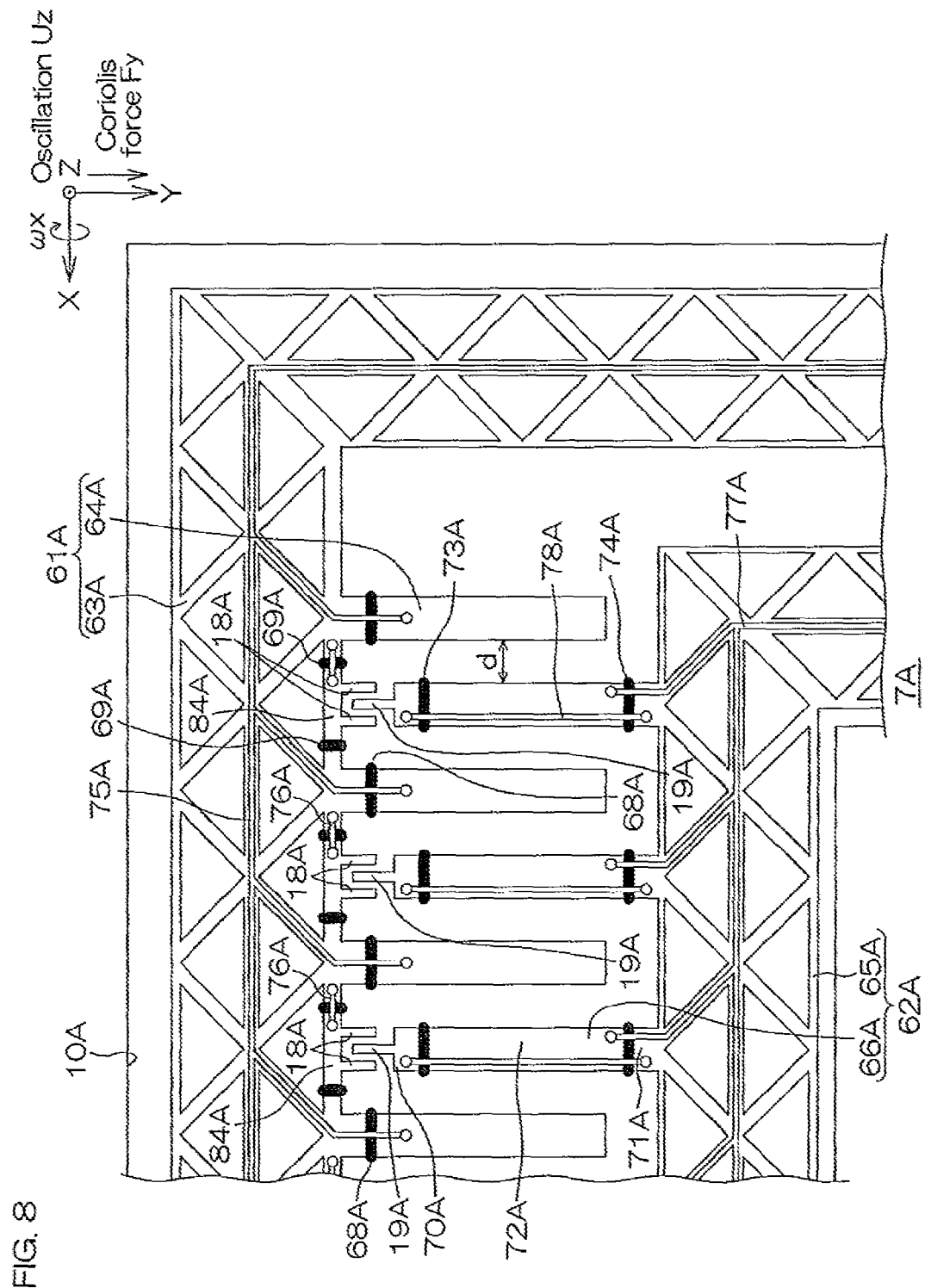
FIG. 8 is a view showing an exemplary variation of first drive portions and second drive portions shown in FIG. 5.

For example, as long as the first drive portions 18A and the second drive portions 19A engage with each other at an interval, as shown in FIG. 8, they may be arranged so that the first drive portions 18A are aligned like comb teeth and the second drive portions 19A are disposed between the comb teeth, or both the first drive portions 18A and the second drive portions 19A are aligned like comb teeth.

(2) Second Preferred Embodiment

<Entire Arrangement of Acceleration Sensor>

Figure 9:
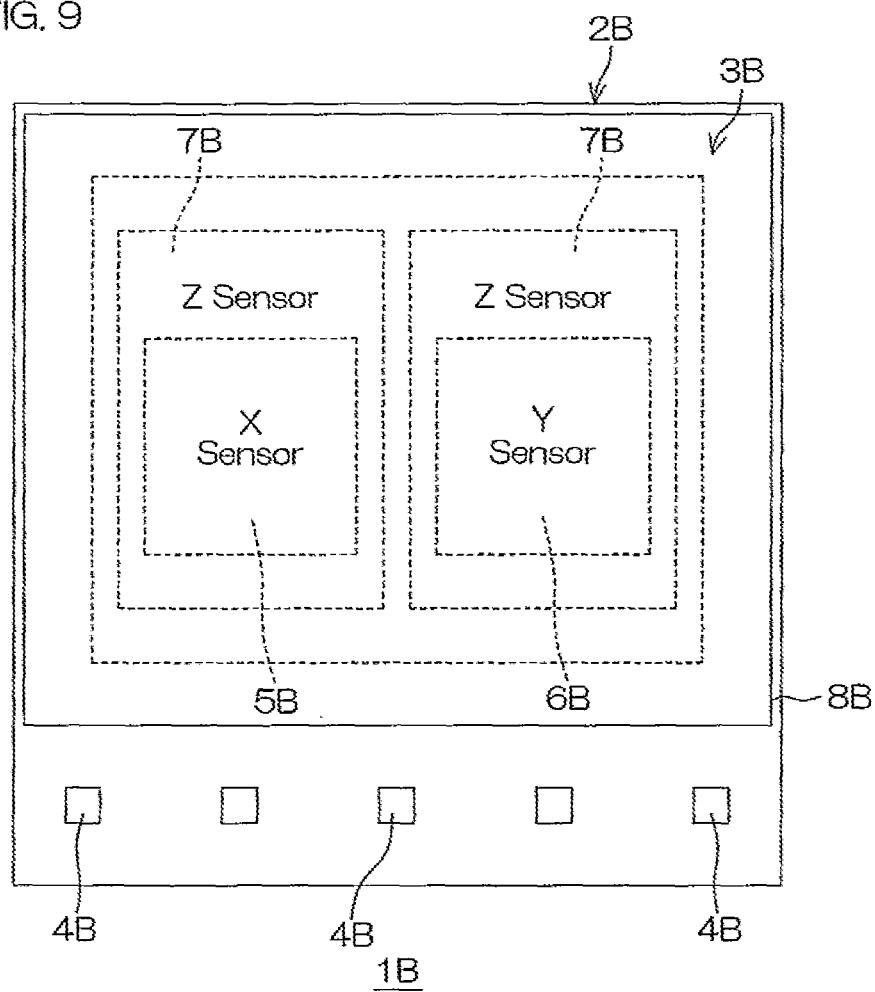
FIG. 9 is a schematic plan view of an acceleration sensor according to a second preferred embodiment of the present invention.

FIG. 9 is a schematic plan view of an acceleration sensor according to a second preferred embodiment of the present invention.

The acceleration sensor 1B includes the semiconductor substrate 2B having a quadrilateral shape in a plan view, a sensor portion 3B disposed at the central portion of the semiconductor substrate 2B, and electrode pads 4B that are disposed on the lateral side of the sensor portion 3B of the semiconductor substrate 2B and for supplying electric power to the sensor portion 3B.

The sensor portion 3B includes an X-axis sensor 5B, a Y-axis sensor 6B, and Z-axis sensors 7B as sensors that detect accelerations applied in directions along three axes orthogonal to each other in a three-dimensional space. In the present preferred embodiment, the two directions orthogonal to each other along the surface of the semiconductor substrate 2B are defined as the X-axis direction and the Y-axis direction, and a direction along the thickness direction of the semiconductor substrate 2B orthogonal to these X-axis and Y-axis directions is defined as the Z-axis direction.

These three sensors 5B to 7B are covered and sealed by a lid substrate 8B by bonding the lid substrate 8B formed of, for example, a silicon substrate to the surface of the semiconductor substrate 2B.

A plurality (five in FIG. 9) of the electrode pads 4B are provided at even intervals.

<Arrangement of X-axis Sensor and Y-axis Sensor>

Next, an arrangement of the X-axis sensor and the Y-axis sensor will be described with reference to FIG. 10 to FIG. 12.

Figure 10:
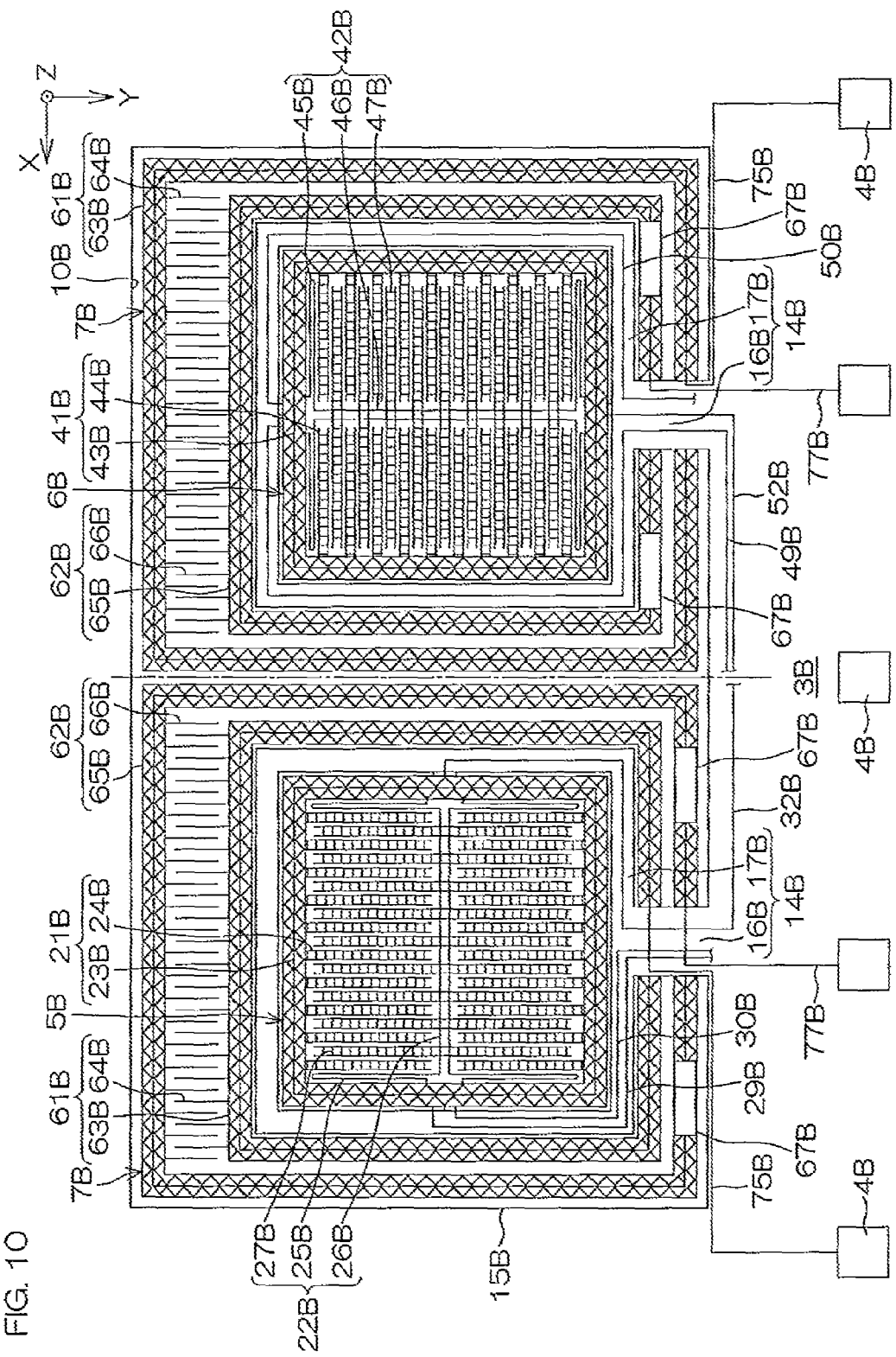
FIG. 10 is a schematic plan view of a sensor portion shown in FIG. 9.

FIG. 10 is a schematic plan view of the sensor portion shown in FIG. 9. FIG. 11 is a plan view of a principal portion of the X-axis sensor shown in FIG. 10. FIG. 12 is a sectional view of the principal portion of the X-axis sensor shown in FIG. 10, illustrating a section taken along the cutting plane C-C in FIG. 11.

The semiconductor substrate 2B is formed of a conductive silicon substrate (for example, a low-resistance substrate with resistivity of 5 Ω·m to 500 Ω·m). This semiconductor substrate 2B has a cavity 10B inside, and in the upper wall 11B (surface portion) of the semiconductor substrate 2B having a ceiling that partitions the cavity 10B from the surface side, the X-axis sensor 5B, the Y-axis sensor 6B, and the Z-axis sensors 7B are formed. Specifically, the X-axis sensor 5B, the Y-axis sensor 6B, and the Z-axis sensors 7B are formed of portions of the semiconductor substrate 2B, and are supported while in a floating state with respect to the bottom wall 12B (back surface portion) of the semiconductor substrate 2B having a bottom surface that partitions the cavity 10B from the back surface side.

The X-axis sensor 5B and the Y-axis sensor 6B are disposed adjacent to each other at an interval, and the Z-axis sensors 7B are disposed to surround the X-axis sensor 5B and the Y-axis sensor 6B, respectively. In the present preferred embodiment, the Y-axis sensor 6B has an arrangement that is substantially the same as an arrangement obtained by rotating 90 degrees the X-axis sensor 5B in a plan view. Therefore, hereinafter, instead of a detailed description of the arrangement of the Y-axis sensor 6B, in the description of the portions of the X-axis sensor 5B, portions of the Y-axis sensor corresponding to the portions of the X-axis sensor are also described with parentheses.

Between the X-axis sensor 5B and the Z-axis sensor 7B and between the Y-axis sensor 6B and the Z-axis sensor 7B, support portions 14B for supporting these in a floating state are formed. The support portions 14B integrally include straight portions 16B extending across the Z-axis sensors 7B from one side walls 15B having side surfaces that partition the cavity 10B of the semiconductor substrate 2B from the lateral sides toward the X-axis sensor 5B and the Y-axis sensor 6B, and annular portions 17B surrounding the X-axis sensor 5B and the Y-axis sensor 6B.

The X-axis sensor 5B and the Y-axis sensor 6B are disposed inside the annular portions 17B, and both ends of these sensors are supported at two points opposing each other on the inner walls of the annular portions 17B. Both ends of the Z-axis sensors 7B are supported on both side walls of the straight portions 16B.

The X-axis sensor 5B (Y-axis sensor 6B) includes an X fixed electrode 21B (Y fixed electrode 41B) fixed to the support portion 14B provided inside the cavity 10B, and an X movable electrode 22B (Y movable electrode 42B) held to be capable of oscillating with respect to the X fixed electrode 21B. The X fixed electrode 21B and the X movable electrode 22B are formed to have the same thickness.

The X fixed electrode 21B (Y fixed electrode 41B) includes a base portion 23B (base portion 43B of the Y fixed electrode 41B) that is fixed to the support portion 14B and has a quadrilateral annular shape in a plan view, and a plurality of pairs of electrode portions 24B (electrode portions 44B of the Y fixed electrode 41B) aligned like comb teeth at even intervals along the inner wall of the base portion 23B.

The X movable electrode 22B (Y movable electrode 42B) includes a base portion 26B (base portion 46B of the Y movable electrode 42B) that extends in a direction across the electrode portions 24B of the X fixed electrode 21B and has both ends connected to the base portion 23B of the X fixed electrode 21B via expandable beam portions 25B (beam portions 45B of the Y-axis sensor 6B) along the direction across the electrode portions 24B, and electrode portions 27B (electrode portions 47B of the Y movable electrode 42B) that extend from the base portion 26B to both sides toward the portions between the electrode portions 24B adjacent to each other of the X fixed electrode 21B, and are aligned like comb teeth that engage with the electrode portions 24B of the X fixed electrode 21B without contact.

In the X-axis sensor 5B, when the beam portions 25B expand and contract and the base portion 26B of the X movable electrode 22B oscillates along the surface of the semiconductor substrate 2B (oscillation Ux), and accordingly, the electrode portions 27B of the X movable electrode 22B that engage with the electrode portions 24B of the X fixed electrode 21B like comb teeth oscillate alternately in directions approaching and away from the electrode portions 24B of the X fixed electrode 21B.

The base portion 23B of the X fixed electrode 21B has a truss-shaped framed structure including straight main frames extending parallel to each other and reinforcing frames combined with the main frames so that a triangular space is repeatedly formed along the main frames.

As the electrode portions 24B of the X fixed electrode 21B, two electrode portions straight in a plan view that have base end portions connected to the base portion 23B and tip end portions thereof opposed to each other are paired, and a plurality of the pairs are provided at even intervals. Each electrode portion 24B has a framed structure having a ladder-like shape in a plan view including straight main frames extending parallel to each other and a plurality of traverse frames laid across the main frames.

The base portion 26B of the X movable electrode 22B is formed by a plurality (six in the present preferred embodiment) of straight frames extending parallel to each other, and both ends of the base portion are connected to the beam portions 25B. Two beam portions 25B are provided on each of the ends of the base portion 26B of the X movable electrode 22B.

Each electrode portion 27B of the X movable electrode 22B has a framed structure having a ladder-like shape in a plan view including straight main frames extending parallel to each other across the frames of the base portion 26B and a plurality of traverse frames laid across the main frames.

In the X movable electrode 22B, on lines halving the electrode portions 27B in a direction orthogonal to the oscillation direction Ux, insulating layers 28B (silicon oxide in the present preferred embodiment) across the traverse frames are embedded from the surface to the cavity 10B. By the insulating layer 28B, each electrode portion 27B is insulated and separated into two of one side and the other side along the oscillation direction Ux. Accordingly, the separated electrode portions 27B of the X movable electrode 22B function as independent electrodes in the X movable electrode 22B.

On the surface of the semiconductor substrate 2B including the X fixed electrode 21B and the X movable electrode 22B, a first insulating film 33B and a second insulating film 34B made of silicon oxide ($SiO_2$) are laminated in order.

On this second insulating film 34B, an X first sensor wiring 29B (Y first sensor wiring 49B) and an X second sensor wiring 30B (Y second sensor wiring 50B) are formed.

Figure 11:
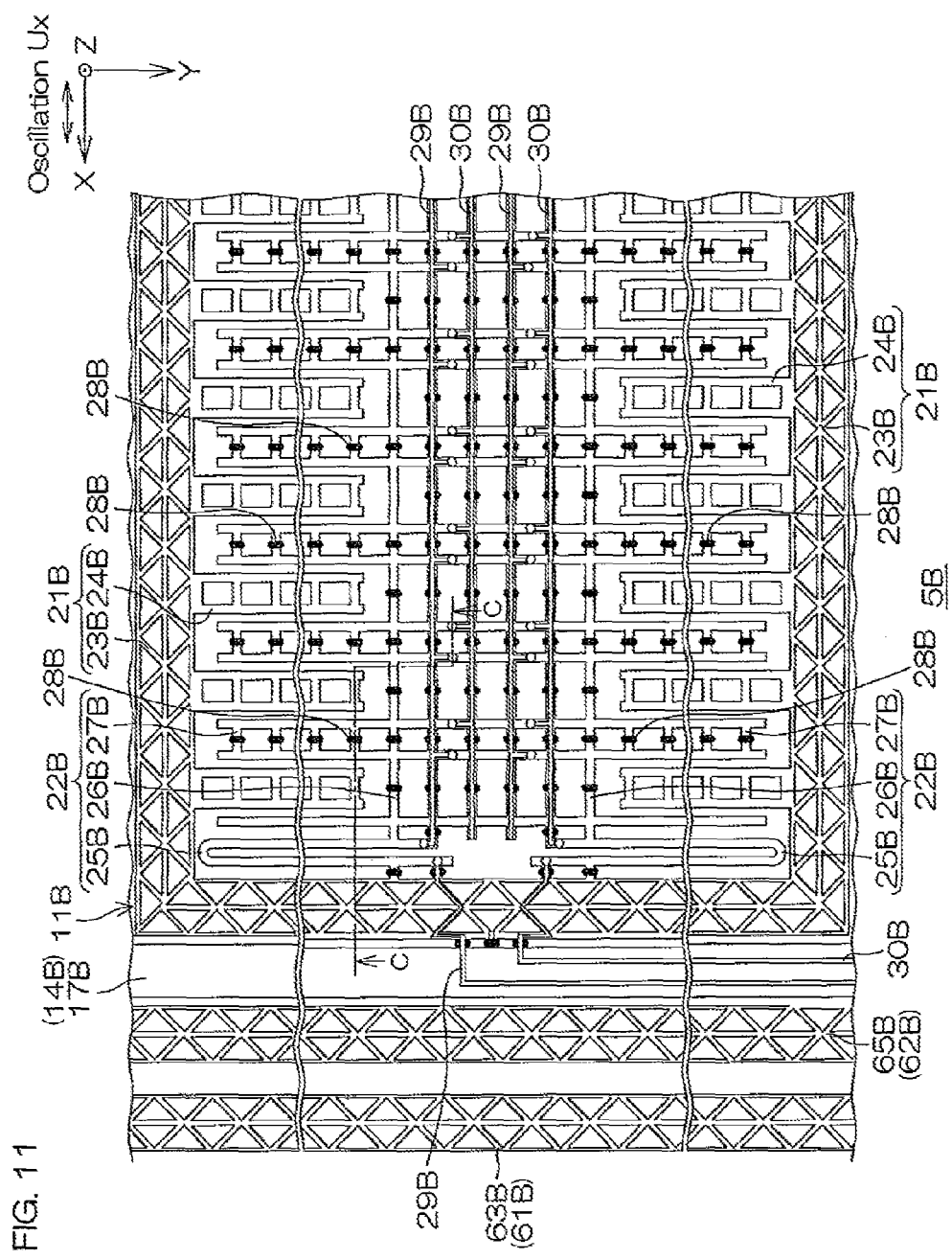
FIG. 11 is a plan view of a principal portion of an X-axis sensor shown in FIG. 10.
Figure 12:
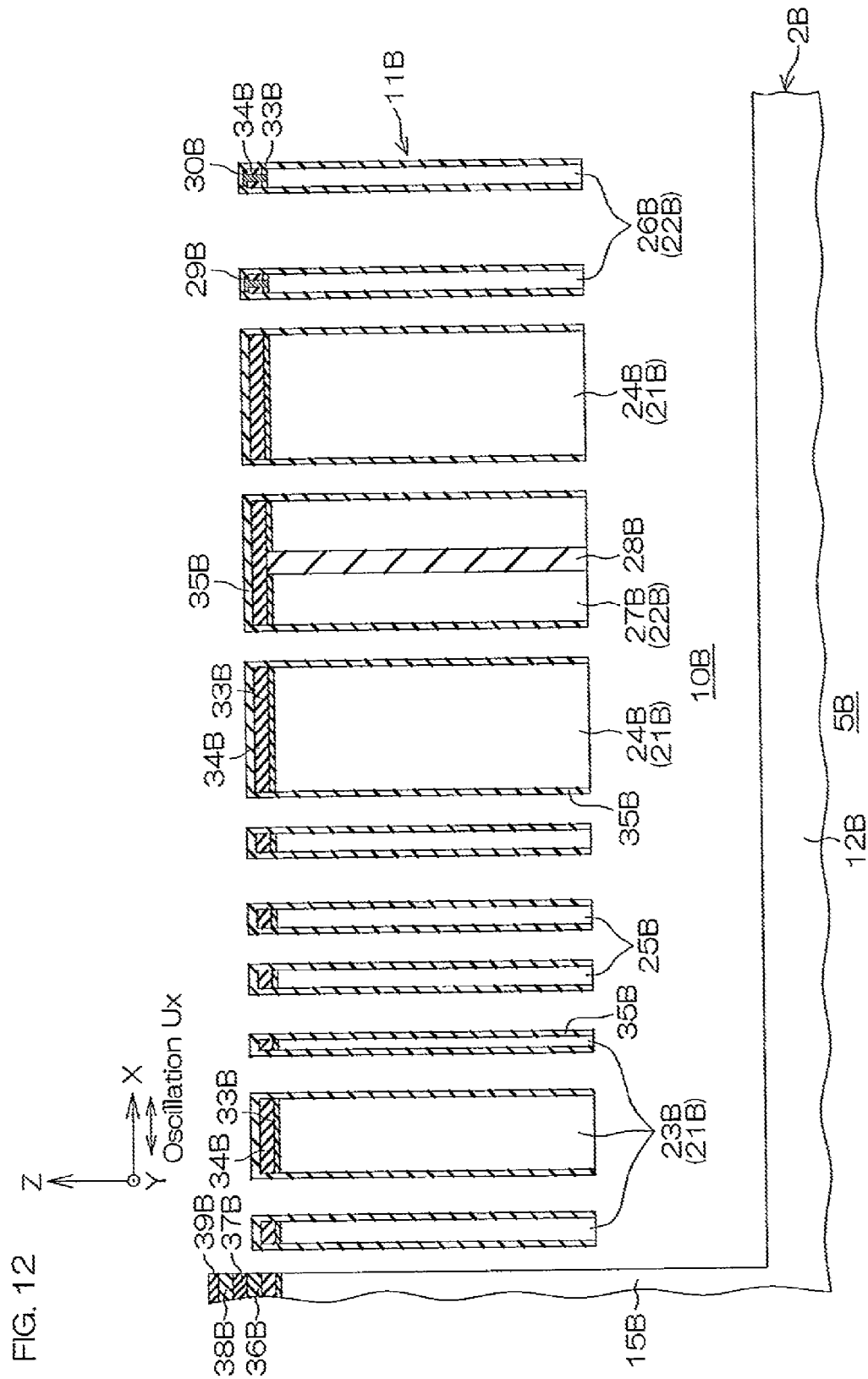
FIG. 12 is a sectional view of the principal portion of the X-axis sensor shown in FIG. 10, illustrating a section taken along the cutting plane C-C in FIG. 11.

The X first sensor wiring 29B supplies a drive voltage to one side (in the present preferred embodiment, the left side on the paper surface shown in FIG. 11) of each electrode portion 27B insulated and separated into two, and detects a change in voltage accompanying a change in capacitance from the electrode portion 27B. On the other hand, the X second sensor wiring 30B supplies a drive voltage to the other side (in the present preferred embodiment, the right side on the paper surface shown in FIG. 11) of each electrode portion 27B insulated and separated into two, and detects a change in voltage accompanying a change in capacitance from the electrode portion 27B.

The X first and X second sensor wirings 29B and 30B are made of aluminum (Al) in the present preferred embodiment. The X first and X second sensor wirings 29B and 30B are electrically connected to the electrode portions 27B by penetrating through the first and second insulating films 33B and 34B.

The X first and X second sensor wirings 29B and 30B are led onto the support portion 14B via the beam portions 25B of the X movable electrode 22B and the base portion 23B of the X fixed electrode 21B, and are partially exposed as electrode pads 4B. The X first and X second sensor wirings 29B and 30B use the beam portions 25B themselves formed of portions of the conductive semiconductor substrate 2B as current paths in sections passing through the beam portions 25B of the X movable electrode 22B. No aluminum wiring is provided on the beam portions 25B, so that the expandability of the beam portions 25B can be maintained.

To the support portion 14B, an X third sensor wiring 32B that detects a change in voltage caused by a change in capacitance from the electrode portions 24B of the X fixed electrode 21B is led, and this X third sensor wiring 32B is also partially exposed as an electrode pad 4B (not shown) in the same manner as other wirings 29B and 30B.

On the semiconductor substrate 2B, the upper surfaces and the side surfaces of the X fixed electrode 21B and the X movable electrode 22B are coated together with the first insulating film 33B and the second insulating film 34B by a protective thin film 35B made of silicon oxide ($SiO_2$).

On portions except for the cavity 10B of the surface of the semiconductor substrate 2B, a third insulating film 36B, a fourth insulating film 37B, a fifth insulating film 38B, and a surface protective film 39B are laminated in order on the second insulating film 34B.

In the X-axis sensor 6B structured as described above, when acceleration in the X-axis direction is applied to the X movable electrode 22B, the beam portions 25B expand and contract and the base portion 26B of the X movable electrode 22B oscillates along the surface of the semiconductor substrate 2B, and accordingly, the electrode portions 27B of the X movable electrode 22B that engage with the electrode portions 24B of the X fixed electrode 21B like comb teeth oscillate alternately in directions approaching and away from the electrode portions 24B of the X fixed electrode 21B. Accordingly, the opposing distance dx between the electrode portions 24B of the X fixed electrode 21B and the electrode portions 27B of the X movable electrode 22B adjacent to each other changes. Then, by detecting a change in capacitance between the X movable electrode 22B and the X fixed electrode 21B caused by the change in opposing distance dx, the acceleration ax in the X-axis direction is detected.

In the present preferred embodiment, the acceleration ax in the X-axis direction is obtained by calculating a difference between detection values of the electrode portions on one side and the other side insulated and separated from each other of the X movable electrode 22B.

In the Y-axis sensor 7B, when acceleration in the Y-axis direction is applied to the Y movable electrode 42B, the beam portions 45B expand and contract and the base portion 46B of the Y movable electrode 42B oscillates along the surface of the semiconductor substrate 2B, and accordingly, the electrode portions 47B of the Y movable electrode 42B that engage with the electrode portions 44B of the Y fixed electrode 41B like comb teeth oscillate alternately in directions approaching and away from the electrode portions 44B of the Y fixed electrode 41B. Accordingly, the opposing distance between the electrode portions 44B of the Y fixed electrode 41B and the electrode portions 47B of the Y movable electrode 42B adjacent to each other changes. Then, by detecting a change in capacitance between the Y movable electrode 42B and the Y fixed electrode 41B caused by the change in opposing distance, the acceleration ay in the Y-axis direction is detected.

<Arrangement of Z-axis Sensor>

Next, with reference to FIG. 10, FIG. 13, and FIG. 14, the arrangement of the Z-axis sensor will be described.

Figure 13:
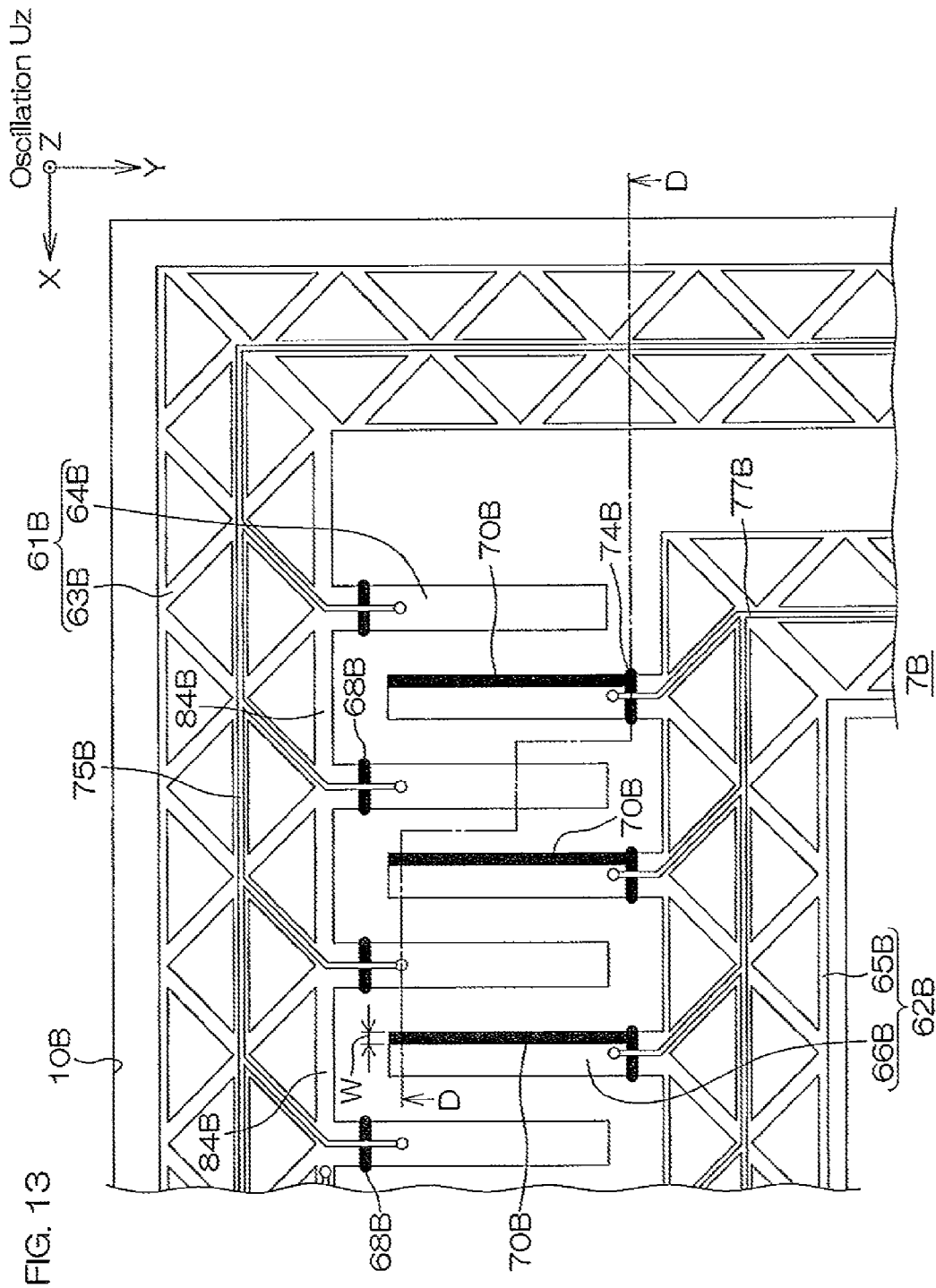
FIG. 13 is a plan view of a principal portion of a Z-axis sensor shown in FIG. 10.

FIG. 13 is a plan view of a principal portion of the Z-axis sensor shown in FIG. 10. FIG. 14 is a sectional view of the principal portion of the Z-axis sensor shown in FIG. 10, illustrating a section taken along the cutting plane D-D in FIG. 13.

Referring to FIG. 10, the semiconductor substrate 2B made of conductive silicon has the cavity 10B inside as described above. In the upper wall 11B (surface portion) of the semiconductor substrate 2B, Z-axis sensors 7B supported by the support portions 14B while in a floating state with respect to the bottom wall 12B of the semiconductor substrate 2B are disposed to surround the X-axis sensor 5B and the Y-axis sensor 6B, respectively.

Each Z-axis sensor 7B includes a Z fixed electrode 61B as a second electrode fixed to the support portion 14B (straight portion 16B) provided inside the cavity 10B, and a Z movable electrode 62B as a first electrode held to be capable of oscillating with respect to the Z fixed electrode 61B. The Z fixed electrode 61B and the Z movable electrode 62B are formed to have the same thickness.

In one Z-axis sensor 7B of these two Z-axis sensors 7B, the Z movable electrode 62B is disposed to surround the annular portion 17B of the support portion 14B, and the Z fixed electrode 61B is disposed to further surround the Z movable electrode 62B. In the other Z-axis sensor 7B, the Z fixed electrode 61B is disposed to surround the annular portion 17B of the support portion 14B, and the Z movable electrode 62B is disposed to further surround the Z fixed electrode 61B. The Z fixed electrode 61B and the Z movable electrode 62B are connected integrally to both side walls of the straight portion 16B of the support portion 14B.

The Z fixed electrode 61B includes a base portion 63B that has a quadrilateral annular shape in a plan view and is fixed to the support portion 14B, and electrode portions 64B that are provided on the portion opposite to the straight portion 16B with respect to the X-axis sensor 5B (Y-axis sensor 6B) on the base portion 63B and aligned like comb teeth.

The Z movable electrode 62B includes a base portion 65B having a quadrilateral annular shape in a plan view, and electrode portions 66B that extend from the base portion 65B toward the portions between the comb-tooth-like electrode portions 64B of the Z fixed electrode 61B adjacent to each other, and are aligned like comb teeth so as to engage with the electrode portions 64B of the Z fixed electrode 61B without contact. The base portion 65B of this Z movable electrode 62B has a truss-shaped framed structure including straight main frames extending parallel to each other and reinforcing frames combined with the main frames so that a triangular space is repeatedly formed along the main frames. The base portion 65B of the Z movable electrode 62B thus structured has sections in which the reinforcing frames are omitted at portions on the side opposite to the side of disposition of the electrode portions 66B, and the main frames in these sections function as beam portions 67B for enabling the Z movable electrode 62B to move up and down.

Specifically, in this Z-axis sensor 7B, the beam portions 67B elastically warp, and the base portion 65B of the Z movable electrode 62B turns like a pendulum in directions approaching and away from the cavity 10B around the beam portions 67B as pivot points (oscillation Uz), and accordingly, the electrode portions 66B of the Z movable electrode 62B that engage with the electrode portions 64B of the Z fixed electrode 61B like comb teeth oscillate up and down.

The base portion 63B of the Z fixed electrode 61B has a truss-shaped framed structure including straight main frames extending parallel to each other and reinforcing frames combined with the main frames so that a triangular space is repeatedly formed along the main frames.

The electrode portions 64B of the Z fixed electrode 61B have base end portions connected to the base portion 63B of the Z fixed electrode 61B and tip end portions extending toward the Z movable electrode 62B, and are aligned like comb teeth at even intervals along the inner wall of the base portion 63B. In portions close to the base end portions of the electrode portions 64B, insulating layers 68B (silicon oxide in the present preferred embodiment) are embedded from the surface to the cavity 10B across the electrode portions 64B in the width direction. By the insulating layers 68B, the electrode portions 64B of the Z fixed electrode 61B are insulated from other portions of the Z fixed electrode 61B.

The electrode portions 66B of the Z movable electrode 62B have base end portions connected to the base portion 65B of the Z movable electrode 62B and tip end portions extending toward the portions between the electrode portions 64B of the Z fixed electrode 61B, and are aligned like comb teeth engaging with the electrode portions 64B of the Z fixed electrode 61B without contact. Accordingly, one electrode portion 64B is disposed on each of one side and the other side in the width direction of each electrode portion 66B.

In portions close to the base end portions of the electrode portions 66B of the Z movable electrode 62B, insulating layers 74B (silicon oxide in the present preferred embodiment) are embedded from the surface to the cavity 10B of the semiconductor substrate 2B across the electrode portions 66B in the width direction. By the insulating layers 74B, the electrode portions 66B of the Z movable electrode 62B are insulated from other portions of the Z movable electrode 62B.

In each electrode portion 66B, from the surface of the semiconductor substrate 2B to a point halfway in the thickness direction to the cavity 10B, a dielectric layer 70B (silicon oxide in the present preferred embodiment) is embedded.

Each dielectric layer 70B is provided one-sided to one end side in the width direction of the electrode portion 66B (the right side in a direction from the base end portion toward the tip end portion of each electrode portion 66B). Accordingly, each electrode portion 66B is partitioned into the dielectric layer 70B provided on one end side in the width direction and a conductive layer 80B provided on the other end side with respect to the dielectric layer 70B (the left side in a direction from the base end portion toward the tip end portion of each electrode portion 66B) in a plan view.

The conductive layer 80B is a portion formed by using a portion of the semiconductor substrate 2B on the electrode portion 66B. The conductive layer 80B integrally includes a first portion 76B formed adjacently on the other end side in the width direction to the dielectric layer 70B, and a second portion 78B formed adjacently on the cavity 10B side in the thickness direction to the dielectric layer 70B.

On the surface of the semiconductor substrate 2B including the Z fixed electrode 61B and the Z movable electrode 62B, as described above, the first insulating film 33B and the second insulating film 34B made of silicon oxide ($SiO_2$) are laminated in order.

On the second insulating film 34B, a Z first sensor wiring 75B and a Z second sensor wiring 77B are formed. The Z first sensor wiring 75B and the Z second sensor wiring 77B are respectively connected to the electrode portions 64B of the Z fixed electrode 61B and the electrode portions 66B (conductive layers 80B) of the Z movable electrode 62B adjacent to each other.

In detail, the Z first sensor wiring 75B is formed along the base portion 63B of the Z fixed electrode 61B and includes aluminum wirings branched toward the tip end portions of the electrode portions 64B across the insulating layers 68B of the electrode portions 64B of the Z fixed electrode 61B. The branched aluminum wirings are electrically connected to the tip end sides relative to the insulating layers 68B of the electrode portions 64B by penetrating through the first insulating film 33B and the second insulating film 34B. As shown in FIG. 10, the Z first sensor wiring 75B is led onto the support portion 14B via the base portion 63B of the Z fixed electrode 61B, and partially exposed as electrode pads 4B.

The Z second sensor wiring 77B is formed along the base portion 65B of the Z movable electrode 62B, and includes aluminum wirings branched toward the electrode portions 66B across the insulating layers 74B close to the base end portions of the electrode portions 66B of the Z movable electrode 62B. The branched aluminum wirings are electrically connected to the electrode portions 66B by penetrating through the first insulating film 33B and the second insulating film 34B. As shown in FIG. 10, the Z second sensor wiring 77B is led onto the support portion 14B via the base portion 65B of the Z movable electrode 62B, and partially exposed as electrode pads 4B.

On the semiconductor substrate 2B, the upper surfaces and side surfaces of the Z fixed electrode 61B and the Z movable electrode 62B are coated together with the first insulating film 33B and the second insulating film 34B by a protective thin film 35B made of silicon oxide ($SiO_2$).

On portions other than the cavity 10B on the surface of the semiconductor substrate 2B, the third insulating film 36B, the fourth insulating film 37B, the fifth insulating film 38B, and the surface protective film 39B are laminated in order on the second insulating film 34B.

In this Z-axis sensor 7B, the electrode portions 64B to which the Z first sensor wiring 75B is connected and the conductive layers 80B of the electrode portions 66B to which the Z second sensor wiring 77B is connected are opposed to each other, and constitute electrodes of a capacitor when a fixed voltage is applied between these electrodes and the capacitance changes due to a change in opposing area S.

When acceleration in the Z-axis direction is applied to the Z movable electrode 62B, the comb-tooth-like Z movable electrode 62B oscillates up and down like a pendulum similarly around the comb-tooth-like Z fixed electrode 61B as a center of oscillation along the Z-axis direction with respect to the Z fixed electrode 61B. Accordingly, the opposing area S between the electrode portions 64B of the Z fixed electrode 61B and the electrode portions 66B of the Z movable electrode 62B adjacent to each other changes. Then, by detecting a change in capacitance between the Z movable electrode 62B and the Z fixed electrode 61B caused by the change in opposing area S, the acceleration az in the Z-axis direction is detected.

In the present preferred embodiment, the conductive layer 80B of each electrode portion 66B includes a first portion 76B opposed to the electrode portion 64B of the Z fixed electrode 61B via the dielectric layer 70B and a second portion 78B opposed to the electrode portion 64B without interposition of the dielectric layer 70B therebetween.

Therefore, in the capacitor arranged by making the electrode portions 64B of the Z fixed electrode 61B and the electrode portions 66B of the Z movable electrode 62B opposed to each other, at the portion at which the first portion 76B of the conductive layer 80B and the electrode portion 64B are opposed to each other, the electrode-to-electrode distance d1 of the capacitor is larger by the width W of the dielectric layer 70B than the electrode-to-electrode distance d2 that the capacitor originally has (the distance between the second portion 78B of the conductive layer 80B and the electrode portion 64B of the Z fixed electrode 61B) (that is, d1=d2+W). Therefore, in the same capacitor, a capacitance difference can be provided.

Therefore, when the Z movable electrode 62B oscillates first to the side (upper side) away from the cavity 10B with respect to the Z fixed electrode 61B, the capacitance of the capacitor decreases at a decrease rate D1 (D1>0) based on the electrode-to-electrode distance d1 while the first portions 76B of the conductive layers 80B are opposed to the electrode portions 64B of the Z fixed electrode 61B. Thereafter, when the first portions 76B completely protrude above the Z fixed electrode 61B and only the second portions 78B of the conductive layers 80B are opposed to the electrode portions 64B of the Z fixed electrode 61B, the capacitance decreases from this timing at a decrease rate D2 (D2>0) based on the original electrode-to-electrode distance d2.

This decrease rate D2 of the capacitance is larger than the decrease rate D1 because the electrode-to-electrode distance d2 is smaller than the electrode-to-electrode distance d1 and the capacitance to decrease per unit time increases. Specifically, when the Z movable electrode 62B starts to oscillate to the upper side, the capacitance of the capacitor decreases at the first decrease rate D1 and then decreases at the second decrease rate D2 higher than the first decrease rate D1.

On the other hand, when the Z movable electrode 62B oscillates first to the side (lower side) to approach the cavity 10B with respect to the Z fixed electrode 61B, the capacitance of the capacitor decreases at the decrease rate D2 based on the electrode-to-electrode distance d2 until the second portions 78B completely protrude below the Z fixed electrode 61B. Thereafter, when the second portions 78B completely protrude below the Z fixed electrode 61B and only the first portions 76B are opposed to the electrode portions 64B of the Z fixed electrode 61B, the capacitance decreases from this timing at the decrease rate D1 based on the electrode-to-electrode distance d1. This decrease rate D1 of the capacitance is smaller than the decrease rate D2 because the electrode-to-electrode distance d1 is larger than the electrode-to-electrode distance d2 and the capacitance to decrease per unit time becomes smaller. Specifically, when the Z movable electrode 62B starts to oscillate to the lower side, the capacitance of the capacitor decreases at the second decrease rate D2 and then decreases at the first decrease rate D1 smaller than the second decrease rate D2.

Therefore, by detecting whether the capacitance of the capacitor decreases at the relatively small decrease rate D1 and then decreases at the relatively large decrease rate D2 (D1->D2) or decreases at the relatively large decrease rate D2 and then decreases at the relatively small decrease rate D1 (D2->D1), the direction in which the Z movable electrode 62B oscillated first (the direction away from the cavity 10B or the direction approaching the cavity 10B) can be easily grasped. As a result, the direction of the acceleration vector can be accurately detected, so that the detection sensitivity can be improved.

In addition, in the present preferred embodiment, each conductive layer 80B integrally includes the first portion 76B and the second portion 78B, and therefore, the conductive layers 80B are formed in the entire thickness direction from the surface to the back surface of the Z movable electrode 62B. Therefore, regardless of the direction of oscillation (upward or downward) of the Z movable electrode 62B with respect to the Z fixed electrode 61B, the opposing area S between the conductive layers 80B of the Z movable electrode 62B and the Z fixed electrode 61B decreases by necessity. In detail, when the Z movable electrode 62B oscillates to the upper side first, the opposing area between the first portions 76B of the conductive layers 80B and the electrode portions 64B of the Z fixed electrode 61B decreases, and on the other hand, when the Z movable electrode oscillates to the lower side first, the opposing area between the second portions 78B of the conductive layers 80B and the electrode portions 64B of the Z fixed electrode 61B decreases.

Accordingly, a change in capacitance can be detected immediately after the start of oscillation of the Z movable electrode 62B, so that the magnitude of the acceleration vector immediately after the start of oscillation can also be detected.

This improvement in detection sensitivity is obtained by embedding the dielectric layers 70B in the electrode portions 66B of the Z movable electrode 62B constituting the capacitor, so that the sensor structure can be prevented from becoming complicated.

Further, the semiconductor substrate 2B is a conductive silicon substrate, so that even without applying a special treatment for giving conductivity to the X fixed electrode 21B, the Y fixed electrode 41B, and the Z fixed electrode 61B, and the X movable electrode 22B, the Y movable electrode 42B, and the Z movable electrode 62B molded into predetermined shapes, the molded structures can be used as they are as electrodes. In addition, the portions except for the portions to be used as electrodes can be used as wirings (the Z first sensor wiring 75B, the Z second sensor wiring 77B, etc.).

In the present preferred embodiment, the acceleration az in the Z-axis direction can be obtained by calculating a difference between a detection value of the Z-axis sensor 7B surrounding the X-axis sensor 5B and a detection value of the Z-axis sensor 7B surrounding the Y-axis sensor 6B. For example, as shown in FIG. 10, the difference can be obtained by making the position relationship of the fixed electrode and the movable electrode of the Z-axis sensor 7B surrounding the X-axis sensor 5B opposite to the position relationship of the fixed electrode and the movable electrode of the Z-axis sensor 7B surrounding the Y-axis sensor 6B. Accordingly, the manner of oscillation of the Z movable electrode 62B differs between the pair of Z-axis sensors 7B, so that the difference occurs.

<Method for Manufacturing Acceleration Sensor 1B>

Next, the manufacturing process of the above-described acceleration sensor 1B will be described in order of steps with reference to FIG. 15A to FIG. 15G. In this paragraph, only the manufacturing process of the Z-axis sensors is shown in the drawings, and the manufacturing processes of the X-axis sensor and the Y-axis sensor are omitted, however, the manufacturing processes of the X-axis sensor and the Y-axis sensor are performed in parallel to the manufacturing process of the Z-axis sensors in the same manner as the manufacturing process of the Z-axis sensors.

Figure 14:
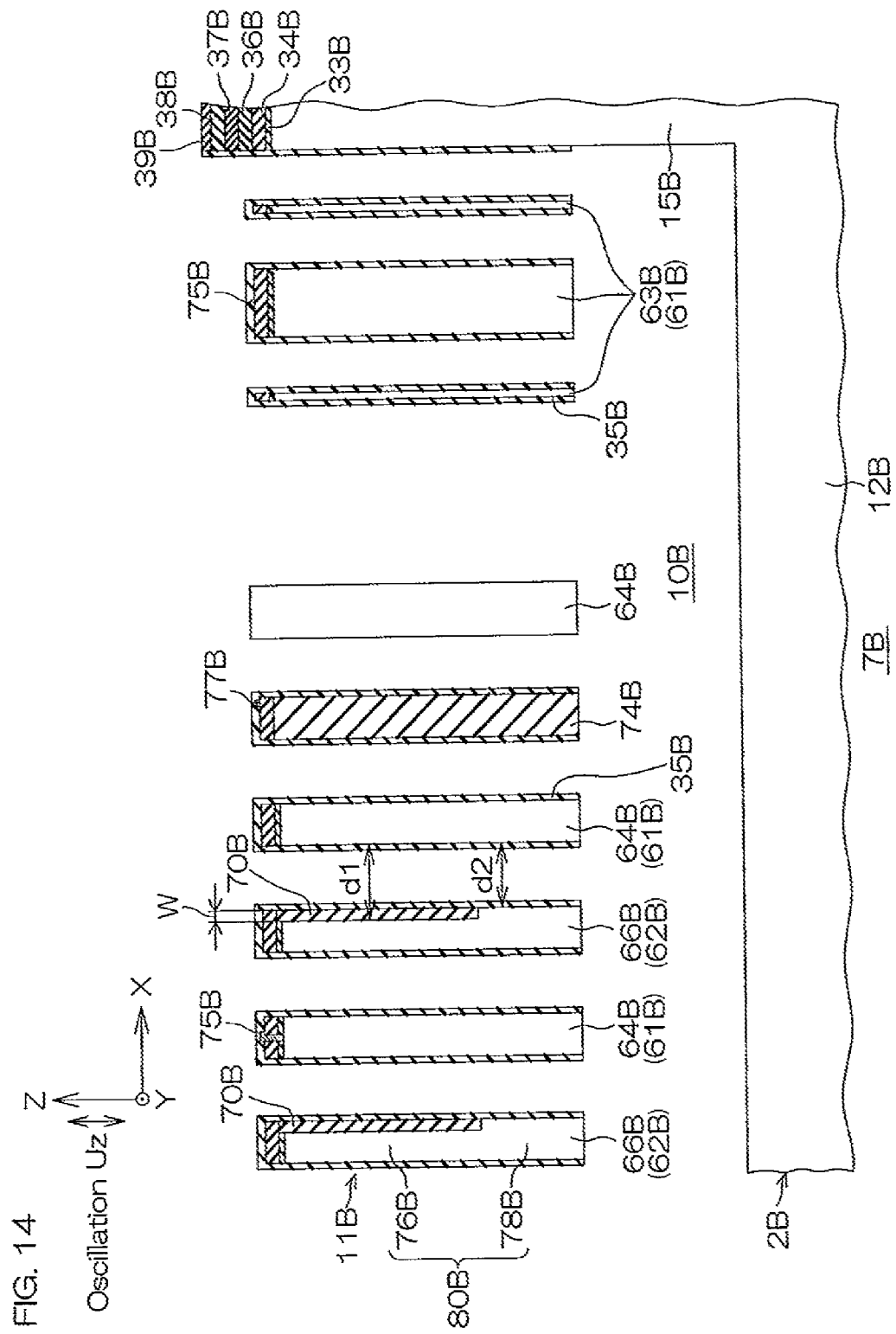
FIG. 14 is a sectional view of the principal portion of the Z-axis sensor shown in FIG. 10, illustrating a section taken along the cutting plane D-D in FIG. 13.

FIG. 15A to FIG. 15G are schematic sectional views showing parts of the manufacturing process of the acceleration sensor 1B according to the second preferred embodiment of the present invention in order of steps, illustrating a section taken along the cutting plane at the same position as in FIG. 14.

To manufacture this acceleration sensor 1B, first, as shown in FIG. 15A, the surface of the semiconductor substrate 2B made of conductive silicon is thermally oxidized (for example, temperature: 1100 to 1200° C., film thickness: 5000 Å). Accordingly, the first insulating film 33B is formed on the surface of the semiconductor substrate 2B. Next, by a known patterning technique, the first insulating film 33B is patterned, and openings in which the dielectric layers 70B and the insulating layers 68B and 74B should be embedded are formed. Next, by anisotropic deep RIE (Reactive Ion Etching) using the first insulating film 33B as a hard mask, specifically, by a Bosch process, the semiconductor substrate 2B is dug. Accordingly, trenches are formed in the semiconductor substrate 2B. In the Bosch process, a step of etching the semiconductor substrate 2B by using $SF_6$ (sulfur hexafluoride) and a step of forming a protective film on the etched surfaces by using $C_4F_8$ (perfluorocyclobutane) are alternately repeated. Accordingly, the semiconductor substrate 2B can be etched at a high aspect ratio, however, a wavy irregularity called scallop is formed on the etched surfaces (inner peripheral surfaces of the trenches). Subsequently, the insides of the trenches formed in the semiconductor substrate 2B and the surface of the semiconductor substrate 2B are thermally oxidized (for example, temperature: 1100 to 1200° C.), and then, the surface of the oxide film is etched back (for example, the film thickness after etching back is 21800 Å). Accordingly, the dielectric layers 70B and the insulating layers 68B and 74B filling the trenches are formed concurrently (only the dielectric layers 70B and the insulating layer 74B are shown).

Next, as shown in FIG. 15B, by a CVD method, the second insulating film 34B made of silicon oxide is laminated on the semiconductor substrate 2B. Next, the second insulating film 34B and the first insulating film 33B are successively etched. Accordingly, contact holes are formed in the second insulating film 34B and the first insulating film 33B. Next, contact plugs filling the contact holes are formed, and by sputtering, aluminum is deposited (for example, 7000 Å) on the second insulating film 34B, and the aluminum deposit layer is patterned. Accordingly, the wirings 75B and 77B are formed on the second insulating film 34B.

Figure 15C:
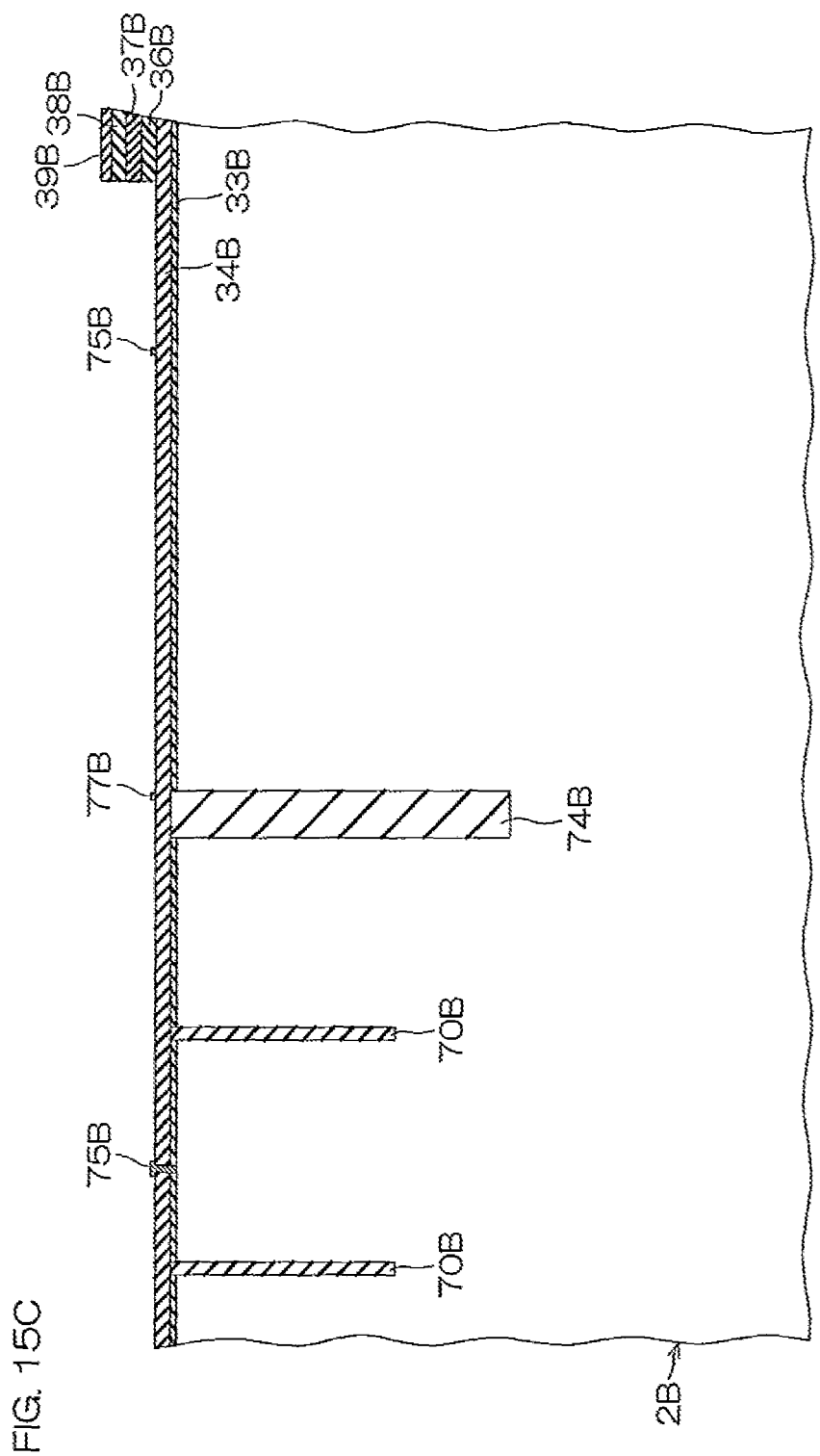

Next, as shown in FIG. 15C, by a CVD method, the third insulating film 36B, the fourth insulating film 37B, the fifth insulating film 38B, and the surface protective film 39B are laminated in order on the second insulating film 34B. Next, the third to fifth insulating films 36B to 38B and the surface protective film 39B on the region in which the cavity 10B of the semiconductor substrate 2B should be formed are removed by etching.

Figure 15D:
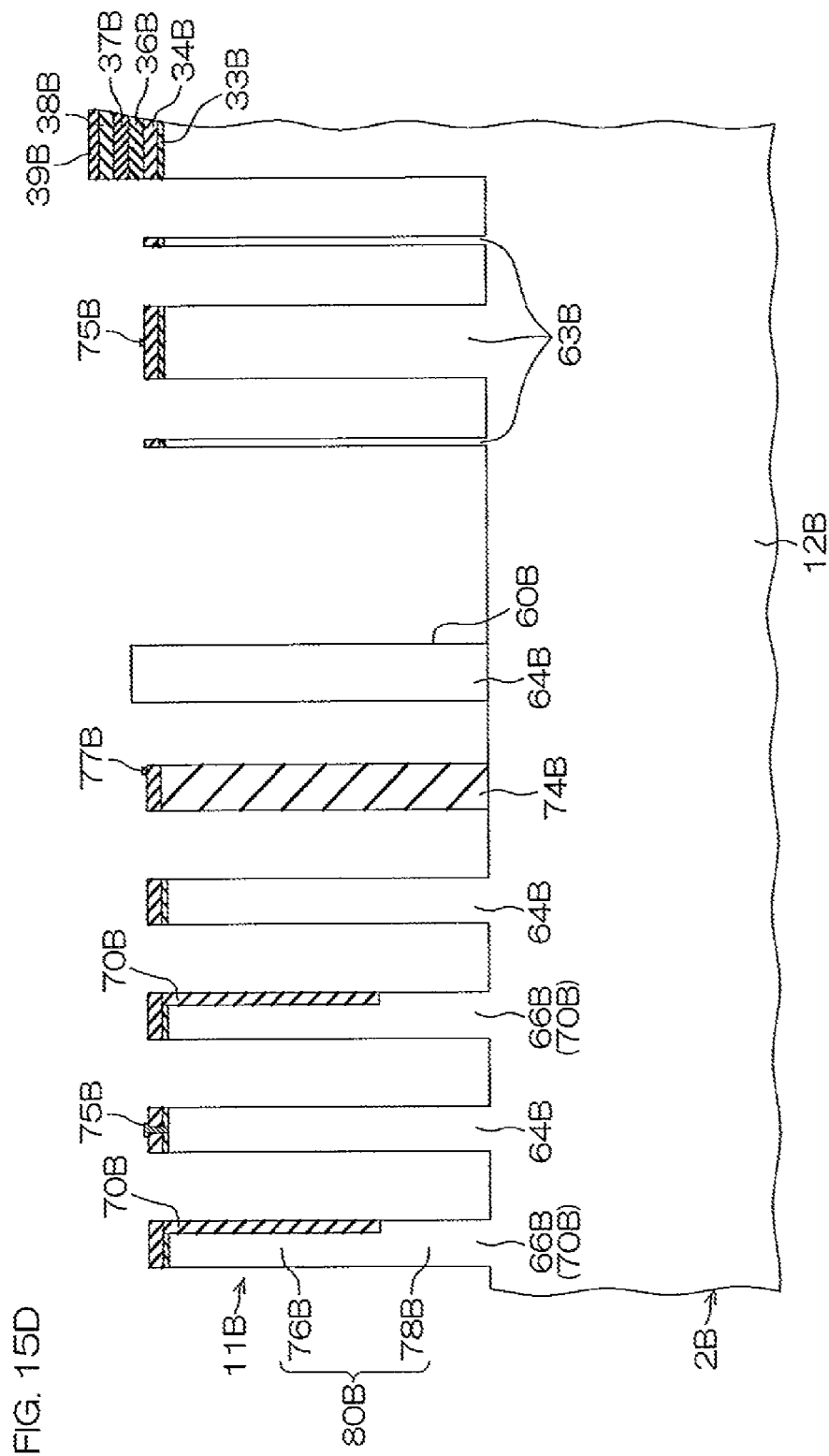

Next, as shown in FIG. 15D, a resist having openings in regions other than the regions in which the Z fixed electrode 61B and the Z movable electrode 62B should be formed is formed on the second insulating film 34B. Subsequently, by anisotropic deep RIE using this resist as a mask, specifically, by a Bosch process, the semiconductor substrate 2B is dug. Accordingly, the surface portion of the semiconductor substrate 2B is molded into the shapes of the Z fixed electrode 61B and the Z movable electrode 62B, and between these, trenches 60B are formed. In the Bosch process, a step of etching the semiconductor substrate 2B by using $SF_6$ (sulfur hexafluoride) and a step of forming a protective film on the etched surfaces by using $C_4F_8$ (perfluorocyclobutane) are alternately repeated. After the deep RIE, the resist is stripped.

Figure 15E:
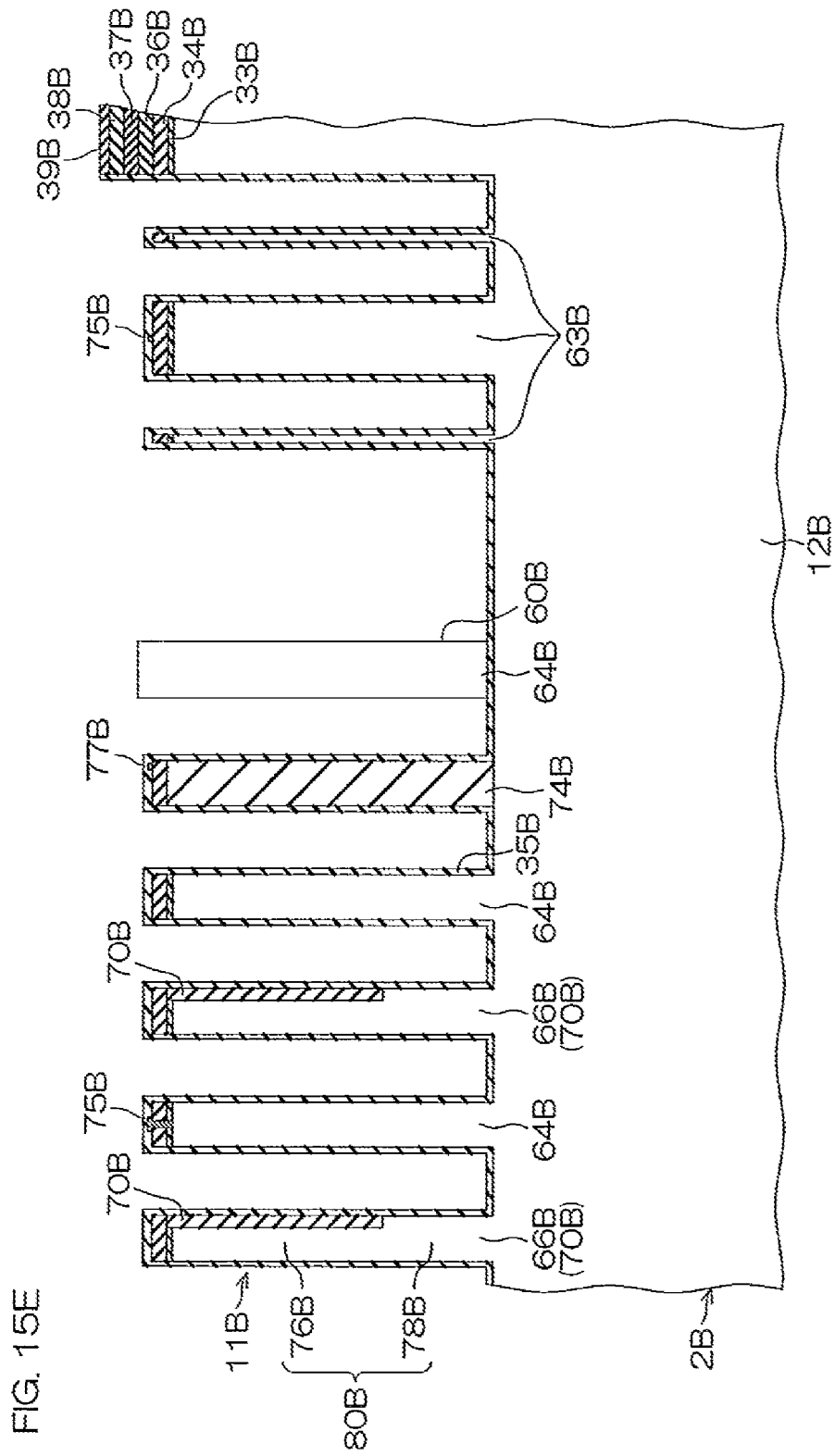

Next, as shown in FIG. 15E, by thermal oxidization or by a PECVD method, on the entire surfaces of the Z fixed electrode 61B and the Z movable electrode 62B and the entire inner surfaces of the trenches 60B (that is, the side surfaces and the bottom surfaces that define the trenches 60B), the protective thin film 35B made of silicon oxide ($SiO_2$) is formed.

Next, as shown in FIG. 15F, by etching back, the portions on the bottom surfaces of the trenches 60B of the protective thin film 35B are removed. Accordingly, the bottom surfaces of the trenches 60B are exposed.

Figure 15G:
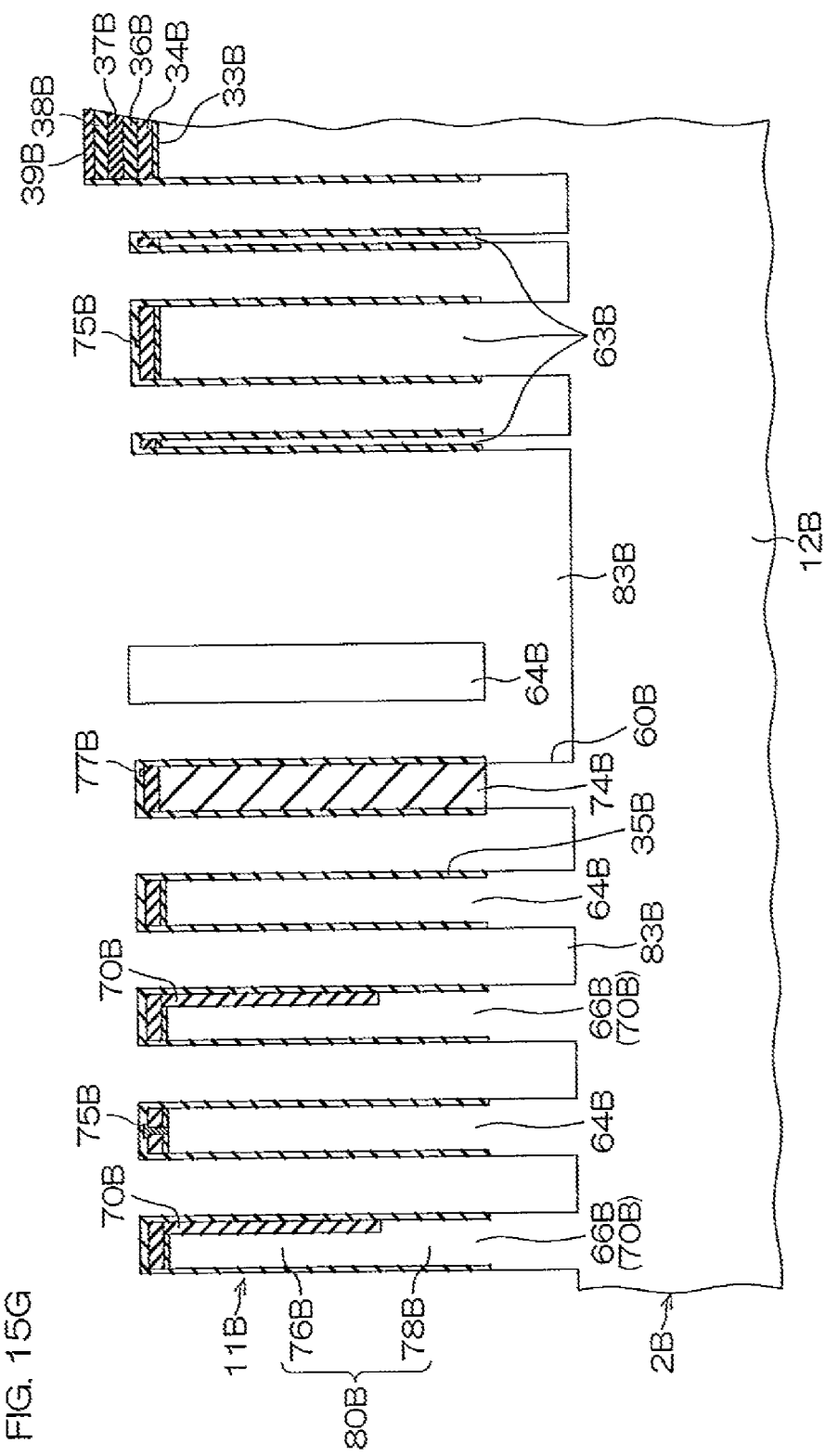

Next, as shown in FIG. 15G, by anisotropic deep RIE using the surface protective film 39B as a mask, the bottom surfaces of the trenches 60B are further dug. Accordingly, at the bottom portions of the trenches 60B, exposure spaces 83B from which the crystal face of the semiconductor substrate 2B is exposed are formed. Subsequent to this anisotropic deep RIE, by isotropic RIE, reactive ions and etching gas are supplied into the exposure spaces 83B of the trenches 60B. Then, by action of the reactive ions, etc., the semiconductor substrate 2B is etched in a direction parallel to the surface of the semiconductor substrate 2B while being etched in the thickness direction of the semiconductor substrate 2B from the exposure spaces 83B. Accordingly, all exposure spaces 83B adjacent to each other are integrated together to form the cavity 10B inside the semiconductor substrate 2B, and inside the cavity 10B, the Z fixed electrode 61B and the Z movable electrode 62B float.

Through these steps, the acceleration sensor 1B (Z-axis sensor 7B) shown in FIG. 9 is obtained.

The second preferred embodiment of the present invention is described above, however the present invention can also be carried out in other embodiments.

Figure 16:
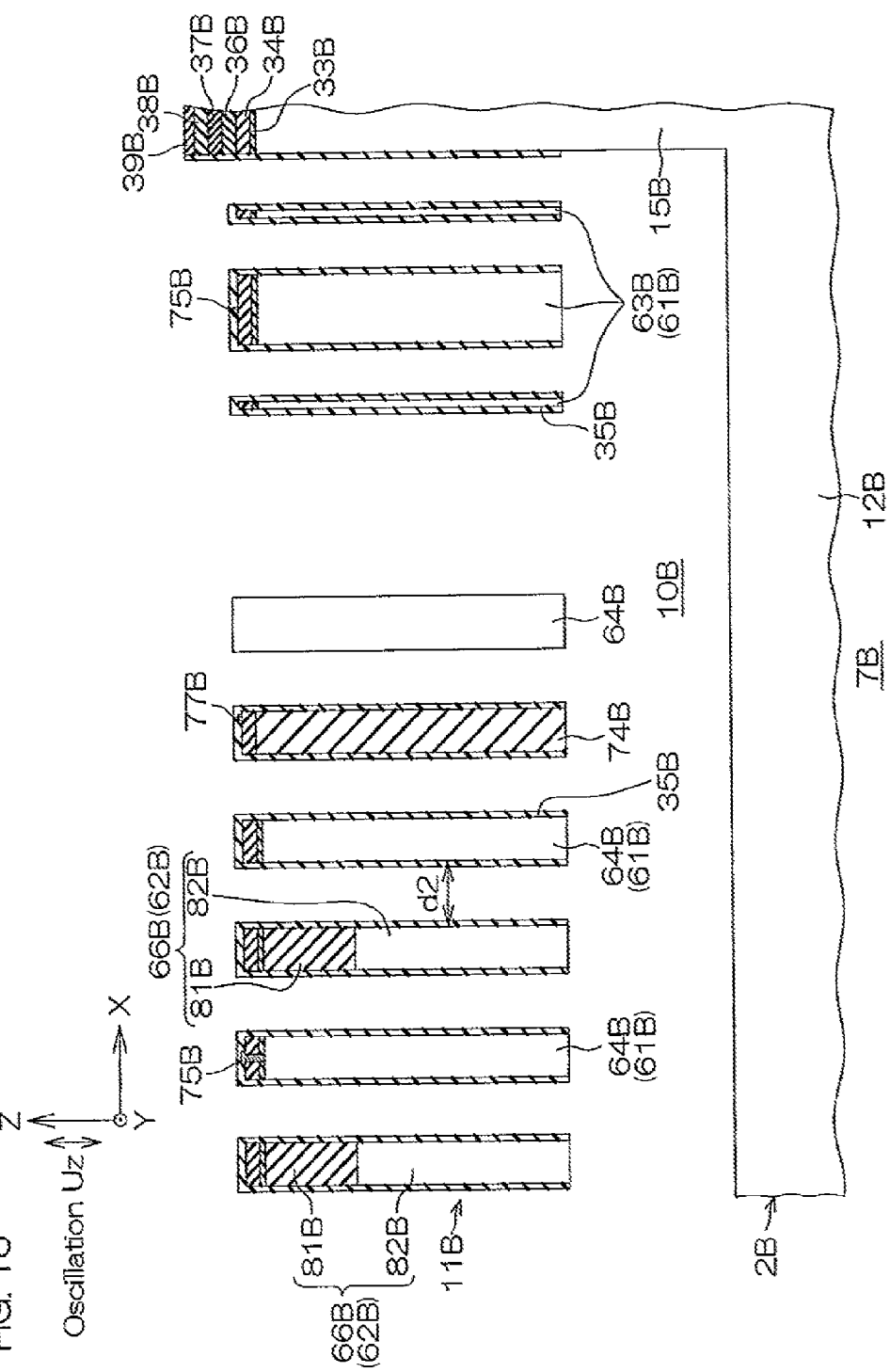
FIG. 16 is a view showing an exemplary variation of a Z movable electrode shown in FIG. 14.

For example, as shown in FIG. 16, each electrode portion 66B of the Z movable electrode 62B may have a lamination structure including a dielectric layer 81B formed from one end to the other end in the width direction of the electrode portion 66B and a conductive layer 82B formed below the dielectric layer 81B.

With the present arrangement, the portion from the surface or the back surface to a halfway point of the Z movable electrode 62B is entirely formed of the dielectric layer 81B. In this case, in the capacitor formed by making the electrode portions 64B of the Z fixed electrode 61B and the electrode portions 66B of the Z movable electrode 62B opposed to each other, at the portions at which the dielectric layers 81B and the electrode portions 64B of the Z fixed electrode 61B are opposed to each other, no conductive layer opposed to the Z fixed electrode 61B is provided, so that the capacitance becomes 0 (zero).

Therefore, when the Z movable electrode 62B oscillates first to the side (upper side) away from the cavity 10B with respect to the Z fixed electrode 61B, the capacitance of the capacitor does not change (that is, the decrease rate D1=0) while the dielectric layers 81B are opposed to the electrode portions 64B of the Z fixed electrode 61B. Thereafter, when the dielectric layers 81B completely protrude above the Z fixed electrode 61B and only the conductive layers 82B are opposed to the Z fixed electrode 61B, the capacitance decreases from this timing at the decrease rate D2 (D2>0) based on the original electrode-to-electrode distance d2.

On the other hand, when the Z movable electrode 62B oscillates first to the side (lower side) to approach the cavity 10B, the capacitance of the capacitor decreases at the decrease rate D2 based on the electrode-to-electrode distance d2 while the conductive layers 82B are opposed to the electrode portions 64B of the Z fixed electrode 61B. Thereafter, when the conductive layers 82B completely protrude below the Z fixed electrode 61B and only the dielectric layers 81B are opposed to the Z fixed electrode 61B, the capacitance does not change from this timing (that is, the decrease rate D1=0).

Therefore, with the present arrangement, the direction of the acceleration vector can be judged based on whether the decrease rate of the capacitance is 0 or not, that is, whether the capacitance changes or not. Accordingly, the acceleration can be easily detected.

The dielectric layers 70B and 81B may be made of a material other than silicon oxide as long as the material is dielectric.

Figure 17:
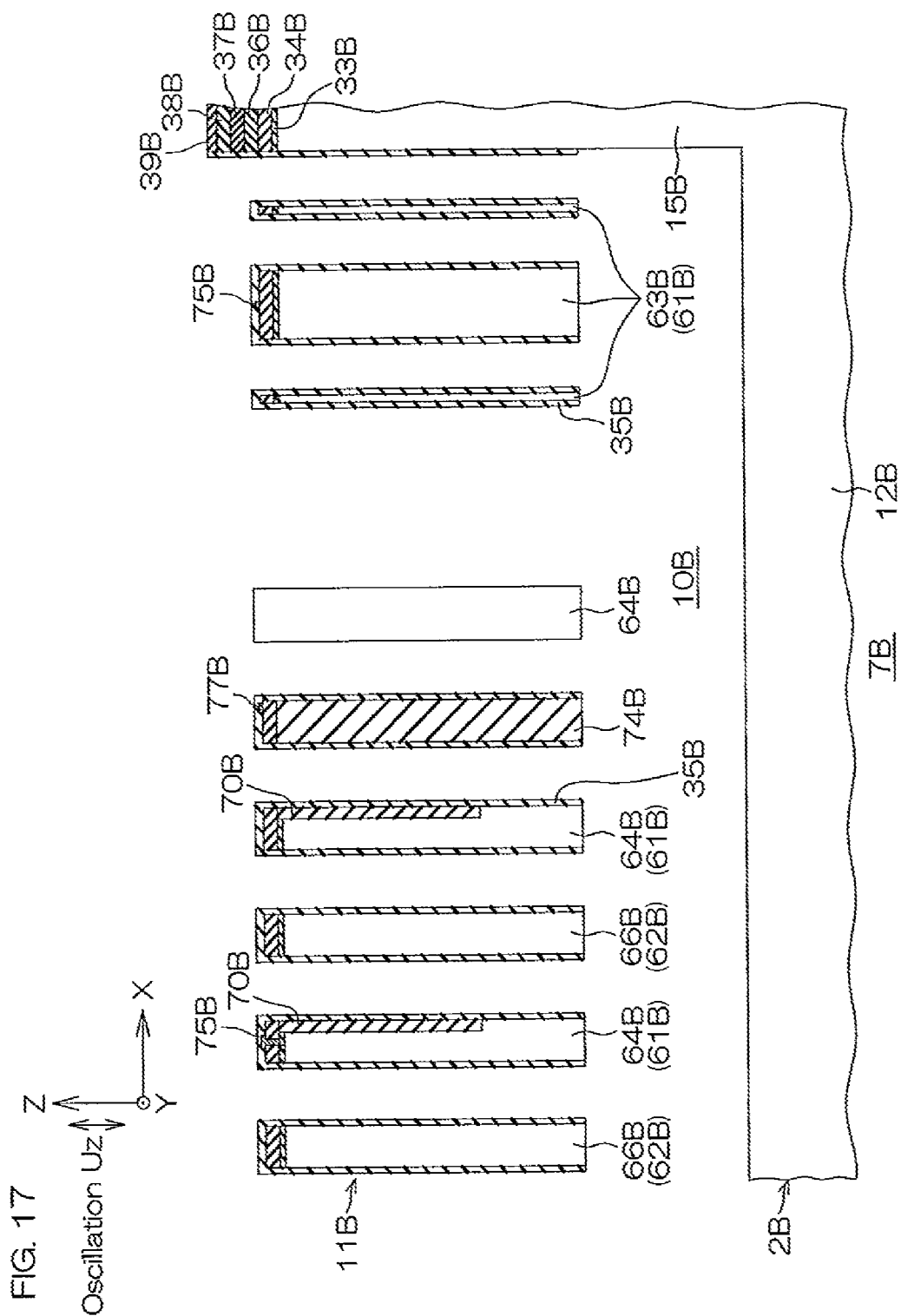
FIG. 17 is a view showing an exemplary variation of dielectric layers shown in FIG. 14.
Figure 18:
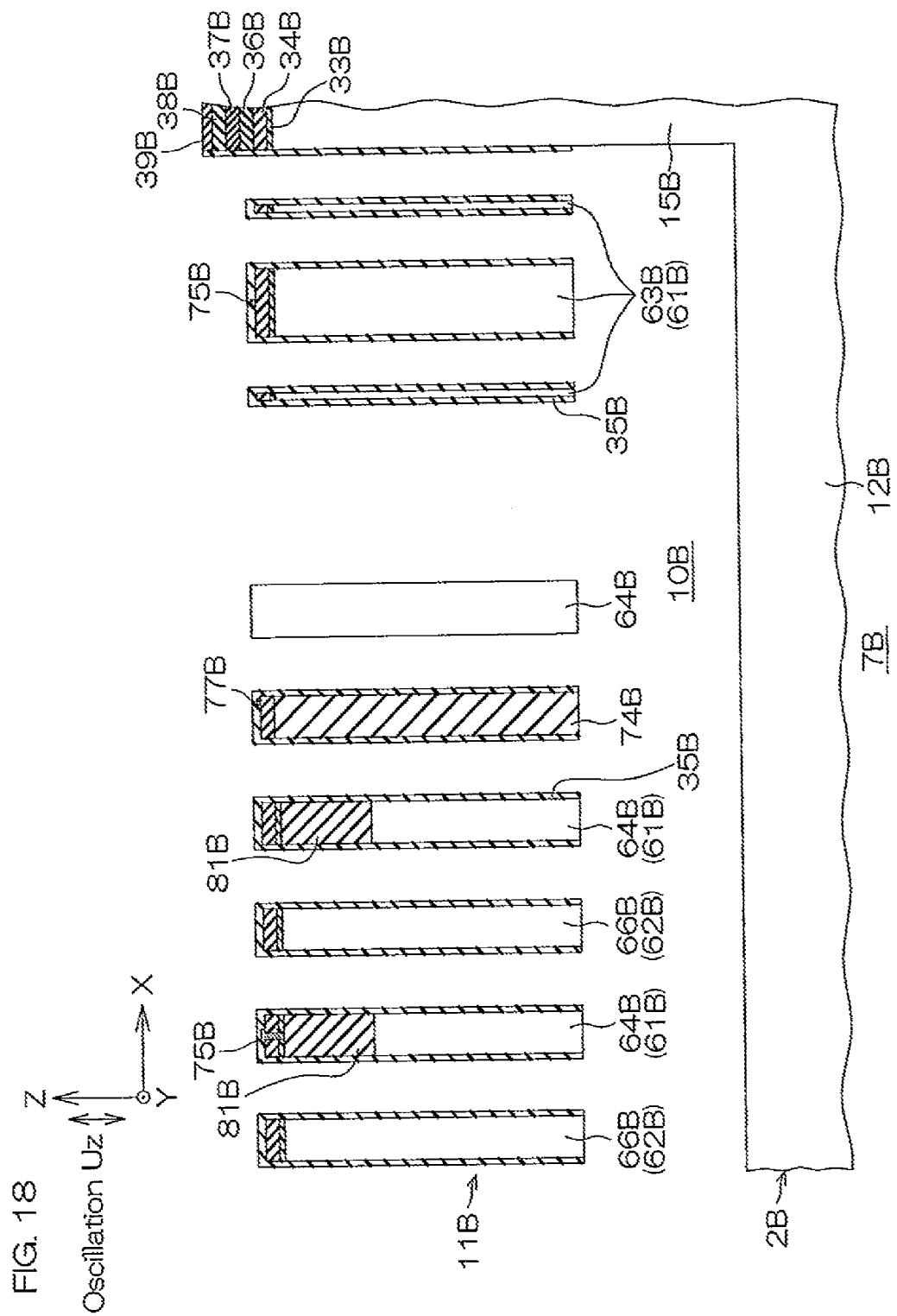
FIG. 18 is a view showing an exemplary variation of the dielectric layers shown in FIG. 16.

The dielectric layers 70B may be provided in the Z fixed electrode 61B as shown in FIG. 17 instead of in the Z movable electrode 62B. Similarly, the dielectric layers 81B may also be provided in the Z fixed electrode 61B as shown in FIG. 18 instead of in the Z movable electrode 62B.

(3) Third Preferred Embodiment
<Entire Arrangement of MEMS Package>

Figure 19:
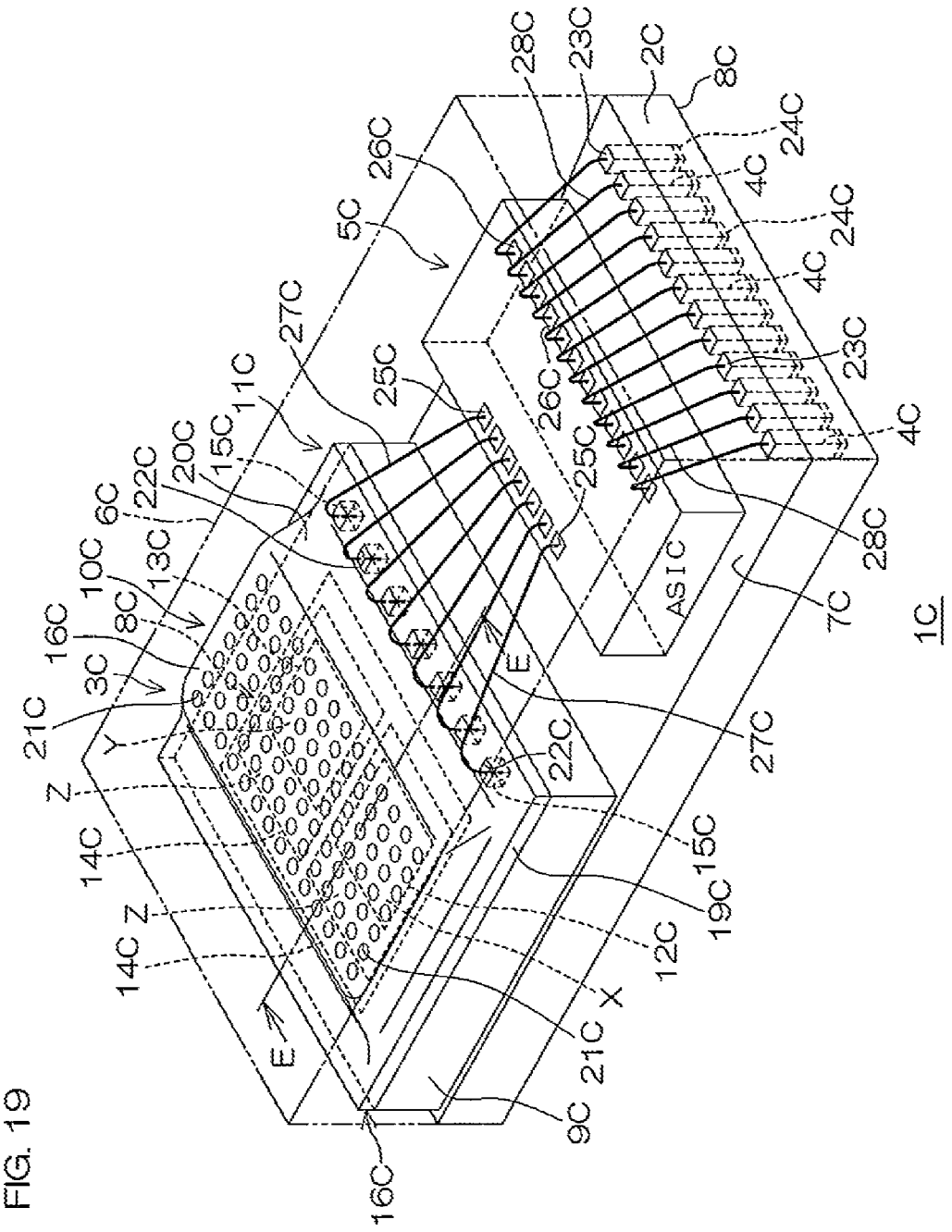
FIG. 19 is a schematic perspective view of a MEMS package according to a third preferred embodiment of the present invention.
Figure 20:
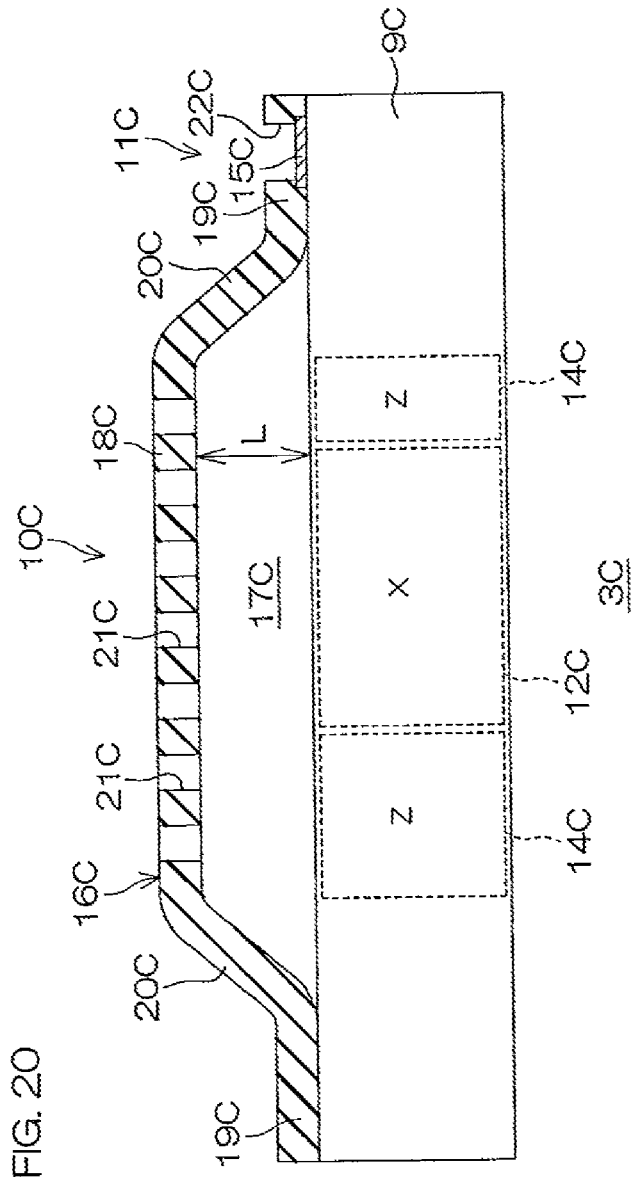
FIG. 20 is a sectional view of a principal portion of the MEMS package shown in FIG. 19, illustrating a section taken along the cutting plane E-E in FIG. 19.

FIG. 19 is a schematic perspective view of a MEMS package according to a third preferred embodiment of the present invention. FIG. 20 is a sectional view of a principal portion of the MEMS package shown in FIG. 19, illustrating a section taken along the cutting plane E-E in FIG. 19.

The MEMS package 1C includes a substrate 2C, an acceleration sensor 3C as a MEMS sensor, external terminals 4C, an integrated circuit 5C (ASIC: Application Specific Integrated Circuit), and a resin package 6C.

The substrate 2C is formed to have a rectangular plate shape having a surface 7C and a back surface 8C.

The acceleration sensor 3C is disposed on one end portion in the longitudinal direction on the surface 7C side of the substrate 2C. The acceleration sensor 3C includes a base substrate 9C as a semiconductor substrate formed of a Si substrate having a square plate shape.

The base substrate 9C has a sensor region 10C and a pad region 11C (peripheral region) surrounding the sensor region 10C.

In the sensor region 10C, as sensors that detect respective accelerations around three axes orthogonal to each other in a three-dimensional space, an X-axis sensor 12C, a Y-axis sensor 13C, and Z-axis sensors 14C are provided. In the present preferred embodiment, the two directions orthogonal to each other along the surface 7C of the substrate 2C are defined as the X-axis direction and the Y-axis direction, and a direction along the thickness direction of the substrate 2C orthogonal to these X-axis and Y-axis directions is defined as the Z-axis direction.

In the pad region 11C, electrode pads 15C for supplying voltages to the X-axis sensor 12C, the Y-axis sensor 13C, and the Z-axis sensor 14C, respectively, are formed. A plurality (seven in FIG. 19) of electrode pads 15C are provided at even intervals along the width direction orthogonal to the longitudinal direction of the substrate 2C.

The sensor region 10C and the pad region 11C are covered by a protective layer 16C made of $SiO_2$ as a first inorganic material and formed on the base substrate 9C.

The protective layer 16C is formed to have a mesa shape integrally including a flat top portion 18C (central portion) opposed to the sensor region 10C via a space 17C, a flat bottom portion 19C (peripheral edge portion) surrounding the top portion 18C and bonded to the pad region 11C, and an inclined portion 20C inclined from the entire circumference of the peripheral edge of the top portion 18C toward the bottom portion 19C. Between the top portion 18C and the bottom portion 19C of the protective layer 16C, a level difference with a predetermined height L is provided.

In the top portion 18C of the protective layer 16C, a large number of through holes 21C that make communication between the inside and the outside of the space 17C are formed in a matrix.

On the bottom portion 19C of the protective layer 16C, pad openings 22C for exposing the respective electrode pads 15C are formed as many as the electrode pads 15C. In the present preferred embodiment, the arrangement in which the bottom portion 19C of the protective layer 16C is bonded to the pad region 11C includes an idea that the bottom portion 19C of the protective layer 16C is in close contact with the surface of the base substrate 9C (meaning the uppermost surface of the base substrate 9C, and meaning the uppermost surface of an insulating film when the insulating film such as a surface protective film is formed on the base substrate 9C).

A plurality (twelve in FIG. 19) of the external terminals 4C are provided at even intervals along the width direction of the substrate 2C on the other end portion in the longitudinal direction of the substrate 2C (the end portion on the side opposite to the acceleration sensor 3C). Each external terminal 4C is formed to penetrate through the substrate 2C in the thickness direction, and is exposed as an internal pad 23C to the surface 7C of the substrate 2C, and exposed as an external pad 24C to the back surface 8C of the substrate 2C.

The integrated circuit 5C is disposed between the acceleration sensor 3C and the external terminals 4C (internal pads 23C) on the surface 7C side of the substrate 2C. The integrated circuit 5C is formed of, for example, a Si substrate having a rectangular plate shape long in the width direction of the substrate 2C. Inside the Si substrate, charge amplifiers that amplify electric signals output from the sensors 12C to 14C, filter circuits (low-pass filter: LPF, etc.) that extract specific frequency components of the electric signals, and logic circuits that carry out logic operations of filtered electric signals, etc., are formed. These circuits consist of, for example, CMOS devices. The integrated circuit 5C includes first electrode pads 25C and second electrode pads 26C.

A plurality (seven in FIG. 19) of the first electrode pads 25C are provided at even intervals along the width direction of the substrate 2C on the end portion on the side close to the acceleration sensor 3C in the longitudinal direction of the substrate 2C. The first electrode pads 25C are connected one-to-one to the electrode pads 15C of the acceleration sensor 3C by bonding wires 27C.

A plurality (twelve in FIG. 19) of the second electrode pads 26C are provided at even intervals along the width direction of the substrate 2C on an end portion on the side close to the external terminals 4C in the longitudinal direction of the substrate 2C. The second electrode pads 26C are connected one-to-one to the internal pads 23C of the external terminals 4C by bonding wires 28C.

The resin package 6C defines the external shape of the MEMS package 1C in cooperation with the substrate 2C, and is formed to have a substantially rectangular parallelepiped shape. The resin package 6C is made of, for example, a known molding resin such as epoxy resin, and seals the acceleration sensor 3C and the integrated circuit 5C so as to cover the bonding wires 27C and 28C and the internal pads 23C as well as the acceleration sensor 3C and the integrated circuit 5C, and expose the external pads 24C.

<Arrangement of X-axis Sensor and Y-axis Sensor>

Figure 22:
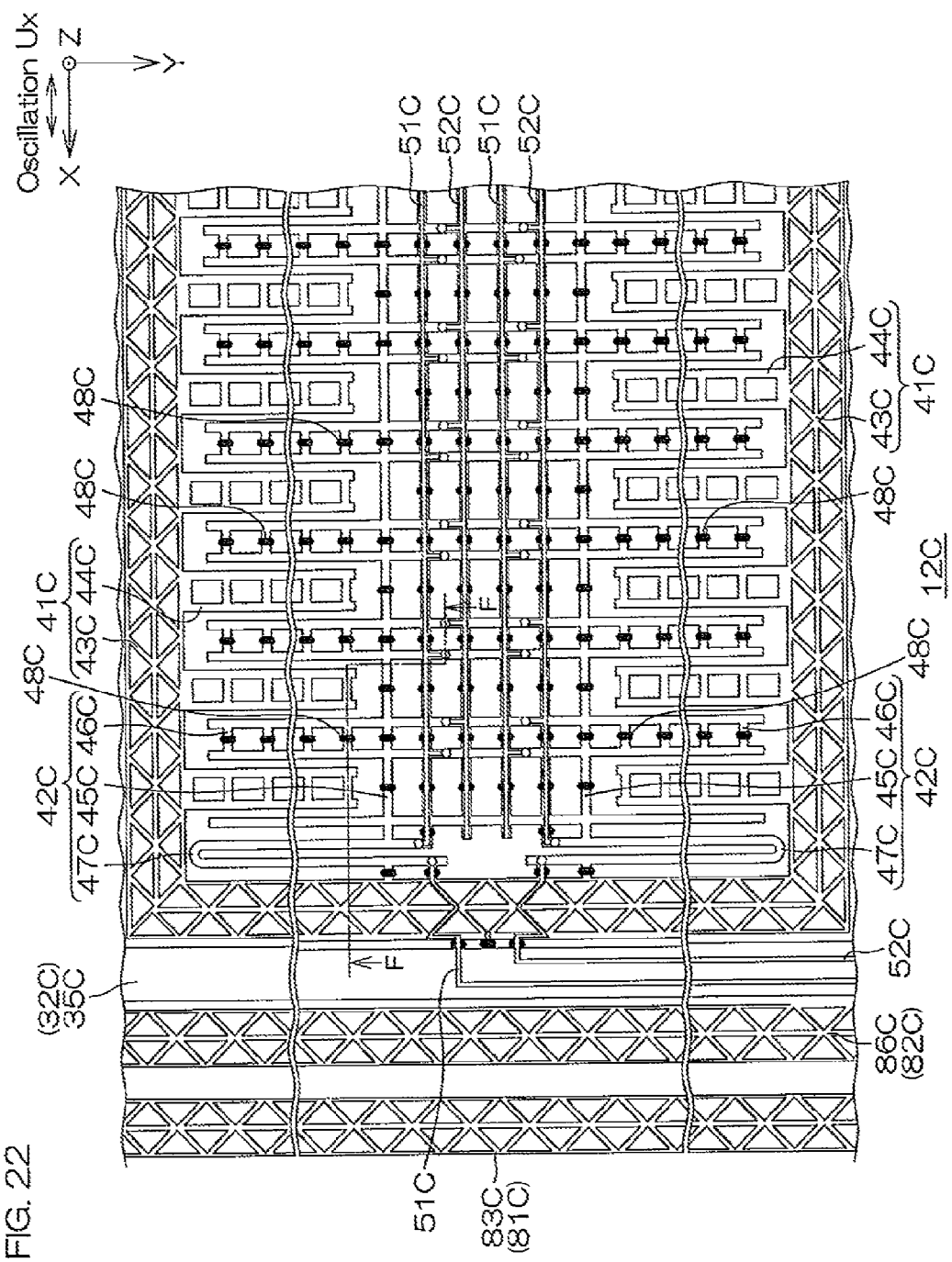
FIG. 22 is a plan view of a principal portion of an X-axis sensor shown in FIG. 21.
Figure 23:
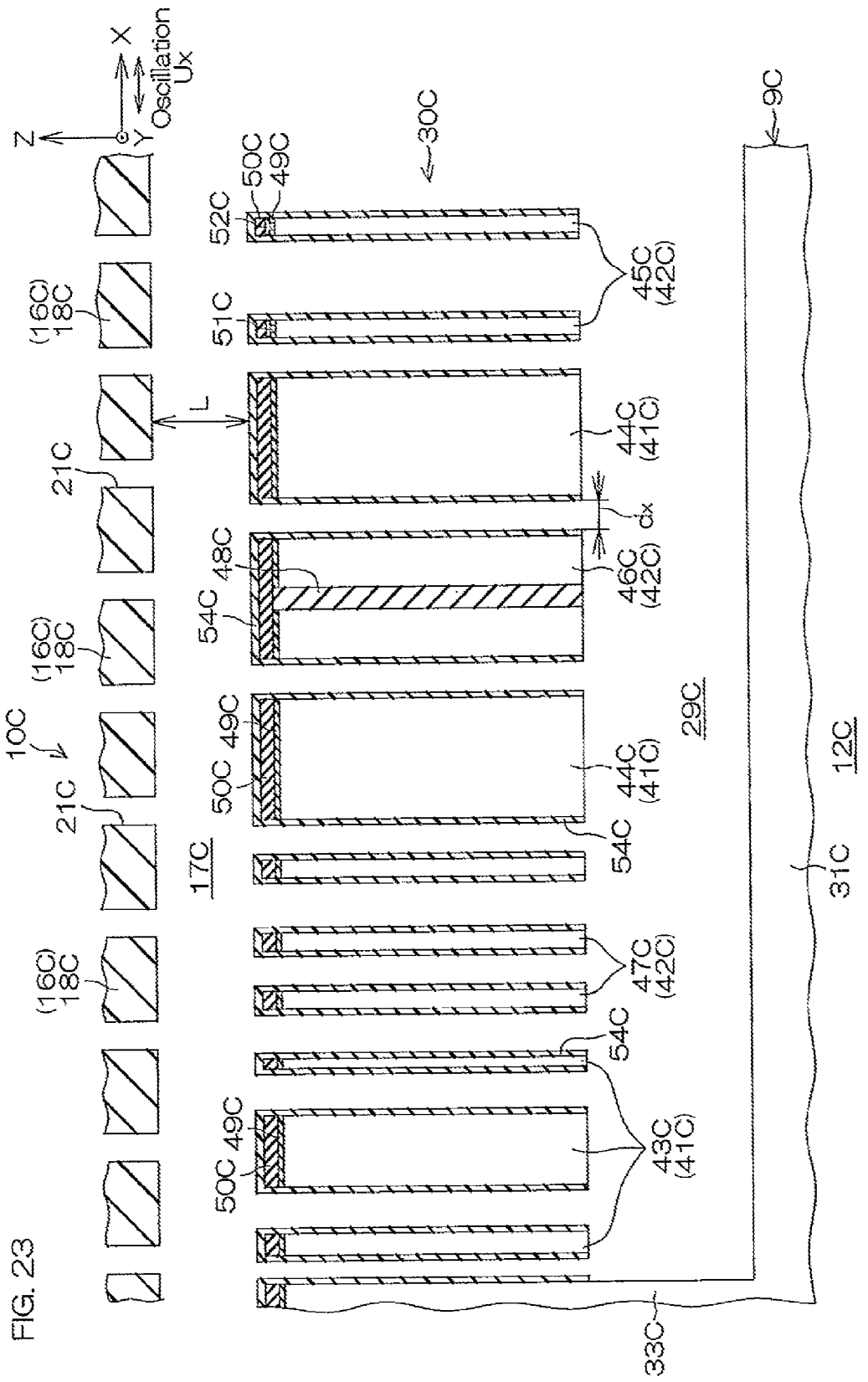
FIG. 23 is a sectional view of the principal portion of the X-axis sensor shown in FIG. 21, illustrating a section taken along the cutting plane F-F in FIG. 22.

Next, with reference to FIG. 21 to FIG. 23, the arrangement of the X-axis sensor and the Y-axis sensor will be described.

Figure 21:
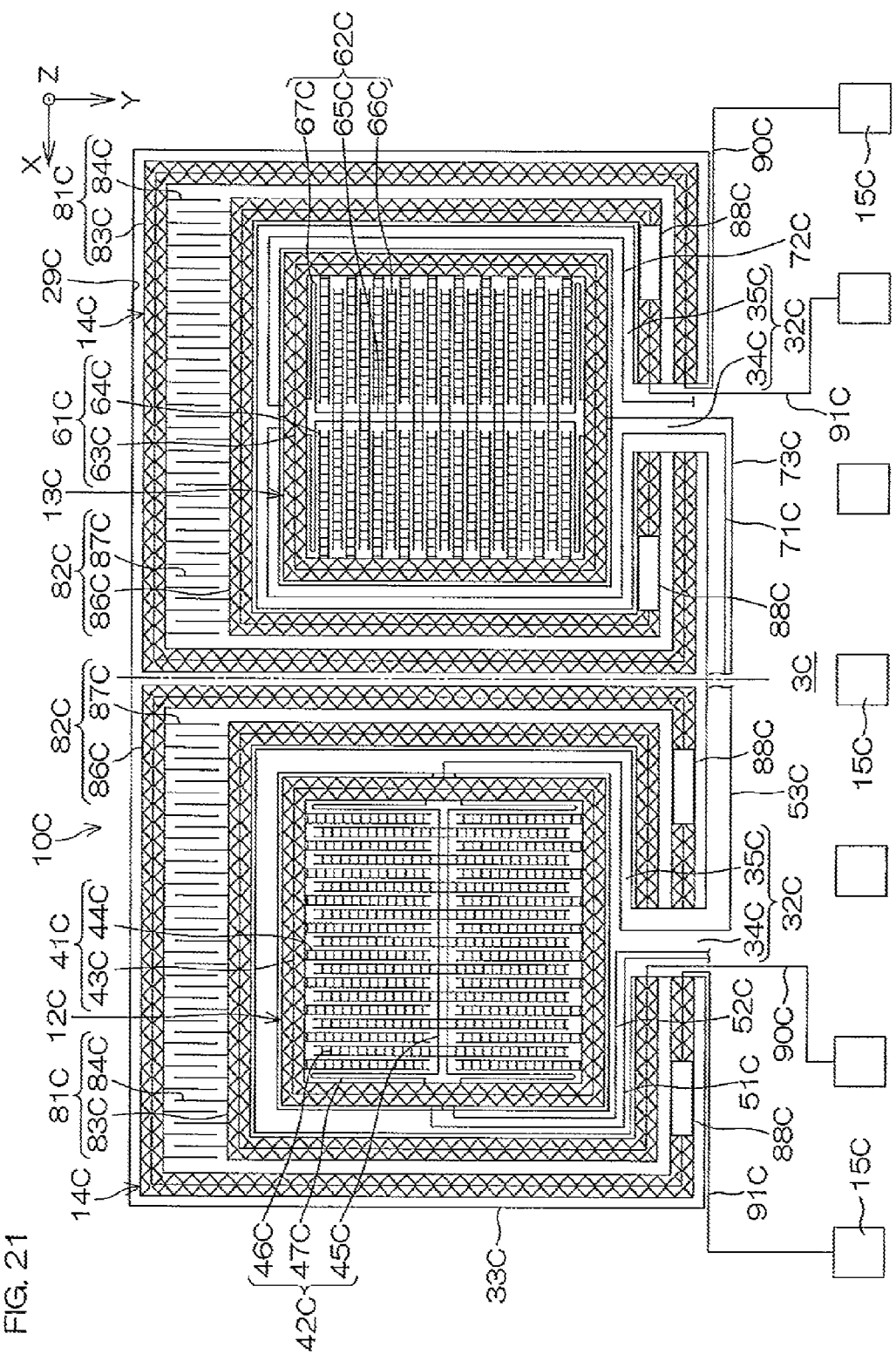
FIG. 21 is a schematic plan view of an acceleration sensor shown in FIG. 19.

FIG. 21 is a schematic plan view of the acceleration sensor shown in FIG. 19. FIG. 22 is a plan view of a principal portion of the X-axis sensor shown in FIG. 21. FIG. 23 is a sectional view of a principal portion of the X-axis sensor shown in FIG. 21, illustrating a section taken along the cutting plane F-F in FIG. 22.

The acceleration sensor 3C includes the base substrate 9C formed of a Si substrate as described above. This base substrate 9C has a cavity 29C inside, and in the upper wall 30C as a surface layer portion of the base substrate 9C having a ceiling that partitions the cavity 29C from the surface side, the X-axis sensor 12C, the Y-axis sensor 13C, and the Z-axis sensors 14C are formed. Specifically, the X-axis sensor 12C, the Y-axis sensor 13C, and the Z-axis sensors 14C are formed of portions of the base substrate 9C, and are supported while in a floating state with respect to the bottom wall 31C of the base substrate 9C that has a bottom surface partitioning the cavity 29C from the back surface side.

The X-axis sensor 12C and the Y-axis sensor 13C are disposed adjacent to each other at an interval. The Z-axis sensors 14C are disposed to surround the X-axis sensor 12C and the Y-axis sensor 13C, respectively.

In the present preferred embodiment, the Y-axis sensor 13C has an arrangement that is substantially the same as an arrangement obtained by rotating 90 degrees the X-axis sensor 12C in a plan view. Therefore, hereinafter, instead of a detailed description of the arrangement of the Y-axis sensor 13C, in the description of the portions of the X-axis sensor 12C, portions of the Y-axis sensor corresponding to the portions of the X-axis sensor are also described with parentheses.

Between the X-axis sensor 12C and the Z-axis sensor 14C and between the Y-axis sensor 13C and the Z-axis sensor 14C, support portions 32C for supporting these sensors in a floating state are formed.

The support portions 32C integrally include straight portions 34C extending across the Z-axis sensors 14C toward the X-axis sensor 12C and the Y-axis sensor 13C from one side wall 33C having side surfaces partitioning the cavity 29C of the base substrate 9C from the lateral sides, and annular portions 35C surrounding the X-axis sensor 12C and the Y-axis sensor 13C.

The X-axis sensor 12C and the Y-axis sensor 13C are disposed inside the annular portions 35C, and both ends of these sensors are supported at two points opposing each other on the inner walls of the annular portions 35C. Both ends of the Z-axis sensors 14C are supported by both side walls of the straight portions 34C.

The X-axis sensor 12C (Y-axis sensor 13C) has an X fixed electrode 41C (Y fixed electrode 61C) and an X movable electrode 42C (Y movable electrode 62C) that are formed to have the same thickness with respect to each other.

The X fixed electrode 41C (Y fixed electrode 61C) includes a first base portion 43C (first base portion 63C of the Y fixed electrode 61C) having a quadrilateral annular shape in a plan view fixed to the support portion 32C, and a plurality of pairs of first comb tooth portions 44C (first comb tooth portions 64C of the Y fixed electrode 61C) aligned like comb teeth at even intervals along the inner wall of the first base portion 43C.

The first base portion 43C of the X fixed electrode 41C has a truss-shaped framed structure including straight main frames extending parallel to each other and reinforcing frames combined with the main frames so that a triangular space is repeatedly formed along the main frames.

As the first comb tooth portions 44C of the X fixed electrode 41C, two electrode portions straight in a plan view and having base end portions connected to the first base portion 43C and tip end portions thereof opposed to each other are paired, and a plurality of pairs of the electrode portions are provided at even intervals. Each first comb tooth portion 44C has a framed structure that has a ladder-like shape in a plan view and includes straight main frames extending parallel to each other and a plurality of traverse frames laid across the main frames.

The X movable electrode 42C (Y movable electrode 62C) is held to be capable of oscillating with respect to the X fixed electrode 41C.

The X movable electrode 42C (Y movable electrode 62C) includes a second base portion 45C (second base portion 65C of the Y movable electrode 62C) and second comb tooth portions 46C (second comb tooth portions 66C of the Y movable electrode 62C).

The second base portion 45C of the X movable electrode 42C is formed of a plurality (six in the present preferred embodiment) of straight frames extending parallel to each other along a direction across the first comb tooth portions 44C of the X fixed electrode 41C. Both ends of the second base portion 45C are connected to beam portions 47C (beam portions 67C of the Y movable electrode 62C) capable of expanding and contracting along the direction across the first comb tooth portions 44C.

Two beam portions 47C are provided on each of the ends of the second base portion 45C of the X movable electrode 42C.

The second comb tooth portions 46C of the X movable electrode 42C extend from the second base portion 45C to both sides toward the portions between the first comb tooth portions 44C of the X fixed electrode 41C adjacent to each other, and are aligned like comb teeth that engage with the first comb tooth portions 44C of the X fixed electrode 41C without contact therebetween. Each second comb tooth portion 46C has a framed structure having a ladder-like shape in a plan view including straight main frames extending parallel to each other across the frames of the second base portion 45C and a plurality of traverse frames laid across the main frames.

In the X movable electrode 42C, on lines halving the second comb tooth portions 46C in a direction orthogonal to the oscillation direction Ux, insulating layers 48C across the traverse frames are embedded from the surface to the cavity 29C.

The insulating layers 48C are made of $SiO_2$ (silicon oxide). Each second comb tooth portion 46C is insulated and separated into two of one side and the other side along the oscillation direction Ux by the insulating layers 48C. Accordingly, the separated second comb tooth portions 46C of the X movable electrode 42C function as respective independent electrodes in the X movable electrode 42C.

On the surface of the base substrate 9C including the X fixed electrode 41C and the X movable electrode 42C, a first insulating film 49C and a second insulating film 50C made of silicon oxide ($SiO_2$) are laminated in order.

Between the first insulating film 49C and the second insulating film 50C, an X first detection wiring 51C (Y first detection wiring 71C) and an X second detection wiring 52C (Y second detection wiring 72C) are formed.

The X first detection wiring 51C detects a change in voltage accompanying a change in capacitance from one side (in the present preferred embodiment, the left side on the paper surface shown in FIG. 21) of each second comb tooth portion 46C insulated and separated into two.

The X second detection wiring 52C detects a change in voltage accompanying a change in capacitance from the other side (in the present preferred embodiment, the right side on the paper surface shown in FIG. 21) of each second comb tooth portion 46C insulated and separated into two.

The X first detection wiring 51C and the X second detection wiring 52C are made of aluminum (Al) in the present preferred embodiment. The X first detection wiring 51C and the X second detection wiring 52C are electrically connected to the second comb tooth portions 46C by penetrating through the first insulating film 49C.

The X first detection wiring 51C and the X second detection wiring 52C are led onto the support portion 32C via the beam portions 47C of the X movable electrode 42C and the first base portion 43C of the X fixed electrode 41C, and partially exposed as electrode pads 15C.

The X first detection wiring 51C and the X second detection wiring 52C use the beam portions 47C themselves formed of portions of the conductive base substrate 9C as current paths in sections passing through the beam portions 47C of the respective X movable electrode 42C. No aluminum wiring is provided on the beam portions 47C, so that the expandability of the beam portions 47C can be maintained.

To the support portion 32C, an X third detection wiring 53C (Y third detection wiring 73C) that detects a change in voltage accompanying a change in capacitance from the first comb tooth portions 44C of the X fixed electrode 41C is led. The X third detection wiring 53C is also partially exposed as an electrode pad 15C (not shown) in the same manner as other wirings 51C and 52C.

The upper surfaces and side surfaces of the X fixed electrode 41C and the X movable electrode 42C are coated by a protective thin film 54C made of $SiO_2$ so that the first insulating film 49C and the second insulating film 50C are covered.

In the X-axis sensor 12C structured as described above, the first comb tooth portions 44C (X fixed electrode 41C) to which the X third detection wiring 53C is connected and the second comb tooth portions 46C (X movable electrode 42C) to which the X first detection wiring 51C and the X second detection wiring 52C are connected are opposed to each other at an electrode-to-electrode distance $d_x$ to constitute a capacitor.

Then, when acceleration in the X-axis direction is applied to the X movable electrode 42C, the beam portions 47C expand and contract and the second base portion 45C of the X movable electrode 42C oscillates along the surface of the base substrate 9C. Accordingly, the second comb tooth portions 46C of the X movable electrode 42C that engage with the first comb tooth portions 44C of the X fixed electrode 41C like comb teeth oscillate alternately in directions approaching and away from the first comb tooth portions 44C of the X fixed electrode 41C.

As a result, the electrode-to-electrode distance $d_x$ between the first comb tooth portions 44C of the X fixed electrode 41C and the second comb tooth portions 46C of the X movable electrode 42C adjacent to each other changes. Then, by detecting a change in capacitance between the X movable electrode 42C and the X fixed electrode 41C caused by the change in electrode-to-electrode distance $d_x$, the acceleration $a_x$ in the X-axis direction is detected.

In the present preferred embodiment, the acceleration $a_x$ in the X-axis direction is obtained by calculating a difference between detection values of one side and the other side electrode portions insulated and separated from each other of the X movable electrode 42C.

In the Y-axis sensor 13C, when acceleration in the Y-axis direction is applied to the Y movable electrode 62C, the beam portions 67C expand and contract and the second base portion 65C of the Y movable electrode 62C oscillates along the surface of the base substrate 9C. Accordingly, the second comb tooth portions 66C of the Y movable electrode 62C that engage with the first comb tooth portions 64C of the Y fixed electrode 61C like comb teeth oscillate alternately in directions approaching and away from the first comb tooth portions 64C of the Y fixed electrode 61C.

As a result, the electrode-to-electrode distance $d_y$ between the first comb tooth portions 64C of the Y fixed electrode 61C and the second comb tooth portions 66C of the Y movable electrode 62C adjacent to each other changes. Then, by detecting a change in capacitance between the Y movable electrode 62C and the Y fixed electrode 61C caused by the change in electrode-to-electrode distance $d_y$, the acceleration $a_y$ in the Y-axis direction is detected.

<Arrangement of Z-axis Sensor>

Next, an arrangement of the Z-axis sensor will be described with reference to FIG. 21, FIG. 24, and FIG. 25.

Figure 24:
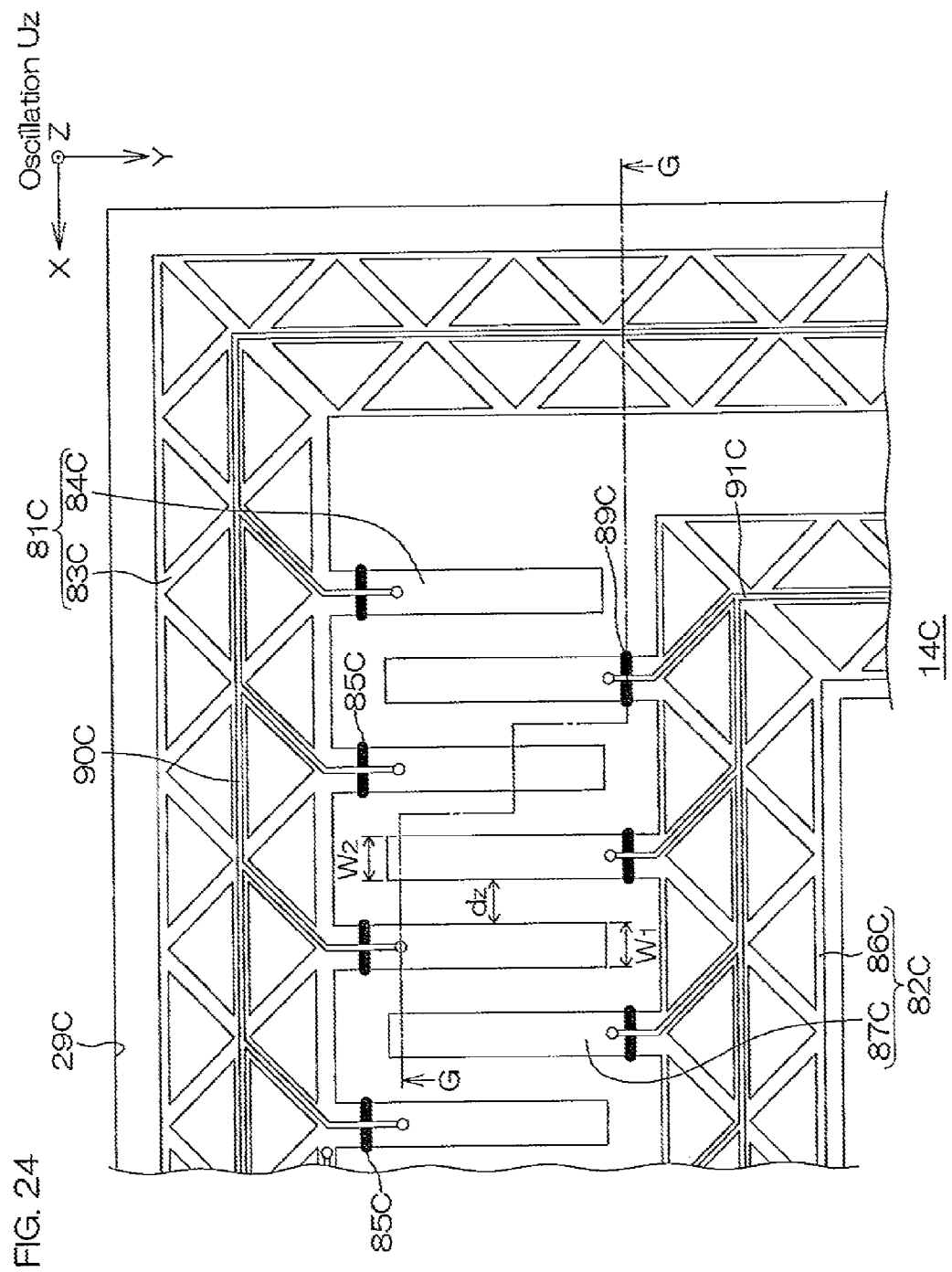
FIG. 24 is a plan view of a principal portion of a Z-axis sensor shown in FIG. 21.

FIG. 24 is a plan view of a principal portion of the Z-axis sensor shown in FIG. 21. FIG. 25 is a sectional view of the principal portion of the Z-axis sensor shown in FIG. 21, illustrating a section taken along the cutting plane G-G in FIG. 24.

The Z-axis sensors 14C are disposed to surround the X-axis sensor 12C and the Y-axis sensor 13C, respectively, as described above.

The Z-axis sensor 14C includes a Z fixed electrode 81C and a Z movable electrode 82C formed to have the same thickness and the same width with respect to each other. In FIG. 24 and FIG. 25, the thickness and the width of the Z fixed electrode 81C are the thickness $T_1$ and the width $W_1$, respectively, and the thickness and the width of the Z movable electrode 82C are the thickness $T_2$ and the width $W_2$, respectively.

The Z fixed electrode 81C is fixed to the support portion 32C (straight portion 34C) provided inside the cavity 29C.

The Z movable electrode 82C is held to be capable of oscillating with respect to the Z fixed electrode 81C.

In the present preferred embodiment, in one Z-axis sensor 14C of the two Z-axis sensors 14C, the Z movable electrode 82C is disposed to surround the annular portion 35C, and the Z fixed electrode 81C is disposed to surround the Z movable electrode 82C.

In the other Z-axis sensor 14C, the Z fixed electrode 81C is disposed to surround the annular portion 35C, and the Z movable electrode 82C is disposed to surround the Z fixed electrode 81C.

In each Z-axis sensor 14C, the Z fixed electrode 81C includes a first base portion 83C and a plurality of first comb tooth portions 84C.

The first base portion 83C of the Z fixed electrode 81C is formed to have a quadrilateral annular shape in a plan view and fixed to the support portion 32C. The first base portion 83C has a truss-shaped framed structure including straight main frames extending parallel to each other and reinforcing frames combined with the main frames so that a triangular space is repeatedly formed along the main frames.

The first comb tooth portions 84C of the Z fixed electrode 81C are aligned like comb teeth at even intervals along the inner wall of the first base portion 83C on the portion on the side opposite to the straight portion 34C with respect to the X-axis sensor 12C (Y-axis sensor 13C) in the first base portion 83C.

The first comb tooth portions 84C have base end portions connected to the first base portion 83C of the Z fixed electrode 81C, and tip end portions extending toward the Z movable electrode 82C. In portions close to the base end portions of the first comb tooth portions 84C, insulating layers 85C as first insulating layers across the first comb tooth portions 84C in the width direction are embedded from the surface to the cavity 29C.

The insulating layers 85C are made of $SiO_2$. The first comb tooth portions 84C are insulated from other portions of the Z fixed electrode 81C by the insulating layers 85C.

In each Z-axis sensor 14C, the Z movable electrode 82C includes a second base portion 86C and second comb tooth portions 87C.

The second base portion 86C of the Z movable electrode 82C is formed to have a quadrilateral annular shape in a plan view. In addition, the second base portion 86C has a truss-shaped framed structure including straight main frames extending parallel to each other and reinforcing frames combined with the main frames so that a triangular space is repeatedly formed along the main frames.

The second base portion 86C having the framed structure has sections in which the reinforcing frames are omitted at portions on the side opposite to the disposition of the second comb tooth portions 87C. The main frames in these omitted sections function as beam portions 88C for enabling the Z movable electrode 82C to move up and down.

The second comb tooth portions 87C of the Z movable electrode 82C extend from the second base portion 86C toward the portions between the first comb tooth portions 84C adjacent to each other of the Z fixed electrode 81C, and aligned like comb teeth to engage with the first comb tooth portions 84C without contact.

The second comb tooth portions 87C have base end portions connected to the second base portion 86C of the Z movable electrode 82C, and tip end portions extending toward the portions between the first comb tooth portions 84C of the Z fixed electrode 81C.

In portions close to the base end portions of the second comb tooth portions 87C, insulating layers 89C as second insulating layers across the second comb tooth portions 87C in the width direction are embedded from the surface to the cavity 29C of the base substrate 9C.

The insulating layers 89C are made of $SiO_2$. The second comb tooth portions 87C are insulated from other portions of the Z movable electrode 82C by the insulating layers 89C.

On the surface of the base substrate 9C including the Z fixed electrode 81C and the Z movable electrode 82C, as described above, a first insulating film 49C and a second insulating film 50C made of $SiO_2$ are laminated in order.

Between the first insulating film 49C and the second insulating film 50C, a Z first detection wiring 90C and a Z second detection wiring 91C are formed.

The Z first detection wiring 90C and the Z second detection wiring 91C are respectively connected to the first comb tooth portions 84C of the Z fixed electrode 81C and the second comb tooth portions 87C of the Z movable electrode 82C adjacent to each other.

In detail, the Z first detection wiring 90C is formed along the first base portion 83C, and includes Al wirings branched toward the tip end portions of the first comb tooth portions 84C across the insulating layers 85C of the first comb tooth portions 84C.

The branched Al wirings are electrically connected to the tip end sides relative to the insulating layers 85C of the first comb tooth portions 84C by penetrating through the first insulating film 49C.

As shown in FIG. 21, the Z first detection wiring 90C is led onto the support portion 32C via the first base portion 83C, and partially exposed as an electrode pad 15C.

The Z second detection wiring 91C is formed along the second base portion 86C, and includes Al wirings branched toward the second comb tooth portions 87C across the insulating layers 89C close to the base end portions of the second comb tooth portions 87C.

The branched Al wirings are electrically connected to the second comb tooth portions 87C by penetrating through the first insulating film 49C.

As shown in FIG. 21, the Z second detection wiring 91C is led onto the support portion 32C via the second base portion 86C, and partially exposed as an electrode pad 15C.

The upper surfaces and side surfaces of Z fixed electrode 81C and the Z movable electrode 82C are coated by a protective thin film 54C made of $SiO_2$ so that the first insulating film 49C and the second insulating film 50C are covered.

In the Z-axis sensor 14C structured as described above, the first comb tooth portions 84C (Z fixed electrode 81C) to which the Z first detection wiring 90C is connected and the second comb tooth portions 87C (Z movable electrode 82C) to which the Z second detection wiring 91C is connected are opposed at an electrode-to-electrode distance $d_z$ to constitute a capacitor.

When acceleration in the Z-axis direction is applied to the Z movable electrode 82C, the comb-tooth-like Z movable electrode 82C oscillates up and down like a pendulum similarly around the comb-tooth-like Z fixed electrode 81C as a center of oscillation along the Z-axis direction with respect to the Z fixed electrode 81C.

Accordingly, the opposing area S between the first comb tooth portions 84C of the Z fixed electrode 81C and the second comb tooth portions 87C of the Z movable electrode 82C adjacent to each other changes. Then, by detecting a change in capacitance between the Z movable electrode 82C and the Z fixed electrode 81C caused by the change in opposing area S, the acceleration $a_z$ in the Z-axis direction is detected.

In the present preferred embodiment, the acceleration $a_z$ in the Z-axis direction is obtained by calculating a difference between a detection value of the Z-axis sensor 14C surrounding the X-axis sensor 12C and a detection value of the Z-axis sensor 14C surrounding the Y-axis sensor 13C.

For example, as shown in FIG. 21, the difference can be obtained by making the position relationship between the fixed electrode and the movable electrode of the Z-axis sensor 14C surrounding the X-axis sensor 12C opposite to the position relationship between the fixed electrode and the movable electrode of the Z-axis sensor 14C surrounding the Y-axis sensor 13C. Accordingly, the manner of oscillation of the Z movable electrode 82C differs between the pair of Z-axis sensors 14C, so that the difference occurs.

<Method for Manufacturing Acceleration Sensor>

Next, the manufacturing process of the above-described acceleration sensor will be described with reference to FIG. 26A to FIG. 26M in order of steps. In this paragraph, only the manufacturing process of the Z-axis sensors is shown in the drawings, and the description of the manufacturing processes of the X-axis sensor and the Y-axis sensor are omitted, however, the manufacturing processes of the X-axis sensor and the Y-axis sensor are performed in the same manner as the manufacturing process of the Z-axis sensors in parallel to the manufacturing process of the Z-axis sensors.

Figure 25:
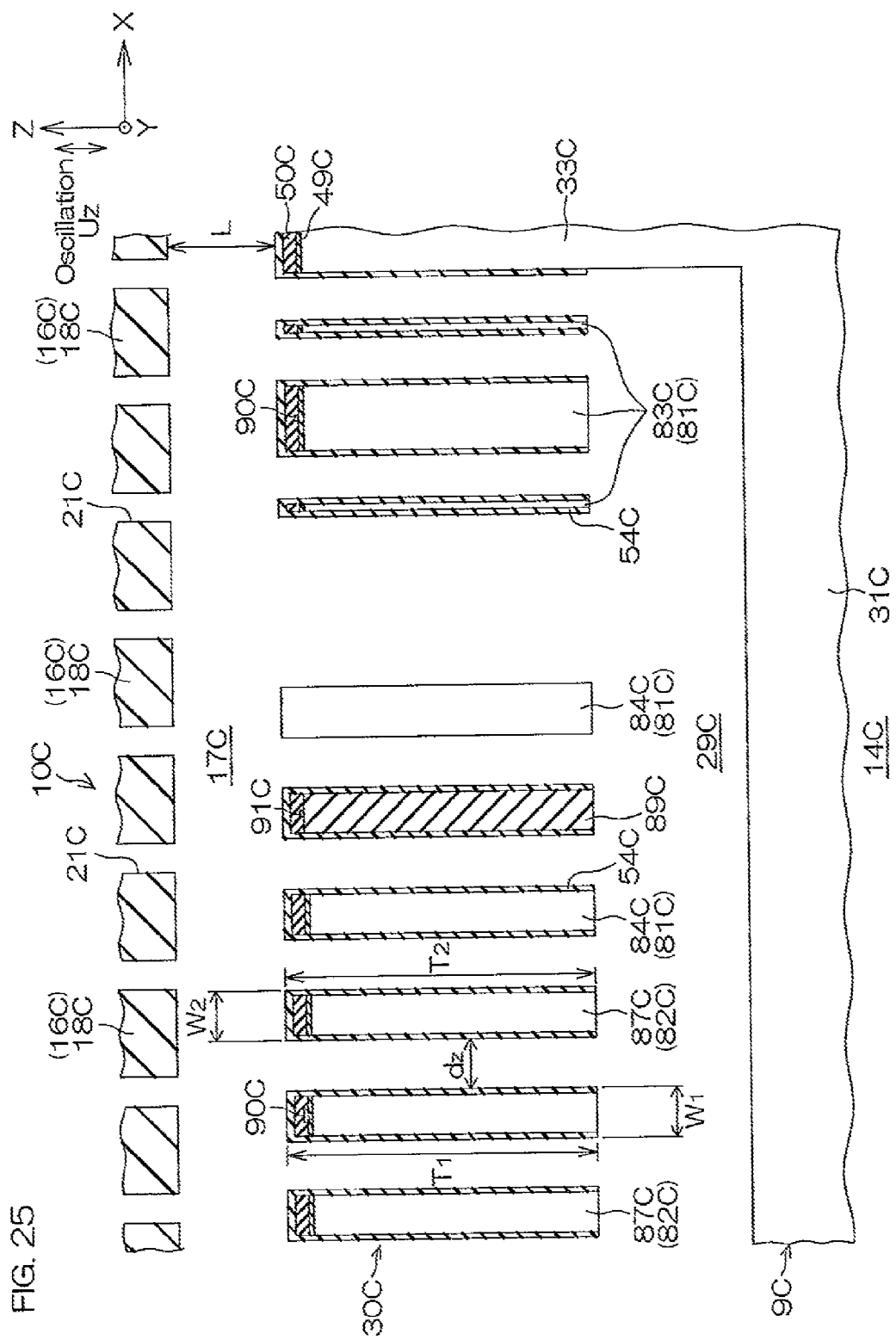
FIG. 25 is a sectional view of the principal portion of the Z-axis sensor shown in FIG. 21, illustrating a section taken along the cutting plane G-G in FIG. 24.

FIG. 26A to FIG. 26M are schematic sectional views showing parts of the manufacturing process of the Z-axis sensors shown in FIG. 21 in order of steps, illustrating a cutting plane taken at the same position as in FIG. 25.

To manufacture the Z-axis sensors 14C, as shown in FIG. 26A, the surface of the base substrate 9C made of conductive silicon is thermally oxidized (for example, temperature: 1100 to 1200° C., film thickness: 5000 Å). Accordingly, the first insulating film 49C is formed on the surface of the base substrate 9C.

Next, by a known patterning technique, the first insulating film 49C is patterned, and openings are formed in regions in which the insulating layers 85C and 89C should be embedded. Next, by anisotropic deep RIE (Reactive Ion Etching) using the first insulating film 49C as a hard mask, specifically, by a Bosch process, the base substrate 9C is dug. Accordingly, trenches 36C are formed in the base substrate 9C.

In the Bosch process, a step of etching the base substrate 9C by using $SF_6$ (sulfur hexafluoride) and a step of forming a protective film on the etched surfaces by using $C_4F_8$ (perfluorocyclobutane) are alternately repeated. Accordingly, the base substrate 9C can be etched at a high aspect ratio, however, a wavy irregularity called scallop is formed on the etched surfaces (inner peripheral surfaces of the trenches).

Next, as shown in FIG. 26B, the insides of the trenches 36C formed in the base substrate 9C and the surface of the base substrate 9C are thermally oxidized (for example, temperature: 1100 to 1200° C.), and then, the surface of the oxide film is etched back (for example, the film thickness after etching back of the first insulating film 49C is 21800 Å). Accordingly, the insulating layers 85C and 89C filling the trenches are formed concurrently (only the insulating layer 89C is shown).

Next, as shown in FIG. 26C, the first insulating film 49C is etched. Accordingly, contact holes are formed in the first insulating film 49C. Next, contact plugs filling the contact holes are formed, and then, by sputtering, aluminum is deposited (for example, 7000 Å) on the first insulating film 49C, and this aluminum deposit layer is patterned. Accordingly, on the first insulating film 49C, the Z first detection wiring 90C and the Z second detection wiring 91C are formed. At this time, the electrode pads 15C are also formed on the first insulating film 49C concurrently although this is not shown.

Figure 26D:
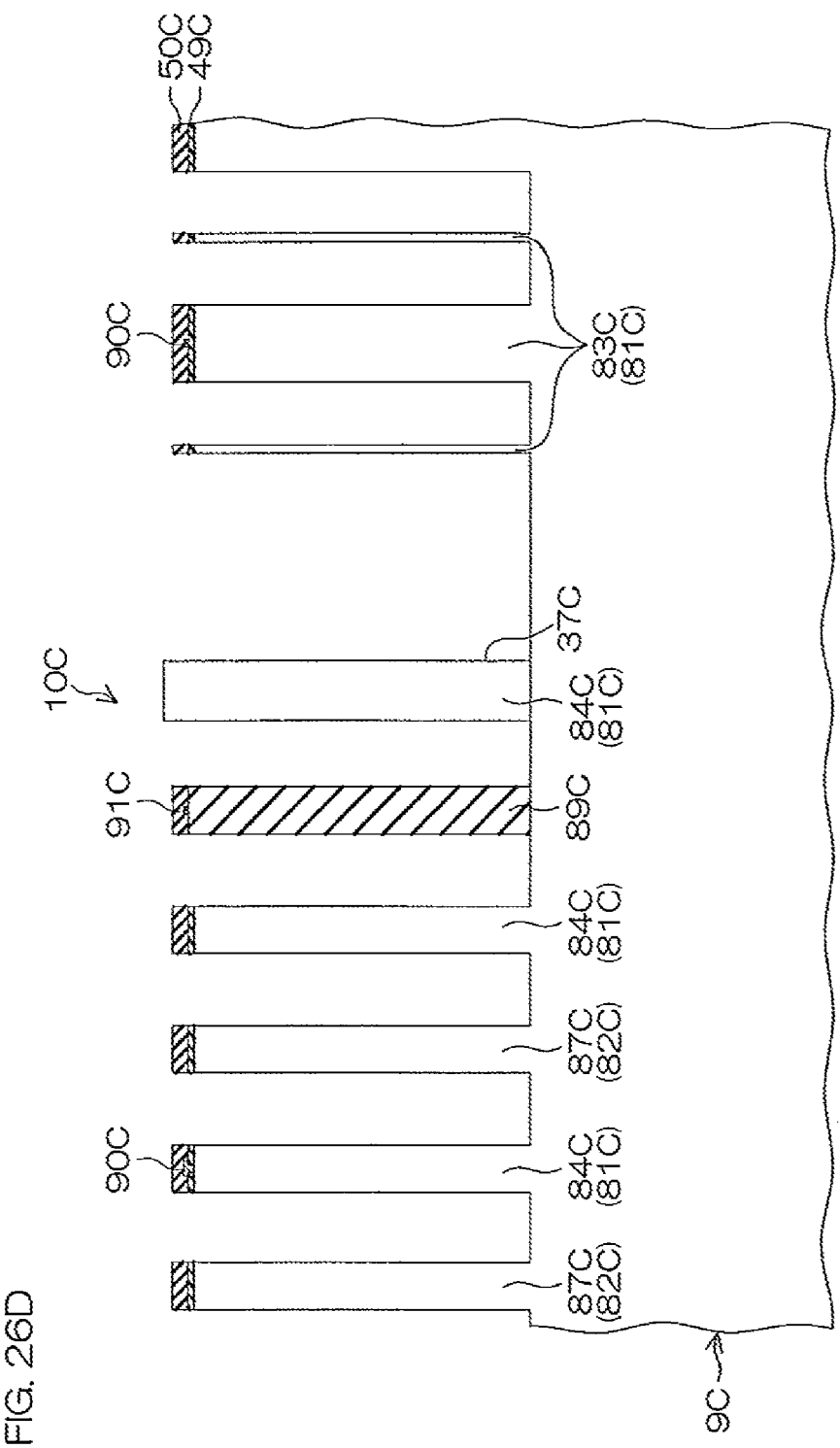
FIG. 26A to FIG. 26M are sectional views showing parts of a manufacturing process of the Z-axis sensors shown in FIG. 21 in order of steps.

Next, as shown in FIG. 26D, by a CVD method, the second insulating film 50C is laminated on the first insulating film 49C. Next, the second insulating film 50C and the first insulating film 49C on regions in which the cavity 29C of the base substrate 9C should be formed are removed in order by etching. By etching the second insulating film 50C, openings for exposing the electrode pads 15C are formed in the second insulating film 50C although this is not shown.

Subsequently, a resist having openings in regions other than the regions in which the Z fixed electrode 81C and the Z movable electrode 82C should be formed is formed on the second insulating film 50C. Subsequently, by anisotropic deep RIE using the resist as a mask, specifically, by a Bosch process, the base substrate 9C is dug. Accordingly, the surface portion of the base substrate 9C is molded into the shapes of the Z fixed electrode 81C and the Z movable electrode 82C, and between these, the trenches 37C are formed.

Next, as shown in FIG. 26E, by thermal oxidization or by a PECVD method, on the entire surfaces of the Z fixed electrode 81C and the Z movable electrode 82C and the entire inner surfaces of the trenches 37C (that is, the side surfaces and the bottom surfaces defining the trenches 37C), a protective thin film 54C made of $SiO_2$ is formed.

Next, as shown in FIG. 26F, the portions on the bottom surfaces of the trenches 37C of the protective thin film 54C are removed by etching back. Accordingly, the bottom surfaces of the trenches 37C are exposed.

Next, as shown in FIG. 26G, by anisotropic deep RIE using the remaining protective thin film 54C as a mask, the bottom surfaces of the trenches 37C are further dug. Accordingly, at the bottom portions of the trenches 37C, exposure spaces 38C as recesses to which the crystal face of the base substrate 9C is exposed are formed.

Figure 26H:
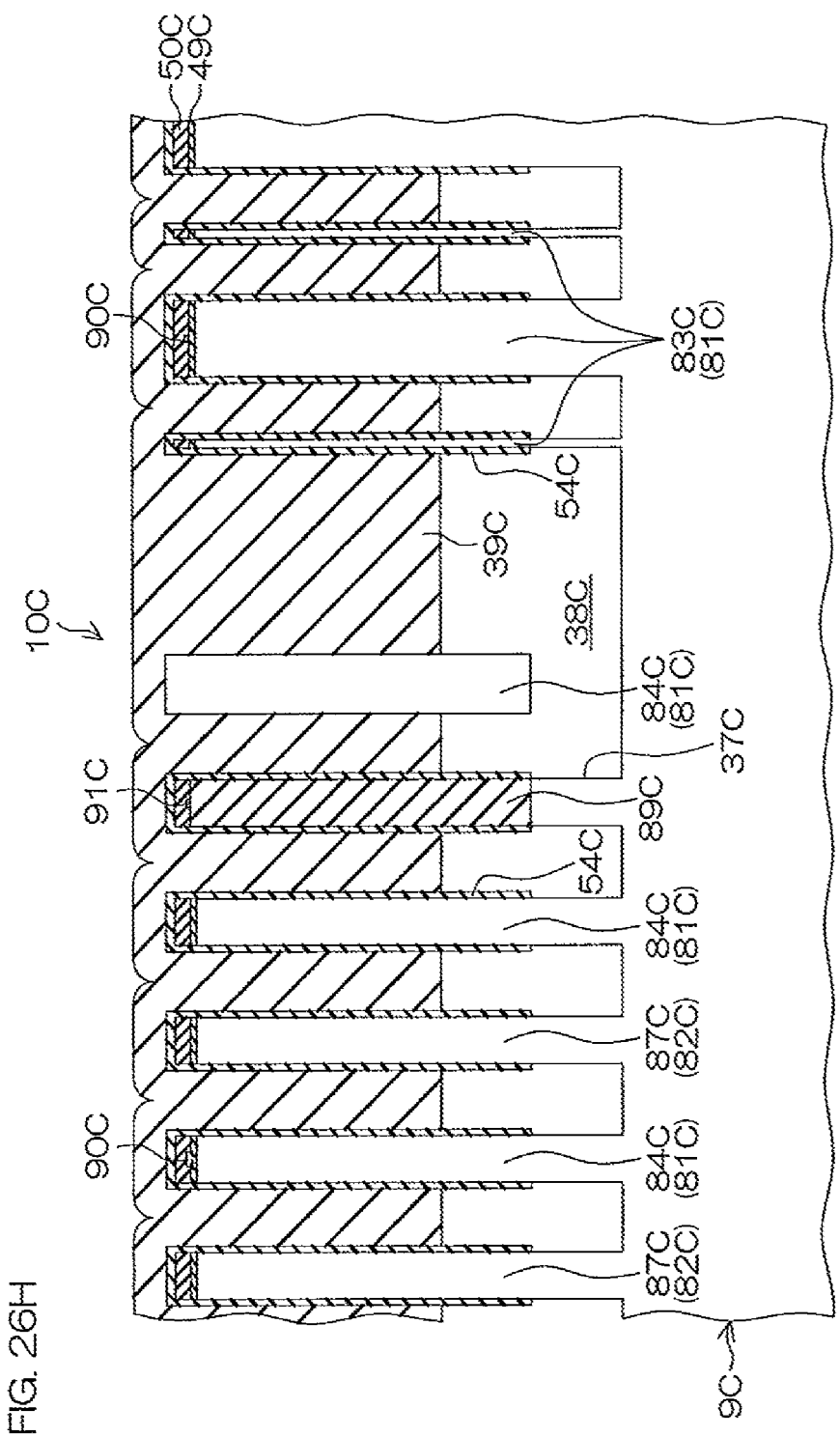
Figure 26:
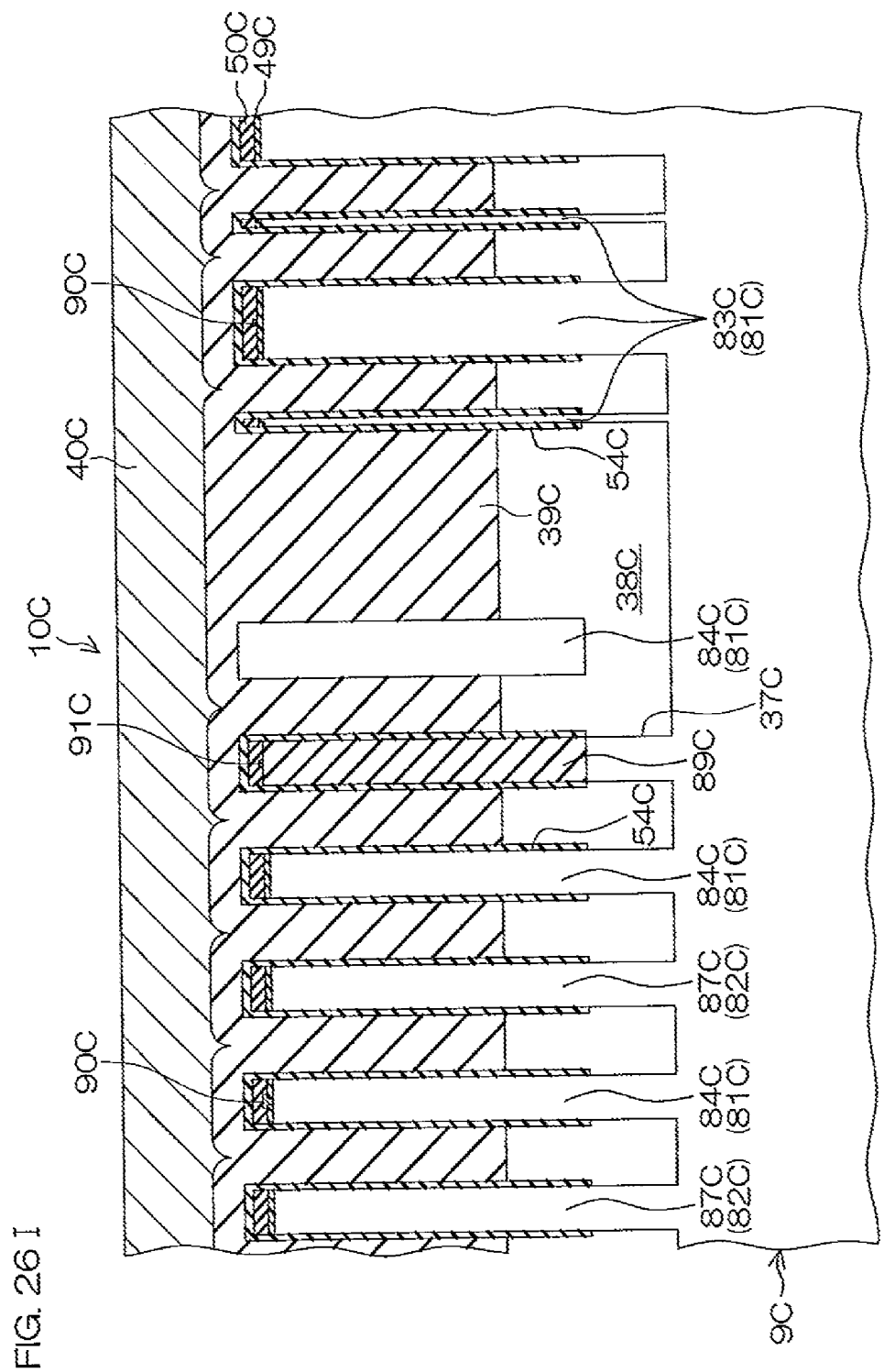

Next, as shown in FIG. 26H, by a PECVD method, SiN as a second inorganic material is deposited on the entire surface of the base substrate 9C (the entire region including the sensor region 10C and the pad region 11C) from above. Accordingly, a first sacrifice layer 39C (for example, thickness: 1 μm to 5 μm) that fills the upper portions of the exposure spaces 38C and covers the entire region including the sensor region 10C and the pad region 11C is formed. Accordingly, the opening ends of the exposure spaces 38C are closed by the first sacrifice layer 39C and the lower portions of the exposure spaces 38C are kept hollow.

Next, as shown in FIG. 26I, by sputtering, Al as a metal material is deposited on the entire surface of the first sacrifice layer 39C (the entire region including the sensor region 10C and the pad region 11C) from above the base substrate 9C. Accordingly, a second sacrifice layer 40C (for example, thickness: 1 μm to 5 μm) thicker than the first sacrifice layer 39C is formed on the first sacrifice layer 39C.

Subsequently, by a known patterning technique, the portions above the pad region 11C (not shown) in the second sacrifice layer 40C and the first sacrifice layer 39C are removed in order.

Figure 26J:
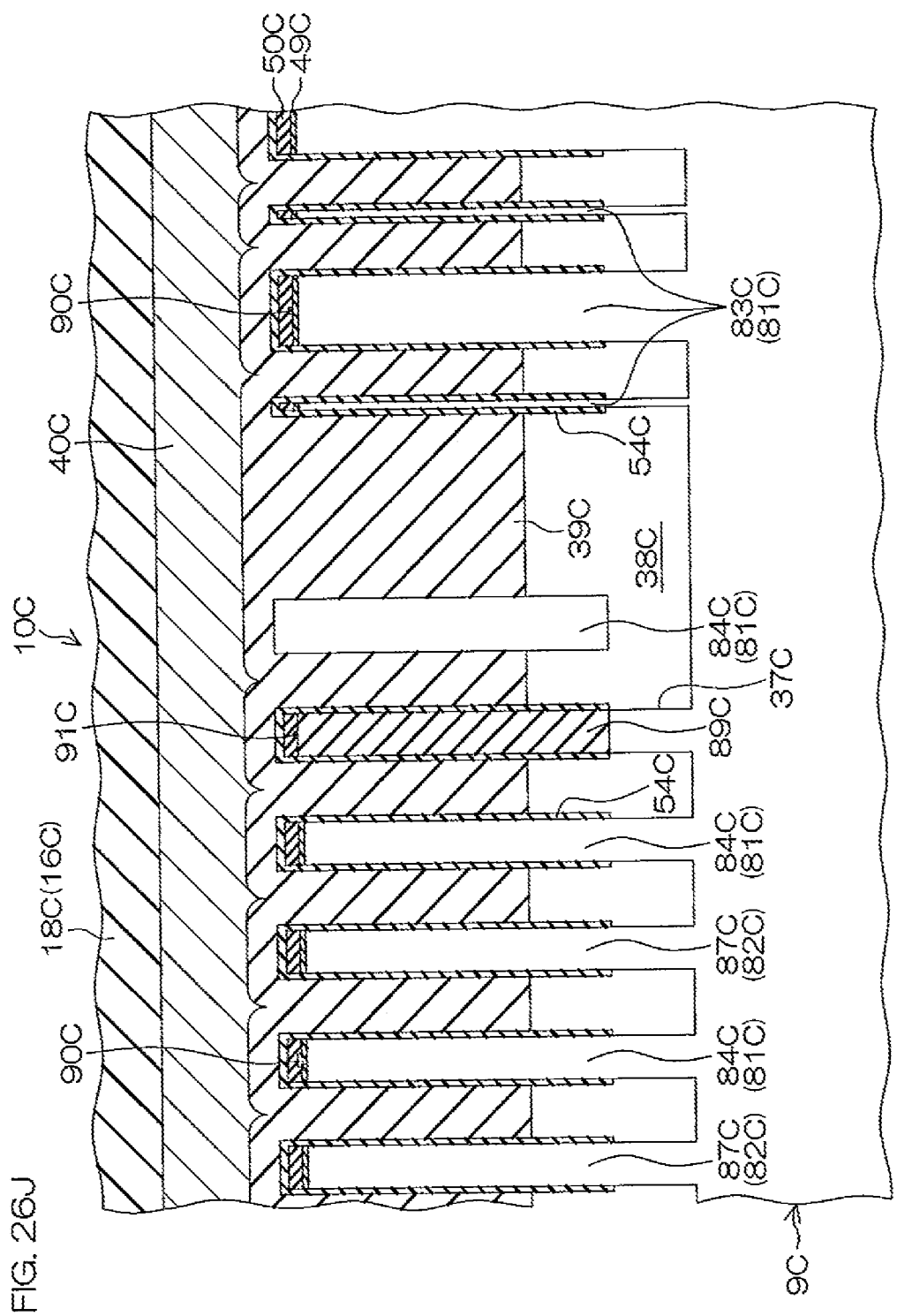

Next, as shown in FIG. 26J, by a PECVD method, $SiO_2$ as a first inorganic material is deposited on the entire region of the base substrate 9C (the entire region including the sensor region 10C and the pad region 11C) from above. Accordingly, a protective layer 16C that adheres to the pad region 11C exposed from the first sacrifice layer 39C and the second sacrifice layer 40C (specifically, the protective thin film 54C formed on the base substrate 9C) and covers the second sacrifice layer 40C is formed.

Figure 26K:
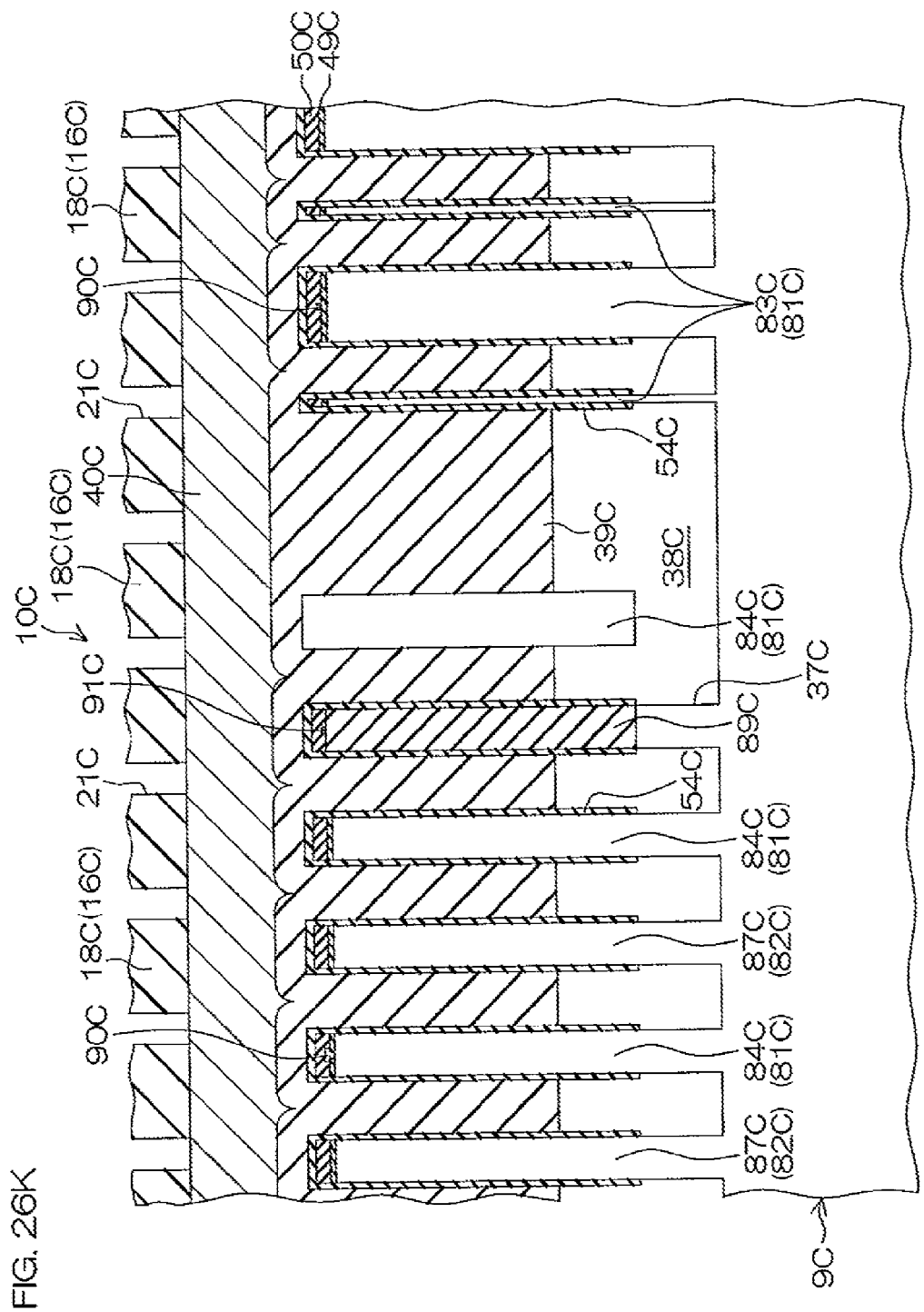

Next, as shown in FIG. 26K, by a known patterning technique, a large number of through holes 21C are formed in the top portion 18C of the protective layer 16C.

Next, as shown in FIG. 26L, a fluorine-based gas (for example, $NF_3$, $SF_6$, $XeF_2$, etc.) as an etching medium is supplied to the second sacrifice layer 40C via the through holes 21C. Accordingly, the second sacrifice layer 40C is removed by etching. Accordingly, a space 17C is formed directly below the protective layer 16C.

Figure 26M:
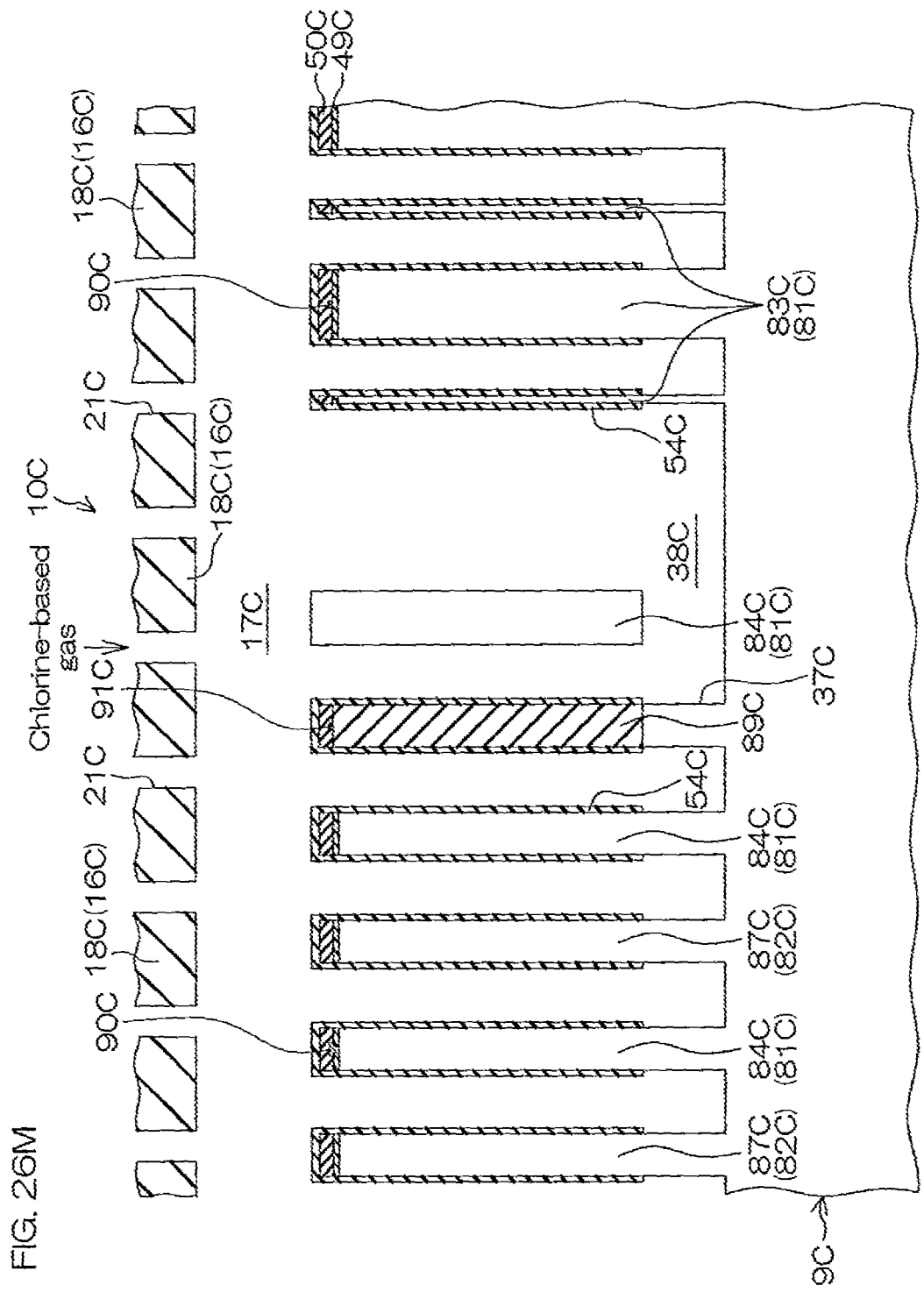

Next, as shown in FIG. 26M, a chlorine-based gas (for example, $Cl_2$, HCl, $BCl_3$, etc.) as an etching medium is supplied to the first sacrifice layer 39C via the through holes 21C. Accordingly, the first sacrifice layer 39C is removed by etching. Accordingly, the opening ends of the exposure spaces 38C closed by the first sacrifice layer 39C, are opened.

Thereafter, via the through holes 21C, reactive ions and an etching gas are supplied into the exposure spaces 38C of the trenches 37C. Then, by action of the reactive ions, etc., the base substrate 9C is etched in a direction parallel to the surface of the base substrate 9C while being etched in the thickness direction of the base substrate 9C from the exposure spaces 38C. Accordingly, all exposure spaces 38C adjacent to each other are integrated together to form a cavity 29C inside the base substrate 9C, and inside the cavity 29C, the Z fixed electrode 81C and the Z movable electrode 82C float.

Through these steps, the Z-axis sensor 14C shown in FIG. 19 is obtained.

According to the above-described method, by forming the protective layer 16C made of $SiO_2$ on the base substrate 9C in which the Z fixed electrode 81C and the Z movable electrode 82C are formed, a layer that protects the sensor region 10C can be formed without using a bonding material such as glass frit. Therefore, the cost for forming the protective layer 16C can be reduced.

Concerning operability of formation of the protective layer 16C, the protective layer 16C can be formed more easily than in the case where a lid substrate is bonded by using a bonding material.

In detail, according to the present preferred embodiment, the first sacrifice layer 39C made of SiN is formed by a PECVD method to cover the sensor region 10C in which the Z fixed electrode 81C and the Z movable electrode 82C are formed (the step of FIG. 26H), and the second sacrifice layer 40C made of Al is formed by sputtering to cover the first sacrifice layer 39C (the step of FIG. 26I). Then, by a known patterning technique (photolithography), these sacrifice layers 39C and 40C are patterned. Next, a protective layer 16C made of $SiO_2$ is formed by a PECVD method to cover the patterned sacrifice layers 39C and 40C. Thereafter, by a known patterning technique, the through holes 21C are formed in the top portion 18C of the protective layer 16C, and by supplying a fluorine-based etching gas and a chlorine-based etching gas in order via the through holes 21C, the second sacrifice layer 40C and the first sacrifice layer 39C directly below the protective layer 16C are removed in order. Accordingly, the space 17C is formed at the portion at which the second sacrifice layer 40C existed, and the protective layer 16C that covers the Z fixed electrode 81C and the Z movable electrode 82C via the space 17C with respect to the sensor region 10C is formed.

Therefore, without operations of position alignment of wafers, etc., by combining known semiconductor device manufacturing techniques (a PECVD method, sputtering, photolithography, and etching), the protective layer 16C can be easily formed.

In addition, when forming the sacrifice layers 39C and 40C for forming the space 17C between the sensor region 10C and the protective layer 16C, the cavity 29C is not formed directly below the Z fixed electrode 81C and the Z movable electrode 82C, and these lower portions of the electrodes 81C and 82C are fixed integrally to the base substrate 9C. Therefore, even if the sacrifice layers 39C and 40C come into contact with the Z fixed electrode 81C and the Z movable electrode 82C, the electrodes 81C and 82C are not oscillated by the impact of this contact. Therefore, it is not necessary to add a step, etc., for protecting the electrodes 81C and 82C from the sacrifice layers 39C and 40C, so that the process can be prevented from becoming complicated.

In the present preferred embodiment, the space 17C is formed between the protective layer 16C and the sensor region 10C by etching the second sacrifice layer 40C made of Al. Specifically, what (second sacrifice layer 40C) is to be removed by etching is made of Al, and what (protective layer 16C) is to be left even after etching is made of $SiO_2$. Accordingly, when forming the space 17C, the etching selectivity of the protective layer 16C to the second sacrifice layer 40C can be increased.

Therefore, even if the protective layer 16C is exposed to a fluorine-based etching gas to be used for removing the second sacrifice layer 40C for a long period of time, the fluorine-based etching gas is for etching Al, and therefore, erosion of the protective layer 16C made of $SiO_2$ can be reduced. Therefore, the shape of the protective layer 16C can be excellently maintained.

On the other hand, in the case where the second sacrifice layer 40C made of Al is used as a sacrifice layer that closes the opening ends of the exposure spaces 38C, if the second sacrifice layer 40C remains on the Z fixed electrode 81C and/or the Z movable electrode 82C, this second sacrifice layer 40C may cause an operation failure of the sensor. For example, if the second sacrifice layer 40C remains across the Z fixed electrode 81C and the Z movable electrode 82C, a short-circuit occurs between the Z fixed electrode 81C and the Z movable electrode 82C via this second sacrifice layer 40C.

Therefore, in the present preferred embodiment, as the sacrifice layer that closes the opening ends of the exposure spaces 38C, the first sacrifice layer 39C made of SiN is used. Accordingly, while the etching selectivity of the protective layer 16C to the first sacrifice layer 39C is secured, operation failures of the sensor can be prevented from occurring due to the sacrifice layer remaining.

According to the present preferred embodiment, on the entire surfaces of the Z fixed electrode 81C and the Z movable electrode 82C and the entire inner surfaces of the trenches 37C, the protective thin film 54C made of $SiO_2$ having etching selectivity to the sacrifice layers 39C and 40C is formed. Therefore, when the sacrifice layers 39C and 40C are removed by etching, even if the etching gas comes into contact with the side walls of the Z fixed electrode 81C and the Z movable electrode 82C, erosion (damage) of the Z fixed electrode 81C and the Z movable electrode 82C can be reduced. As a result, the variation in size (thicknesses $T_1$ and $T_2$ and the widths $W_1$ and $W_2$) of the Z fixed electrode 81C and the Z movable electrode 82C can be reduced.

In the acceleration sensor 3C obtained by the above-described method, the Z fixed electrode 81C and the Z movable electrode 82C are covered by the top portion 18C of the protective layer 16C. Accordingly, dust, etc., can be prevented from entering the inside of the protective layer 16C from the outside of the protective layer 16C (from the side opposite to the sensor region 10C with respect to the protective layer 16C). Therefore, the Z fixed electrode 81C and the Z movable electrode 82C can be excellently protected from dust, etc. As a result, operation failures of the sensor can be reduced.

In addition, the base substrate 9C is a conductive silicon substrate, so that even without applying a special treatment for giving conductivity to the Z fixed electrode 81C and the Z movable electrode 82C molded into predetermined shapes, the molded structures can be used as they are as electrodes. Portions except for the portions to be used as electrodes can be used as wirings (Z first detection wiring 90C and Z second detection wiring 91C).

The operation and effects in the Z-axis sensors 14C are described in detail above, and the same operation and effects (reduction in cost due to the protective layer 16C, simplification of the manufacturing process, shape maintenance of the protective layer 16C, prevention of operation failures of the sensor, and stabilization of the sizes of the electrodes, etc.) as in the Z-axis sensors 14C can also be obtained in the X-axis sensor 12C and the Y-axis sensor 13C.

The MEMS package 1C according to the present preferred embodiment includes the X-axis sensor 12C, the Y-axis sensor 13C, and the Z-axis sensors 14C, so that operation failures of the sensor can be reduced. As a result, a highly reliable MEMS package can be provided.

The third preferred embodiment of the present invention is described above, however the present invention can also be carried out in other embodiments.

For example, the MEMS package 1C may include an angular velocity sensor instead of or in addition to the acceleration sensor 3C. This angular velocity sensor can be manufactured by providing circuits for driving, for example, the movable electrodes 42C, 62C, and 82C in the sensors 12C to 14C shown in FIG. 21 to FIG. 25.

Figure 27:
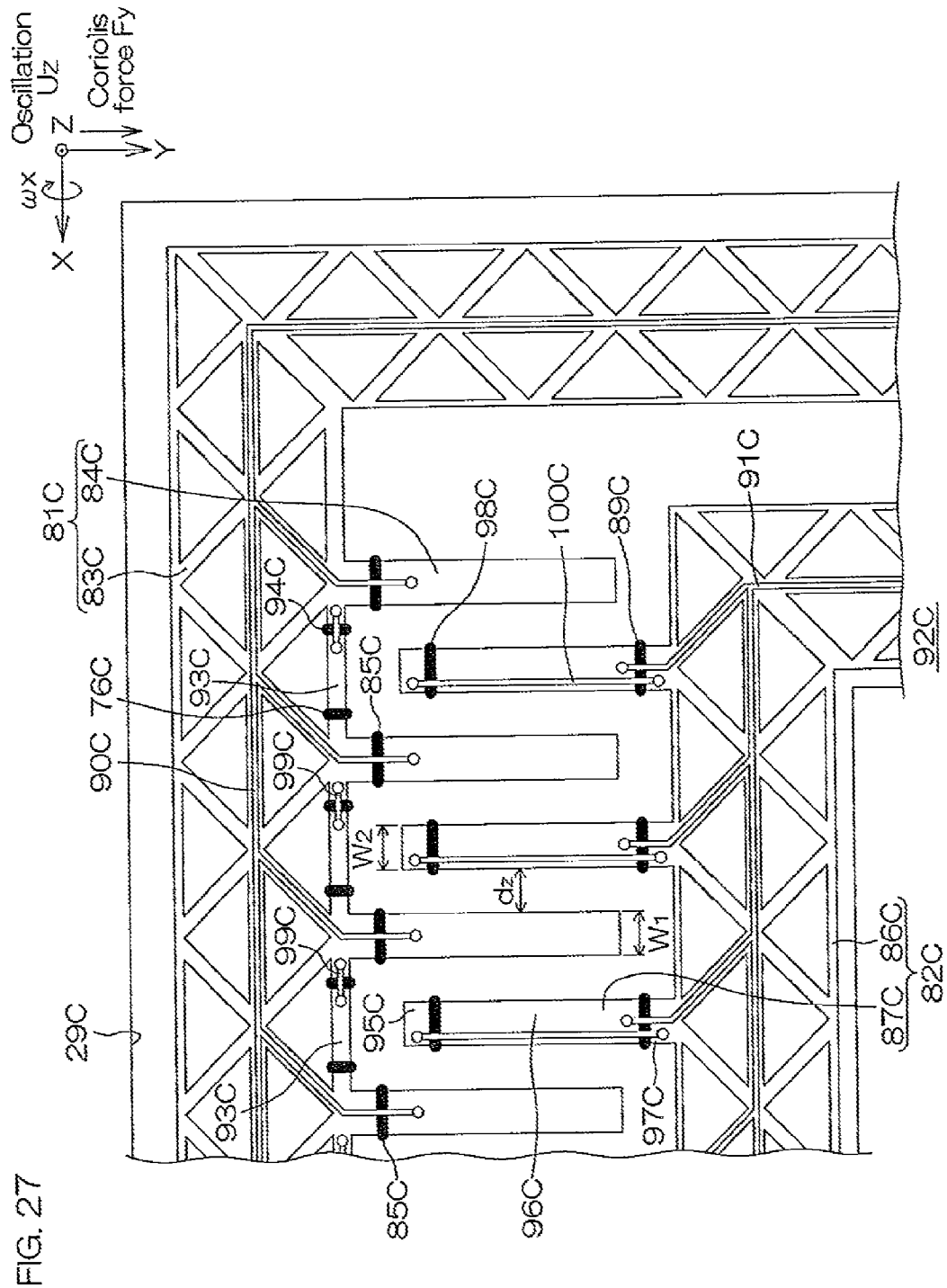
FIG. 27 is a plan view showing a mode in which the Z-axis sensor shown in FIG. 24 is used as an angular velocity sensor.

For example, a Z-axis angular velocity sensor 92C that detects an angular velocity $\omega_x$ applied around the X axis includes, as shown in FIG. 27, insulating layers 94C embedded in both sides of the portion (opposed portion 93C) opposed to the tip end portion 95C (described later) of each second comb tooth portion 87C on the first base portion 83C in the Z-axis sensor 14C shown in FIG. 24. The opposed portion 93C surrounded by the insulating layers 94C and the triangular space of the truss structure is insulated from other portions of the first base portion 83C.

Further, the Z-axis angular velocity sensor 92C includes insulating layers 98C embedded in portions close to the tip end portions 95C of the second comb tooth portions 87C. Each second comb tooth portion 87C is partitioned into the tip end portion 95C, the intermediate portion 96C, and the base end portion 97C by the insulating layers 89C and 98C.

Further, the Z-axis angular velocity sensor 92C includes Z first drive wiring 99C and Z second drive wiring 100C connected to the opposed portions 93C of the first base portion 83C and the tip end portions 95C of the second comb tooth portions 87C, respectively.

In this Z-axis angular velocity sensor 92C, the opposed portions 93C of the Z fixed electrode 81C and the tip end portions 95C of the Z movable electrode 82C opposed to each other at an interval therebetween constitute drive portions between which drive voltages are applied to oscillate the Z movable electrode 82C by coulomb forces generated by changes in the drive voltages.

Between the opposed portions 93C of the Z fixed electrode 81C and the tip end portions 95C of the Z movable electrode 82C, drive voltages with the same polarity and drive voltages with different polarities are alternately applied via the Z first drive wiring 99C and the Z second drive wiring 100C. Accordingly, coulomb repulsive and attractive forces are alternately generated between the opposed portions 93C and the tip end portions 95C.

As a result, the comb-tooth-like Z movable electrode 82C oscillates up and down like a pendulum similarly around the comb-tooth-like Z fixed electrode 81C as a center of oscillation along the Z-axis direction with respect to the Z fixed electrode 81C (oscillation Uz).

In this state, when the Z movable electrode 82C rotates around the X axis as a central axis, a coriolis force $F_y$ is generated in the Y-axis direction. This coriolis force $F_y$ changes the opposing area and/or electrode-to-electrode distance $d_z$ between the first comb tooth portions 84C and the intermediate portions 96C of the second comb tooth portions 87C adjacent to each other.

Then, by detecting a change in capacitance between the Z movable electrode 82C and the Z fixed electrode 81C caused by the change in opposing area and/or electrode-to-electrode distance $d_z$, the angular velocity $\omega_x$ around the X axis is detected.

The material of the protective layer 16C is not limited to $SiO_2$ as long as the material is an inorganic material, and may be, for example, SiN. In this case, in order to secure the etching selectivity of the first sacrifice layer 39C to the protective layer 16C, the first sacrifice layer 39C is preferably made of $SiO_2$.

In the preferred embodiment described above, a sacrifice layer having a two-layer structure including the first sacrifice layer 39C and the second sacrifice layer 40C is formed, however, the sacrifice layer may have a single-layer structure, a three-layer structure, a four-layer structure, and five or more-layer structures as long as the material of the sacrifice layer has etching selectivity to the protective layer 16C and the base substrate 9C.

(4) Fourth Preferred Embodiment
<Entire Arrangement of MEMS Package>

Figure 28:
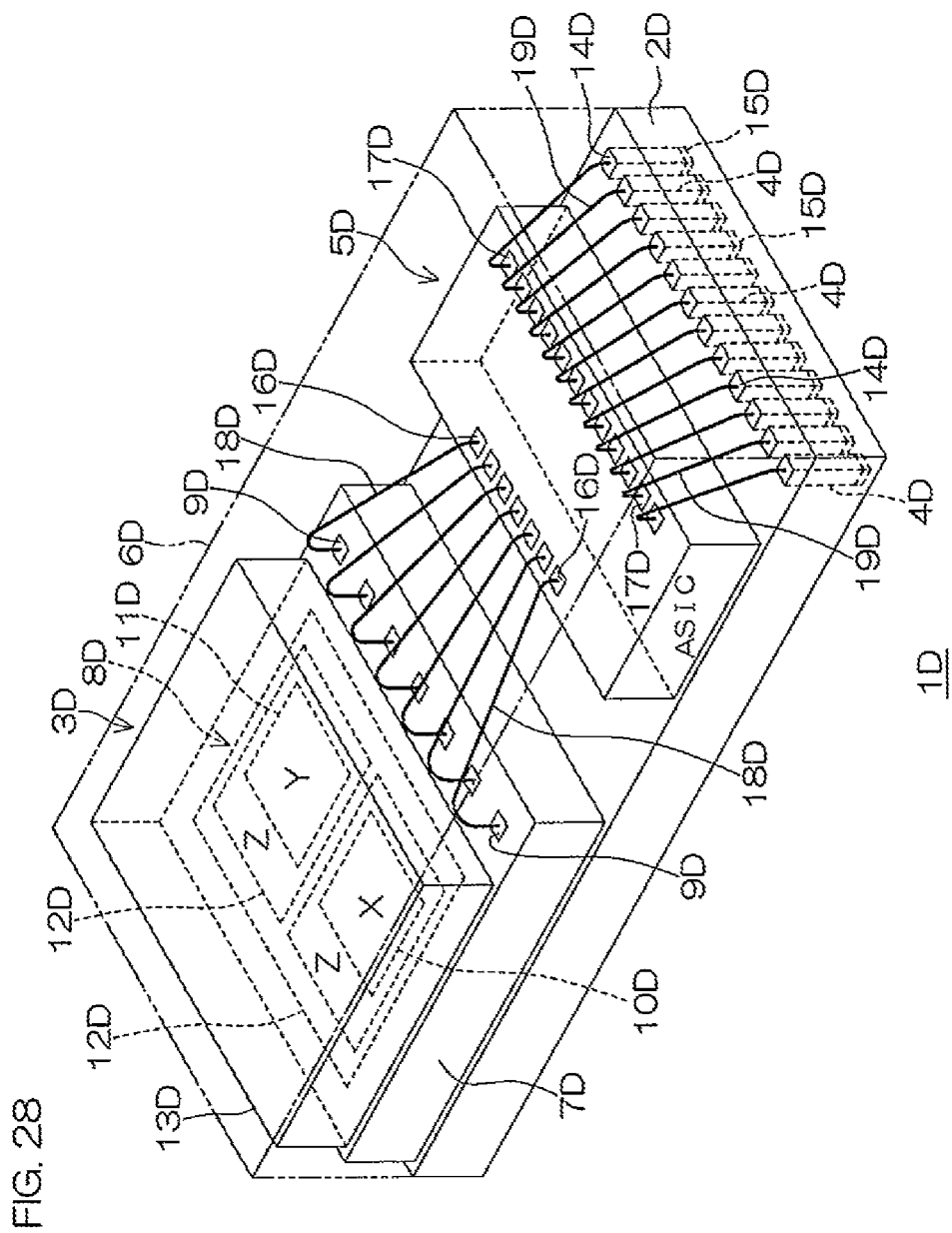
FIG. 28 is a schematic perspective view of a MEMS package according to a fourth preferred embodiment of the present invention.

FIG. 28 is a schematic perspective view of a MEMS package according to a fourth preferred embodiment of the present invention.

The MEMS package 1D is used for, for example, correction of shake of a video camera or a still camera, position detection of a car navigation system, and motion detection of a robot and a gaming machine, etc.

The MEMS package 1D includes a substrate 2D, an angular velocity sensor 3D as a MEMS sensor, external terminals 4D, an integrated circuit 5D (ASIC: Application Specific Integrated Circuit), and a resin package 6D.

The substrate 2D is formed to have a rectangular plate shape having a surface and a back surface.

The angular velocity sensor 3D is disposed on one end portion in the longitudinal direction on the surface side of the substrate 2D. The angular velocity sensor 3D includes a base substrate 7D having a square plate shape formed of a Si substrate, a sensor portion 8D provided at the central portion of the base substrate 7D, and electrode pads 9D that are disposed on the lateral side of the sensor portion 8D on the base substrate 7D to supply a voltage to the sensor portion 8D.

The sensor portion 8D includes an X-axis sensor 10D, a Y-axis sensor 11D, and Z-axis sensors 12D as sensors that respectively detect angular velocities around three axes orthogonal to each other in a three-dimensional space. These three sensors 10D to 12D are covered and sealed by a lid substrate 13D that is formed of, for example, a Si substrate and bonded to the base substrate 7D.

The X-axis sensor 10D generates a coriolis force Fz in the Z-axis direction by using oscillation Ux in the X-axis direction when the MEMS package 1D is tilted, and detects an angular velocity ωy applied around the Y axis by detecting a change in capacitance caused by the coriolis force. The Y-axis sensor 11D generates a coriolis force Fx in the X-axis direction by using oscillation Uy in the Y-axis direction when the MEMS package 1D is tilted, and detects an angular velocity ωz applied around the Z axis by detecting a change in capacitance caused by the coriolis force. The Z-axis sensor 12D generates a coriolis force Fy in the Y-axis direction by using oscillation Uz in the Z-axis direction when the MEMS package 1D is tilted, and detects an angular velocity ωx applied around the X axis by detecting a change in capacitance caused by the coriolis force.

A plurality (seven in FIG. 28) of the electrode pads 9D are provided at even intervals along the width direction orthogonal to the longitudinal direction of the substrate 2D.

A plurality (twelve in FIG. 28) of the external terminals 4D are provided at even intervals along the width direction of the substrate 2D on the other end portion in the longitudinal direction of the substrate 2D (end portion on the side opposite to the angular velocity sensor 3D). The external terminals 4D are formed to penetrate through the substrate 2D in the thickness direction, and are exposed as internal pads 14D to the surface of the substrate 2D and exposed as external pads 15D to the back surface of the substrate 2D.

The integrated circuit 5D is disposed between the angular velocity sensor 3D and the external terminals 4D (internal pads 14D) on the surface side of the substrate 2D. The integrated circuit 5D is formed of, for example, a Si substrate having a rectangular plate shape long in the width direction of the substrate 2D. Inside this Si substrate, charge amplifiers that amplify electric signals output from the sensors 10D to 12D, filter circuits (low-pass filters: LPF, etc.) that extract specific frequency components of the electric signals, and logic circuits that carry out logic operations of filtered electric signals, etc., are formed. These circuits consist of, for example, CMOS devices. The integrated circuit 5D includes first electrode pads 16D and second electrode pads 17D.

A plurality (seven in FIG. 28) of first electrode pads 16D are provided at even intervals along the width direction of the substrate 2D at an end portion on the side close to the angular velocity sensor 3D in the longitudinal direction of the substrate 2D. The first electrode pads 16D are connected one-to-one to the electrode pads 9D of the angular velocity sensor 3D by bonding wires 18D.

A plurality (twelve in FIG. 28) of the second electrode pads 17D are provided at even intervals along the width direction of the substrate 2D on an end portion on the side close to the external terminals 4D in the longitudinal direction of the substrate 2D. The second electrode pads 17D are connected one-to-one to the internal pads 14D of the external terminals 4D by bonding wires 19D.

The resin package 6D defines the external shape of the MEMS package 1D in cooperation with the substrate 2D, and is formed to have a substantially rectangular parallelepiped shape. The resin package 6D is made of, for example, a known molding resin such as epoxy resin, and covers the bonding wires 18D and 19D and the internal pads 14D as well as the angular velocity sensor 3D and the integrated circuit 5D, and seals the angular velocity sensor 3D and the integrated circuit 5D in such a manner that the external pads 15D are exposed.

<Arrangement of Z-axis Sensors>

Next, an arrangement of the Z-axis sensors 12D will be described with reference to FIG. 29.

The angular velocity sensor 3D includes a base substrate 7D (for example, thickness: 625 μm) as described above.

On the surface 20D of the base substrate 7D, a base insulating film 21D (for example, thickness: 10000 Å) is formed. The base insulating film 21D is made of $SiO_2$ (silicon oxide).

On the base insulating film 21D, a drive electrode 22D (for example, thickness: 5000 Å) is formed as a lower electrode. The drive electrode 22D is made of polysilicon.

Further, on the base insulating film 21D, an electrode coating film 23D (for example, thickness: 5000 Å) that coats the drive electrode 22D is formed. The electrode coating film 23D is made of $SiO_2$. In the electrode coating film 23D, an opening 25D for exposing a portion of the drive electrode 22D as a pad 24D is formed.

On the electrode coating film 23D, a polysilicon layer 26D (for example, thickness: 10 μm) is formed. The polysilicon layer 26D includes a fixed electrode 27D and a movable electrode 28D as an upper electrode and a contact electrode 29D.

The fixed electrode 27D includes a contact portion 31D provided to stand on the surface 30D of the electrode coating film 23D, and comb tooth portions 32D formed of a plurality of electrodes aligned like comb teeth along the surface 20D of the base substrate 7D above the electrode coating film 23D.

The contact portion 31D of the fixed electrode 27D includes a base portion 33D (for example, height: 5 μm) fixed to the surface 30D of the electrode coating film 23D, and a joint portion 34D that is joined integrally to the top portion of the base portion 33D and has the same thickness (described later) as the comb tooth portions 32D.

The joint portion 34D is formed to bulge more to the outside than the side surfaces 35D of the base portion 33D. Accordingly, between the side surfaces 36D of the joint portion 34D and the side surfaces 35D of the base portion 33D, a step $S_1$ is formed.

The comb tooth portions 32D of the fixed electrode 27D are formed integrally with the joint portion 34D of the contact portion 31D, and one end of the comb tooth portions 32D is supported by the joint portion 34D so that a cavity 37D is formed between the comb tooth portions 32D and the surface 30D of the electrode coating film 23D. Specifically, the comb tooth portions 32D are supported in a floating state by the height of the base portion 33D of the contact portion 31D from the surface 30D of the electrode coating film 23D. The thickness of the comb tooth portions 32D (the height from the top portion of the base portion 33D to the surface of the polysilicon layer 26D) is, for example, approximately 15 μm.

The movable electrode 28D includes a contact portion 38D provided to stand on the surface 30D of the electrode coating film 23D and comb tooth portions 39D that consist of a plurality of electrodes disposed on the respective portions between the comb tooth portions 32D of the fixed electrode 27D above the electrode coating film 23D, and engage with the comb tooth portions 32D of the fixed electrode 27D as a whole. A distance (electrode-to-electrode distance $d_1$) of, for example, approximately 2 μm is provided between the comb tooth portions 39D and the comb tooth portions 32D of the fixed electrode 27D.

The contact portion 38D of the movable electrode 28D is provided on the side opposite to the comb tooth portions 32D of the fixed electrode 27D with respect to the contact portion 31D of the fixed electrode 27D. The contact portion 38D includes a base portion 40D (for example, height: 5 μm) fixed to the surface 30D of the electrode coating film 23D, and a joint portion 41D joined integrally to the top portion of the base portion 40D and having the same thickness (described later) as that of the comb tooth portions 39D.

The joint portion 41D is formed to bulge more to the outside than the side surfaces 42D of the base portion 40D. Accordingly, a step $S_2$ is formed between the side surfaces 43D of the joint portion 41D and the side surfaces 42D of the base portion 40D.

The comb tooth portions 39D of the movable electrode 28D are formed integrally with the joint portion 41D of the contact portion 38D, and one end of the comb tooth portions 39D is supported by the joint portion 41D so that a cavity 37D is formed between the comb tooth portions 39D and the surface 30D of the electrode coating film 23D in the same manner as the comb tooth portions 32D of the fixed electrode 27D. Specifically, the comb tooth portions 39D are supported in a floating state by the height of the base portion 40D of the contact portion 38D from the surface 30D of the electrode coating film 23D. The thickness of the comb tooth portions 39D (the height from the top portion of the base portion 40D to the surface of the polysilicon layer 26D) is, for example, approximately 15 μm.

In the present preferred embodiment, directly below the cavity 37D, the drive electrode 22D is formed across the comb teeth on both ends (in FIG. 29, the comb tooth portion 32D closest to the contact electrode 29D and the comb tooth portion 39D closest to the contact portion 31D of the fixed electrode 27D) so as to extend across the comb tooth portions 32D and 39D of the fixed electrode 27D and the movable electrode 28D that engage with each other like comb teeth. Accordingly, one drive electrode 22D is opposed to all the comb tooth portions 32D and 39D of the fixed electrode 27D and the movable electrode 28D.

The contact electrode 29D includes a base portion 44D (for example, height: 5 μm) connected to the drive electrode 22D via the opening 25D of the electrode coating film 23D and a joint portion 45D joined integrally to the top portion of the base portion 44D.

The joint portion 45D is formed to bulge more to the outside than the side surfaces 46D of the base portion 44D. Accordingly, between the side surfaces 47D of the joint portion 45D and the side surfaces 46D of the base portion 44D, a step $S_3$ is formed.

On the polysilicon layer 26D, a surface protective film 48D (for example, thickness: 3000 Å) made of $SiO_2$ is formed. Accordingly, the surfaces of the comb tooth portions 32D and 39D and the contact portions 31D and 38D (joint portions 34D and 41D) of the fixed electrode 27D and the movable electrode 28D and the contact electrode 29D are covered by the surface protective film 48D.

On the surface protective film 48D, at portions opposed to the contact portion 31D of the fixed electrode 27D, the contact portion 38D of the movable electrode 28D, and the contact electrode 29D, a first detection wiring 49D, a second detection wiring 50D, and a drive wiring 51D are formed, respectively. The wirings 49D to 51D are made of Al (aluminum), and are connected to the contact portion 31D of the fixed electrode 27D, the contact portion 38D of the movable electrode 28D, and the contact electrode 29D, respectively, by penetrating through the surface protective film 48D.

In the Z-axis sensor 12D structured as described above, drive voltages with the same polarity and drive voltages with different polarities are alternately applied between the comb tooth portions 39D of the movable electrode 28D and the drive electrode 22D. Accordingly, coulomb repulsive and attractive forces are alternately generated between the comb tooth portions 39D of the movable electrode 28D and the drive electrode 22D.

As a result, the comb-tooth-like movable electrode 28D oscillates up and down like a pendulum similarly around the comb-tooth-like fixed electrode 27D as a center of oscillation along the Z-axis direction with respect to the fixed electrode 27D (oscillation Uz).

In this state, when the movable electrode 28D rotates around the X axis as a central axis, a coriolis force Fy is generated in the Y-axis direction. This coriolis force Fy changes the opposing area and/or electrode-to-electrode distance $d_1$ between the comb tooth portions 39D of the movable electrode 28D and the comb tooth portions 32D of the fixed electrode 27D adjacent to each other.

Then, by detecting a change in capacitance C between the movable electrode 28D and the fixed electrode 27D caused by the change in opposing area and/or electrode-to-electrode distance $d_1$, the angular velocity ωx around the X axis is detected.

<Method for Manufacturing Angular Velocity Sensor>

Next, with reference to FIG. 30A to FIG. 30L, the manufacturing process of the above-described angular velocity sensor will be described in order of steps. In this paragraph, only the manufacturing process of the Z-axis sensors is shown in the drawings, and the description of the manufacturing processes of the X-axis sensor and the Y-axis sensor are omitted, however, the manufacturing processes of the X-axis sensor and the Y-axis sensor are performed in parallel to the manufacturing process of the Z-axis sensors in the same manner as the manufacturing process of the Z-axis sensors.

Figure 29:
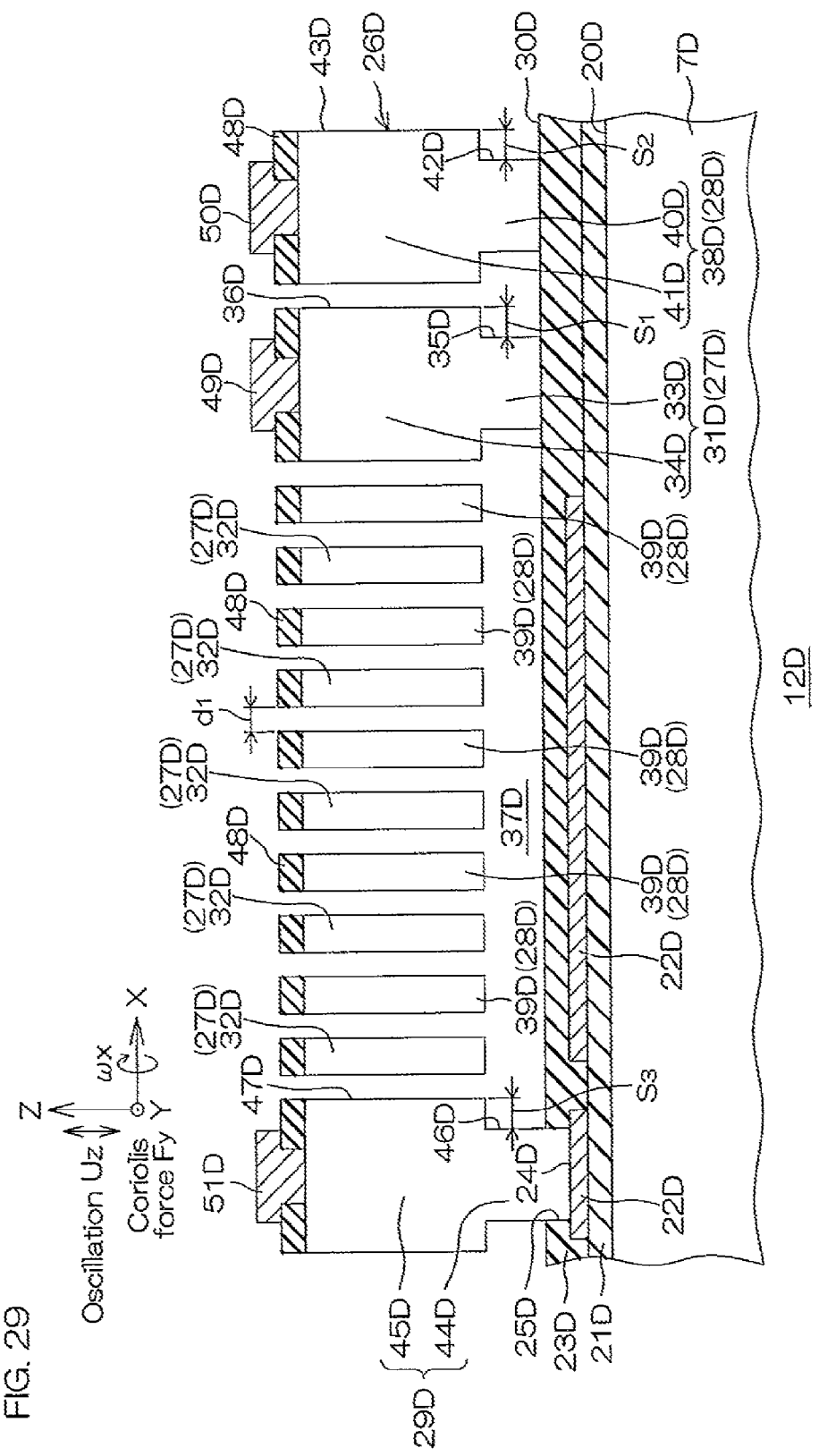
FIG. 29 is a schematic sectional view of the Z-axis sensor shown in FIG. 1.

FIG. 30A to FIG. 30L are sectional views showing parts of the manufacturing process of the Z-axis sensors shown in FIG. 29, illustrating a section taken at the same position as in FIG. 29.

To manufacture the Z-axis sensor 12D, as shown in FIG. 30A, the surface 20D of the base substrate 7D made of conductive silicon is thermally oxidized (for example, temperature: 1000° C. to 1200° C.). Accordingly, on the surface 20D of the base substrate 7D, a base insulating film 21D made of $SiO_2$ is formed. Next, by a CVD (Chemical Vapor Deposition) method, polysilicon is deposited on the entire surface of the base insulating film 21D. Subsequently, by a known patterning technique, the polysilicon is selectively patterned to form the drive electrode 22D.

Next, as shown in FIG. 30B, by a CVD method, the electrode coating film 23D made of $SiO_2$ having etching selectivity to polysilicon is formed on the entire surface of the base insulating film 21D. Accordingly, the drive electrode 22D is completely coated by the electrode coating film 23D.

Here, the material having etching selectivity to polysilicon (in this paragraph, defined as material A) is, for example, a material satisfying a ratio (etching selectivity) of the etching rate of polysilicon to a certain etching medium to the etching rate of material A to the etching medium=(etching rate of material A/etching rate of polysilicon)≠1. In particular, the material A preferably makes the etching selectivity closer to 0 (zero) (etching selectivity≈0), and in detail, the material A is preferably $SiO_2$ as in the present preferred embodiment. The electrode coating film 23D may be made of other materials (for example, SiN, etc.) having etching selectivity to polysilicon.

Next, as shown in FIG. 30C, by a CVD method, polysilicon (for example, thickness: 5000 Å) is deposited on the entire region of the surface 30D of the electrode coating film 23D. Subsequently, by a known patterning technique, the polysilicon is selectively patterned to form a sacrifice polysilicon layer 52D.

Next, as shown in FIG. 30D, by a CVD method, a sacrifice oxide film 53D made of $SiO_2$ (for example, thickness: 5000 Å) is formed on the entire surface of the sacrifice polysilicon layer 52D.

Next, as shown in FIG. 30E, by a known patterning technique, the sacrifice oxide film 53D is patterned, and the portions at which the base portions 33D, 40D, and 44D should be formed of the sacrifice oxide film 53D are selectively removed, and accordingly, openings 25D, 54D, and 55D are formed. Accordingly, a portion of the drive electrode 22D is exposed as a pad 24D from the opening 25D.

Figure 30F:
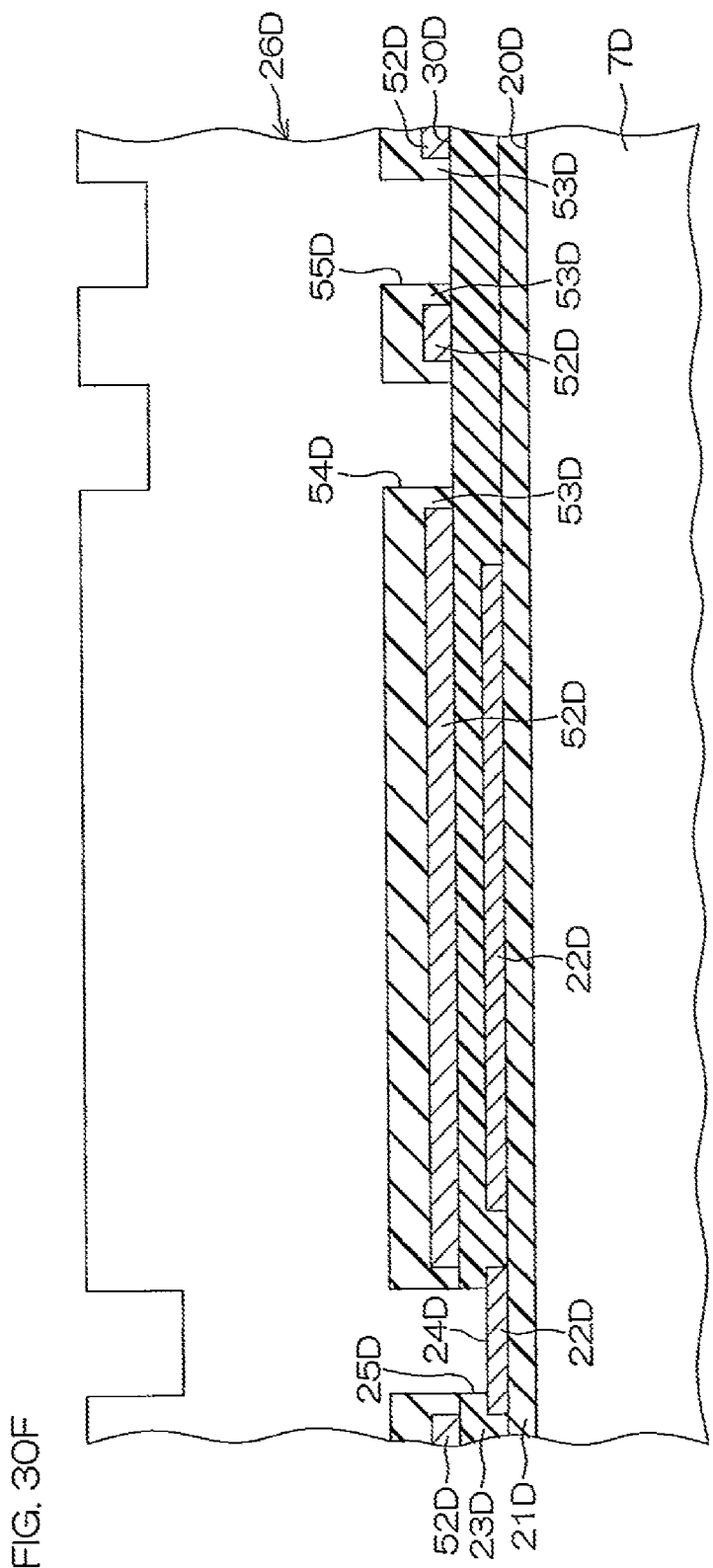
FIG. 30A to FIG. 30L are sectional views showing parts of a manufacturing process of the Z-axis sensors shown in FIG. 29 in order of steps.

Next, on the sacrifice oxide film 53D, a seed film made of polysilicon is formed. Subsequently, from this seed film, polysilicon is epitaxially grown. Accordingly, as shown in FIG. 30F, a polysilicon layer 26D (for example, thickness: 15 μm) is formed as an electrode polysilicon layer.

Next, as shown in FIG. 30G, CMP (Chemical Mechanical Polishing) is applied until the surface of the polysilicon layer 26D becomes flush. Accordingly, the thickness of the polysilicon layer 26D changes from, for example, 15 μm to 10 μm. Subsequently, by a CVD method, a surface protective film 48D made of $SiO_2$ is formed on the entire surface of the polysilicon layer 26D. Subsequently, by a known patterning technique, the surface protective film 48D is selectively removed. Accordingly, contact holes are formed in the surface protective film 48D. Subsequently, after contact plugs filling the contact holes are formed, Al is deposited by sputtering on the surface protective film 48D, and this Al deposition layer is patterned. Accordingly, wirings 49D to 51D are formed concurrently on the surface protective film 48D.

Figure 30H:
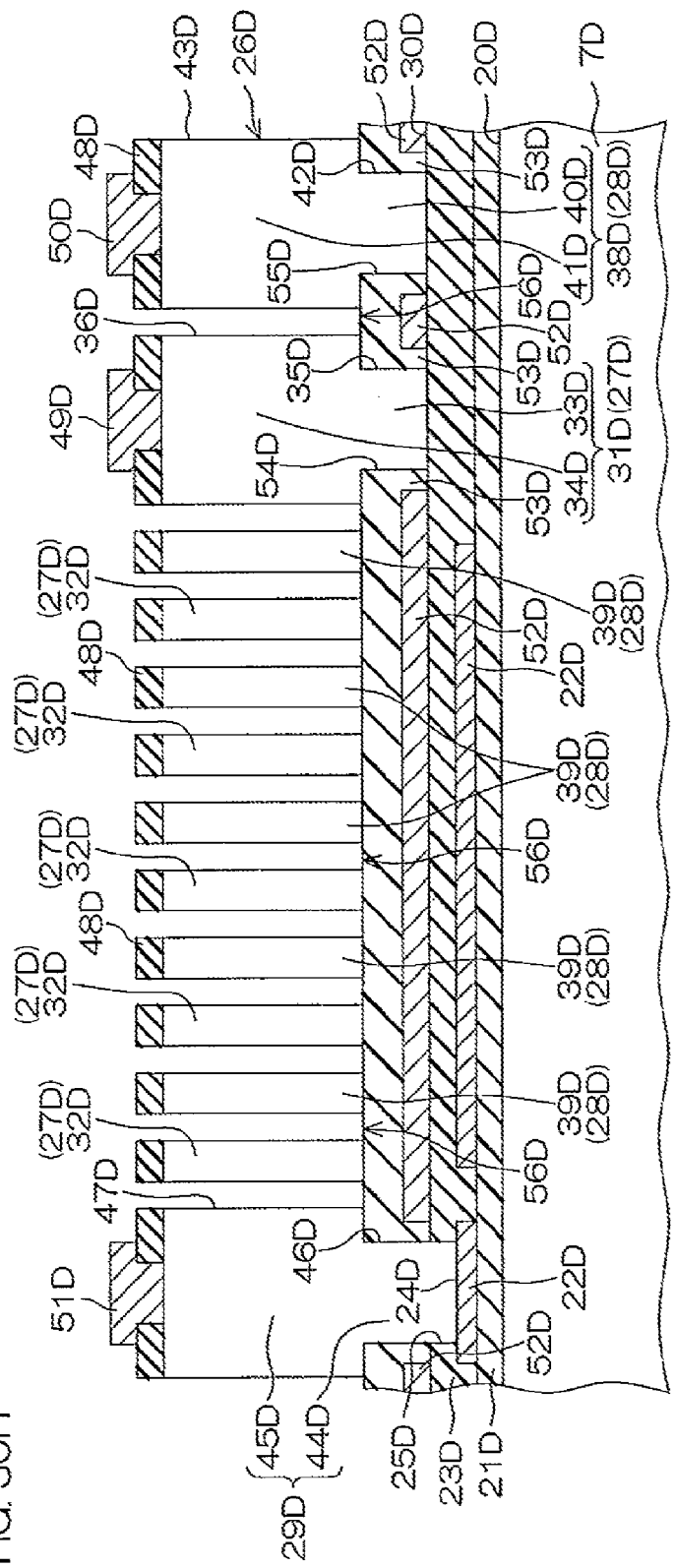
Figure 30:
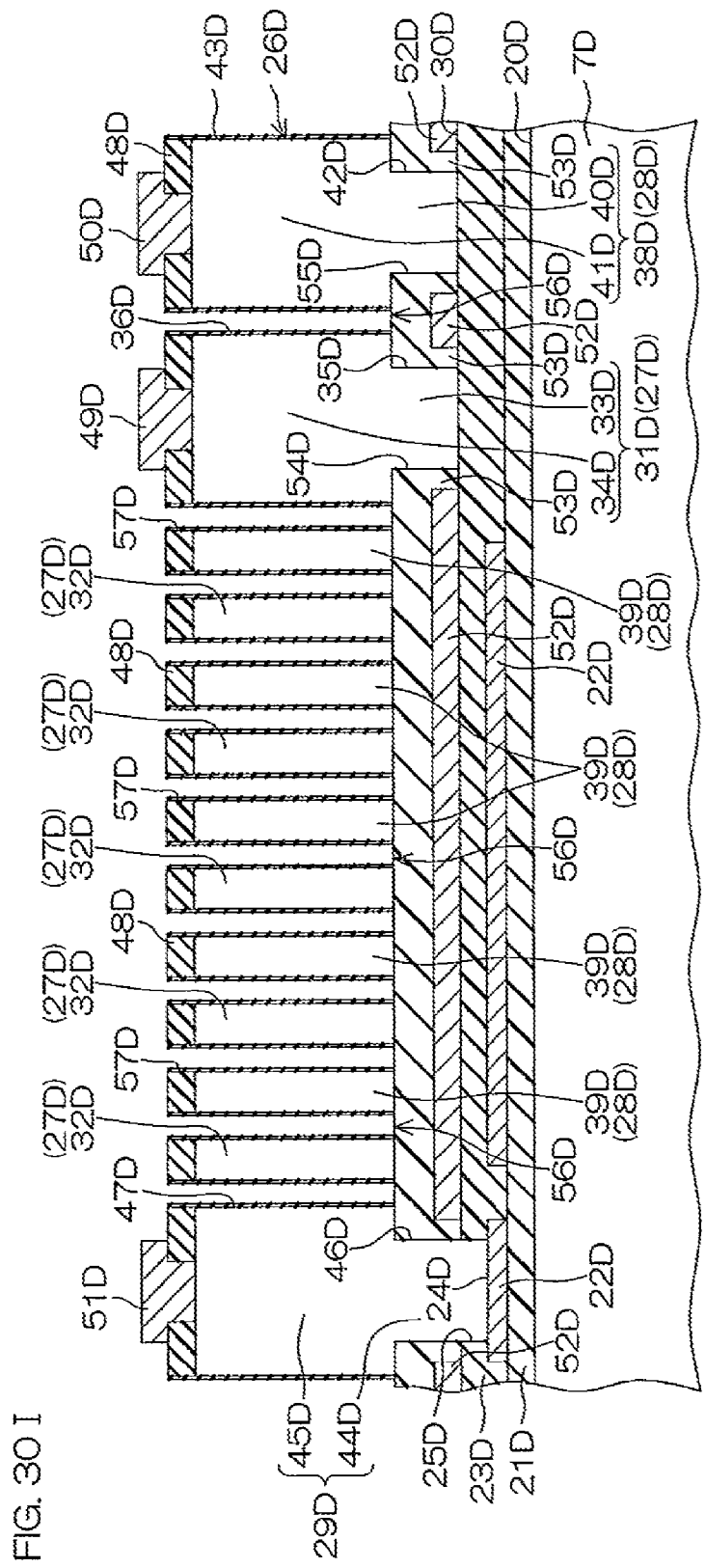

Next, as shown in FIG. 30H, by a known patterning technique, openings are formed in regions except for the regions in which the fixed electrode 27D, the movable electrode 28D, and the contact electrode 29D should be formed in the surface protective film 48D. Subsequently, by anisotropic deep RIE using the remaining surface protective film 48D as a hard mask, specifically, by a Bosch process, the polysilicon layer 26D is dug. In the Bosch process, a step of etching the polysilicon layer 26D by using $SF_6$ (sulfur hexafluoride) and a step of forming a protective film on the etched surfaces by using $C_4F_8$ (perfluorocyclobutane) are alternately repeated. Accordingly, the polysilicon layer 26D can be etched at a high aspect ratio, however, a wavy irregularity called scallop is formed on the etched surfaces (inner peripheral surfaces of the trenches).

Accordingly, the polysilicon layer 26D is molded into the shapes of the fixed electrode 27D, the movable electrode 28D, and the contact electrode 29D, and between these portions (the comb tooth portions 32D and 39D and the contact portions 31D and 38D, etc.), trenches 56D are formed. The surface of the sacrifice oxide film 53D is exposed to the bottom surfaces of the trenches 56D.

Next, as shown in FIG. 30I, by a CVD method, a protective thin film 57D made of $SiO_2$ is formed on the entire surfaces of the fixed electrode 27D, the movable electrode 28D, and the contact electrode 29D and the entire inner surfaces of the trenches 56D (that is, the side surfaces and the bottom surfaces defining the trenches 56D).

Figure 30J:
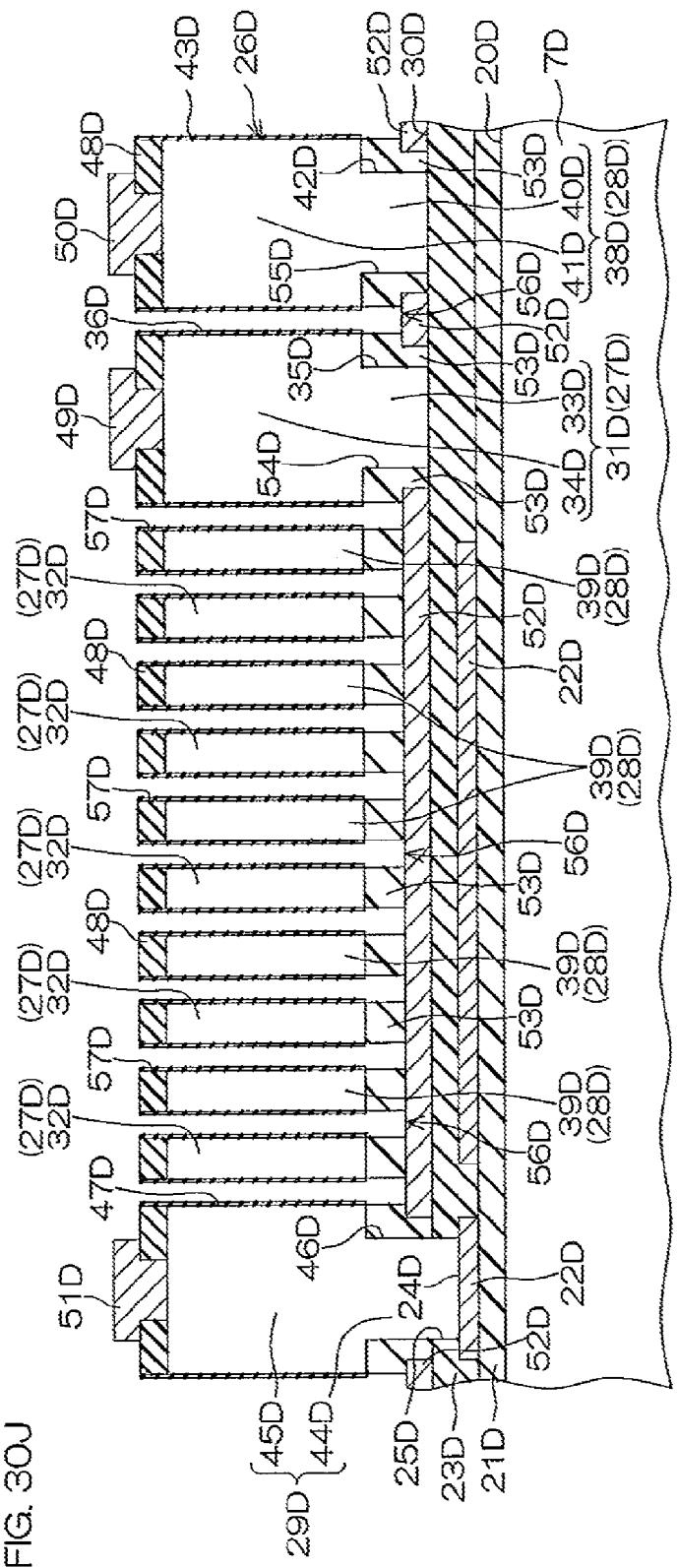

Next, as shown in FIG. 30J, by anisotropic deep RIE, the bottom surfaces of the trenches 56D are further dug. Accordingly, the sacrifice polysilicon layer 52D is exposed as the bottom surfaces of the trenches 56D.

Figure 30K:
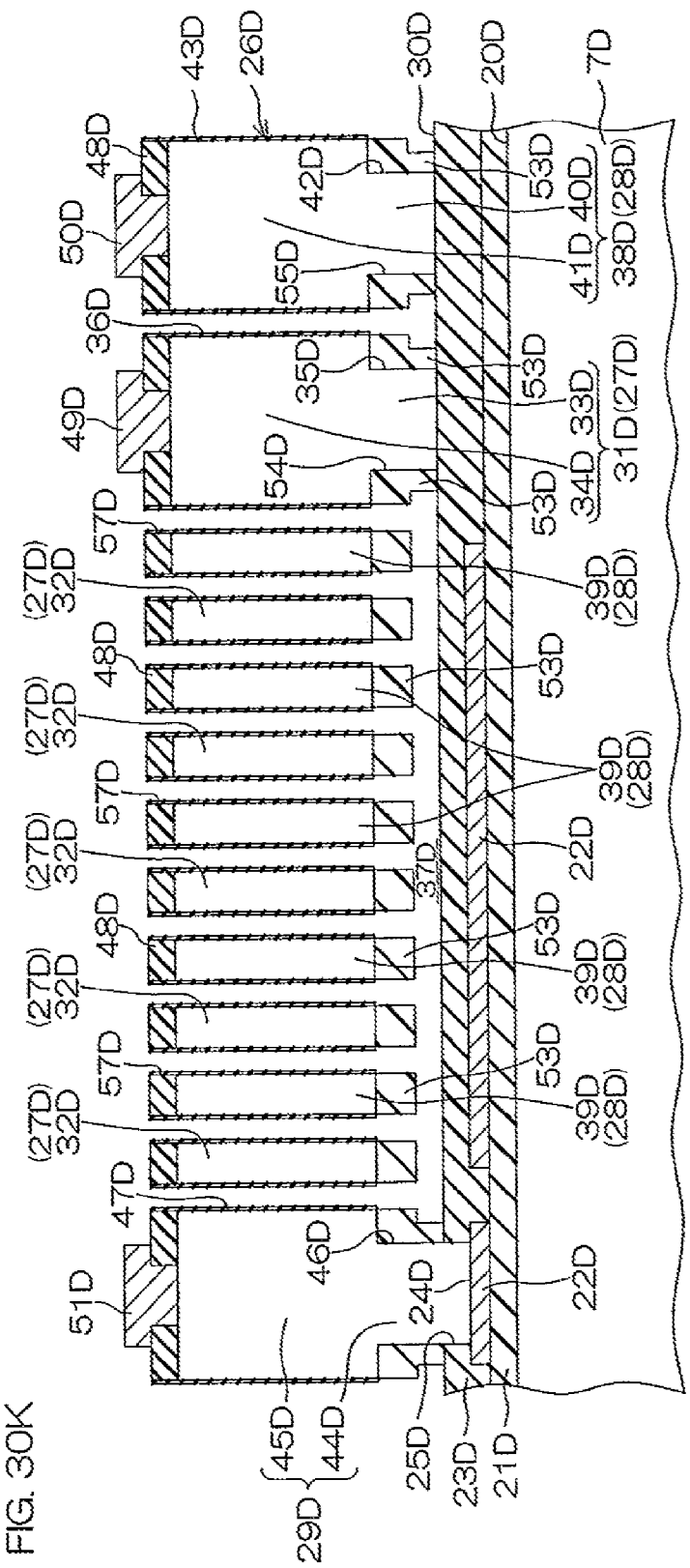

Subsequent to this anisotropic deep RIE, reactive ions and etching gas (for example, $SF_6$ gas) are supplied into the trenches 56D by isotropic RIE. Then, by action of the reactive ions, etc., as shown in FIG. 30K, the sacrifice polysilicon layer 52D is etched in the direction parallel to the surface of the base substrate 7D while being etched in the thickness direction of the base substrate 7D from the bottom portions of the trenches 56D. Accordingly, the bottom portions of all trenches 56D adjacent to each other are integrated together to form a cavity 37D, and directly above the cavity 37D, the fixed electrode 27D (comb tooth portions 32D) and the movable electrode 28D (comb tooth portions 39D) are in a floating state.

Next, as shown in FIG. 30L, an etching gas (for example, HF (hydrofluoric acid) gas) is supplied into the trenches 56D. By the action of this HF gas, the protective thin film 57D and the sacrifice oxide film 53D made of $SiO_2$ are removed.

Through the above-described steps, the Z-axis sensor 12D shown in FIG. 29 is obtained.

According to the above-described method, after the drive electrode 22D is formed on the base substrate 7D (the step of FIG. 30A), the fixed electrode 27D and the movable electrode 28D for angular velocity detection in the Z-axis sensor 12D are formed by using the polysilicon layer 26D on the base substrate 7D. Therefore, before forming the fixed electrode 27D and the movable electrode 28D, the drive electrode 22D can be easily formed directly below the fixed electrode 27D and the movable electrode 28D.

Further, in the manufacturing process of the Z-axis sensors 12D, between the drive electrode 22D and the polysilicon layer 26D, the sacrifice polysilicon layer 52D and the sacrifice oxide film 53D are formed (the steps of FIG. 30C and FIG. 30D). These sacrifice layers 52D and 53D are removed after the polysilicon layer 26D is molded into the fixed electrode 27D and the movable electrode 28D (the steps of FIG. 30K and FIG. 30L). Therefore, the cavity 37D can be easily formed between the fixed electrode 27D (comb tooth portions 32D), the movable electrode 28D (comb tooth portions 39D) and the drive electrode 22D. Accordingly, the Z-axis sensor 12D including a capacitor in which the fixed electrode 27D (comb tooth portions 32D), the movable electrode 28D (comb tooth portions 39D) are opposed to the drive electrode 22D vertically via the cavity 37D can be manufactured.

Therefore, in the step of FIG. 30A, by adjusting the area of the drive electrode 22D to an appropriate size, the capacitor capacity between the movable electrode 28D (comb tooth portions 39D) and the drive electrode 22D can be controlled to an optimum capacity for sensor operation.

In detail, the drive electrode 22D is formed across comb teeth on both ends so as to extend across the comb tooth portions 32D and 39D of the fixed electrode 27D and the movable electrode 28D. Accordingly, the area of the drive electrode 22D opposed to the movable electrode 28D (comb tooth portions 39D) can be made larger than the opposing area of the fixed electrode 27D (comb tooth portions 32D) to the movable electrode 28D (comb tooth portions 39D). Therefore, as compared with a case where drive voltages are applied between the fixed electrode 27D and the movable electrode 28D that engage with each other like comb teeth, the movable electrode 28D can be oscillated with a larger amplitude. As a result, the angular velocity detection sensitivity can be improved.

In addition, even after the cavity 37D is formed by removing the sacrifice polysilicon layer 52D and the sacrifice oxide film 53D, the drive electrode 22D is covered by the electrode coating film 23D. Therefore, even if the movable electrode 28D approaches the drive electrode 22D due to great oscillation, the movable electrode 28D (comb tooth portions 39D) and the drive electrode 22D can be prevented from coming into contact with each other. As a result, the movable electrode 28D (comb tooth portions 39D) and the drive electrode 22D can be prevented from being short-circuited by each other. Therefore, operation failures of the sensor can be reduced.

As a result, according to the MEMS package 1D, the detection accuracy of the Z-axis sensors 12D can be improved.

In the manufactured Z-axis sensor 12D, if the protective thin film 57D remains on the side walls of the fixed electrode 27D and the movable electrode 28D, as compared with the present preferred embodiment in which the protective thin film 57D is not provided, the fixed electrode 27D and the movable electrode 28D are easily charged. Therefore, for example, when a voltage X (V) is applied between the fixed electrode 27D and the movable electrode 28D, the Z-axis sensor 12D may erroneously recognize a potential difference between the fixed electrode 27D and the movable electrode 28D caused by charging as a voltage applied between the fixed electrode 27D and the movable electrode 28D, that is, a so-called memory effect may occur. As a result, there is a possibility that a voltage lower than the voltage X (V) is applied between the fixed electrode 27D and the movable electrode 28D and the designed detection performance cannot be realized.

Therefore, in the Z-axis sensor 12D of the present preferred embodiment, after the cavity 37D is formed, by removing the protective thin film 57D (the step of FIG. 30L), the side walls of the fixed electrode 27D and the movable electrode 28D are exposed. Therefore, the occurrence of the memory effect described above can be reduced. As a result, a necessary and sufficient voltage can be applied between the fixed electrode 27D and the movable electrode 28D, so that the designed detection performance can be reliably realized.

In the Z-axis sensor 12D, by using a portion of the polysilicon layer 26D forming the fixed electrode 27D and the movable electrode 28D, the contact electrode 29D is formed in the same layer as that of the fixed electrode 27D and the movable electrode 28D. Therefore, all contacts with the fixed electrode 27D, the movable electrode 28D, and the drive electrode 22D can be collectively formed as the wirings 49D to 51D formed on the same layer (polysilicon layer 26D). As a result, these wirings 49D to 51D can be formed in the same step, so that the number of manufacturing steps can be reduced. Therefore, the cost can be reduced.

The fourth preferred embodiment of the present invention is described above, however the present invention can also be carried out in other embodiments.

For example, the MEMS package 1D may include an acceleration sensor instead of or in addition to the angular velocity sensor 3D. The acceleration sensor can be manufactured, for example, by forming the capacitor formed between the drive electrode 22D and the movable electrode 28D as a capacitor for acceleration detection.

For example, as shown in FIG. 31, in a Z-axis acceleration sensor 60D that detects acceleration applied in the Z-axis direction, in addition to the capacitor consisting of the fixed electrode 27D (comb tooth portions 32D) and the movable electrode 28D (comb tooth portions 39D), a capacitor consisting of the movable electrode 28D (comb tooth portions 39D) and a second fixed electrode 61D opposed to each other via the cavity 37D and the electrode coating film 23D (at electrode-to-electrode distance $d_2$) along the Z-axis direction can be used for sensor operations. Accordingly, the capacitor relating to acceleration detection operations of the sensor can be increased, so that the acceleration applied to the MEMS package 1D can be accurately detected.

Figure 32:
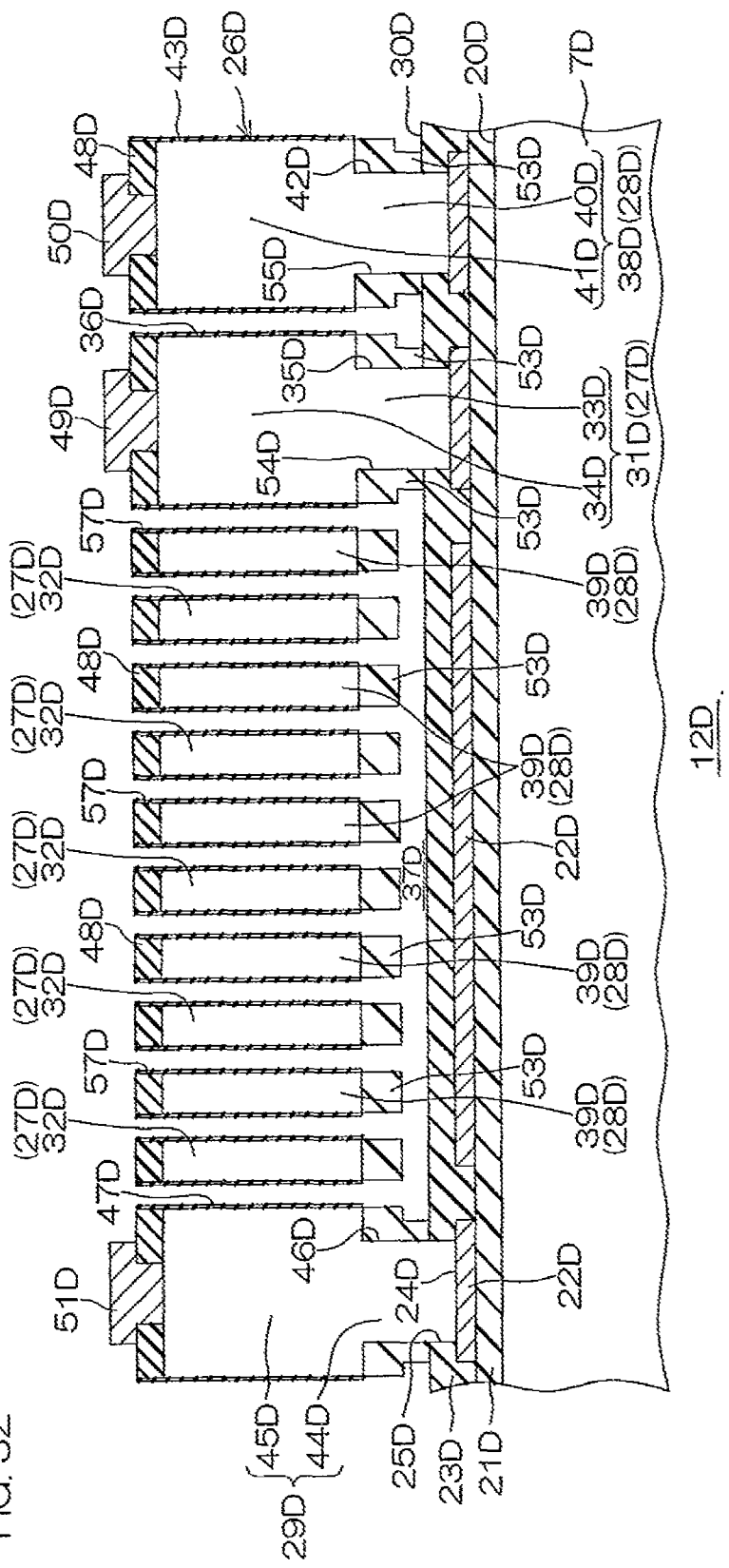
FIG. 32 is a view showing an exemplary variation of the Z-axis sensor shown in FIG. 29.

In the above-described embodiment, in the step of FIG. 30L, the protective thin film 57D and the sacrifice oxide film 53D are removed, however, the protective thin film 57D and the sacrifice oxide film 53D may be left by omitting the step of FIG. 30L as shown in FIG. 32.

(5) Fifth Preferred Embodiment
<Entire Arrangement of MEMS Package>

Figure 33:
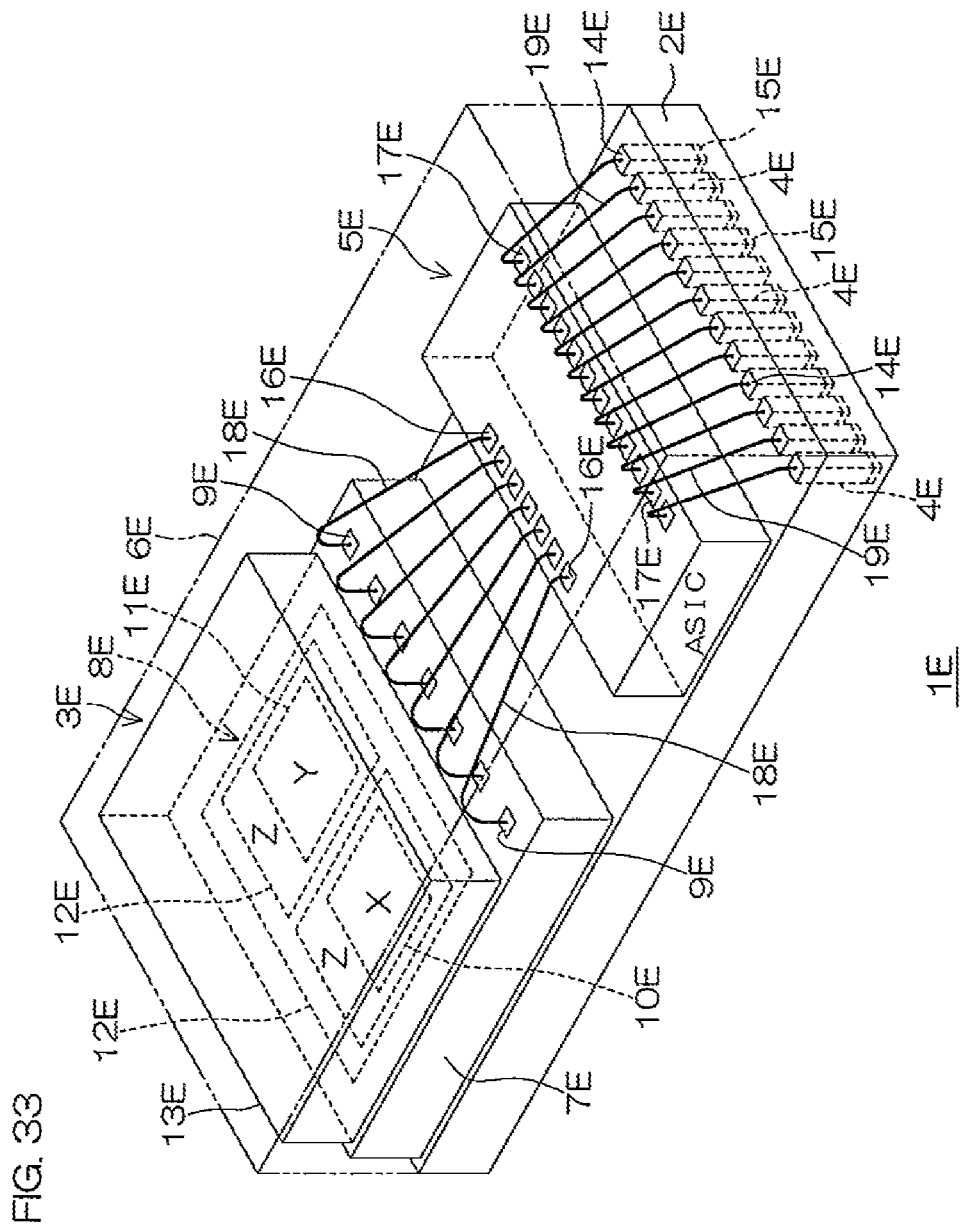
FIG. 33 is a schematic perspective view of a MEMS package according to a fifth preferred embodiment of the present invention.

FIG. 33 is a schematic perspective view of a MEMS package according to a fifth preferred embodiment of the present invention.

The MEMS package 1E is used for, for example, correction of shake of a video camera or a still camera, position detection of a car navigation system, and motion detection of a robot and a gaming machine, etc.

The MEMS package 1E includes a substrate 2E, an angular velocity sensor 3E as a MEMS sensor, external terminals 4E, an integrated circuit 5E (ASIC: Application Specific Integrated Circuit), and a resin package 6E.

The substrate 2E is formed to have a rectangular plate shape having a surface and a back surface.

The angular velocity sensor 3E is disposed on one end portion in the longitudinal direction on the surface side of the substrate 2E. The angular velocity sensor 3E includes a base substrate 7E formed of a Si substrate having a square plate shape, a sensor portion 8E provided at the central portion of the base substrate 7E, and electrode pads 9E that are disposed on the lateral side of the sensor portion 8E on the base substrate 7E and supply a voltage to the sensor portion 8E.

The sensor portion 8E includes an X-axis sensor 10E, a Y-axis sensor 11E, and Z-axis sensors 12E as sensors that respectively detect angular velocities around three axes orthogonal to each other in a three-dimensional space. These three sensors 10E to 12E are covered and sealed by a lid substrate 13E formed of, for example, a Si substrate and bonded to the base substrate 7E.

The X-axis sensor 10E generates a coriolis force Fz in the Z-axis direction by using oscillation Ux in the X-axis direction when the MEMS package 1E is tilted, and detects an angular velocity ωy applied around the Y axis by detecting a change in capacitance caused by the coriolis force. The Y-axis sensor 11E generates a coriolis force Fx in the X-axis direction by using oscillation Uy in the Y-axis direction when the MEMS package 1E is tilted, and detects an angular velocity ωz applied around the Z axis by detecting a change in capacitance caused by the coriolis force. The Z-axis sensor 12E generates a coriolis force Fy in the Y-axis direction by using oscillation Uz in the Z-axis direction when the MEMS package 1E is tilted, and detects an angular velocity ωx applied around the X axis by detecting a change in capacitance caused by the coriolis force.

A plurality (seven in FIG. 33) of the electrode pads 9E are provided at even intervals along the width direction orthogonal to the longitudinal direction of the substrate 2E.

A plurality (twelve in FIG. 33) of the external terminals 4E are provided at even intervals along the width direction of the substrate 2E on the other end portion in the longitudinal direction of the substrate 2E (the end portion on the side opposite to the angular velocity sensor 3E). The external terminals 4E are formed to penetrate through the substrate 2E in the thickness direction, and are exposed as internal pads 14E to the surface of the substrate 2E and exposed as external pads 15E to the back surface of the substrate 2E.

The integrated circuit 5E is disposed between the angular velocity sensor 3E and the external terminals 4E (internal pads 14E) on the surface side of the substrate 2E. The integrated circuit 5E is formed of, for example, a Si substrate having a rectangular plate shape long in the width direction of the substrate 2E. Inside the Si substrate, charge amplifiers that amplify electric signals output from the sensors 10E to 12E, filter circuits (low-pass filters: LPF, etc.) that extract specific frequency components of the electric signals, and logic circuits that carry out logic operations of filtered electric signals, etc., are formed. These circuits consist of, for example, CMOS devices. The integrated circuit 5E includes first electrode pads 16E and second electrode pads 17E.

A plurality (seven in FIG. 33) of the first electrode pads 16E are provided at even intervals along the width direction of the substrate 2E on the end portion on the side close to the angular velocity sensor 3E in the longitudinal direction of the substrate 2E. The first electrode pads 16E are connected one-to-one to the electrode pads 9E of the angular velocity sensor 3E by bonding wires 18E.

A plurality (twelve in FIG. 33) of the second electrode pads 17E are provided at even intervals along the width direction of the substrate 2E on the end portion on the side close to the external terminals 4E in the longitudinal direction of the substrate 2E. The second electrode pads 17E are connected one-to-one to the internal pads 14E of the external terminals 4E by bonding wires 19E.

The resin package 6E defines the external shape of the MEMS package 1E in cooperation with the substrate 2E, and is formed to have a substantially rectangular parallelepiped shape. The resin package 6E is made of, for example, a known molding resin such as epoxy resin, and covers the bonding wires 18E and 19E and the internal pads 14E together with the angular velocity sensor 3E and the integrated circuit 5E, and seals the angular velocity sensor 3E and the integrated circuit 5E in such a manner that the external pads 15E are exposed.

<Arrangement of X-axis Sensor and Y-axis Sensor>

Next, with reference to FIG. 34 to FIG. 36, an arrangement of the X-axis sensor and the Y-axis sensor will be described.

Figure 34:
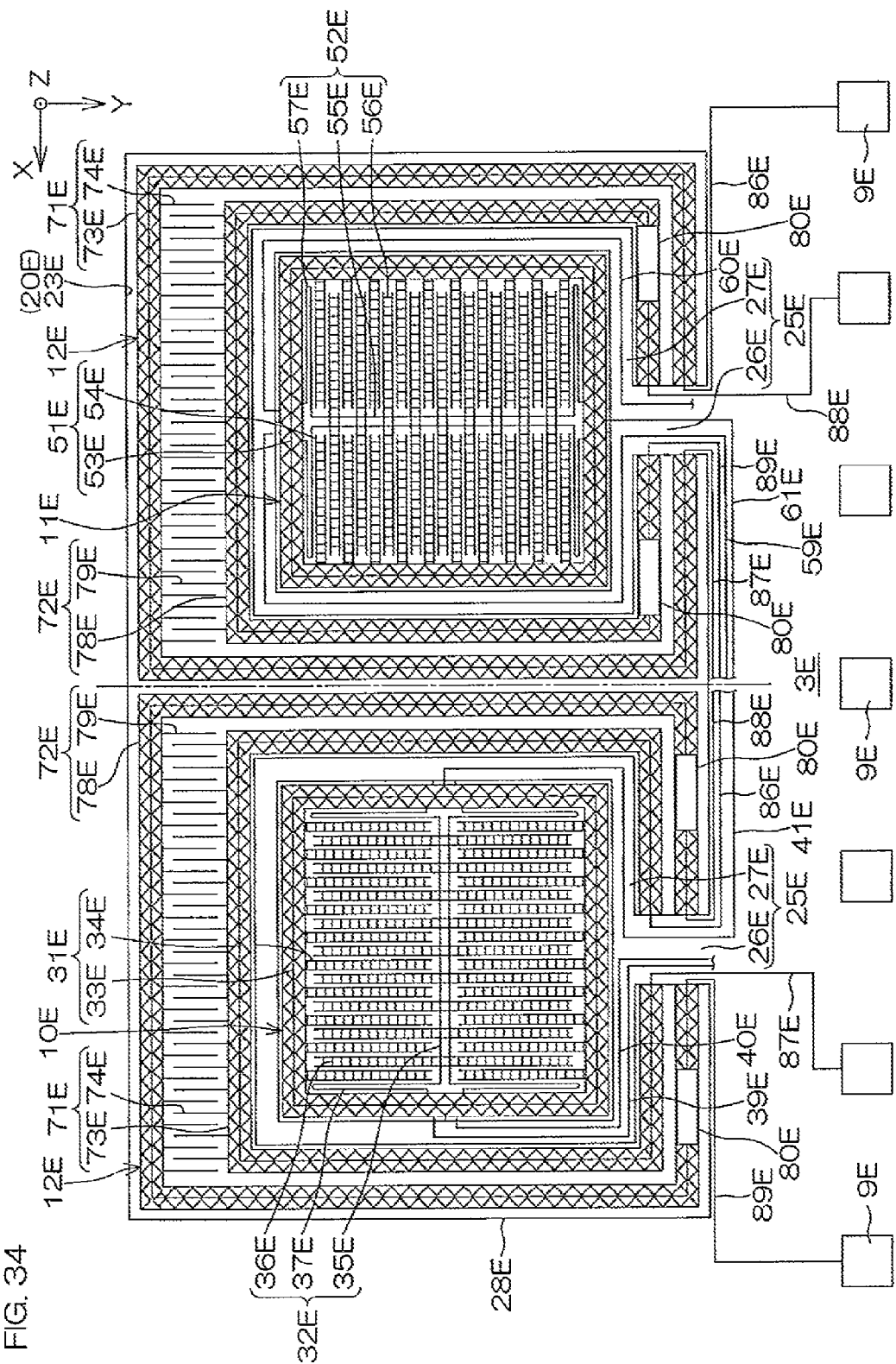
FIG. 34 is a schematic plan view of the angular velocity sensor shown in FIG. 1.

FIG. 34 is a schematic plan view of the angular velocity sensor shown in FIG. 1. FIG. 35 is a plan view of a principal portion of the X-axis sensor shown in FIG. 2. FIG. 36 is a sectional view of the principal portion of the X-axis sensor shown in FIG. 2, illustrating a section taken along the cutting plane H-H in FIG. 35.

The angular velocity sensor 3E includes a base substrate 7E formed of a Si substrate as described above. On the surface layer portion of the base substrate 7E (the portion opposed to the lid substrate 13E of the base substrate 7E), a recess 20E having a rectangular shape in a plan view is formed.

On the base substrate 7E, a base insulating layer 21E (for example, thickness: 2 μm to 10 μm) as a base film and a polysilicon layer 22E (for example, thickness: 5 μm to 20 μm) are laminated in order so as to cover the recess 20E. Accordingly, inside the lamination structure consisting of the base substrate 7E, the base insulating layer 21E, and the polysilicon layer 22E of the angular velocity sensor 3E, a cavity 23E partitioned by the base insulating layer 21E and the base substrate 7E is formed.

The X-axis sensor 10E, the Y-axis sensor 11E, and the Z-axis sensors 12E have a lamination structure including the base insulating layer 21E and the polysilicon layer 22E, and are disposed directly above the cavity 23E. Specifically, the X-axis sensor 10E, the Y-axis sensor 11E, and the Z-axis sensors 12E are provided in a floating state with respect to the bottom wall 24E of the base substrate 7E forming the bottom surface that partitions the cavity 23E from the back surface side.

The X-axis sensor 10E and the Y-axis sensor 11E are disposed adjacent to each other at an interval. The Z-axis sensors 12E are disposed to surround the X-axis sensor 10E and the Y-axis sensor 11E, respectively.

In the present preferred embodiment, the Y-axis sensor 11E has an arrangement substantially similar to an arrangement obtained by rotating 90 degrees the X-axis sensor 10E in a plan view. Therefore, hereinafter, instead of a detailed description of the arrangement of the Y-axis sensor 11E, in the description of the portions of the X-axis sensor 10E, portions of the Y-axis sensor corresponding to the portions of the X-axis sensor are also described with parentheses.

Between the X-axis sensor 10E and the Z-axis sensor 12E and between the Y-axis sensor 11E and the Z-axis sensor 12E, support portions 25E for supporting these in a floating state are formed.

The support portions 25E have a lamination structure of the base substrate 7E, the base insulating layer 21E, and the polysilicon layer 22E, and integrally include straight portions 26E and annular portions 27E.

The straight portions 26E of the support portions 25E extend across the Z-axis sensors 12E from one side walls 28E of the lamination structure that form the side surfaces partitioning the cavity 23E from the lateral sides toward the X-axis sensor 10E and the Y-axis sensor 11E. The annular portions 27E of the support portions 25E surround the X-axis sensor 10E and the Y-axis sensor 11E.

The X-axis sensor 10E and the Y-axis sensor 11E are disposed inside the annular portions 27E, and both ends of the sensors are supported at two points opposing each other on the inner walls of the annular portions 27E. Both ends of the Z-axis sensors 12E are supported on both side walls of the straight portions 26E.

The X-axis sensor 10E (Y-axis sensor 11E) has an X fixed electrode 31E (Y fixed electrode 51E) and an X movable electrode 32E (Y movable electrode 52E) formed to have the same thickness.

The X fixed electrode 31E (Y fixed electrode 51E) is fixed to the support portion 25E provided inside the cavity 23E.

The X fixed electrode 31E (Y fixed electrode 51E) includes a first base portion 33E (first base portion 53E of the Y fixed electrode 51E) having a quadrilateral annular shape in a plan view and fixed to the support portion 25E, and a plurality of pairs of first comb tooth portions 34E (first comb tooth portions 54E of the Y fixed electrode 51E) aligned like comb teeth at even intervals along the inner wall of the first base portion 33E.

The first base portion 33E of the X fixed electrode 31E has a truss-shaped framed structure including straight main frames extending parallel to each other and reinforcing frames combined with the main frames so that a triangular space is repeatedly formed along the main frames.

As the first comb tooth portions 34E of the X fixed electrode 31E, two electrode portions that have base end portions connected to the first base portion 33E and tip end portions thereof straight in a plan view and opposed to each other are paired, and a plurality of the pairs are provided at even intervals. Each first comb tooth portion 34E has a framed structure having a ladder-like shape in a plan view including straight main frames extending parallel to each other and a plurality of traverse frames laid across the main frames.

The X movable electrode 32E (Y movable electrode 52E) is held to be capable of oscillating with respect to the X fixed electrode 31E.

The X movable electrode 32E (Y movable electrode 52E) includes a second base portion 35E (second base portion 55E of the Y movable electrode 52E) and second comb tooth portions 36E (second comb tooth portions 56E of the Y movable electrode 52E).

The second base portion 35E of the X movable electrode 32E is formed of a plurality (six in the present preferred embodiment) of straight frames extending parallel to each other along a direction across the first comb tooth portions 34E of the X fixed electrode 31E. Both ends of the second base portion 35E are connected to beam portions 37E (beam portions 57E of the Y-axis sensor 11E) capable of expanding and contracting along a direction across the first comb tooth portions 34E.

Two beam portions 37E are provided on each of the ends of the second base portion 35E of the X movable electrode 32E.

The second comb tooth portions 36E of the X movable electrode 32E extend to both sides from the second base portion 35E toward the portions between the first comb tooth portions 34E adjacent to each other of the X fixed electrode 31E, and are aligned like comb teeth to engage with the first comb tooth portions 34E of the X fixed electrode 31E without contact. Each second comb tooth portion 36E has a framed structure having a ladder-like shape in a plan view including straight main frames extending parallel to each other across the frames of the second base portion 35E and a plurality of traverse frames laid across the main frames.

In the X movable electrode 32E, on lines halving the second comb tooth portions 36E along a direction orthogonal to the oscillation direction Ux, insulating layers 38E across the traverse frames are embedded from the surface of the polysilicon layer 22E to the base insulating layer 21E.

The insulating layers 38E are made of $SiO_2$ (silicon oxide), and are formed integrally with the base insulating layer 21E. The second comb tooth portions 36E are insulated and separated into two of one side and the other side along the oscillation direction Ux by the insulating layers 38E. Accordingly, the separated second comb tooth portions 36E of the X movable electrode 32E function as independent electrodes in the X movable electrode 32E.

On the polysilicon layer 22E, a first insulating film 42E and a second insulating film 43E made of $SiO_2$ are laminated in order. On the second insulating film 43E, an X first drive/detection wiring 39E (Y first drive/detection wiring 59E) and an X second drive/detection wiring 40E (Y second drive/detection wiring 60E) are formed.

Figure 35:
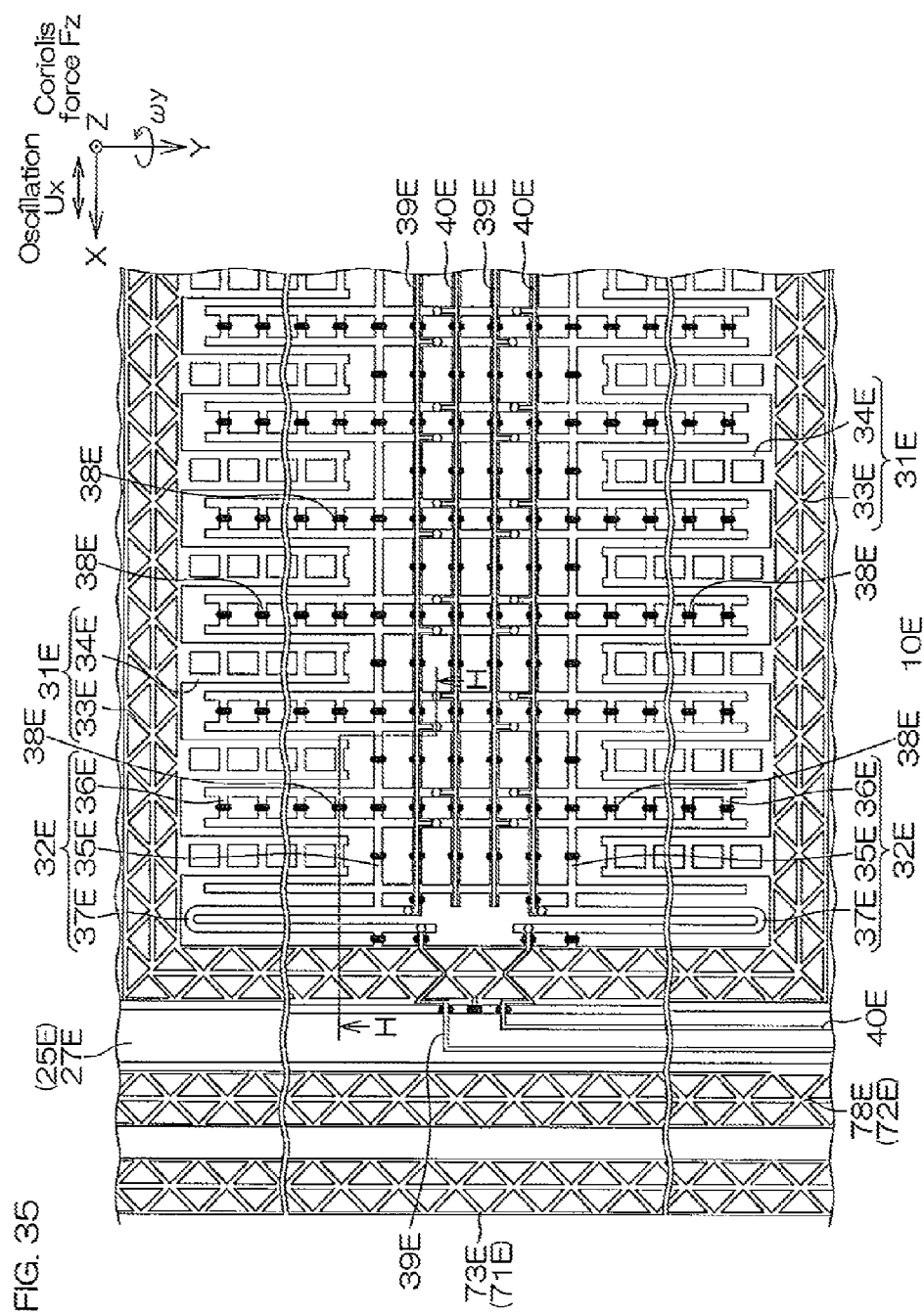
FIG. 35 is a plan view of a principal portion of the X-axis sensor shown in FIG. 2.

The X first drive/detection wiring 39E supplies a drive voltage to one side (in the present preferred embodiment, the left side on the paper surface of FIG. 35) of each second comb tooth portion 36E insulated and separated into two, and detects a change in voltage accompanying a change in capacitance from the second comb tooth portion 36E.

The X second drive/detection wiring 40E supplies a drive voltage to the other side (in the present preferred embodiment, the right side on the paper surface of FIG. 35) of each second comb tooth portion 36E insulated and separated into two, and detects a change in voltage accompanying a change in capacitance from the second comb tooth portion 36E.

The first drive/detection wiring 39E and the X second drive/detection wiring 40E are made of Al (aluminum) in the present preferred embodiment. The X first drive/detection wiring 39E and the X second drive/detection wiring 40E are electrically connected to the second comb tooth portions 36E by penetrating through the first insulating film 42E and the second insulating film 43E.

The X first drive/detection wiring 39E and the X second drive/detection wiring 40E are led onto the support portion 25E via the beam portions 37E of the X movable electrode 32E and the first base portion 33E of the X fixed electrode 31E, and partially exposed as electrode pads 9E.

The X first drive/detection wiring 39E and the X second drive/detection wiring 40E use the beam portions 37E themselves formed of portions of the conductive polysilicon layer 22E as current paths in sections passing through the beam portions 37E of the X movable electrode 32E, respectively. Al wirings may not be provided on the beam portion 37E, so that the expandability of the beam portions 37E can be maintained.

To the support portion 25E, an X third drive/detection wiring 41E that detects a change in voltage accompanying a change in capacitance from the first comb tooth portions 34E of the X fixed electrode 31E is led. The X third drive/detection wiring 41E is also partially exposed as an electrode pad 9E (not shown) in the same manner as other wirings 39E and 40E.

The upper surfaces and side surfaces of the X fixed electrode 31E and the X movable electrode 32E are coated by the protective thin film 44E made of $SiO_2$ so that the first insulating film 42E and the second insulating film 43E are covered.

On the polysilicon layer 22E, at portions except for the cavity 23E, a third insulating film 45E, a fourth insulating film 46E, a fifth insulating film 47E, and a surface protective film 48E are laminated in order on the second insulating film 43E.

In the X-axis sensor 10E structured as described above, via the X first to X third drive/detection wirings 39E to 41E, drive voltages with the same polarity and drive voltages with different polarities are alternately applied between the X fixed electrode 31E and the X movable electrode 32E. Accordingly, coulomb repulsive and attractive forces are alternately generated between the first comb tooth portions 34E of the X fixed electrode 31E and the second comb tooth portions 36E of the X movable electrode 32E.

As a result, the comb-tooth-like X movable electrode 32E oscillates similarly to the left and right along the X axis direction with respect to the comb-tooth-like X fixed electrode 31E (oscillation Ux).

In this state, when the X movable electrode 32E rotates around the Y axis as a central axis, a coriolis force Fz is generated in the Z axis direction. This coriolis force Fz changes the opposing area and/or distance between the first comb tooth portions 34E of the X fixed electrode 31E and the second comb tooth portions 36E of the X movable electrode 32E adjacent to each other.

Then, by detecting a change in capacitance between the X movable electrode 32E and the X fixed electrode 31E caused by the change in opposing area and/or distance, the angular velocity $\omega y$ around the Y axis is detected.

In the present preferred embodiment, the angular velocity $\omega y$ around the Y axis is obtained by calculating a difference between detection values of the one side and the other side, respectively, electrode portions insulated and separated from each other of the X movable electrode 32E.

In the Y-axis sensor 11E, via the Y first to Y third drive/detection wirings 59E to 61E, drive voltages with the same polarity and drive voltages with different polarities are alternately applied between the Y fixed electrode 51E and the Y movable electrode 52E. Accordingly, coulomb repulsive and attractive forces are alternately generated between the first comb tooth portions 54E of the Y fixed electrode 51E and the second comb tooth portions 56E of the Y movable electrode 52E.

As a result, the comb-tooth-like Y movable electrode 52E oscillates similarly to the left and right along the Y-axis direction with respect to the comb-tooth-like Y fixed electrode 51E (oscillation Uy).

In this state, when the Y movable electrode 52E rotates around the Y axis as a central axis, a coriolis force Fx is generated in the X-axis direction. This coriolis force Fx changes the opposing area and/or distance between the first comb tooth portions 54E of the Y fixed electrode 51E and the second comb tooth portions 56E of the Y movable electrode 52E adjacent to each other.

Then, by detecting a change in capacitance between the Y movable electrode 52E and the Y fixed electrode 51E caused by the change in opposing area and/or distance, the angular velocity $\omega z$ around the Z axis is detected.

<Arrangement of Z-axis Sensor>

Next, an arrangement of the Z-axis sensors will be described with reference to FIG. 34, FIG. 37, and FIG. 38.

Figure 37:
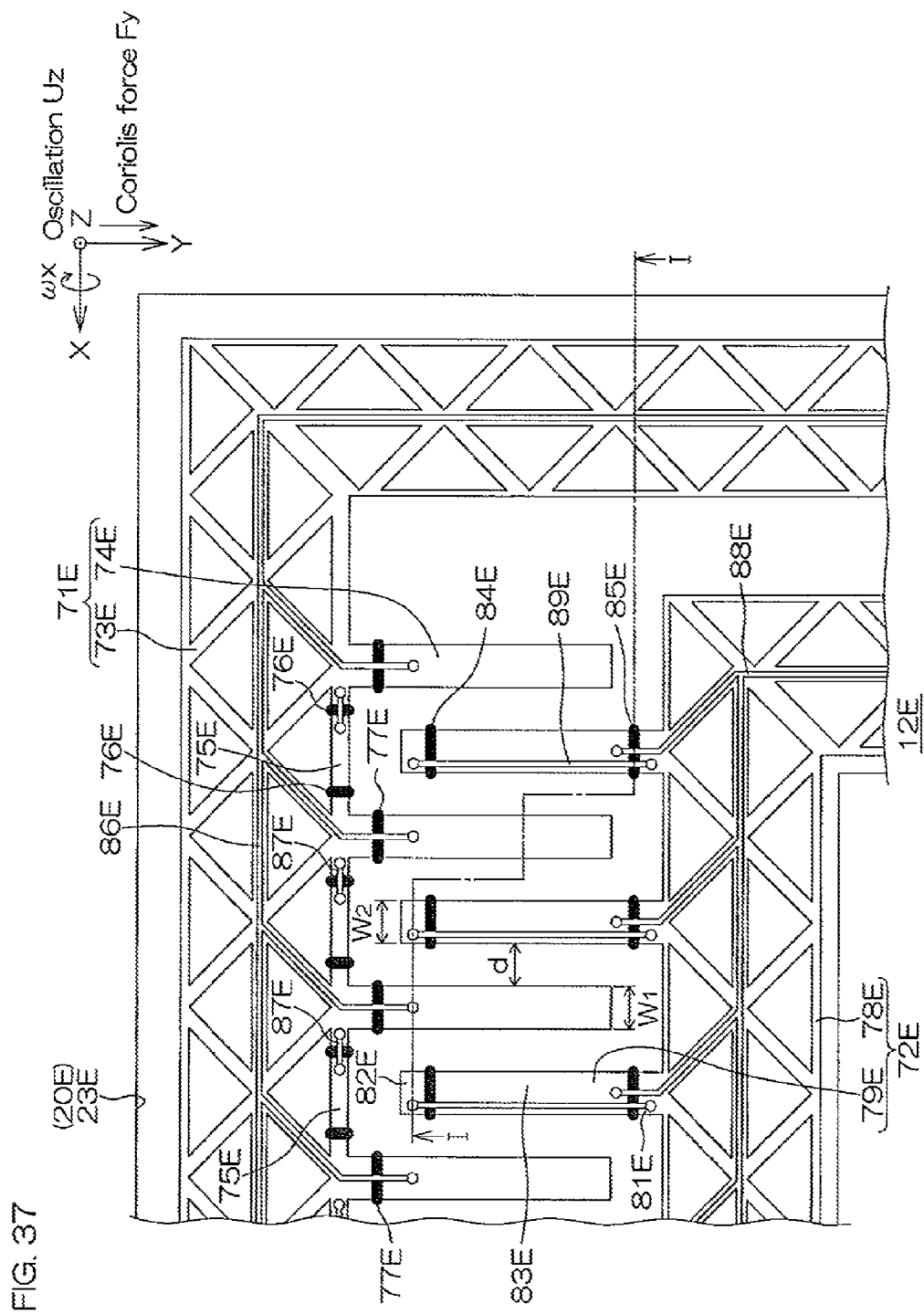
FIG. 37 is a plan view of a principal portion of the Z-axis sensor shown in FIG. 34.

FIG. 37 is a plan view of a principal portion of the Z-axis sensor of FIG. 34. FIG. 38 is a sectional view of the principal portion of the Z-axis sensor shown in FIG. 34, illustrating a section taken along the cutting plane I-I in FIG. 37.

The Z-axis sensors 12E are disposed to surround the X-axis sensor 10E and the Y-axis sensor 11E, respectively, directly above the cavity 23E as described above.

Each Z-axis sensor 12E includes a Z fixed electrode 71E and a Z movable electrode 72E formed to have the same thickness and the same width. In FIG. 37 and FIG. 38, the thickness and width of the Z fixed electrode 71E are thickness $T_1$ and width $W_1$, respectively, and the thickness and width of the Z movable electrode 72E are thickness $T_2$ and width $W_2$, respectively.

The Z fixed electrode 71E is fixed to the support portion 25E (straight portion 26E) provided inside the cavity 23E.

The Z movable electrode 72E is held to be capable of oscillating with respect to the Z fixed electrode 71E.

In the present preferred embodiment, in one Z-axis sensor 12E of the two Z-axis sensors 12E, the Z movable electrode 72E is disposed to surround the annular portion 27E, and the Z fixed electrode 71E is disposed to surround this Z movable electrode 72E.

In the other Z-axis sensor 12E, the Z fixed electrode 71E is disposed to surround the annular portion 27E, and the Z movable electrode 72E is disposed to surround this Z fixed electrode 71E.

In each Z-axis sensor 12E, the Z fixed electrode 71E includes a first base portion 73E and a plurality of first comb tooth portions 74E.

The first base portion 73E of the Z fixed electrode 71E is formed to have a quadrilateral annular shape in a plan view fixed to the support portion 25E. The first base portion 73E has a truss-shaped framed structure including straight main frames extending parallel to each other and reinforcing frames combined with the main frames so that a triangular space is repeatedly formed along the main frames.

In the first base portion 73E, on both sides of the portion (opposed portion 75E) opposed to the tip end portion 82E (described later) of each second comb tooth portion 79E, insulating layers 76E across the main frame of the truss structure in the width direction are embedded from the surface of the polysilicon layer 22E to the cavity 23E.

The insulating layers 76E are made of $SiO_2$, and are formed integrally with the base insulating layer 21E. Accordingly, the opposed portion 75E surrounded by the insulating layers 76E and the triangular space of the truss structure is insulated from other portions of the first base portion 73E of the Z fixed electrode 71E.

The first comb tooth portions 74E of the Z fixed electrode 71E are aligned like comb teeth at even intervals along the inner wall of the first base portion 73E on the portion on the side opposite to the straight portion 26E with respect to the X-axis sensor 10E (Y-axis sensor 11E) on the first base portion 73E.

The first comb tooth portions 74E have base end portions connected to the first base portion 73E of the Z fixed electrode 71E and tip end portions extending toward the Z movable electrode 72E. In portions close to the base end portions of the first comb tooth portions 74E, insulating layers 77E across the first comb tooth portions 74E in the width direction are embedded from the surface of the polysilicon layer 22E to the cavity 23E.

The insulating layers 77E are made of $SiO_2$, and formed integrally with the base insulating layer 21E. Each first comb tooth portion 74E is insulated from other portions of the Z fixed electrode 71E by the insulating layer 77E.

In each Z-axis sensor 12E, the Z movable electrode 72E includes a second base portion 78E and second comb tooth portions 79E.

The second base portion 78E of the Z movable electrode 72E is formed to have a quadrilateral annular shape in a plan view. The second base portion 78E has a truss-shaped framed structure including straight main frames extending parallel to each other and reinforcing frames combined with the main frames so that a triangular space is repeatedly formed along the main frames.

The second base portion 78E of the framed structure has sections in which the reinforcing frames are omitted at portions on the side opposite to the disposition of the second comb tooth portions 79E. The main frames in these omitted sections function as beam portions 80E for enabling the Z movable electrode 72E to move up and down.

The second comb tooth portions 79E of the Z movable electrode 72E extend from the second base portion 78E toward the portions between the first comb tooth portions 74E adjacent to each other of the Z fixed electrode 71E, and are aligned like comb teeth that engage with the first comb tooth portions 74E without contact.

The second comb tooth portions 79E have base end portions 81E connected to the second base portion 78E of the Z movable electrode 72E and tip end portions 82E extending toward the portions between the first comb tooth portions 74E of the Z fixed electrode 71E.

In portions close to the tip end portions 82E of the second comb tooth portions 79E, insulating layers 84E across the second comb tooth portions 79E in the width direction are embedded from the surface of the polysilicon layer 22E to the cavity 23E. In portions close to the base end portions 81E of the second comb tooth portions 79E, insulating layers 85E across the second comb tooth portions 79E in the width direction are embedded from the surface of the polysilicon layer 22E to the cavity 23E.

The insulating layers 84E and 85E are made of $SiO_2$, and are formed integrally with the base insulating layer 21E. By the insulating layers 84E and 85E, each second comb tooth portion 79E has three portions (the tip end portion 82E, the base end portion 81E, and an intermediate portion 83E between the tip end portion 82E and the base end portion 81E) insulated from other portions.

On the polysilicon layer 22E, as described above, a first insulating film 42E and a second insulating film 43E made of $SiO_2$ are laminated in order. On the second insulating film 43E, a Z first detection wiring 86E, a Z first drive wiring 87E, a Z second detection wiring 88E, and a Z second drive wiring 89E are formed.

The Z first detection wiring 86E and the Z second detection wiring 88E are connected, respectively, to the first comb tooth portions 74E of the Z fixed electrode 71E and the intermediate portions 83E of the Z movable electrode 72E adjacent to each other. Specifically, in the Z-axis sensor 12E, the first comb tooth portions 74E of the Z fixed electrode 71E and the intermediate portions 83E of the Z movable electrode 72E are opposed to each other at an electrode-to-electrode distance d, and constitute electrodes of a capacitor (detector) when a fixed voltage is applied therebetween and the capacitance changes according to a change in the electrode-to-electrode distance d and/or opposing area.

In detail, the Z first detection wiring 86E is formed along the first base portion 73E, and includes Al wirings branched toward the tip end portions of the first comb tooth portions 74E across the insulating layers 77E of the first comb tooth portions 74E.

The branched Al wirings are electrically connected to the tip end sides relative to the insulating layers 77E of the first comb tooth portions 74E by penetrating through the first insulating film 42E and the second insulating film 43E.

As shown in FIG. 34, the Z first detection wiring 86E is led onto the support portion 25E via the first base portion 73E, and partially exposed as an electrode pad 9E.

The Z second detection wiring 88E detects a change in voltage accompanying a change in capacitance from the second comb tooth portions 79E of the Z movable electrode 72E. The Z second detection wiring 88E is formed along the second base portion 78E, and includes Al wirings branched toward the intermediate portions 83E across the insulating layers 85E close to the base end portions 81E of the second comb tooth portions 79E.

The branched Al wirings are electrically connected to the intermediate portions 83E of the second comb tooth portions 79E by penetrating through the first insulating film 42E and the second insulating film 43E.

As shown in FIG. 34, the Z second detection wiring 88E is led onto the support portion 25E via the second base portion 78E of the Z movable electrode 72E, and partially exposed as an electrode pad 9E.

The Z first drive wiring 87E and the Z second drive wiring 89E are connected, respectively, to the opposed portions 75E and the tip end portions 82E that face each other in the direction orthogonal to the opposing direction of the electrodes constituting a capacitor. Specifically, in the Z-axis sensor 12E, the opposed portions 75E of the Z fixed electrode 71E and the tip end portions 82E of the Z movable electrode 72E opposed to each other at an interval constitute drive portions between which drive voltages are applied to oscillate the Z movable electrode 72E by coulomb forces generated by changes in the drive voltages.

In detail, the Z first drive wiring 87E supplies a drive voltage to the opposed portions 75E of the Z fixed electrode 71E. The Z first drive wiring 87E includes Al wirings across both sides of the insulating layers 76E by using the surface of the second insulating film 43E. The Z first drive wiring 87E is electrically connected to the opposed portions 75E and portions except for the opposed portions 75E of the first base portion 73E by penetrating through the first insulating film 42E and the second insulating film 43E. The portion except for the Al wirings of the Z first drive wiring 87E is formed by using the first base portion 73E formed of the conductive polysilicon layer 22E.

As shown in FIG. 34, the Z first drive wiring 87E is led onto the support portion 25E and partially exposed as an electrode pad 9E.

The Z second drive wiring 89E supplies a drive voltage to the tip end portions 82E of the Z movable electrode 72E. The Z second drive wiring 89E includes Al wirings laid across the tip end portions 82E and the base end portions 81E of the second comb tooth portions 79E by using the surface of the second insulating film 43E. The Z second drive wiring 89E is electrically connected to the tip end portions 82E and the base end portions 81E by penetrating through the first insulating film 42E and the second insulating film 43E. The portion except for the Al wirings of the Z second drive wiring 89E is formed by using the second base portion 78E formed of the conductive polysilicon layer 22E.

As shown in FIG. 34, the Z second drive wiring 89E is led onto the support portion 25E, and partially exposed as an electrode pad 9E.

The upper surfaces and the side surfaces of the Z fixed electrode 71E and the Z movable electrode 72E are coated by a protective thin film 44E made of $SiO_2$ so that the first insulating film 42E and the second insulating film 43E are covered.

In the Z-axis sensor 12E structured as described above, drive voltages with the same polarity and drive voltages with different polarities are alternately applied between the opposed portions 75E of the Z fixed electrode 71E and the tip end portions 82E of the Z movable electrode 72E via the Z first drive wiring 87E and the Z second drive wiring 89E. Accordingly, coulomb repulsive and attractive forces are alternately generated between the opposed portions 75E and the tip end portions 82E.

As a result, the comb-tooth-like Z movable electrode 72E oscillates up and down like a pendulum similarly around the comb-tooth-like Z fixed electrode 71E as a center of oscillation along the Z-axis direction with respect to the Z fixed electrode 71E (oscillation Uz).

In this state, when the Z movable electrode 72E rotates around the X axis as a central axis, a coriolis force Fy is generated in the Y-axis direction. This coriolis force Fy changes the opposing area and/or electrode-to-electrode distance d between the first comb tooth portions 74E and the intermediate portions 83E of the second comb tooth portions 79E adjacent to each other.

Then, by detecting a change in capacitance C between the Z movable electrode 72E and the Z fixed electrode 71E caused by the change in opposing area and/or electrode-to-electrode distanced, the angular velocity $\omega x$ around the X axis is detected.

In the present preferred embodiment, the angular velocity $\omega x$ around the X axis is obtained by calculating a difference between a detection value of the Z-axis sensor 12E surrounding the X-axis sensor 10E and a detection value of the Z-axis sensor 12E surrounding the Y-axis sensor 11E.

For example, as shown in FIG. 34, the difference is obtained by making the position relationship between the fixed electrode and the movable electrode of the Z-axis sensor 12E surrounding the X-axis sensor 10E opposite to the position relationship between the fixed electrode and the movable electrode of the Z-axis sensor 12E surrounding the Y-axis sensor 11E. Accordingly, the manner of oscillation of the Z movable electrode 72E differs between the pair of Z-axis sensors 12E, so that the difference occurs.

<Method for Manufacturing Angular Velocity Sensor>

Next, with reference to FIG. 39A to FIG. 39K, the manufacturing process of the above-described angular velocity sensor will be described in order of steps. In this paragraph, only the manufacturing process of the Z-axis sensors is shown in the drawings, and the description of the manufacturing processes of the X-axis sensor and the Y-axis sensor are omitted, however, the manufacturing processes of the X-axis sensor and the Y-axis sensor are performed in the same manner as in the manufacturing process of the Z-axis sensors in parallel to the manufacturing process of the Z-axis sensors.

Figure 38:
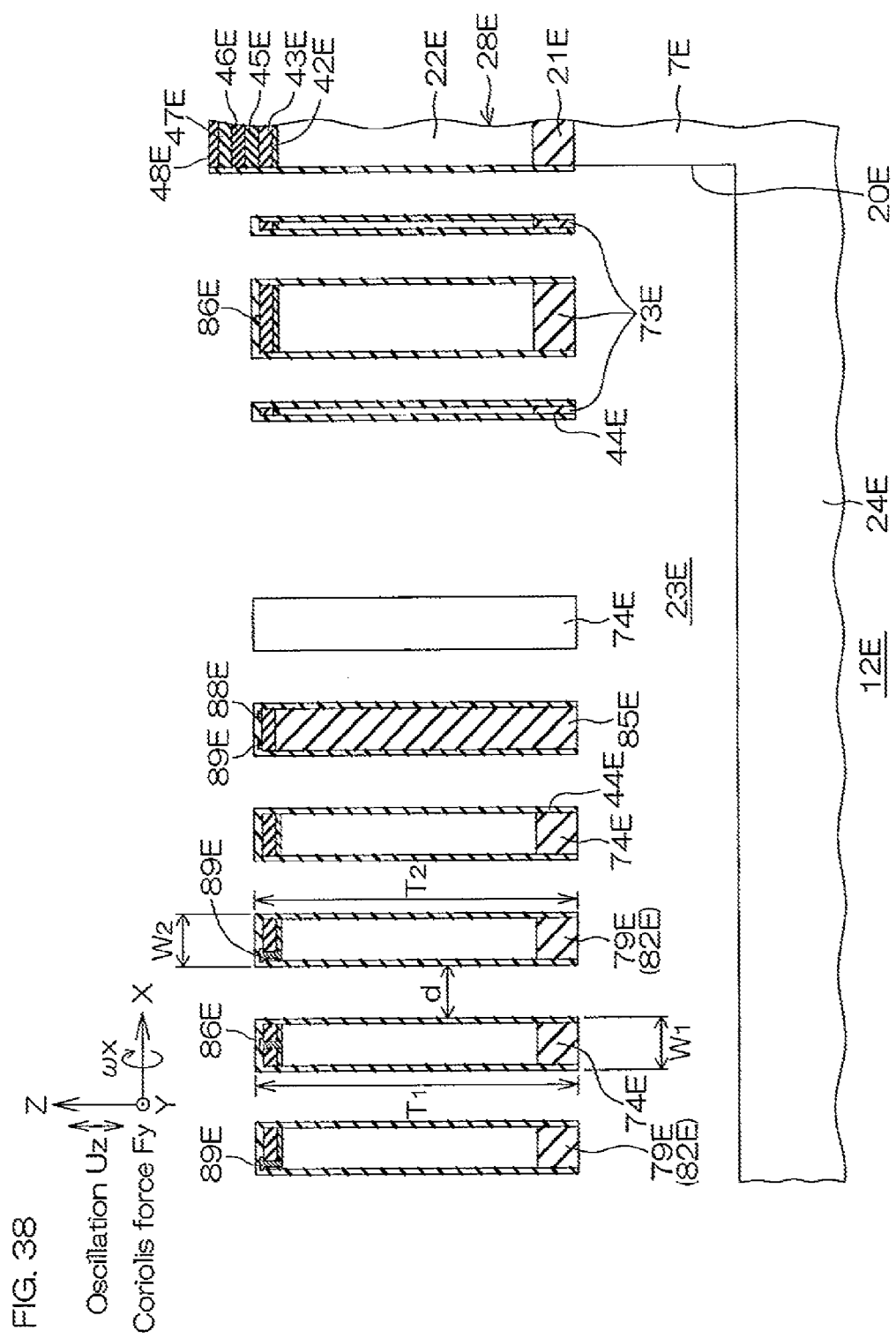
FIG. 38 is a sectional view of the principal portion of the Z-axis sensor shown in FIG. 34, illustrating a section taken along the cutting plane I-I shown in FIG. 37.

FIG. 39A to FIG. 39K are schematic sectional views showing parts of the manufacturing process of the Z-axis sensors shown in FIG. 34 in order of steps, illustrating a section taken along the cutting plane at the same position as in FIG. 38.

To manufacture the Z-axis sensors 12E, the surface of the base substrate 7E made of conductive silicon is thermally oxidized (for example, temperature: 1000° C. to 1200° C.). Accordingly, a mask (not shown) made of $SiO_2$ is formed on the surface of the base substrate 7E. Next, by a known patterning technique, the mask is patterned, and openings are formed at portions covering regions other than the regions in which the insulating layers 76E, 77E, 84E and 85E should be formed.

Next, by anisotropic deep RIE (Reactive Ion Etching) using this mask as a hard mask, specifically, by a Bosch process, trenches (for example, depth: approximately 10 μm) are selectively formed in the base substrate 7E. In the Bosch process, a step of etching the base substrate 7E by using $SF_6$ (sulfur hexafluoride) and a step of forming a protective film on the etched surfaces by using $C_4F_8$ (perfluorocyclobutane) are alternately repeated. Accordingly, the base substrate 7E can be etched at a high aspect ratio, however, a wavy irregularity called scallop is formed on the etched surfaces (inner peripheral surfaces of the trenches).

Figure 39A:
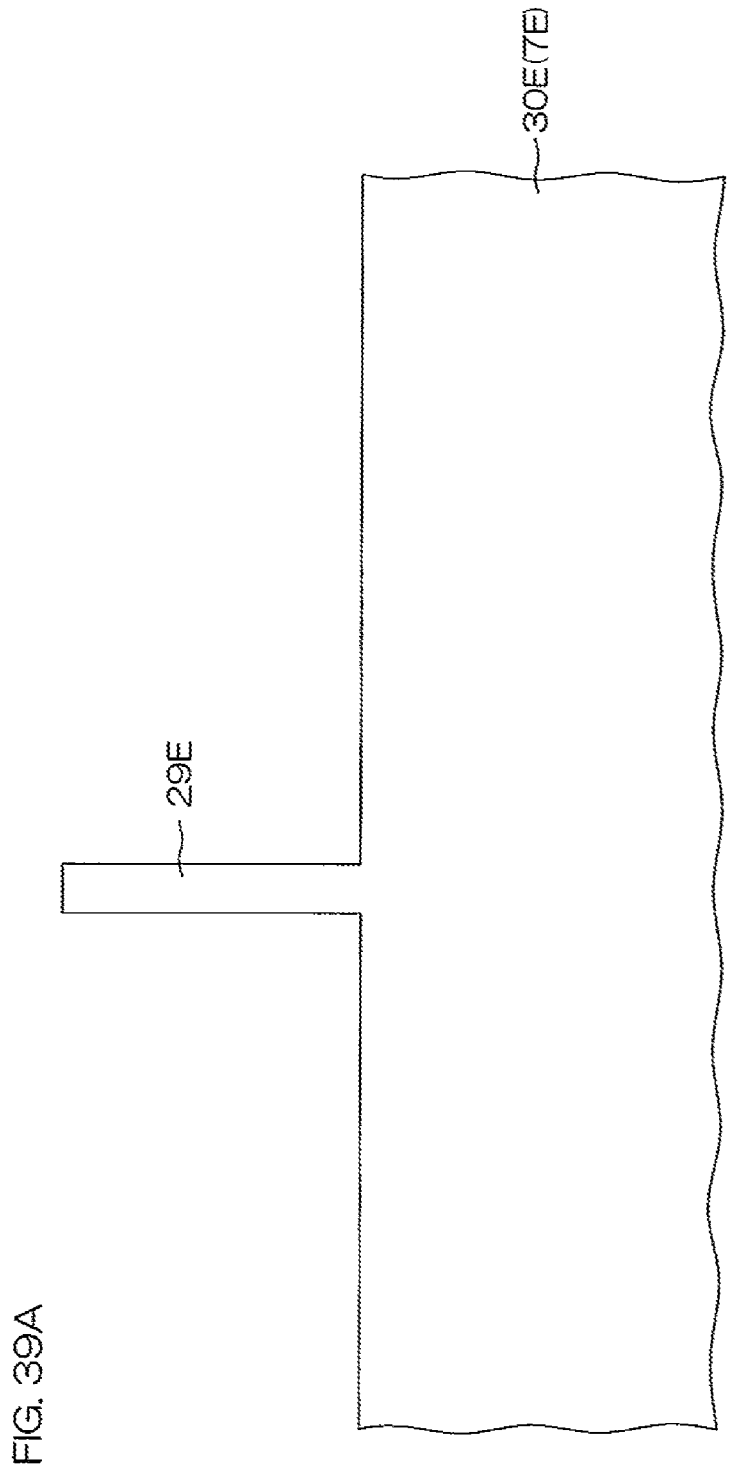
FIG. 39A to FIG. 39K are sectional views showing parts of a manufacturing process of the Z-axis sensors shown in FIG. 34 in order of steps.
Figure 39:
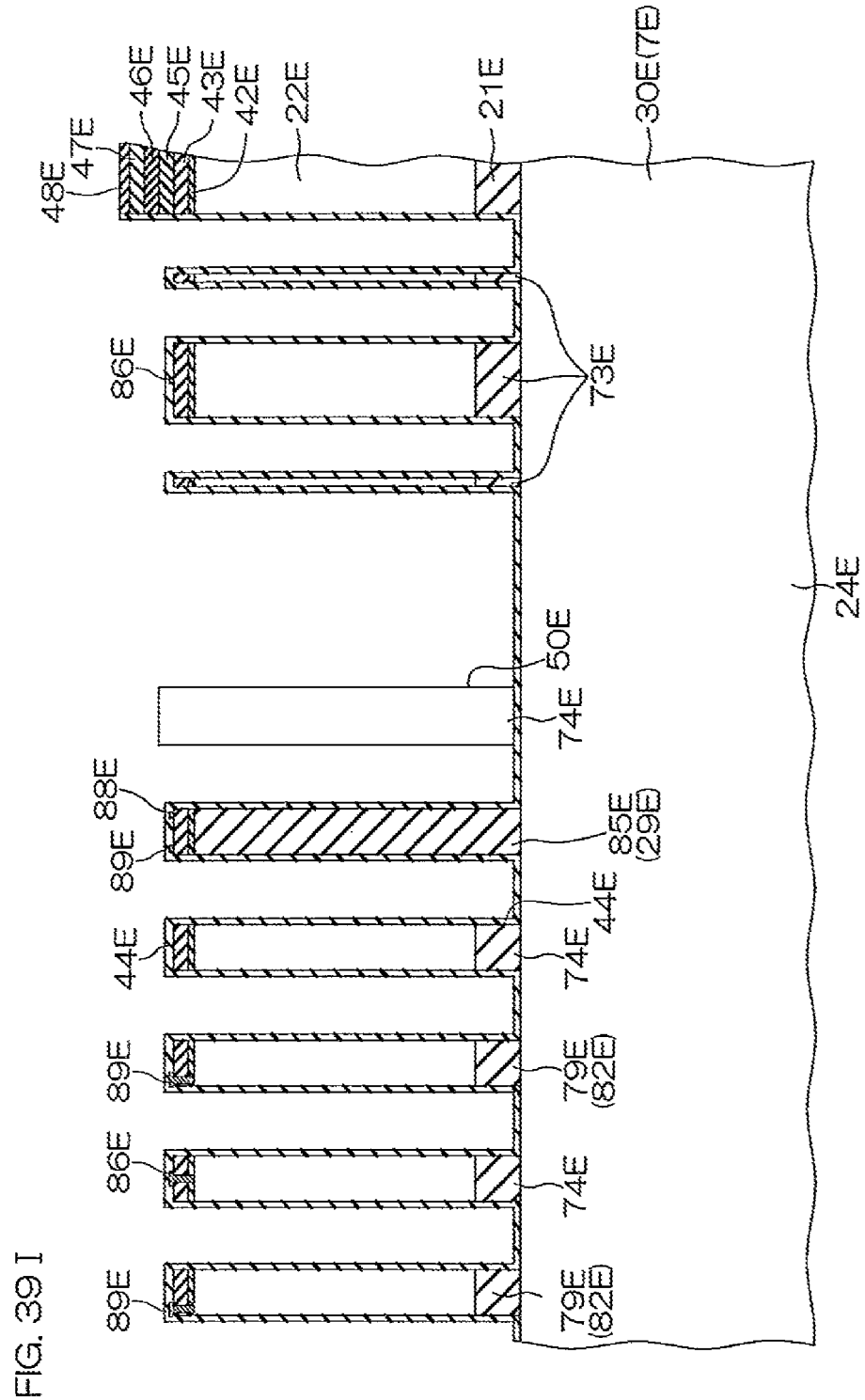

Accordingly, as shown in FIG. 39A, the left columnar portions where the trenches were not formed of the base substrate 7E are formed as columnar portions 29E having the same shapes as the insulating layers 76E, 77E, 84E, and 85E, and a plate-shaped base portion 30E that integrally supports the bottom portions of the columnar portions 29E is formed concurrently.

Next, as shown in FIG. 39B, the columnar portions 29E and the base portion 30E of the base substrate 7E are thermally oxidized (for example, temperature: 1000° C. to 1200° C.) Accordingly, the entire columnar portions 29E and the surface layer portion of the base portion 30E are altered into insulating films made of $SiO_2$. Among the altered insulating films, the columnar portions 29E become the insulating layers 76E, 77E, 84E, and 85E and the surface layer portion of the base portion 30E becomes the base insulating layer 21E, respectively.

Next, on the surfaces of the insulating layers 76E, 77E, 84E, and 85E and the base insulating layer 21E, a seed film made of polysilicon is formed. Subsequently, from this seed film, polysilicon is epitaxially grown. This epitaxial growth is continued until the height of the grown polysilicon layer 22E becomes higher than the top portions (only the top portion 49E of the insulating layer 85E is shown in FIG. 39C) of the columnar portions 29E altered into the insulating layers 76E, 77E, 84E, and 85E as shown in FIG. 39C.

Next, as shown in FIG. 39D, by applying CMP (Chemical Mechanical Polishing) to the surface of the polysilicon layer 22E, the surface of the polysilicon layer 22E is made flush with the top portions 49E of the columnar portions 29E (insulating layer 85E). The top portions 49E of the columnar portions 29E are exposed to the surface of the polysilicon layer 22E.

Next, as shown in FIG. 39E, by a CVD method, the first insulating film 42E made of $SiO_2$ is laminated on the polysilicon layer 22E.

Next, as shown in FIG. 39F, the second insulating film 43E is laminated on the first insulating film 42E. Subsequently, the second insulating film 43E and the first insulating film 42E are successively etched. Accordingly, contact holes are formed in the second insulating film 43E and the first insulating film 42E. Subsequently, after contact plugs filling the contact holes are formed, Al is deposited (for example, 7000 Å) by sputtering on the second insulating film 43E, and the Al deposition layer is patterned. Accordingly, wirings 86E to 89E are formed on the second insulating film 43E.

Next, as shown in FIG. 39G, by a CVD method, the third insulating film 45E, the fourth insulating film 46E, the fifth insulating film 47E, and the surface protective film 48E are laminated in order on the second insulating film 43E. Next, the third to fifth insulating films 45E to 47E and the surface protective film 48E on the region in which the recess 20E should be formed of the base substrate 7E are removed by etching.

Next, as shown in FIG. 39H, a resist having openings in regions except for the regions in which the Z fixed electrode 71E and the Z movable electrode 72E should be formed is formed on the second insulating film 43E. Subsequently, by anisotropic deep RIE using the resist as a mask, specifically, by a Bosch process, the polysilicon layer 22E and the base insulating layer 21E are dug in order. Accordingly, the lamination structure of the base insulating layer 21E and the polysilicon layer 22E is molded into the shapes of the Z fixed electrode 71E as a first electrode or a second electrode and the Z movable electrode 72E as a first electrode or a second electrode, and between these, trenches 50E are formed. To the bottom surfaces of the trenches 50E, the surface of the base substrate 7E is exposed.

Next, as shown in FIG. 39I, by thermal oxidization or by a PECVD method, on the entire surfaces of the Z fixed electrode 71E and the Z movable electrode 72E and the entire inner surfaces of the trenches 50E (that is, the side surfaces and bottom surfaces defining the trenches 50E), a protective thin film 44E made of $SiO_2$ is formed.

Figure 39J:
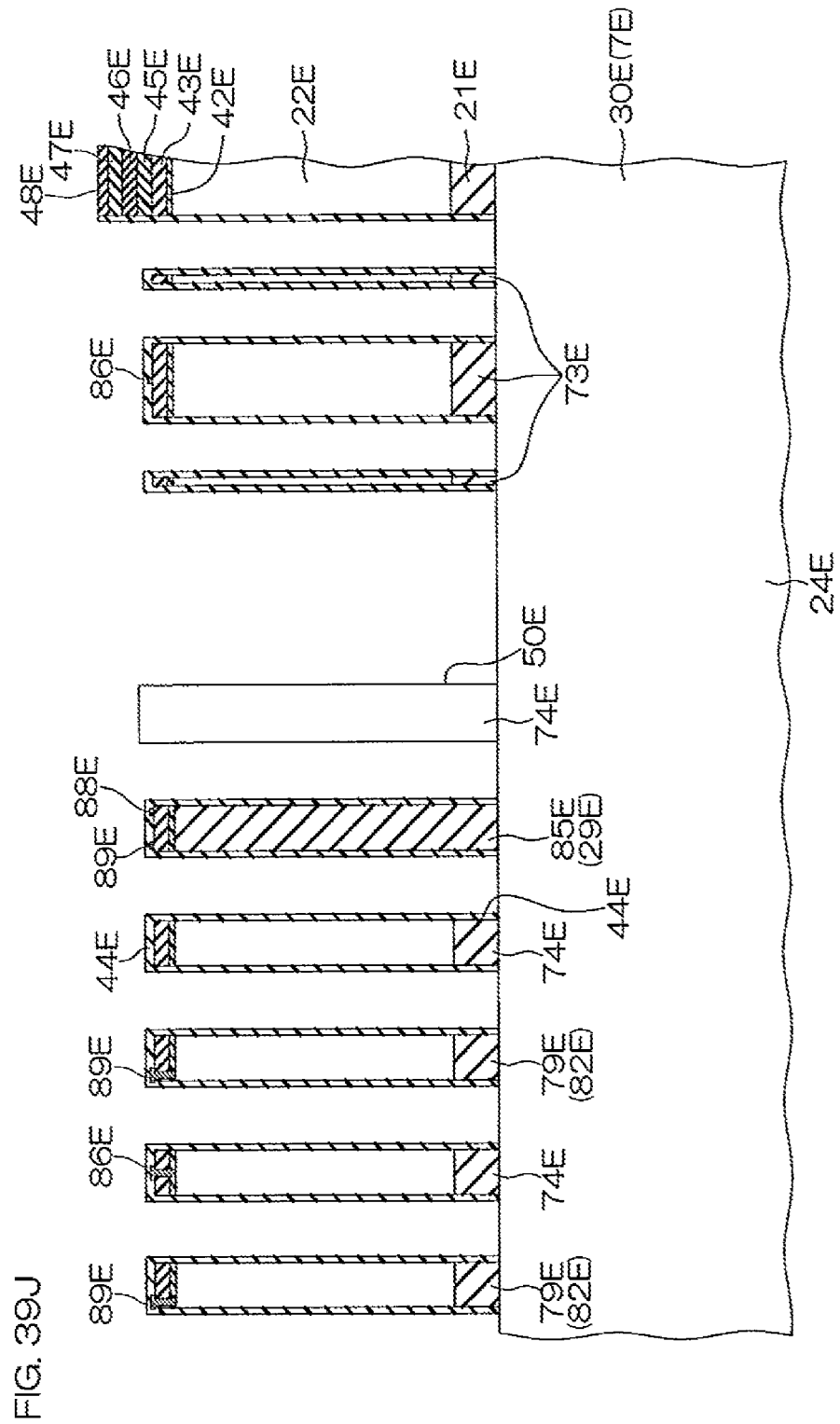

Next, as shown in FIG. 39J, by etching back, the portions on the bottom surfaces of the trenches 50E of the protective thin film 44E are removed. Accordingly, the bottom surfaces of the trenches 50E are exposed.

Figure 39K:
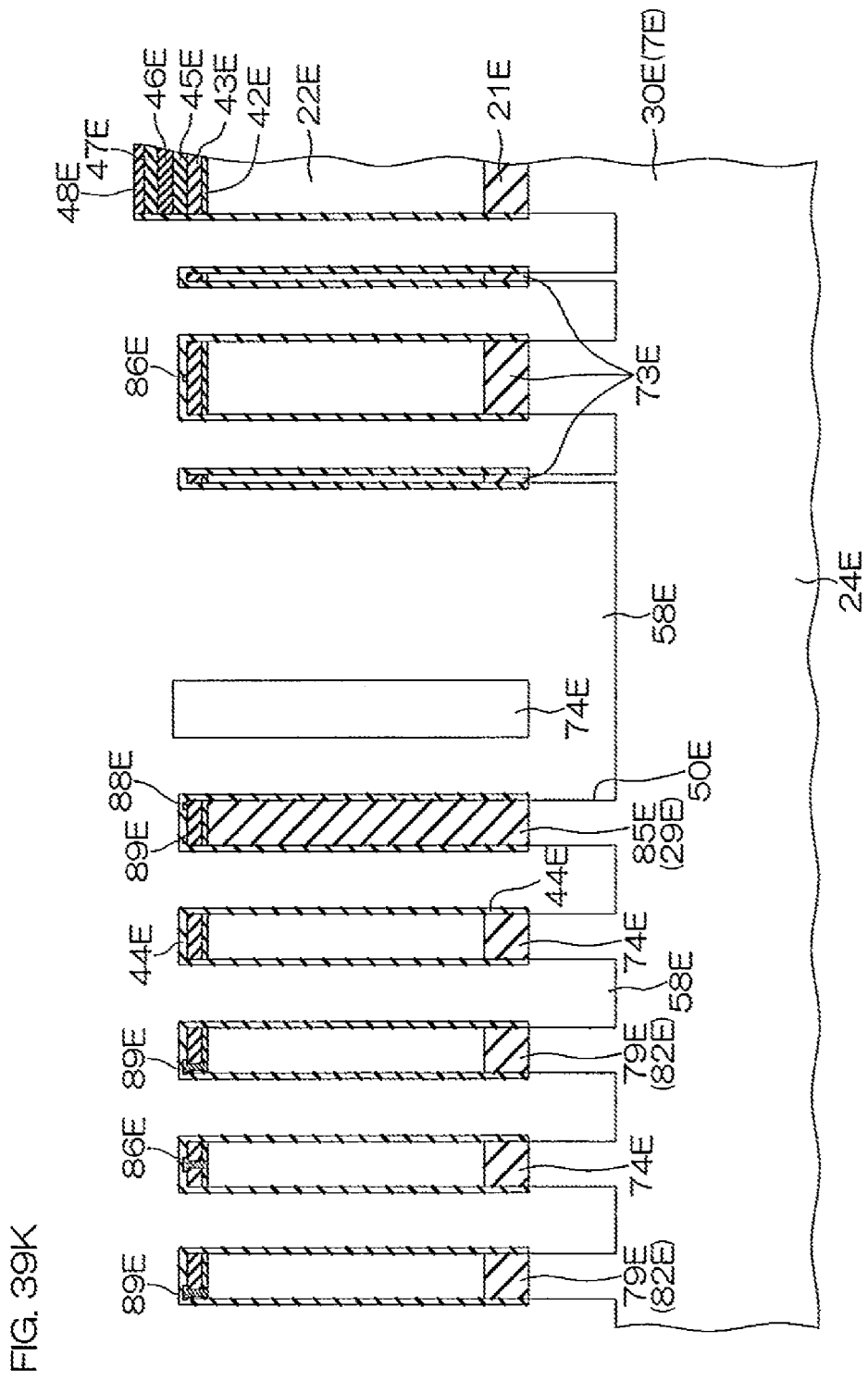

Next, as shown in FIG. 39K, by anisotropic deep RIE using the surface protective film 48E as a mask, the bottom surfaces of the trenches 50E (that is, the surface of the base substrate 7E) are further dug. Accordingly, in the bottom portions of the trenches 50E (the surface layer portion of the base substrate 7E), exposure spaces 58E to which the crystal face of the base substrate 7E is exposed are formed.

Subsequent to this anisotropic deep RIE, by isotropic RIE, reactive ions and etching gas as etching media are supplied into the exposure spaces 58E of the trenches 50E. Then, by action of the reactive ions, etc., the base substrate 7E is etched in a direction parallel to the surface of the base substrate 7E while being etched in the thickness direction of the base substrate 7E from the exposure spaces 58E. Accordingly, all exposure spaces 58E adjacent to each other are integrated to form a recess 20E (cavity 23E) on the surface layer portion of the base substrate 7E, and directly above the recess 20E, the Z fixed electrode 71E and the Z movable electrode 72E is in a floating state.

Through the above-described steps, the Z-axis sensors 12E shown in FIG. 34 are obtained.

According to the method described above, the lowest portions of the Z fixed electrode 71E and the Z movable electrode 72E are formed of the base insulating layer 21E made of $SiO_2$ having etching selectivity to Si. Further, the side surfaces of the Z fixed electrode 71E and the Z movable electrode 72E are also covered by the protective thin film 44E made of $SiO_2$.

Therefore, in the step of FIG. 39K, when reactive ions and etching gas are supplied into the exposure spaces 58E and the base substrate 7E is isotropically etched, even if the etching gas, etc., come into contact with the Z fixed electrode 71E and the Z movable electrode 72E, the Z fixed electrode 71E and the Z movable electrode 72E can be prevented from being eroded by the etching gas. As a result, the variation in size (the thicknesses $T_1$ and $T_2$ and the width $W_1$ and $W_2$) of the Z fixed electrode 71E and the Z movable electrode 72E can be reduced.

Therefore, in the Z-axis sensor 12E, the opposing area between the first comb tooth portions 74E and the intermediate portions 83E of the second comb tooth portions 79E according to the thicknesses $T_1$ and $T_2$ of the Z fixed electrode 71E and the Z movable electrode 72E, and the electrode-to-electrode distance d according to the widths $W_1$ and $W_2$ of the Z fixed electrode 71E and the Z movable electrode 72E can be maintained constantly. Therefore, a change in capacitance between the Z movable electrode 72E and the Z fixed electrode 71E caused by a change in the opposing area and/or electrode-to-electrode distance d can be accurately detected.

The variations in the widths $W_1$ and $W_2$ of the Z fixed electrode 71E and the Z movable electrode 72E are small, so that the magnitudes of coulomb repulsive and attractive forces to be generated at the respective portions between the opposed portions 75E and the tip end portions 82E can be made substantially equal to each other among the respective portions. As a result, the Z movable electrode 72E can be driven as designed.

In the invention described in Patent Document 1, the plurality of portions that should be electrically insulated in the Si substrate are isolated by isolation joints (isolation joints 160, 360 . . . ). These isolation joints are formed by forming trenches in a Si substrate and thermally oxidizing the inner walls (side walls and bottom walls) of the trenches as shown in FIG. 6a of Patent Document 1. When the inner walls of the trenches are thermally oxidized, $SiO_2$ grows from the side walls and the bottom walls toward the insides of the trenches, and $SiO_2$ grown from the walls are eventually integrated. By this integration, isolation joints (612 in FIG. 6a) embedded in the trenches are obtained. However, the isolation joints thus obtained are films formed by growing a plurality of $SiO_2$ inside trenches that were originally void and integrating these, so that the strength of the films is not so high, and this formation takes time (for example, the etching rate is approximately 2 μm/h).

Therefore, in the present preferred embodiment, the shapes of the insulating layers 76E, 77E, 84E, and 85E for insulating and separating the portions of the Z fixed electrode 71E and the Z movable electrode 72E from other portions are formed as columnar portions 29E by etching the base substrate 7E whose crystal structure is neat (the step of FIG. 39A). Next, the columnar portions 29E are altered into insulating films by thermal oxidization (the step of FIG. 39B). Next, a polysilicon layer 22E is formed around the insulating films (the step from FIG. 39C to FIG. 39D), and the polysilicon layer 22E is etched into the shapes of the Z fixed electrode 71E and the Z movable electrode 72E (the step of FIG. 39H). Specifically, the shapes of the insulating layers 76E, 77E, 84E, and 85E are formed by etching the base substrate 7E, so that as compared with the method for forming the isolation joints in Patent Document 1, the insulating layers with higher strength can be formed in a shorter time (for example, the etching rate is approximately 5 μm to 10 μm/min.).

As shown in FIG. 39C, after polysilicon is epitaxially grown so as to completely cover the insulating layers 76E, 77E, 84E and 85E, by applying CMP to the grown polysilicon, the thickness of the polysilicon layer 22E is adjusted. Therefore, as compared with the case where the thickness of the polysilicon layer 22E is adjusted by considering the growth time of polysilicon from the seed film, etc., the polysilicon layer 22E having a thickness equal to the height of the insulating films formed by the columnar portions 29E can be easily formed. Accordingly, the first comb tooth portions 74E and the opposed portions 75E of the Z fixed electrode 71E and the base end portions 81E, the tip end portions 82E, and the intermediate portions 83E of the Z movable electrode 72E can be reliably insulated from other portions of the polysilicon layer 22E, respectively.

As shown in FIG. 39F, previous to the step of molding the polysilicon layer 22E into the Z fixed electrode 71E and the Z movable electrode 72E (the step of FIG. 39H), wirings 86E to 89E are formed on the polysilicon layer 22E. Before molding the electrodes 71E and 72E, the space on the polysilicon layer 22E can be effectively used. Even if a slight difference occurs between the actually formed pattern of the wirings 86E to 89E and the designed specification formation pattern, by correcting the molded pattern of the electrodes 71E and 72E by considering the difference, a sensor as designed can be manufactured finally.

Figure 36:
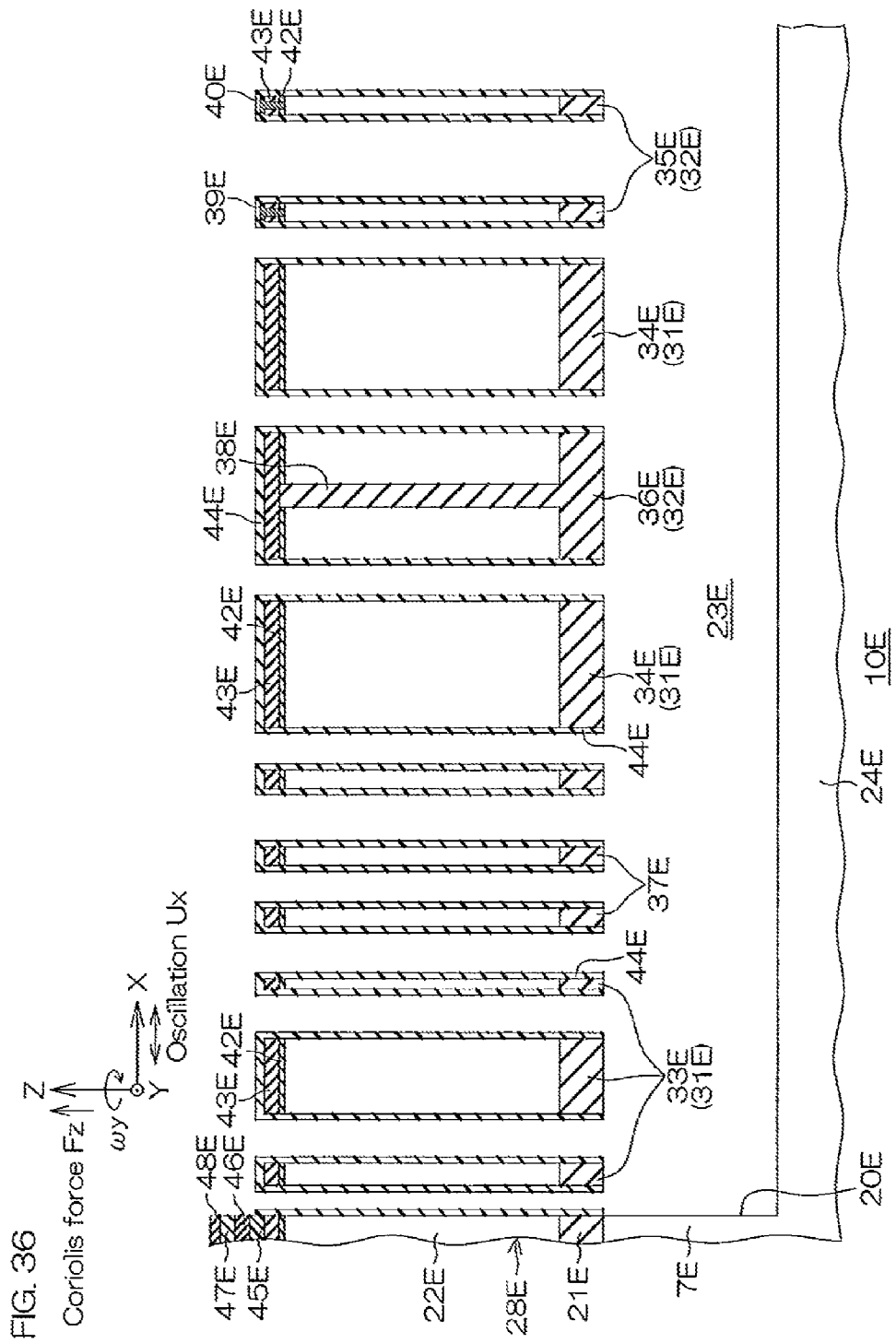
FIG. 36 is a sectional view of the principal portion of the X-axis sensor shown in FIG. 2, illustrating a section taken along the cutting plane H-H in FIG. 35.

The description of the operation and effects of the X-axis sensor 10E and the Y-axis sensor 11E is omitted, however, the same operation and effects as those of the above-described Z-axis sensor 12E can be obtained with the X-axis sensor 10E and the Y-axis sensor 11E according to the present preferred embodiment by arranging these as shown in FIG. 34 to FIG. 36.

The MEMS package 1E according to the present preferred embodiment includes the X-axis sensor 10E, the Y-axis sensor 11E, and the Z-axis sensors 12E, so that the MEMS package can accurately detect angular velocities applied around three axes (X axis, Y axis, and Z axis) orthogonal to each other in a three-dimensional space.

The fifth preferred embodiment of the present invention is described above, however the present invention can also be carried out in other embodiments.

Figure 40:
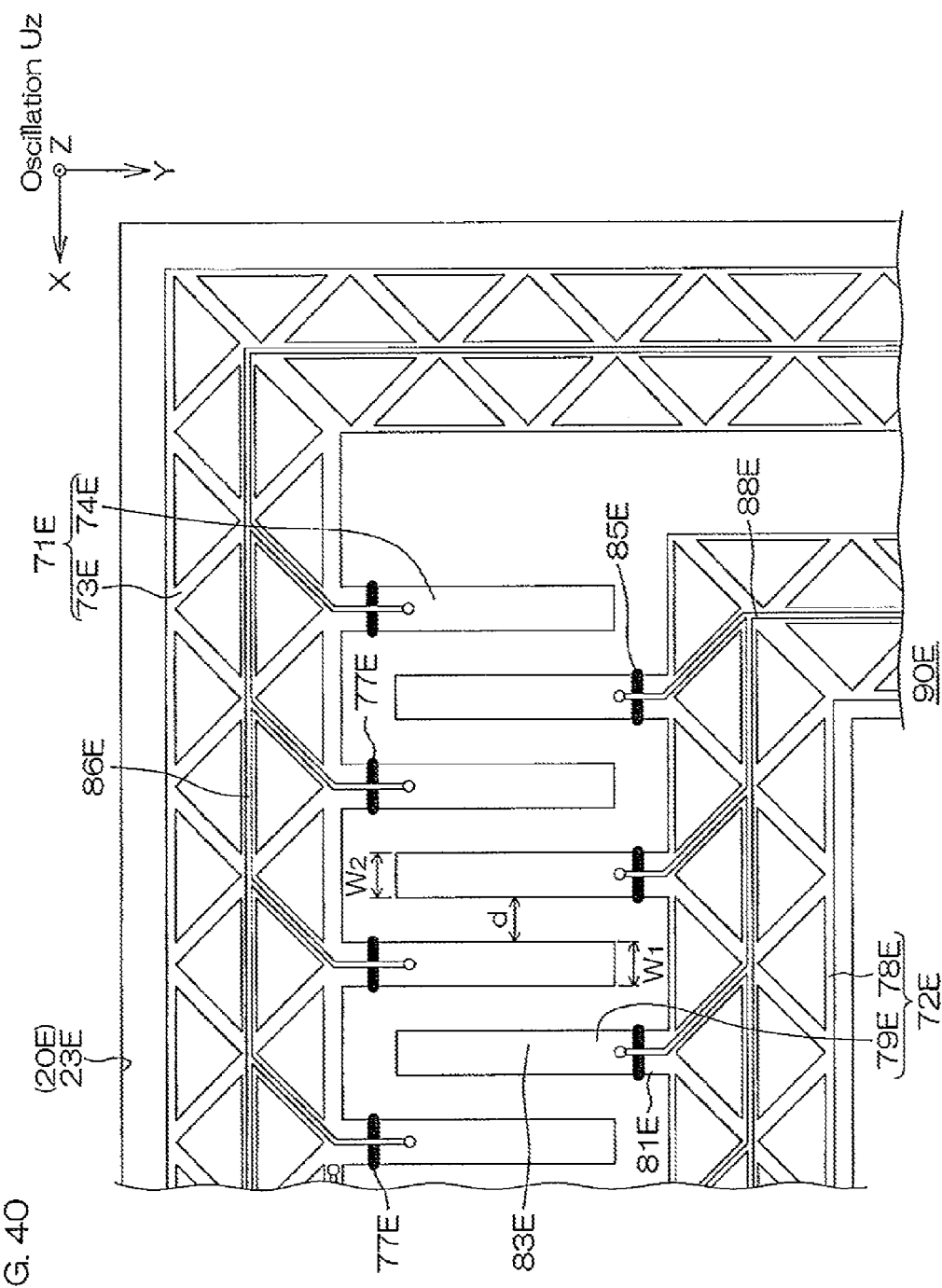
FIG. 40 is a plan view showing a mode in which the Z-axis sensor shown in FIG. 37 is used as an acceleration sensor.

For example, the MEMS package 1E may include an acceleration sensor instead of or in addition to the angular velocity sensor 3E. The acceleration sensor can be manufactured, for example, by omitting the drive portions in the sensors 10E to 12E shown in FIG. 34 to FIG. 38. For example, as shown in FIG. 40, a Z-axis acceleration sensor 90E that detects acceleration applied in the Z-axis direction can be manufactured by omitting the opposed portions 75E of the Z fixed electrode 71E and the tip end portions 82E of the Z movable electrode 72E that function as drive portions and the wirings 87E and 89E connected to these portions in the Z-axis sensor 12E shown in FIG. 37.

In the Z-axis acceleration sensor 90E, the variation in size (thicknesses $T_1$ and $T_2$ and widths $W_1$ and $W_2$) of the Z fixed electrode 71E and the Z movable electrode 72E can be reduced.

Therefore, in the Z-axis acceleration sensor 90E, the opposing area between the first comb tooth portions 74E and the intermediate portions 83E of the second comb tooth portions 79E according to the thicknesses $T_1$ and $T_2$ of the Z fixed electrode 71E and the Z movable electrode 72E, and the electrode-to-electrode distance d according to the widths $W_1$ and $W_2$ of the Z fixed electrode 71E and the Z movable electrode 72E can be maintained constantly. Therefore, a change in capacitance between the Z movable electrode 72E and the Z fixed electrode 71E caused by a change in the opposing area and/or electrode-to-electrode distance d can be accurately detected. As a result, based on the change in capacitance, acceleration can be accurately detected.

The material of the base insulating layer 21E is not limited to $SiO_2$, and may be other materials (for example, SiN, etc.) having etching selectivity to Si.

Preferred embodiments of the present invention are described in detail above, however these are only detailed examples used for clarifying the technical contents of the present invention, and the present invention should not be interpreted as being limited to these detailed examples, and the spirit and scope of the present invention are limited only by the claims attached hereto.

The above-described features grasped from the disclosure of the first to fifth preferred embodiments described above may be combined with each other even among different preferred embodiments. The components described in the preferred embodiments may be combined within the scope of the present invention.

What is claimed is:

1. A capacitance type sensor comprising:
    a semiconductor substrate having a cavity inside by forming an upper wall and a bottom wall, and having a surface portion forming the upper wall of the cavity and a back surface portion forming the bottom wall; and
    a first electrode and a second electrode that are formed by processing the surface portion of the semiconductor substrate and have comb-tooth-like shapes to engage with each other at an interval, where
    a change in capacitance between the first electrode and the second electrode is detected.

2. The capacitance type sensor according to claim 1, wherein
    the first electrode includes dielectric layers that have a predetermined thickness from the surface or the back surface to a halfway point of the first electrode along the thickness direction orthogonal to the opposing direction of the second electrode and have a predetermined width along the opposing direction, and conductive layers consisting of remaining portions except for the dielectric layers.

3. The capacitance type sensor according to claim 1, wherein the dielectric layers are one-sided to one end side in the width direction of the first electrode, and the conductive layer includes a first portion formed adjacently on the other end side in the width direction to the dielectric layer, and a second portion formed below the dielectric layer and having a width larger than that of the first portion.

4. The capacitance type sensor according to claim 1, wherein the dielectric layers are formed from one end to the other end in the width direction of the first electrode and have the same width as that of the first electrode, and the first electrode has a lamination structure including the dielectric layers and the conductive layers formed below the dielectric layers.

5. The capacitance type sensor according to claim 1, wherein the first electrode is a movable electrode and the second electrode is a fixed electrode.

6. The capacitance type sensor according to claim 1, wherein the first electrode is a fixed electrode and the second electrode is a movable electrode.

7. The capacitance type sensor according to claim 1, wherein the semiconductor substrate is a conductive silicon substrate.

8. The capacitance type sensor according to claim 2, wherein the conductive layers are portions formed by using a portion of the semiconductor substrate.

9. The capacitance type sensor according to claim 2, wherein the dielectric layers are made of $SiO_2$.

10. The capacitance type sensor according to claim 1, further comprising a first insulating layer that is selectively embedded in the first electrode and insulate and separate a certain portion of the first electrode from other portion of the first electrode.

11. The capacitance type sensor according to claim 10, wherein the first insulating layer is made of $SiO_2$.

12. The capacitance type sensor according to claim 1, further comprising a second insulating layer that is selectively embedded in the second electrode and insulate and separate a certain portion of the second electrode from other portion of the second electrode.

13. The capacitance type sensor according to claim 12, wherein the second insulating layer is made of $SiO_2$.

14. The capacitance type sensor according to claim 1, comprising an acceleration sensor that detects acceleration applied to the capacitance type sensor by detecting a change in capacitance between the first electrode and the second electrode.

15. The capacitance type sensor according to claim 1, comprising an angular velocity sensor that drives the first electrode in directions approaching and away from the cavity and detects an angular velocity applied to the capacitance type sensor at the time of this driving by detecting a change in capacitance between the first electrode and the second electrode.

* * * * *